(12) United States Patent
Bergman et al.

(10) Patent No.: US 10,436,977 B2
(45) Date of Patent: Oct. 8, 2019

(54) BUILDING AUTOMATION SYSTEM SETUP USING A REMOTE CONTROL DEVICE

(71) Applicant: Ademco Inc., Golden Valley, MN (US)

(72) Inventors: Gabriel Bergman, New Brighton, MN (US); David Quam, Maple Grove, MN (US); Jeffrey Stuart, Minneapolis, MN (US); John Amundson, Minneapolis, MN (US); Paul Schwendinger, North Branch, MN (US); Kevin Weirich, Plymouth, MN (US); Michael Bruce, Forest Lake, MN (US); Soumitri Kolavennu, Blaine, MN (US); Steven Nichols, Plymouth, MN (US)

(73) Assignee: Ademco Inc., Golden Valley, MN (US)

( * ) Notice: Subject to any disclaimer, the term of this patent is extended or adjusted under 35 U.S.C. 154(b) by 679 days.

(21) Appl. No.: 14/565,306

(22) Filed: Dec. 9, 2014

(65) Prior Publication Data

US 2015/0159899 A1 Jun. 11, 2015

Related U.S. Application Data

(60) Provisional application No. 62/009,856, filed on Jun. 9, 2014, provisional application No. 61/914,877, filed on Dec. 11, 2013.

(51) Int. Cl.
*F24F 11/30* (2018.01)
*F21V 8/00* (2006.01)
(Continued)

(52) U.S. Cl.
CPC .......... *G02B 6/0096* (2013.01); *F21V 23/005* (2013.01); *F24F 11/30* (2018.01);
(Continued)

(58) Field of Classification Search
CPC ................. F24F 11/006; F24F 11/0086; F24F 2011/0071; F21V 23/005; G02B 6/0096;
(Continued)

(56) References Cited

U.S. PATENT DOCUMENTS

| 3,656,112 A | 4/1972 | Paull |
| 3,900,842 A | 8/1975 | Calabro et al. |

(Continued)

FOREIGN PATENT DOCUMENTS

| CN | 103262041 | 8/2013 |
| DE | 3334117 | 4/1985 |

(Continued)

OTHER PUBLICATIONS

"Energy User News," ISSN: 0162-9131, 4 pages, Mar. 1, 1997.
(Continued)

*Primary Examiner* — Brian W Wathen
*Assistant Examiner* — Brian T McMenemy
(74) *Attorney, Agent, or Firm* — Shumaker & Sieffert, P.A.

(57) ABSTRACT

An HVAC controller may be programmed using a mobile device having a touch screen display, a wireless port and a controller that is in operative communication with the touch screen display and the wireless port. The controller may establish communication with and download an application program code from the remote download server. The controller may establish a direct wireless connection between the wireless port of the mobile device and the wireless interface of the HVAC controller and execute the application program code, which provides one or more configuration screens on the touch screen display of the mobile device to enable the user to configure the HVAC controller via one or more configuration parameters, and then upload the one or more configuration parameters to the HVAC controller via (Continued)

the direct wireless connection between the wireless port of the mobile device and the wireless interface of the HVAC controller.

18 Claims, 147 Drawing Sheets

(51) Int. Cl.
| | | |
|---|---|---|
| *G05B 15/02* | (2006.01) | |
| *F21V 23/00* | (2015.01) | |
| *G08B 5/36* | (2006.01) | |
| *H04W 4/021* | (2018.01) | |
| *H05K 7/12* | (2006.01) | |
| *H04L 29/08* | (2006.01) | |
| *H04L 12/28* | (2006.01) | |
| *F24F 11/62* | (2018.01) | |
| *F21Y 115/10* | (2016.01) | |
| *F21Y 113/13* | (2016.01) | |
| *F24F 11/58* | (2018.01) | |
| *F24F 11/52* | (2018.01) | |
| *H02G 3/10* | (2006.01) | |

(52) U.S. Cl.
CPC .............. *F24F 11/62* (2018.01); *G05B 15/02* (2013.01); *G08B 5/36* (2013.01); *H04L 12/2818* (2013.01); *H04L 67/025* (2013.01); *H04W 4/021* (2013.01); *H05K 7/12* (2013.01); *F21Y 2113/13* (2016.08); *F21Y 2115/10* (2016.08); *F24F 11/52* (2018.01); *F24F 11/58* (2018.01); *H02G 3/10* (2013.01); *H04L 67/08* (2013.01)

(58) Field of Classification Search
CPC ....... G05B 15/02; G08B 5/36; H04L 12/2818; H04L 67/025; H04W 4/005; H04W 4/021; H05K 7/12; F21Y 2115/10; F21Y 2113/13
See application file for complete search history.

(56) References Cited

U.S. PATENT DOCUMENTS

| | | | |
|---|---|---|---|
| 4,079,366 | A | 3/1978 | Wong |
| 4,174,807 | A | 11/1979 | Smith et al. |
| 4,206,872 | A | 6/1980 | Levine |
| 4,216,384 | A | 8/1980 | Hurley |
| 4,224,615 | A | 9/1980 | Penz |
| 4,264,034 | A | 4/1981 | Hyltin et al. |
| 4,296,334 | A | 10/1981 | Wong |
| 4,298,946 | A | 11/1981 | Hartsell et al. |
| 4,308,991 | A | 1/1982 | Peinetti et al. |
| 4,314,665 | A | 2/1982 | Levine |
| 4,332,352 | A | 6/1982 | Jaeger |
| 4,337,822 | A | 7/1982 | Hyltin et al. |
| 4,337,893 | A | 7/1982 | Flanders et al. |
| 4,341,345 | A | 7/1982 | Hammer et al. |
| 4,345,162 | A | 8/1982 | Hammer et al. |
| 4,357,665 | A | 11/1982 | Korff |
| 4,373,664 | A | 2/1983 | Barker et al. |
| 4,379,483 | A | 4/1983 | Farley |
| 4,382,544 | A | 5/1983 | Stewart |
| 4,386,649 | A | 6/1983 | Hines et al. |
| 4,388,692 | A | 6/1983 | Jones et al. |
| 4,399,510 | A | 8/1983 | Hichs |
| 4,401,262 | A | 8/1983 | Adams et al. |
| 4,429,299 | A | 1/1984 | Kabat et al. |
| 4,429,510 | A | 2/1984 | Thimon |
| 4,431,134 | A | 2/1984 | Hendricks et al. |
| 4,442,972 | A | 4/1984 | Sahay et al. |
| 4,446,913 | A | 5/1984 | Krocker |
| 4,479,604 | A | 10/1984 | Didner |
| 4,506,827 | A | 3/1985 | Jamieson et al. |
| 4,510,398 | A | 4/1985 | Culp et al. |
| 4,511,979 | A | 4/1985 | Amirante |
| 4,551,812 | A | 11/1985 | Gurr et al. |
| 4,556,169 | A | 12/1985 | Zerros |
| 4,556,865 | A | 12/1985 | Fukagawa et al. |
| 4,583,182 | A | 4/1986 | Breddan |
| 4,591,988 | A | 5/1986 | Klima et al. |
| 4,606,401 | A | 8/1986 | Levine et al. |
| 4,608,560 | A | 8/1986 | Allgood |
| 4,621,336 | A | 11/1986 | Brown |
| 4,622,544 | A | 11/1986 | Bially et al. |
| 4,628,201 | A | 12/1986 | Schmitt |
| 4,630,670 | A | 12/1986 | Wellman et al. |
| 4,646,964 | A | 3/1987 | Parker et al. |
| 4,656,835 | A | 4/1987 | Kidder et al. |
| 4,657,179 | A | 4/1987 | Aggers et al. |
| 4,717,333 | A | 1/1988 | Carignan |
| 4,725,001 | A | 2/1988 | Carney et al. |
| 4,742,475 | A | 5/1988 | Kaiser et al. |
| 4,746,766 | A | 8/1988 | Aoyama et al. |
| 4,771,185 | A | 9/1988 | Feron et al. |
| 4,819,714 | A | 4/1989 | Otsuka et al. |
| 4,837,731 | A | 6/1989 | Levine et al. |
| 4,839,636 | A | 6/1989 | Zeiss |
| 4,881,686 | A | 11/1989 | Mehta |
| 4,909,041 | A | 3/1990 | Jones |
| 4,914,568 | A | 4/1990 | Kodosky et al. |
| 4,916,328 | A | 4/1990 | Culp, III |
| 4,918,439 | A | 4/1990 | Wozniak et al. |
| 4,918,615 | A | 4/1990 | Suzuki et al. |
| 4,924,404 | A | 5/1990 | Reinke, Jr. |
| 4,948,040 | A | 8/1990 | Kobayashi et al. |
| 4,992,779 | A | 2/1991 | Sugino et al. |
| 4,997,029 | A | 3/1991 | Otsuka et al. |
| 5,003,457 | A | 3/1991 | Ikei et al. |
| 5,005,365 | A | 4/1991 | Lynch |
| 5,012,973 | A | 5/1991 | Dick et al. |
| 5,038,851 | A | 8/1991 | Mehta |
| 5,053,752 | A | 10/1991 | Epstein et al. |
| 5,065,813 | A | 11/1991 | Berkeley et al. |
| 5,086,385 | A | 2/1992 | Launey et al. |
| 5,088,645 | A | 2/1992 | Bell |
| 5,140,310 | A | 8/1992 | DeLuca et al. |
| 5,153,837 | A | 10/1992 | Shaffer et al. |
| 5,161,606 | A | 11/1992 | Berkeley et al. |
| 5,170,935 | A | 12/1992 | Federspiel et al. |
| 5,172,565 | A | 12/1992 | Wruck et al. |
| 5,181,653 | A | 1/1993 | Foster et al. |
| 5,187,797 | A | 2/1993 | Nielsen et al. |
| 5,218,399 | A | 6/1993 | Izumi et al. |
| 5,230,482 | A | 7/1993 | Ratz et al. |
| 5,238,184 | A | 8/1993 | Adams |
| 5,251,813 | A | 10/1993 | Kniepkamp |
| 5,259,445 | A | 11/1993 | Pratt et al. |
| 5,270,952 | A | 12/1993 | Adams et al. |
| 5,289,362 | A | 2/1994 | Liebl et al. |
| 5,329,991 | A | 7/1994 | Mehta et al. |
| 5,348,078 | A | 9/1994 | Dushane et al. |
| 5,386,577 | A | 1/1995 | Zenda |
| 5,392,042 | A | 2/1995 | Pellon |
| 5,395,042 | A | 3/1995 | Riley et al. |
| 5,404,934 | A | 4/1995 | Carlson et al. |
| 5,459,374 | A | 10/1995 | Thoeny et al. |
| 5,482,209 | A | 1/1996 | Cochran et al. |
| 5,526,422 | A | 6/1996 | Keen |
| 5,537,106 | A | 7/1996 | Mitsuhashi |
| 5,539,633 | A | 7/1996 | Hildebrand et al. |
| 5,544,036 | A | 8/1996 | Brown, Jr. et al. |
| 5,566,879 | A | 10/1996 | Longtin |
| 5,570,837 | A | 11/1996 | Brown et al. |
| 5,572,438 | A | 11/1996 | Ehlers et al. |
| 5,644,173 | A | 7/1997 | Elliason et al. |
| 5,673,850 | A | 10/1997 | Uptegraph |
| 5,682,206 | A | 10/1997 | Wehmeyer et al. |
| 5,706,191 | A | 1/1998 | Bassett et al. |
| 5,732,691 | A | 3/1998 | Maiello et al. |
| 5,761,083 | A | 6/1998 | Brown, Jr. et al. |
| 5,782,296 | A | 7/1998 | Mehta |

(56) References Cited

U.S. PATENT DOCUMENTS

| | | |
|---|---|---|
| 5,790,977 A | 8/1998 | Ezekiel |
| 5,802,467 A | 9/1998 | Salazar et al. |
| 5,818,428 A | 10/1998 | Eisenbrandt et al. |
| 5,845,259 A | 12/1998 | West et al. |
| 5,873,519 A | 2/1999 | Beilfuss |
| 5,877,957 A | 3/1999 | Bennett |
| 5,884,248 A | 3/1999 | Hall |
| 5,886,697 A | 3/1999 | Naughton et al. |
| 5,901,183 A | 5/1999 | Garin et al. |
| 5,902,183 A | 5/1999 | D'Souza |
| 5,903,327 A | 5/1999 | Hijii |
| 5,915,473 A | 6/1999 | Ganesh et al. |
| 5,926,776 A | 7/1999 | Glorioso et al. |
| 5,937,942 A | 8/1999 | Bias et al. |
| 5,947,372 A | 9/1999 | Tiernan |
| 5,950,709 A | 9/1999 | Krueger et al. |
| 5,956,487 A | 9/1999 | Venkatraman et al. |
| 5,975,737 A | 11/1999 | Crater et al. |
| 5,982,362 A | 11/1999 | Crater et al. |
| 5,982,445 A | 11/1999 | Eyer et al. |
| 6,020,881 A | 2/2000 | Naughton et al. |
| 6,032,867 A | 3/2000 | Dushane et al. |
| 6,059,195 A | 5/2000 | Adams et al. |
| 6,061,603 A | 5/2000 | Papadopoulos et al. |
| 6,067,477 A | 5/2000 | Wewalaarchi et al. |
| 6,081,197 A | 6/2000 | Garrick et al. |
| 6,088,029 A | 7/2000 | Guiberson et al. |
| 6,098,893 A | 8/2000 | Berglund et al. |
| 6,101,824 A | 8/2000 | Meyer et al. |
| 6,104,399 A | 8/2000 | Volkel |
| 6,104,963 A | 8/2000 | Cebasek et al. |
| 6,112,246 A | 8/2000 | Horbal et al. |
| 6,119,125 A | 9/2000 | Gloudeman et al. |
| 6,121,875 A | 9/2000 | Hamm et al. |
| 6,122,603 A | 9/2000 | Budike, Jr. |
| 6,139,177 A | 10/2000 | Venkatraman et al. |
| 6,140,987 A | 10/2000 | Stein et al. |
| 6,141,595 A | 10/2000 | Gloudeman et al. |
| 6,149,065 A | 11/2000 | White et al. |
| 6,152,375 A | 11/2000 | Robison |
| 6,154,681 A | 11/2000 | Drees et al. |
| 6,157,943 A | 12/2000 | Meyer |
| 6,160,551 A | 12/2000 | Naughton et al. |
| 6,167,316 A | 12/2000 | Gloudeman et al. |
| 6,192,282 B1 | 2/2001 | Smith et al. |
| 6,196,467 B1 | 3/2001 | Dushane et al. |
| 6,208,331 B1 | 3/2001 | Singh et al. |
| 6,216,956 B1 | 4/2001 | Ehlers et al. |
| 6,229,429 B1 | 5/2001 | Horon |
| 6,236,326 B1 | 5/2001 | Murphy |
| 6,236,443 B1 | 5/2001 | Carlsen |
| 6,259,074 B1 | 7/2001 | Brunner et al. |
| 6,282,454 B1 | 8/2001 | Papdopoulos et al. |
| 6,285,912 B1 | 9/2001 | Ellison et al. |
| 6,290,140 B1 | 9/2001 | Pesko et al. |
| 6,311,105 B1 | 10/2001 | Budike, Jr. |
| 6,315,211 B1 | 11/2001 | Sartain et al. |
| 6,318,639 B1 | 11/2001 | Toth |
| 6,320,577 B1 | 11/2001 | Alexander |
| 6,330,806 B1 | 12/2001 | Beaverson et al. |
| 6,334,107 B1 | 12/2001 | Gale et al. |
| 6,337,635 B1 | 1/2002 | Ericksen et al. |
| 6,344,861 B1 | 2/2002 | Naughton et al. |
| 6,351,693 B1 | 2/2002 | Monie et al. |
| 6,353,853 B1 | 3/2002 | Gravlin |
| 6,369,695 B1 | 4/2002 | Horon |
| 6,398,118 B1 | 6/2002 | Rosen et al. |
| 6,405,099 B1 | 6/2002 | Nagai et al. |
| 6,437,692 B1 | 8/2002 | Petite et al. |
| 6,453,687 B2 | 9/2002 | Sharood et al. |
| 6,466,132 B1 | 10/2002 | Caronna et al. |
| 6,473,661 B1 | 10/2002 | Wollner |
| 6,477,117 B1 | 11/2002 | Naranswami et al. |
| 6,478,233 B1 | 11/2002 | Shah |
| 6,483,906 B1 | 11/2002 | Iggulden et al. |
| 6,484,061 B2 | 11/2002 | Papdopolous et al. |
| 6,487,457 B1 | 11/2002 | Hull et al. |
| 6,496,168 B1 | 12/2002 | Tomida |
| 6,502,758 B2 | 1/2003 | Cottrell |
| 6,518,953 B1 | 2/2003 | Armstrong |
| 6,518,957 B1 | 2/2003 | Lehtinen et al. |
| 6,519,509 B1 | 2/2003 | Nierlich et al. |
| 6,546,419 B1 | 4/2003 | Humpleman et al. |
| 6,556,899 B1 | 4/2003 | Harvey et al. |
| 6,574,537 B2 | 6/2003 | Kipersztok et al. |
| 6,574,581 B1 | 6/2003 | Bohrer et al. |
| 6,578,770 B1 | 6/2003 | Rosen |
| 6,580,950 B1 | 6/2003 | Johnson et al. |
| 6,581,846 B1 | 6/2003 | Rosen |
| 6,595,430 B1 | 7/2003 | Shah |
| 6,598,096 B1 | 7/2003 | Hull et al. |
| 6,608,560 B2 | 8/2003 | Abrams |
| 6,619,555 B2 | 9/2003 | Rosen |
| 6,621,507 B1 | 9/2003 | Shah |
| 6,643,567 B2 | 11/2003 | Kolk et al. |
| 6,663,010 B2 | 12/2003 | Chene et al. |
| 6,671,586 B2 | 12/2003 | Davis et al. |
| 6,675,193 B1 | 1/2004 | Slavin et al. |
| 6,681,848 B2 | 1/2004 | Breeden |
| 6,721,607 B2 | 4/2004 | Brault |
| 6,726,112 B1 | 4/2004 | Ho |
| 6,741,915 B2 | 5/2004 | Poth |
| 6,783,079 B2 | 8/2004 | Carey et al. |
| 6,786,421 B2 | 9/2004 | Rosen |
| 6,789,739 B2 | 9/2004 | Rosen |
| 6,801,849 B2 | 10/2004 | Szukala et al. |
| 6,824,069 B2 | 11/2004 | Rosen |
| 6,833,990 B2 | 12/2004 | LaCroix et al. |
| 6,842,721 B2 | 1/2005 | Kim et al. |
| 6,861,154 B2 | 1/2005 | Nierlich et al. |
| 6,851,621 B1 | 2/2005 | Wacker et al. |
| 6,862,498 B2 | 3/2005 | Davis et al. |
| 6,868,293 B1 | 3/2005 | Schurr et al. |
| 6,891,838 B1 | 5/2005 | Petite et al. |
| 6,904,385 B1 | 6/2005 | Budike, Jr. |
| 6,931,445 B2 | 8/2005 | Davis |
| 6,934,862 B2 | 8/2005 | Sharood et al. |
| 6,967,565 B2 | 11/2005 | Lingemann |
| 6,973,410 B2 | 12/2005 | Seigel |
| 6,975,958 B2 | 12/2005 | Bohrer et al. |
| 6,988,671 B2 | 1/2006 | DeLuca |
| 6,993,417 B2 | 1/2006 | Osann, Jr. |
| 7,000,849 B2 | 2/2006 | Ashworth et al. |
| 7,001,495 B2 | 2/2006 | Essalik et al. |
| 7,010,363 B2 | 3/2006 | Donnelly et al. |
| 7,050,026 B1 | 5/2006 | Rosen |
| 7,092,794 B1 | 8/2006 | Hill et al. |
| 7,110,843 B2 | 9/2006 | Pagnano et al. |
| 7,127,734 B1 | 10/2006 | Amit |
| 7,130,719 B2 | 10/2006 | Ehlers et al. |
| 7,146,253 B2 | 12/2006 | Hoog et al. |
| 7,152,058 B2 | 12/2006 | Shotton et al. |
| 7,152,806 B1 | 12/2006 | Rosen |
| 7,155,305 B2 | 12/2006 | Hayes et al. |
| 7,156,318 B1 | 1/2007 | Rosen |
| 7,159,789 B2 | 1/2007 | Schwendinger et al. |
| 7,181,317 B2 | 2/2007 | Amundson et al. |
| 7,183,899 B2 | 2/2007 | Behnke |
| 7,184,861 B2 | 2/2007 | Petite |
| 7,187,986 B2 | 3/2007 | Johnson et al. |
| 7,216,015 B2 | 5/2007 | Poth |
| 7,222,800 B2 | 5/2007 | Wruck |
| 7,240,289 B2 | 7/2007 | Naughton et al. |
| 7,246,087 B1 | 7/2007 | Ruppelt et al. |
| 7,257,397 B2 | 8/2007 | Shamoon et al. |
| 7,269,660 B1 | 9/2007 | Westfield |
| 7,279,659 B2 | 10/2007 | Gagas et al. |
| 7,302,642 B2 | 11/2007 | Smith et al. |
| 7,343,226 B2 | 3/2008 | Ehlers et al. |
| 7,360,717 B2 | 4/2008 | Shah |
| 7,364,093 B2 | 4/2008 | Garozzo |
| 7,434,742 B2 | 10/2008 | Mueller et al. |
| 7,437,755 B2 | 10/2008 | Farino et al. |
| 7,451,017 B2 | 11/2008 | McNally |

(56) References Cited

U.S. PATENT DOCUMENTS

| | | |
|---|---|---|
| 7,455,240 B2 | 11/2008 | Chapman, Jr. et al. |
| 7,488,288 B2 | 2/2009 | Tanaka et al. |
| 7,505,914 B2 | 3/2009 | McCall |
| 7,510,126 B2 | 3/2009 | Rossi et al. |
| 7,542,867 B2 | 6/2009 | Steger et al. |
| 7,565,225 B2 | 7/2009 | Dushane et al. |
| 7,584,899 B2 | 9/2009 | de Pauw et al. |
| 7,634,504 B2 | 12/2009 | Amundson |
| 7,664,573 B2 | 2/2010 | Ahmed |
| 7,668,532 B2 | 2/2010 | Shamoon et al. |
| 7,702,421 B2 | 4/2010 | Sullivan et al. |
| 7,734,476 B2 | 6/2010 | Wildman et al. |
| 7,779,119 B2 | 8/2010 | Ginter et al. |
| 7,845,576 B2 | 12/2010 | Siddaramanna et al. |
| 7,904,209 B2 | 3/2011 | Podgorny et al. |
| 7,908,116 B2 | 3/2011 | Steinberg et al. |
| 7,949,615 B2 | 5/2011 | Ehlers et al. |
| 7,963,454 B2 | 6/2011 | Sullivan et al. |
| 8,005,576 B2 | 8/2011 | Rodgers |
| 8,010,237 B2 | 8/2011 | Cheung et al. |
| 8,019,567 B2 | 9/2011 | Steinberg et al. |
| 8,020,780 B2 | 9/2011 | Schultz et al. |
| 8,024,073 B2 | 9/2011 | Imes et al. |
| 8,063,775 B2 | 11/2011 | Reed et al. |
| 8,078,326 B2 | 12/2011 | Harrod et al. |
| 8,081,616 B2 | 12/2011 | Kito |
| 8,099,195 B2 | 1/2012 | Imes et al. |
| 8,108,076 B2 | 1/2012 | Imes et al. |
| 8,116,917 B2 | 2/2012 | Rodgers |
| 8,131,506 B2 | 3/2012 | Steinberg et al. |
| 8,170,720 B2 | 5/2012 | Amundson et al. |
| 8,180,492 B2 | 5/2012 | Steinberg |
| 8,196,185 B2 | 5/2012 | Lin et al. |
| 8,195,309 B2 | 6/2012 | Hedge et al. |
| 8,195,313 B1 | 6/2012 | Fadell et al. |
| 8,219,251 B2 | 7/2012 | Amundson et al. |
| 8,219,258 B1 | 7/2012 | Almeida et al. |
| 8,239,922 B2 | 8/2012 | Sullivan et al. |
| 8,255,090 B2 | 8/2012 | Frader-Thompson et al. |
| 8,280,536 B1 | 10/2012 | Fadell et al. |
| 8,331,544 B2 | 12/2012 | Kraus et al. |
| 8,332,055 B2 | 12/2012 | Veillette |
| 8,350,697 B2 | 1/2013 | Trundle et al. |
| 8,390,473 B2 | 3/2013 | Kryzanowski et al. |
| 8,392,561 B1 | 3/2013 | Dyer et al. |
| 8,412,654 B2 | 4/2013 | Montalvo |
| 8,423,322 B2 | 4/2013 | Steinberg et al. |
| 8,442,695 B2 | 5/2013 | Imes et al. |
| D687,047 S | 7/2013 | Hales, IV et al. |
| D687,056 S | 7/2013 | Matas et al. |
| D687,057 S | 7/2013 | Plitkins |
| D687,059 S | 7/2013 | Bruck et al. |
| 8,489,243 B2 | 7/2013 | Fadell et al. |
| 8,509,954 B2 | 8/2013 | Imes et al. |
| D691,629 S | 10/2013 | Matas et al. |
| 8,554,374 B2 | 10/2013 | Lunacek et al. |
| 8,556,188 B2 | 10/2013 | Steinberg |
| 8,587,445 B2 | 11/2013 | Rockwell |
| 8,594,850 B1 * | 11/2013 | Gourlay ............... G05B 15/02 165/11.1 |
| 8,606,374 B2 | 12/2013 | Fadell et al. |
| 8,606,409 B2 | 12/2013 | Amundson et al. |
| 8,757,507 B2 | 6/2014 | Fadell et al. |
| 8,806,209 B2 | 8/2014 | Hemphill et al. |
| 8,826,165 B2 | 9/2014 | Harrod et al. |
| 8,843,239 B2 * | 9/2014 | Mighdoll .............. F24F 11/0012 236/91 D |
| 8,870,086 B2 | 10/2014 | Tessier et al. |
| 8,893,032 B2 | 11/2014 | Bruck et al. |
| 8,903,552 B2 | 12/2014 | Amundson et al. |
| 9,014,686 B2 | 4/2015 | Ramachandran et al. |
| 9,026,261 B2 | 5/2015 | Bukhin et al. |
| 9,134,710 B2 | 9/2015 | Cheung et al. |
| 9,134,715 B2 | 9/2015 | Geadelmann et al. |
| 9,152,153 B2 | 10/2015 | Sullivan et al. |
| 9,154,903 B2 | 10/2015 | Adams et al. |
| 9,247,378 B2 * | 1/2016 | Bisson ................ H04W 4/021 |
| 2001/0010032 A1 | 7/2001 | Ehlers et al. |
| 2001/0029585 A1 | 10/2001 | Simon et al. |
| 2001/0052459 A1 | 12/2001 | Essalik et al. |
| 2002/0011923 A1 | 1/2002 | Cunningham et al. |
| 2002/0022991 A1 | 2/2002 | Sharood et al. |
| 2002/0092779 A1 | 7/2002 | Essalik et al. |
| 2002/0111698 A1 | 8/2002 | Graziano et al. |
| 2002/0133636 A1 | 9/2002 | Vekatraman et al. |
| 2002/0147006 A1 | 10/2002 | Coon et al. |
| 2002/0152298 A1 | 10/2002 | Kikta et al. |
| 2003/0000692 A1 | 1/2003 | Okano et al. |
| 2003/0033230 A1 | 2/2003 | McCall |
| 2003/0034897 A1 | 2/2003 | Shamoon et al. |
| 2003/0034898 A1 | 2/2003 | Shamoon et al. |
| 2003/0103075 A1 | 6/2003 | Rosselot |
| 2003/0142141 A1 | 7/2003 | Brown et al. |
| 2003/0233432 A1 | 12/2003 | Davis et al. |
| 2004/0107114 A1 | 6/2004 | Curtis |
| 2004/0143474 A1 | 7/2004 | Haeberle et al. |
| 2004/0260411 A1 | 12/2004 | Cannon |
| 2004/0262410 A1 | 12/2004 | Hull |
| 2005/0040248 A1 | 2/2005 | Wacker et al. |
| 2005/0055432 A1 | 3/2005 | Rodgers |
| 2005/0143863 A1 | 6/2005 | Ruane et al. |
| 2005/0172056 A1 | 8/2005 | Ahn |
| 2005/0194456 A1 | 9/2005 | Tessier et al. |
| 2005/0216302 A1 | 9/2005 | Raji et al. |
| 2006/0049694 A1 | 3/2006 | Kates |
| 2006/0058900 A1 | 3/2006 | Johanson et al. |
| 2006/0063522 A1 | 3/2006 | McFarland |
| 2006/0097063 A1 | 5/2006 | Zeevi |
| 2006/0147003 A1 | 7/2006 | Archaki et al. |
| 2006/0212174 A1 | 9/2006 | Garmon et al. |
| 2006/0283965 A1 | 12/2006 | Mueller et al. |
| 2007/0037605 A1 | 2/2007 | Logan |
| 2007/0043478 A1 | 2/2007 | Ehlers et al. |
| 2007/0045441 A1 | 3/2007 | Ashworth et al. |
| 2007/0058634 A1 | 3/2007 | Gupta et al. |
| 2007/0097993 A1 | 5/2007 | Bojahra |
| 2007/0114295 A1 | 5/2007 | Jenkins |
| 2007/0220907 A1 | 9/2007 | Ehlers |
| 2007/0230962 A1 | 10/2007 | Fisher et al. |
| 2007/0249319 A1 | 10/2007 | Faulkner et al. |
| 2007/0294369 A1 | 12/2007 | Ginter et al. |
| 2008/0033599 A1 | 2/2008 | Aminpour et al. |
| 2008/0158210 A1 | 7/2008 | Boos et al. |
| 2008/0221715 A1 | 9/2008 | Krzyzanowski et al. |
| 2009/0022076 A1 | 1/2009 | Canpolat et al. |
| 2009/0045263 A1 | 2/2009 | Mueller et al. |
| 2009/0057428 A1 | 3/2009 | Geadelmann et al. |
| 2009/0062964 A1 * | 3/2009 | Sullivan ................ G05B 15/02 700/276 |
| 2009/0065596 A1 | 3/2009 | Seem et al. |
| 2009/0140063 A1 | 6/2009 | Wacker et al. |
| 2009/0143879 A1 * | 6/2009 | Amundson ............ G05B 13/02 700/83 |
| 2009/0143916 A1 | 6/2009 | Boll et al. |
| 2009/0204262 A1 | 8/2009 | Nishimura et al. |
| 2010/0081375 A1 | 4/2010 | Rosenblatt et al. |
| 2010/0106307 A1 | 4/2010 | Grohman et al. |
| 2010/0131112 A1 * | 5/2010 | Amundson ........ G05B 19/0426 700/278 |
| 2010/0131884 A1 | 5/2010 | Shah |
| 2010/0146071 A1 | 6/2010 | Comerford et al. |
| 2010/0261465 A1 | 10/2010 | Rhoads et al. |
| 2010/0304670 A1 | 12/2010 | Shuo |
| 2011/0044208 A1 | 2/2011 | Yun et al. |
| 2011/0190910 A1 | 8/2011 | Lombard et al. |
| 2012/0005590 A1 | 1/2012 | Lombard et al. |
| 2012/0029997 A1 | 2/2012 | Khan et al. |
| 2012/0053739 A1 | 3/2012 | Brian et al. |
| 2012/0054125 A1 | 3/2012 | Clifton et al. |
| 2012/0078425 A1 | 3/2012 | Gardenswartz |
| 2012/0130547 A1 | 5/2012 | Fadell et al. |
| 2012/0191257 A1 | 7/2012 | Corcoran et al. |
| 2012/0203379 A1 | 8/2012 | Sloo et al. |
| 2012/0230221 A1 | 9/2012 | Radhakrishnan et al. |

(56) References Cited

U.S. PATENT DOCUMENTS

| | | | |
|---|---|---|---|
| 2012/0232969 | A1 | 9/2012 | Fadell et al. |
| 2012/0236820 | A1* | 9/2012 | Park .................. G08C 17/02 370/331 |
| 2012/0239207 | A1 | 9/2012 | Fadell et al. |
| 2012/0253527 | A1* | 10/2012 | Hietala .............. G05B 17/02 700/278 |
| 2012/0278453 | A1 | 11/2012 | Baum et al. |
| 2013/0030589 | A1* | 1/2013 | Pessina ............ H05B 37/0272 700/295 |
| 2013/0052946 | A1* | 2/2013 | Chatterjee ............ H04W 4/008 455/41.1 |
| 2013/0090767 | A1 | 4/2013 | Bruck et al. |
| 2013/0103622 | A1 | 4/2013 | Matsuoka et al. |
| 2013/0147812 | A1 | 6/2013 | Bias et al. |
| 2013/0178994 | A1* | 7/2013 | Valluri ................ G01D 4/002 700/292 |
| 2013/0204441 | A1 | 8/2013 | Sloo et al. |
| 2013/0226354 | A9 | 8/2013 | Ruff et al. |
| 2013/0345882 | A1 | 12/2013 | Dushane et al. |
| 2014/0025209 | A1 | 1/2014 | Lunacek et al. |
| 2014/0031989 | A1 | 1/2014 | Bergman et al. |
| 2014/0031991 | A1 | 1/2014 | Bergman et al. |
| 2014/0058567 | A1 | 2/2014 | Matsuoka et al. |
| 2014/0142763 | A1 | 5/2014 | Hutchinson |
| 2014/0156087 | A1 | 6/2014 | Amundson |
| 2014/0200718 | A1 | 7/2014 | Tessier |
| 2014/0274014 | A1 | 9/2014 | Dodla |
| 2014/0277805 | A1* | 9/2014 | Browne, Jr. ....... H05B 37/0272 700/295 |
| 2015/0106487 | A1 | 4/2015 | Rezvani et al. |
| 2016/0234035 | A1* | 8/2016 | Boeldt ................ H04W 4/80 |

FOREIGN PATENT DOCUMENTS

| | | |
|---|---|---|
| DE | 29600654 | 4/1996 |
| DE | 19840552 | 3/2000 |
| EP | 0070414 | 1/1983 |
| EP | 0332957 | 9/1989 |
| EP | 0434926 | 7/1991 |
| EP | 0978692 | 2/2000 |
| EP | 0678204 | 3/2000 |
| EP | 0985994 | 3/2000 |
| EP | 1033641 | 9/2000 |
| EP | 1074009 | 3/2002 |
| FR | 2711230 | 4/1995 |
| GB | 2333494 | 7/1999 |
| SL | 20556 | 3/2002 |
| WO | WO 85/01851 | 4/1985 |
| WO | WO 96/21264 | 7/1996 |
| WO | WO 97/11448 | 3/1997 |
| WO | WO 97/39392 | 10/1997 |
| WO | WO 98/08179 | 2/1998 |
| WO | WO 00/43870 | 7/2000 |
| WO | WO 00/57259 | 9/2000 |
| WO | WO 01/52515 | 7/2001 |
| WO | WO 01/79952 | 10/2001 |
| WO | WO 02/27687 | 4/2002 |
| WO | WO 03/032103 | 4/2003 |
| WO | WO 2009/034720 | 3/2009 |
| WO | WO 2009/067251 | 5/2009 |
| WO | WO 2006/096854 | 6/2009 |
| WO | WO 2012/068517 | 5/2012 |

OTHER PUBLICATIONS

"CorAccess Systems/In Home," http://web.archive.org/web20011212084427/www.coraccess.com/home.html, 1 page, copyright 2001, printed Aug. 19, 2004.
"HAI Company Background," http://www.homeauto.com/AboutHAI/abouthai_main.htm, 2 pages, printed Aug. 19, 2004.
"High-tech options take hold in new homes—200-08-28—Dallas Business Journal," http://bizjournals.com/dallas/stories/2000/08/28/focus4, 3 pages, dated Aug. 28, 2000, printed Aug. 19, 2004.
"Home Toys Review—TouchLinc", http://www.hometoys.com/htinews/aug99/reviews/touchlinc/touchlinc.htm, 3 pages, dated Aug. 1999, printed Aug. 20, 2004.
"HTI News Release," http://www.hometoys.com/htinews/apr99/releases/ha101.htm, 3 pages, Apr. 1999.
"Mark of Excellence Award Finalist Announced," http://64.233.167.104/search?Q=cache:ciOA2YtYaBIJ:www.hometoys.com/releases/mar. . . , 6 pages, Leopard Touchscreen on p. 2, dated prior to Mar. 4, 2000, printed Aug. 20, 2004.
"Product Review—Philips Pronto Remote Control," http://hometheaterhifi.com/voume_6_2/philipsprontoremotecontrol.html, 5 pages, dated May 1999, printed Aug. 20, 2004.
"RC X10 Automation Forum: Control your Heating and Cooling System with Pronto(1/1)," http://www.remotecentral.com/cgi-bin/mboard/rc-x10/thread.cgi?12, 2 pages, dated Apr. 23, 1999, printed Aug. 20, 2004.
"Spotlight on Integrated Systems," Custom Builder, V8, N2, p. 66(6), Mar.-Apr. 1993.
"Vantage Expands Controls for Audio/Video, HVAC and Security," http://www.hometoys.com/htinews/aug99/releases/vantage03.htm, 2 pages, dated Aug. 3, 1999, printed Aug. 20, 2004.
Action Closing Prosection for Reexam Control No. 95/002,041, dated Jul. 5, 2013.
ADI, "Leopard User Manual," 93 pages, 2001.
Adicon 2500, "The Automator," 4 pages, Oct.-Dec. 2000.
ADT Security Services, "iCenter Advanced User Interface 8142ADT," Installation and Setup Guide, 4 pages, May 2001; First Sale Feb. 2001.
ADT Security Services, "iCenter Advanced User Interface 8142ADT," User Guide, 136 pages, 2001.
Amendment After Final filed on Jul. 15, 2013 in U.S. Appl. No. 13/434,806.
Amendment filed on Feb. 27, 2012 in U.S. Appl. No. 13/434,806.
Andover Controls, "Facility Management Unleashed," 6 pages, 2002.
Andover Controls, Network News, vol. 2, No. 2, 8 pages, 1997.
Andover Controls, World, 4 pages, Spring 1997.
Aprilaire Electronic Thermostats Models 8344, 8346, 8348, 8363, 8365, 8366 Operating Instructions, 8 pages, prior to Dec. 2, 2003.
Aube Technologies, Electronic Thermostat for Heating System Model TH135-01, 5 pages, Aug. 14, 2001.
Aube Technologies, TH140-28 Electronic Programmable Thermostat, Installation Instructions and User Guide, pp. 1-4, Jan. 22, 2004.
AutomatedBuildings.com Article—"Thin Client" Solutions, "Pressure, Air Flow, Temperature, Humidity & Valves," Dwyer Instruments, Inc., 5 pages, printed Sep. 20, 2004.
Blake et al., "Seng 310 Final Project Demo Program" Illustration, 3 pages, Apr. 6, 2001.
Blake et al., "Seng 310 Final Project" Report, dated Apr. 6, 2001.
Blister Pack Insert from a Ritetemp 8082 Touch Screen Thermostat Product, 2 pages, 2002.
Braeburn Model 3000 Owner's Manual, pp. 1-13, 2001.
Braeburn Model 5000 Owners Manual, pp. 1-17, 2001.
BRK Electronics Maximum Protection Plus Ultimate Convenience Smoke Alarm, 24 pages, Sep. 2000.
BRK First Alert, User's Manual, Smoke and Fire Alarms, pp. 1-7, Nov. 2002.
Bryant Heating & Cooling Systems, "Installation and Start-Up Instructions Evolution Control," SYSTXBBUID01, Catalog No. 809-60019, 2004.
Business Wire, "MicroTouch Specialty Products Group to Capitalize on Growing Market for Low-Cost Digital Matrix Touchscreens," p. 1174 (2 pages), Jan. 6, 1999.
CADgraphics, "The CADgraphics User's Guide," 198 pages, 2003.
Cardio Manual, available at http://www.secant.ca/En/Documentation/Cardio2é-Manual.pdf, Cardio Home Automation Inc., 55 pages, printed Sep. 28, 2004.
Cardio, by Secant; http://www.hometoys.com/htinews/apr98/reviews/cardio.htm, "HTI News Review," Feb. 1998, 5 pages, printed Sep. 14, 2004.
Carrier Comfort Network CCN Web, "Web Browser User Interface to the Carrier Comfort Network," 2 pages, 2002.

(56) References Cited

OTHER PUBLICATIONS

Carrier Comfort Network CCN Web, Overview and Configuration Manual, 134 pages, Apr. 2006.
Carrier Comfort Network CCN Web, Product Data, 2 pages, Apr. 2006.
Carrier ComfortChoice, "Verifiable Demand Response, Two-Way Communicating Thermostat," 4 pages, 2007.
Carrier ComfortChoice, Web Interface, User Guide, pp. 1-6, Jan. 2002.
Carrier Microelectronic Programmable Thermostat Owner's Manual, pp. 1-24, May 1994.
Carrier TSTATCCRF01 Programmable Digital Thermostat, pp. 1-21, prior to Apr. 21, 2005.
Carrier, "i-Vu Powerful and Intuitive Front End for Building Control," 2 pages, Aug. 2005.
Carrier, "i-Vu Web-Based Integrated Control System," 3 pages, 2005.
Carrier, "Programmable Dual Fuel Thermostats," Installation, Start-Up & Operating Instructions, pp. 1-12, Oct. 1998.
Carrier, "Programmable Thermostats," Installation, Start-Up & Operating Instructions, pp. 1-16, Sep. 1998.
Carrier, "Standard Programmable Thermostat," Homeowner's Manual, pp. 1-8 pages, 1998.
Carrier, "Thermidistat Control," Installation, Start-Up, and Operating Instructions, pp. 1-12, Aug. 1999.
Carrier, Demo Screen Shots, 15 pages, prior to Aug. 27, 2007.
Carrier, i-Vu CCN 4.0, Owner's Guide, 20 pages, Jul. 2007.
Carrier, i-Vu CCN, 7 pages, 2007.
Castle, "Ready for Thermostat Wars?" http://greentechadvocates.com/2012/03/08/ready-for-thermostat-wars/ 3 pages, May 8, 2012.
Central and Southwest Communications, Customer Choice and Control Thermostat Touchpad, User Guide, 18 pages, May 1996.
Circon, "i-Browse Web-Based Monitoring and Control for Facility Management," 2 pages, prior to Aug. 27, 2007.
Climatouch, User Manual, Climatouch CT03TSB Thermostat, Climatouch CT03TSHB Thermostat with Humidity Control, Outdoor UHF Temperature Transmitter 217S31, 19 pages, Printed Sep. 15, 2004.
Comverge, Inc., "Adaptive Algorithms Yield Greater Performance," 2 pages, prior to Jun. 28, 2007.
Comverge, Inc., "SuperStat Thermostat Family," 2 pages, prior to Jun. 28, 2007.
U.S. Appl. No. 60/368,963, 202 pages, filed Mar. 28, 2002.
U.S. Appl. No. 60/383,027, 26 pages, filed May 24, 2002.
CorAccess, "Companion 6," User Guide, pp. 1-20, Jun. 17, 2002.
Danfoss RT51/51RF & RT52/52RF User Instructions, 2 pages, Jun. 2004.
DeKoven et al., "Designing Collaboration in Consumer Products," 2 pages, 2001.
DeKoven et al., "Measuring Task Models in Designing Intelligent Products," 2 pages, Jan. 13-16, 2002.
Ditosti, "Alarm.com Cloud Service May Prove to be Smartest Thermostat to Date," http://www.alarm.com/about/media/MediaGeneric.aspx?cmid=41, 2 pages, Feb. 29, 2012.
Domotique Secant Home Automation—Web Page, available at http://www.secant.ca/En/Company/Default.asp, 1 page, printed Sep. 28, 2004.
Echelon, "Energy Control Solutions with the i.Lon SmartServer," 4 pages, 2007.
Echelon, "i.Lon 100e3 Internet Server Models 72101R-300, 72101R-308, 72102R-300, 72103-R300 . . . " 5 pages, copyright 2002-2007.
Echelon, "i.Lon 100e3 Internet Server New Features," 15 pages, Sep. 2006.
Echelon, "i.Lon SmartServer," 5 pages, 2007.
Edina Realty, "Warranties," 3 pages, prior to Dec. 9, 2014.
Facility Robotics Solutions Direct, "Who We Are and What We Do," 2 pages, Sep. 19, 1997.
Facility Robotics Solutions, "Where Can I go to Find Everything I Need to Put Together LonWorks-Based Automation Systems?," 5 pages, prior to Jun. 28, 2007.

Federal Energy Regulatory Commission, "Assessment of Demand Response & Advanced Metering, Staff Report," 228 pages, Aug. 2006.
File History for Reexam Control No. 95/002,041, U.S. Pat. No. 7,634,504, Reexamination filed Jul. 18, 2012. (This Reference will be Uploaded in 4 parts).
Filtrete, "Wireless Setup Guide: Thermostat for Windows," EnergyHub Inc., 7 pages, downloaded Feb. 13, 2012.
Final Office Action dated May 15, 2013 in U.S. Appl. No. 13/434,806.
Firex Smoke Alarm, Ionization Models AD, ADC Photoelectric Model Pad, 4 pages, prior to Apr. 21, 2005.
Freudenthal et al., "Communicating extensive smart home functionality to users of all ages: the design of a mixed-initiative multimodal thermostat-interface," pp. 34-39, Mar. 12-13, 2001.
Gentex Corporation, HD135, 135° Fixed Temperature Heat Detector AC Pwered, 120V, 60Hz With Battery Backup, Installation Instructions—Owner's Information, pp. 1-5, Jun. 1, 1998.
Gentex Corporation, 9000 Series, Photoelectric Type Single Station/Multi-Station Smoke Alarms AC Powered With Battery Backup, Installation Instructions—Owner's Information, pp. 9-1 to 9-6, Jan. 1, 1993.
Gupta, "A Persuasive GPS-Controlled Thermostat System," Massachusetts Institute of Technology, 89 pages, Sep. 2008.
Honeywell Brivis Deluxe Programmable Thermostat, pp. 1-20, 2002.
Honeywell Brivis T8602C Chronotherm IV Deluxe Programmable Thermostats, Installation Instructions, pp. 1-12, 2002.
Honeywell Cannon Technologies Alliance, Programmable Load Management Thermostat Weekday/Weekend (5-day/Saturday/Sunday) T7512A,B, User's Guide, 32 pages, 2002.
Honeywell Cannon Technologies Alliance, T7512A,B Programmable Load Management Thermostat, Installation Instructions, 8 pages, 2002.
Honeywell CT8602C Professional Fuel Saver Thermostat, pp. 1-6, 1995.
Honeywell Electronic Programmable Thermostat, Owner's Guide, pp. 1-20, 2003.
Honeywell Electronic Programmable Thermostats, Installation Instructions, pp. 1-8, 2003.
Honeywell News Release, "Honeywell's New Sysnet Facilities Integration System for Boiler Plant and Combustion Safety Processes," 4 pages, Dec. 15, 1995.
Honeywell T8002 Programmable Thermostat, Installation Instructions, pp. 1-8, 2002.
Honeywell T8602A,B,C,D and TS8602A,C Chronotherm III Fuel Saver Thermostats, Installation Instructions, pp. 1-12, 1995.
Honeywell T8602D Chronotherm IV Deluxe Programmable Thermostats, Installation Instructions, pp. 1-12, 2002.
Honeywell TH8000 Series Programmable Thermostats, Owner's Guide, pp. 1-44, 2004.
Honeywell, "Excel Building Supervisor-Integrated R7044 and FS90 Ver. 2.0," Operator Manual, 70 pages, Apr. 1995.
Honeywell, "TotalHome Energy Management System 2000," 12 pages, 1995.
Honeywell, "Introduction of the S7350A Honeywell WebPAD Information Appliance," Home and Building Control Bulletin, 2 pages, Aug. 29, 2000; Picture of WebPad Device with touch screen, 1 Page; and screen shots of WebPad Device, 4 pages.
Honeywell, "Programmable Thermostat by Honeywell, Weekday/Weekend (5-day/2-day) Programmable Heat and/or Cool Low Voltage (20 to 30 Vat) Thermostat and Mounting Plate Model CT 2400," 14 pages, 1993.
Honeywell, "VisionPro 8000 Touchscreen Programmable Thermostat," Product Data, 40 pages, Revised Mar. 2011.
Honeywell, "W7006A Home Controller Gateway User Guide," 31 pages, Jul. 2001.
Honeywell, CM907 Programmable Thermostat, Product Specification Sheet, 7 pages, Sep. 2006.
Honeywell, Excel 15B W7760B Building Manager Release 2.02.00, Installation Instructions, 28 pages, Dec. 2004.
Honeywell, MagicStat® CT3200 Programmable Thermostat, Installation and Programming Instructions, pp. 1-24, 2001.

(56) References Cited

OTHER PUBLICATIONS

Honeywell, Programmable Load Controller Weekday/Weekend (5-day/Saturday/Sunday) Programmable Heat and/or Cool Conventional and Heat Pump T7512A,B,C, User's Guide, 32 pages, 1996.
Honeywell, R4525A Load Relay Module, Installation Instructions, 4 pages, 1995.
Honeywell, T7512A,B,C,D Programmable Load Controller, Installation Instructions, 8 pages, 1997.
Honeywell, T7525/T7526 Thermostat Touchpad, User Guide, 12 pages, 1995.
Honeywell, The RapidZone Solution, Excel 5000 Open System, Application Guide, 52 pages, Jan. 2004.
Honeywell, TotalHome Energy Management System 2000, Specification Data, 2 pages, 1996.
Honeywell, W8525A,B,C,D Control Module, Installation Instructions, 8 pages, 1995.
Honeywell,"Electromechanical Thermostats," 2 pages, 2002.
http://en.wikipedia.org/wild/AOSS. "AOSS," Wikipedia, Wikimedia Foundation Inc., 2 pages, printed Feb. 13, 2012.
http://en.wikipedia.org/wiki/SecureEasySetup, "SecureEasySetup," Wikipedia, Wikimedia Foundation Inc., 1 page, printed Feb. 13, 2012.
http://en.wikipedia.org/wiki/Wi-Fi_Protected_Setup, "Wi-Fi Protected Setup," Wikipedia, Wikimedia Foundation Inc., 4 pages, printed Feb. 13, 2012.
http://en.wikipedia.org/wiki/Windows_Connect_Now, "Windows Rally," Wikipedia, Wikimedia Foundation Inc., 4 pages, printed Feb. 13, 2012.
http://pueblo.lbl.gov/~olken . . . , "Remote Building Monitoring and Operations Home Page," 5 pages, prior to Aug. 27, 2007.
http://www.alarm.com/about/company_info.aspx, "Company Information," 1 page, printed Apr. 24, 2012.
http://www.alarm.com/overview/empower_cozy_aspx, "Keep it Cozy," 1 page, printed Apr. 24, 2012.
http://www.cc.gatech.edu/computing/classes/cs6751_94_fall/groupc/climate-2/nodel.html, "Contents," 53 pages, printed Sep. 20, 2004.
http://www.comfortchoice.carrier.com/details_printable, "Carrier How Does it Work?", 1 page, printed May 22, 2007.
http://www.comfortchoice.carrier.com/details_printable, "Carrier System Elements and Hardware," 1 page, printed May 22, 2007.
http://www.comfortchoice.carrier.com/details_printable, "EMi—Carrier's Internet Communicating Programmable Thermostat," 1 page, printed May 22, 2007.
http://www.commercial.carrier.com/commercial/hvac/productdescription . . . , "Carrier: i-Vu CCN," 1 page, printed Mar. 11, 2008.
http://www.commercial.carrier.com/commercial/hvac/productdescription . . . , "Carrier: 33CSCCNWEB-01 CCN Web Internet Connection to the Carrier Comfort Network," 1 page, printed Mar. 11, 2008.
http://www.comverge.com/printer.cfm, "Maingate Home," 1 page, printed May 22, 2007.
http://www.docs.hvacpartners.com/idc/groups/public/documents/techlit/gs-controls-ivuccn.rtf, "Products," 5 pages, printed Jul. 3, 2007.
http://www.energyhub.com/news/earth-networks-and-energyhub-debut-e5-home-energy-d . . . "Earth Networks and EnergyHub Debut e5 Home Energy Demand Response Program Based on Neighborhood-LEvel, Real-Time Weather," EnergyHub, 2 pages, Jan. 24, 2012.
http://www.lightstat.com/products/istat.asp, Lightstat Incorporated, "Internet Programmable Communicating Thermostats," 1 page, printed Mar. 13, 2007.
http://www.lightstat.com/products/utility.asp, "Lightstat Products for Utility Demand Response and Load Curtailment Programs," 2 pages, printed May 22, 2007.
http://www.ritetemp.info/rtMenu_13.html, Rite Temp 8082, 6 pages, printed Jun. 20, 2003.
http://www.smarthome.com/3020t.html, "Aprilaire Communicating Thermostat," 4 pages, printed May 16, 2007.
http://www.sync-blog.com/sync/2012/01/how-to-control-your-thermostat-from-anywhere- . . . , "How to control your thermostat from anywhere without breaking the bank," Sync(TM) Blog, 2 pages, printed Apr. 27, 2012.
http://www.thermostatsales.com, Robertshaw, "9610 Digital Programmable Thermostat," 3 pages, printed Jun. 17, 2004.
http://www.thermostatsales.com, Robertshaw, "9700 Deluxe Programmable Thermostat" 3 pages, printed Jun. 17, 2004.
http://www.thermostatsales.com, Robertshaw, "9710 Deluxe Programmable Thermostat," 3 pages, printed Jun. 17, 2004.
http://www.thermostatsales.com, Robertshaw, "9720 Deluxe Programmable Thermostat," 3 pages, printed Jun. 17, 2004.
http://www.wi-fi.org/knowledge-center/faqSecurity, "WiFi Protected Setup," 3 pages, downloaded Feb. 13, 2012.
http://www2.sims.berkeley.edu/courses/is213/s06/projects/lightson;final.html, "Lights on a Wireless Lighting Control System," 11 pages, printed Mar. 22, 2007.
Hunter, "44200/44250," Owner's Manual, 32 pages, prior to Jul. 7, 2004.
Hunter, "44300/44350," Owner's Manual, 35 pages, prior to Jul. 7, 2004.
Hunter, "Auto Saver 550", Owner's Manual Model 44550, 44 pages, prior to Jul. 7, 2004.
I.Lon 100e3 Internet Server, 1 page, prior to Aug. 27, 2007.
I.Lon, SmartServer, 2 pages, prior to Aug. 27, 2007.
Install Guide for Ritetemp Thermostat 8082, 6 pages, 2002.
Invensys™, "9700i 9701i 9715i 9720i Deluxe Programmable Thermostats," User's Manual, 21 pages, prior to Jul. 7, 2004.
I-stat, Demo Screen Shots, 9 pages, printed Mar. 13, 2007.
I-Stat, Installation and Operation Manual, for Low Voltage (24VAC) Systems Only, 14 pages, Nov. 2002.
I-stat, The Internet Programmable Thermostat, 2 pages, prior to Aug. 27, 2007.
Jacobson, "Cloud Services May Yield Smartest Thermostats on the planet," http://www.alarm.com/about/media/MediaGeneric.aspx?cmid=39, 2 pages, printed Apr. 24, 2012.
Jacobson, "Xfinity Expands Home Automation with Ecofactor Cloud-Based Enabled Thermostats," http://www.cepro.com/article/print/xfinity_expands_home_automation_with_ecofactor_cl . . . , 4 pages, printed Mar. 5, 2012.
Johnson Controls, Network Integration Engine (NIE) 3 pages, Nov. 9, 2007.
Johnson Controls, Network Integration Engine (NIE), Product Bulletin, pp. 1-11, Jan. 30, 2008.
LaMonica, "Smart thermostat links to cloud for energy savings," 3 pages, printed Apr. 24, 2012. http://news.cnet.com/8031-11128_3-20086261-54/smart-thermost-links-to-cloud-for-ene. . . .
Lennox, "Network Control Panel (NCP)," User's Manual, 18 pages, Nov. 1999.
Lennox, "L connection Network," pp. 1-5, Feb. 2000.
Lennox, "Network Control Panel," 75 pages, Sep. 2002.
Lennox, "Network Thermostat Controller NTC1-1 KIT," pp. 1-20, Oct. 2006.
Lennox, "User's Manual NCP Software," pp. 1-14, Jul. 2006.
LightStat, "Model RTPstat Thermostat," 2 pages, prior to Jun. 28, 2007.
Lightstat, "Virtual Gateway," 2 pages, prior to Jun. 28, 2007.
Lux ELV1 Programmable Line Voltage Thermostat, Installation Instructions, 3 pages, prior to Jul. 7, 2004.
Lux TX500 Series Smart Temp Electronic Thermostat, 3 pages, prior to Jul. 7, 2004.
Lux TX9000 Installation, 3 pages, prior to Apr. 21, 2005.
Lux, "511 Series Smart Temp Electronic Thermostat," Owner's Manual, 3 pages, prior to Jul. 7, 2004.
Lux, "600 Series Smart Temp Electronic Thermostat," Owner's Manual, 3 pages, prior to Jul. 7, 2004.
Lux, "602 Series Multi-Stage Programmable Thermostat," Owner's Manual, 2 pages, prior to Jul. 7, 2004.
Lux, "605/2110 Series Programmable Heat Pump Thermostat," Owner's Manual, 3 pages, prior to Jul. 7, 2004.
Lux, "700/9000 Series Smart Temp Electronic Thermostat," Owner's Manual, 3 pages, prior to Jul. 7, 2004.

(56) References Cited

OTHER PUBLICATIONS

Lux, "PSPH521 Series Programmable Heat Pump Thermostat," Owner's Manual, 3 pages, prior to Jul. 7, 2004.
Lux, "TX1500 Series Smart Temp Electronic Thermostat," Owner's Manual, 6 pages, prior to Jul. 7, 2004.
LuxPro, PSD122E Everything 'Stat, 2 pages, prior to Jun. 28, 2007.
LuxPro, PSP722E Everything 'Stat, 2 pages, prior to Jun. 28, 2007.
Magic Stat, Electronic, Programmable Thermostat. Owner's Manual, 24 pages, 1986.
Matty, "Advanced Energy Management for Home Use," IEEE Transactions on Consumer Electronics, vol. 35, No. 3, pp. 584-588, 1989.
METASYS, "HVAC PRO for Windows User's Manual," 308 pages, 1998.
Mounting Template for Ritetemp Thermostat 8082, 1 page, 2002.
Mozer, "The Neural Network House: An Environment that Adapts to its Inhabitants," Department of Computer Science and Institute of Cognitive Science University of Colorado, 5 pages, 1998.
Narang, "WEBARC: Control and Monitoring of Building Systems Over the Web," 53 pages, May 1999.
Non-Final Office Action dated Aug. 30, 2012 in U.S. Appl. No. 13/434,806.
Olken et al., "Object Lessons Learned from a Distributed System for Remote Building Monitoring and Operation," ACM SIGPLAN Notices, vol. 33, No. 10, pp. 284-295, Oct. 1998.
Operation Manual for Ritetemp Touch Screen Thermostat 8082, 8 pages, 2002.
Programmable Thermostat by Honeywell. Magic Stat. Programming and Installation Instructions. 14 pages. 1993.
Proliphix, "Web Enabled IP Thermostats, Intelligent HVAC Control," Proliphix Inc., 2 pages, on or before Aug. 28, 2004.
Proliphix, "Web Enabled IP Thermostats, Ultimate in Energy Efficiency!," Proliphix Inc., 2 pages, on or before Aug. 28, 2004.
Proliphix, Inc., "Proliphix IP Devices: HTTP API," 28 pages, Jan. 23, 2006.
Proliphix, Inc., Remote Management User Guide, 12 pages, prior to Aug. 27, 2007.
PSD122E, Installation and Operating Instructions, 6 pages, prior to Jun. 28, 2007.
PSP722E, Installation and Operating Instructions, 8 pages, prior to Jun. 28, 2007.
Quick Start Guide for Ritetemp Thermostat 8082, 1 page, 2002.
Radio Thermostat, "WiFi Setup Guide for iPhone and iPad," Radio Thermostat Company of America, 6 pages, downloaded Feb. 13, 2012.
Radio Thermostat, "WiFi Setup Guide for Windows XP," Radio Thermostat Company of America, 5 pages, downloaded Feb. 13, 2012.
Raji, "Smart Networks for Control," IEEE Spectrum, pp. 49-55, 1994.
Ritetemp Operation 8029, 3 pages, Jun. 19, 2002.
Ritetemp Operation 8050, 5 pages, Jun. 26, 2002.
Ritetemp Operation 8085, pp. 1-6, prior to Apr. 21, 2005.
Sealed Unit Parts Co., Inc., Supco & CTC Thermostats . . . loaded with features, designed for value!, 6 pages, prior to Apr. 21, 2005.
So et al., "Building Automation on the Information Superhighway," ASHRAE (American Society of Heating Refrigerating, and Air Conditioning) Transactions, vol. 104, Part 2, pp. 176-191, 1998.
So et al., "Building Automation Systems on the Internet," Facilities vol. 15, No. 5/6, pp. 125-133, May/Jun. 1997.
St. John, "Smart Grid's Latest Cloud: Honeywell Cloud-Connected Thermostats," http://www.greentechmedia.com/articles/read/smart-grids-latest-cloud-honeywells-cloud-c . . . , 7 pages, Nov. 3, 2011.
Talon, "Raptor Controller," 6 pages, Oct. 2003.
Talon, "Workstation Software," 4 pages, Nov. 2002.
Totaline Model P474-1035 Owner's Manual Programmable 5-2 Day Digital Thermostat, pp. 1-21, Apr. 2003.
Totaline Star CPE230RF, Commercial Programmable Thermostat Wireless Transmitter, Owner's Manual, pp. 1-16, Oct. 1998.
Totaline Star P/N P474-0130 Non-Programmable Digital Thermostat Owner's Manual, pp. 1-22, prior to Apr. 21, 2005.
Totaline, "1 for All Programmable Digital Thermostat," Owner's Manual P/N P374-1100FM, 23 pages, Nov. 1998.
Totaline, "1 for All Programmable Digital Thermostat," Owner's Manual P/N P474-1050, 21 pages, Nov. 1998.
Totaline, "1 for All Programmable Digital Thermostat," Owner's Manual P/N P374-1100, 24 pages, Apr. 2001.
Totaline, "Intellistat Combination Temperature and Humidity Control," Owner's Manual P/N P374-1600, 25 pages, Jun. 2001.
Totaline, "Programmable Thermostat Configurable for Advanced Heat Pump or Dual Fuel Operation," Owner's Manual P/N P374-1500, 24 pages, Jun. 1999.
Totaline, "Instructions P/N P474-1010", Manual, 2 pages, Dec. 1998.
Totaline, "Programmable Thermostat", Homeowner's Guide, 27 pages, Dec. 1998.
Totaline, "Wireless Programmable Digital Thermostat," Owner's Manual 474-1100RF, 21 pages, 2000.
Trane, "System Programming, Tracer Summit Version 14, BMTW-SVP01D-EN," 623 pages, 2002 (This reference will be uploaded in 3 parts).
Trouble Shooting Guide for Ritetemp Thermostat 8082, 1 page, 2002.
Visor Handheld User Guide, 280 pages, Copyright 1999-2000.
Warmly Yours, "Model TH111GFCI-P (120 VAC)," Manual, pp. 1-4, prior to Jul. 7, 2004.
White-Rodgers 1F80-224 Programmable Electronic Digital Thermostat, Installation and Operation Instructions, 8 pages, prior to Apr. 21, 2005.
White-Rodgers Comfort-Set III Thermostat, pp. 1-44, prior to Jul. 7, 2004.
White-Rodgers Installation Instructions for Heating & Air Conditioning IF78 Non-Programmable Thermostat, 6 pages, prior to Apr. 21, 2005.
White-Rodgers Installation Instructions for Heating & Air Conditioning IF78 5/2 Day Programmable Thermostat, 7 pages, prior to Jul. 7, 2004.
White-Rodgers, "Installation Instructions for Heating & Air Conditioning IF72 5/2 Day Programmable Heat Pump Thermostat," 8 pages, prior to Jul. 7, 2004.
White-Rodgers, "Comfort-Set 90 Series Thermostat," Manual, pp. 1-24, prior to Jul. 7, 2004.
White-Rodgers, 1F80-240 "(for Heating Only systems) Programmable Electronic Digital Thermostat," Installation and Operation Instructions, 8 pages, prior to Jul. 7, 2004.
White-Rodgers, 1F80-241 "Programmable Electronic Digital Thermostat," Installation and Operation Instructions, 6 pages, prior to Jul. 7, 2004.
White-Rodgers, 1F80-261 "Programmable Electronic Digital Thermostat," Installation and Operation Instructions, 8 pages, prior to Jul. 7, 2004.
White-Rodgers, 1F81-261 "Programmable Electronic Digital Multi-Stage Thermostat," Installation and Operation Instructions, 8 pages, prior to Jul. 7, 2004.
White-Rodgers, 1F82-261 "Programmable Electronic Digital Heat Pump Thermostat," Installation and Operation Instructions, 8 pages, prior to Jul. 7, 2004.
White-Rodgers, Comfort-Set 90 Series Premium, 4 pages, prior to Apr. 21, 2005.
www.icmcontrols.com, Simplecomfort, SC3000 Single Stage Heat/Single Stage Cool or Single Stage Heat Pump/Manual Changeover, 1 page, prior to Jul. 7, 2004.
www.icmcontrols.com, Simplecomfort, SC3001 Single Stage Heat/Single Stage Cool or Single Stage Heat Pump/Manual Changeover, 1 page, prior to Jul. 7, 2004.
www.icmcontrols.com, Simplecomfort, SC3006 Single Stage Heat/Single Stage Cool or Single Stage Heat Pump/Manual Changeover, 1 page, prior to Jul. 7, 2004.
www.icmcontrols.com, Simplecomfort, SC3201 2 Stage Heat Pump Manual Changeover, 1 page, prior to Jul. 7, 2004.

(56) References Cited

OTHER PUBLICATIONS www.icmcontrols.com, Simplecomfort, SC3801 2 Stage Heat/2 Stage Cool 2 Stage Heat Pump/Audio Changeover, 1 page, prior to Jul. 7, 2004.
www.nexiahome.com/products.productdetail.aspx?model=043156179510, Nexia, "Trane Remote Temperature Monitoring," 2 pages, printed Mar. 25, 2013.
Xytronix Research & Design, Inc., "X-300 User's Manual, Revision 1.2" 89 pages, Jul. 30, 2009.

* cited by examiner

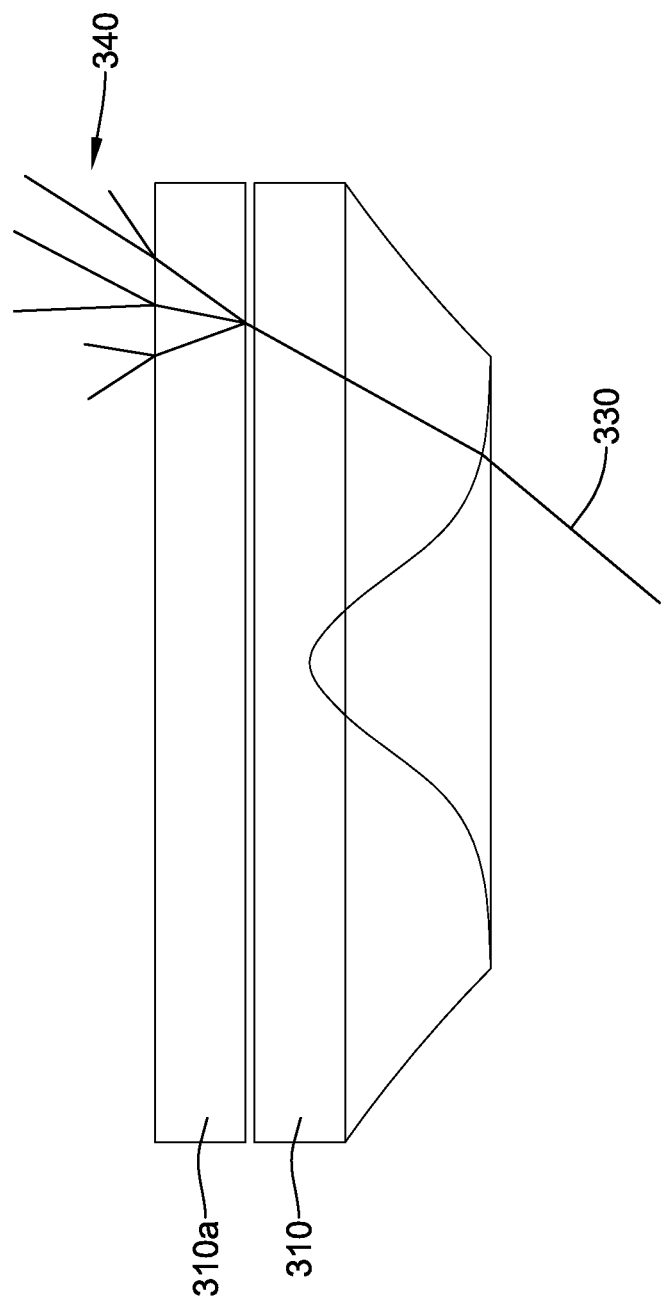

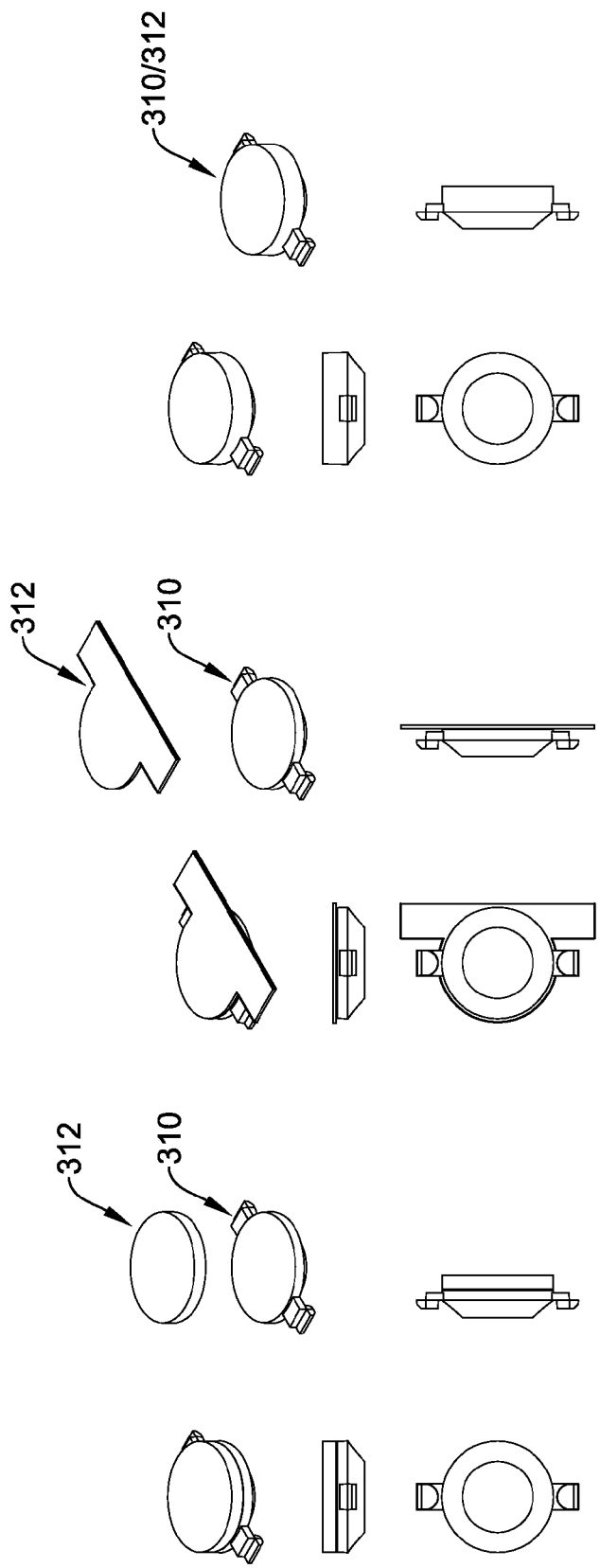

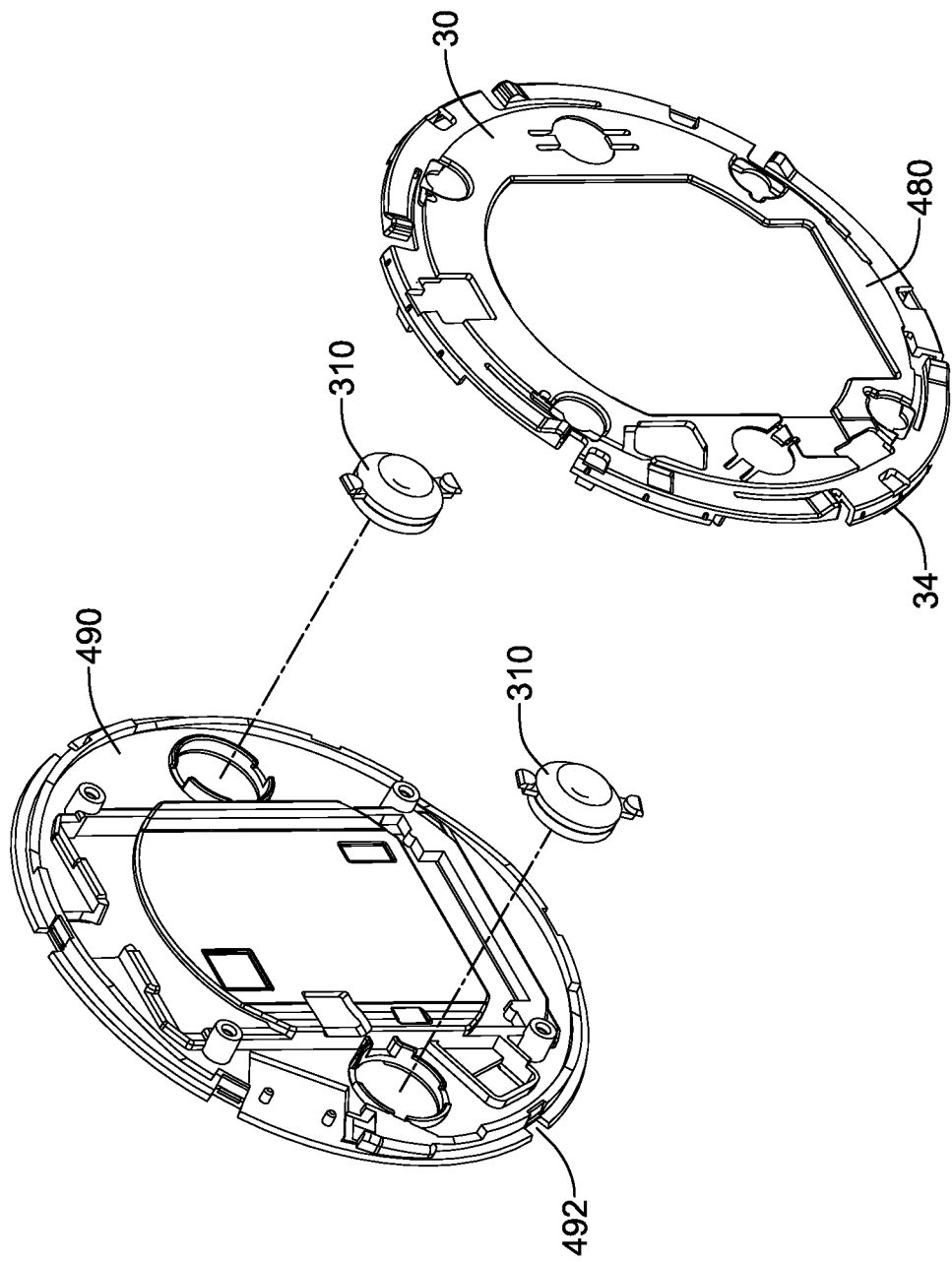

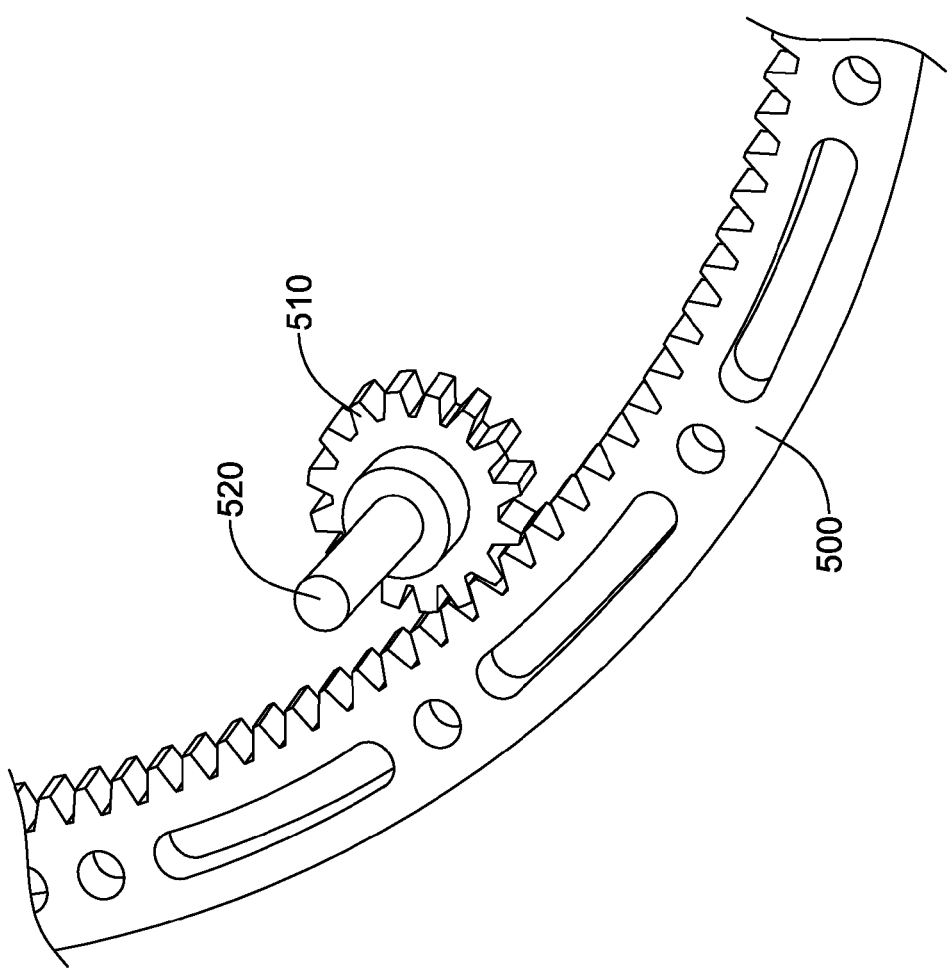

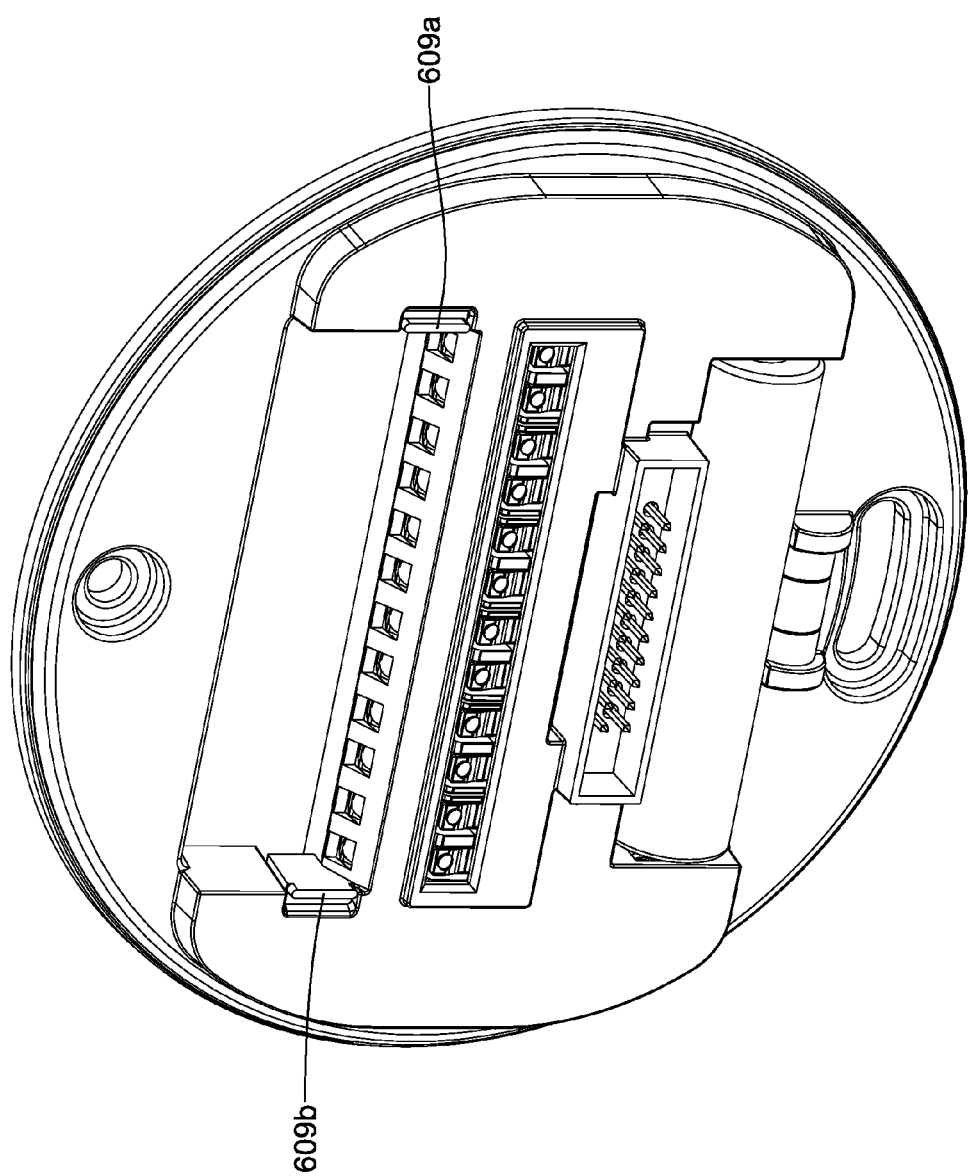

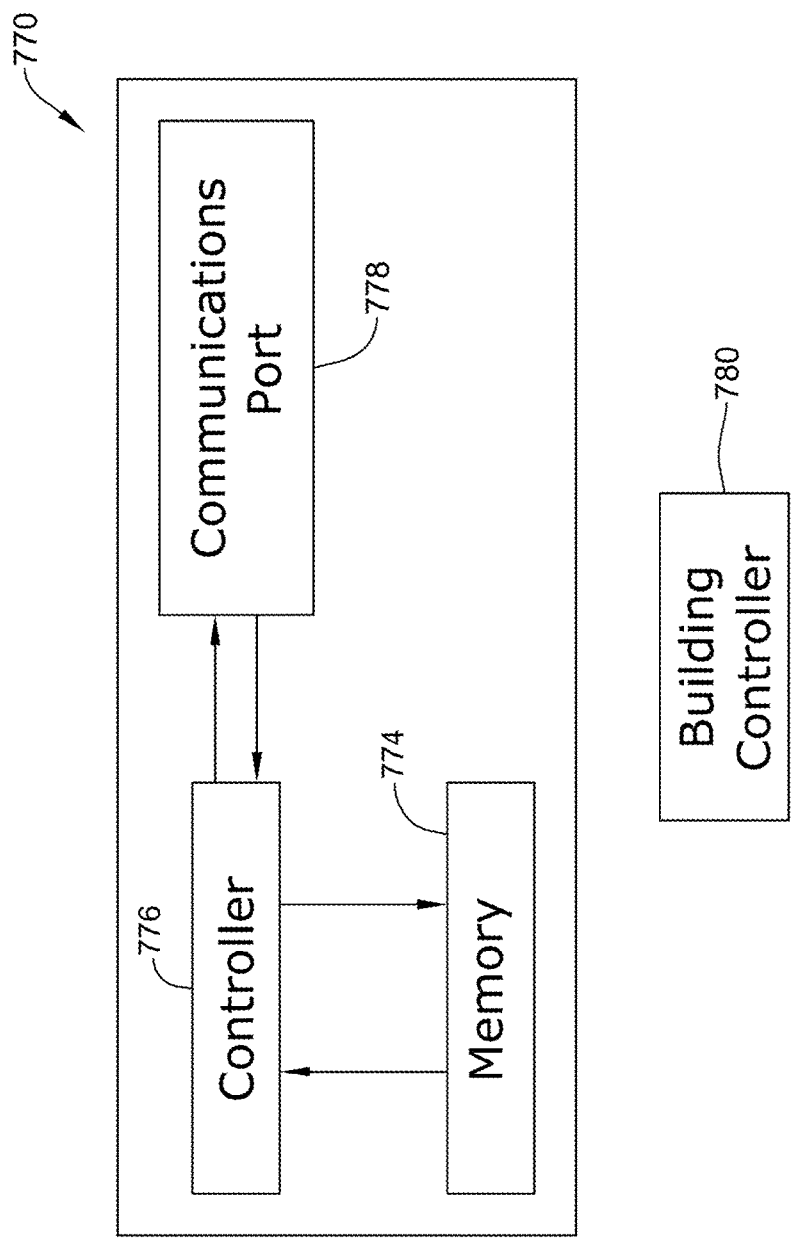

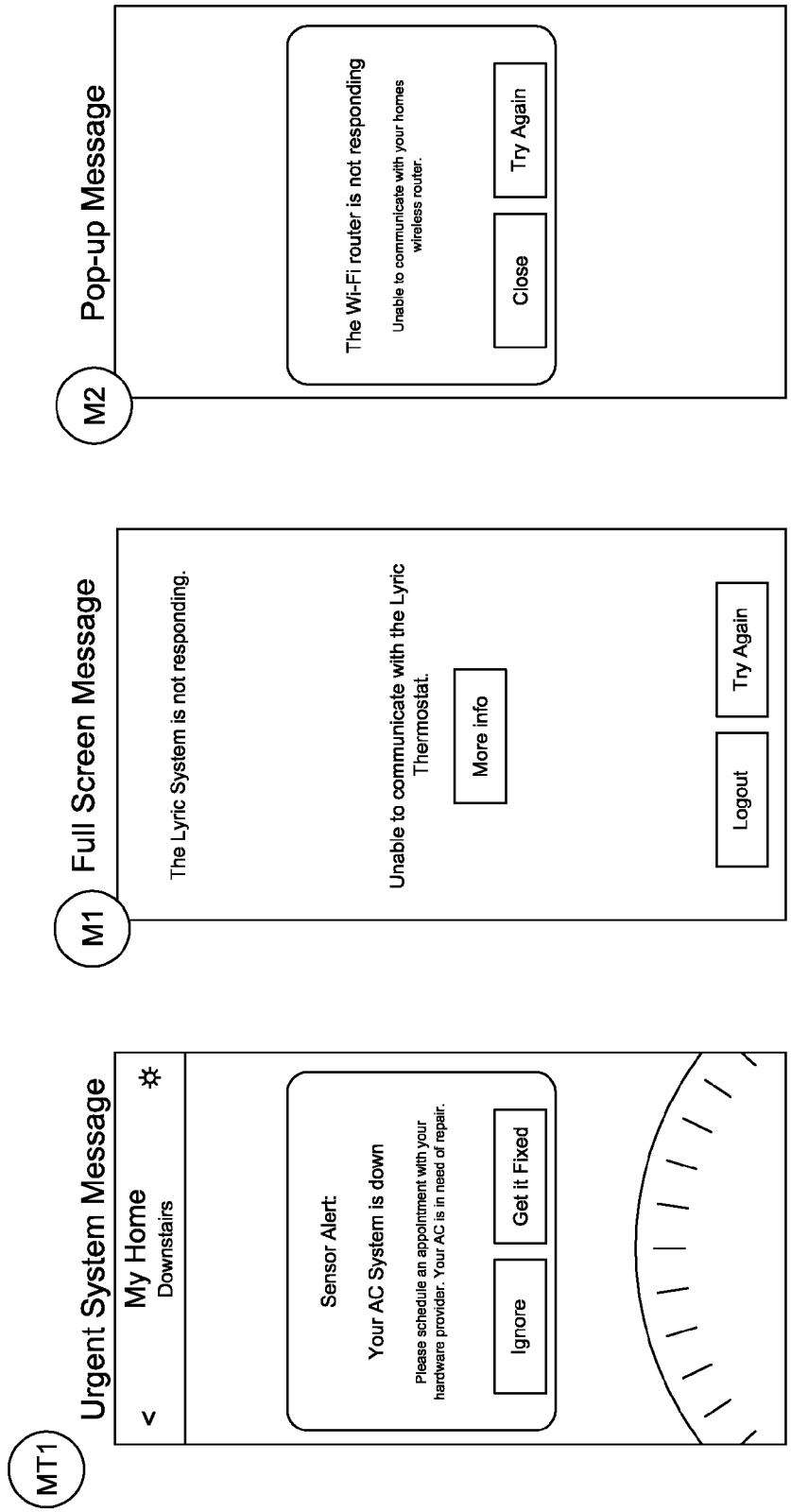

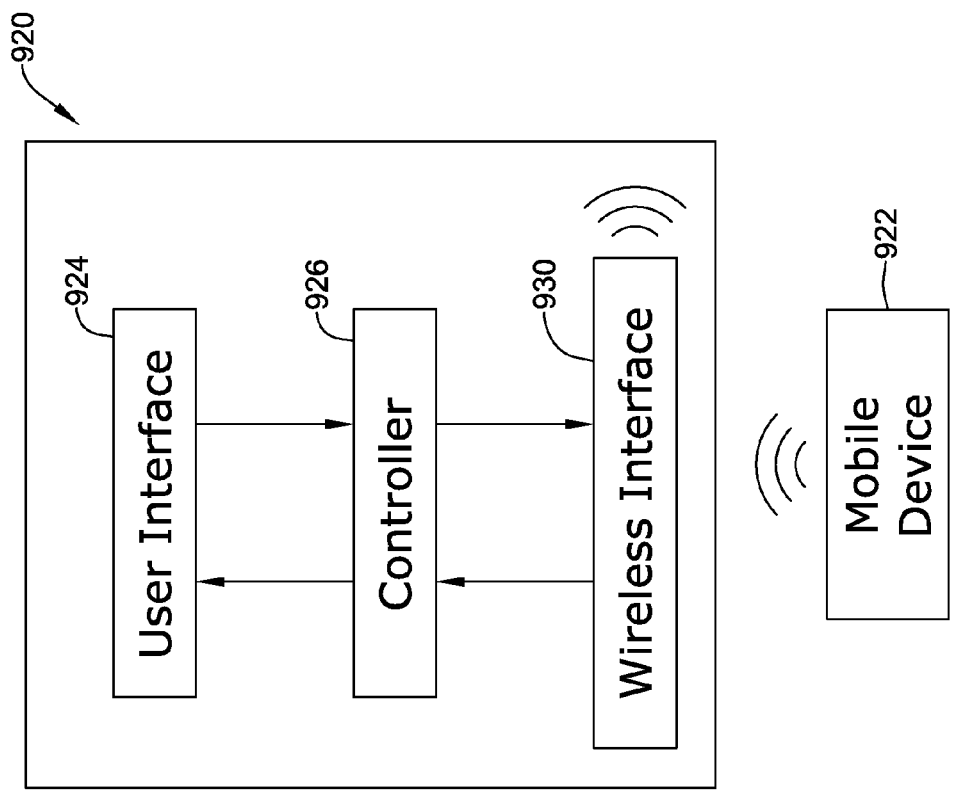

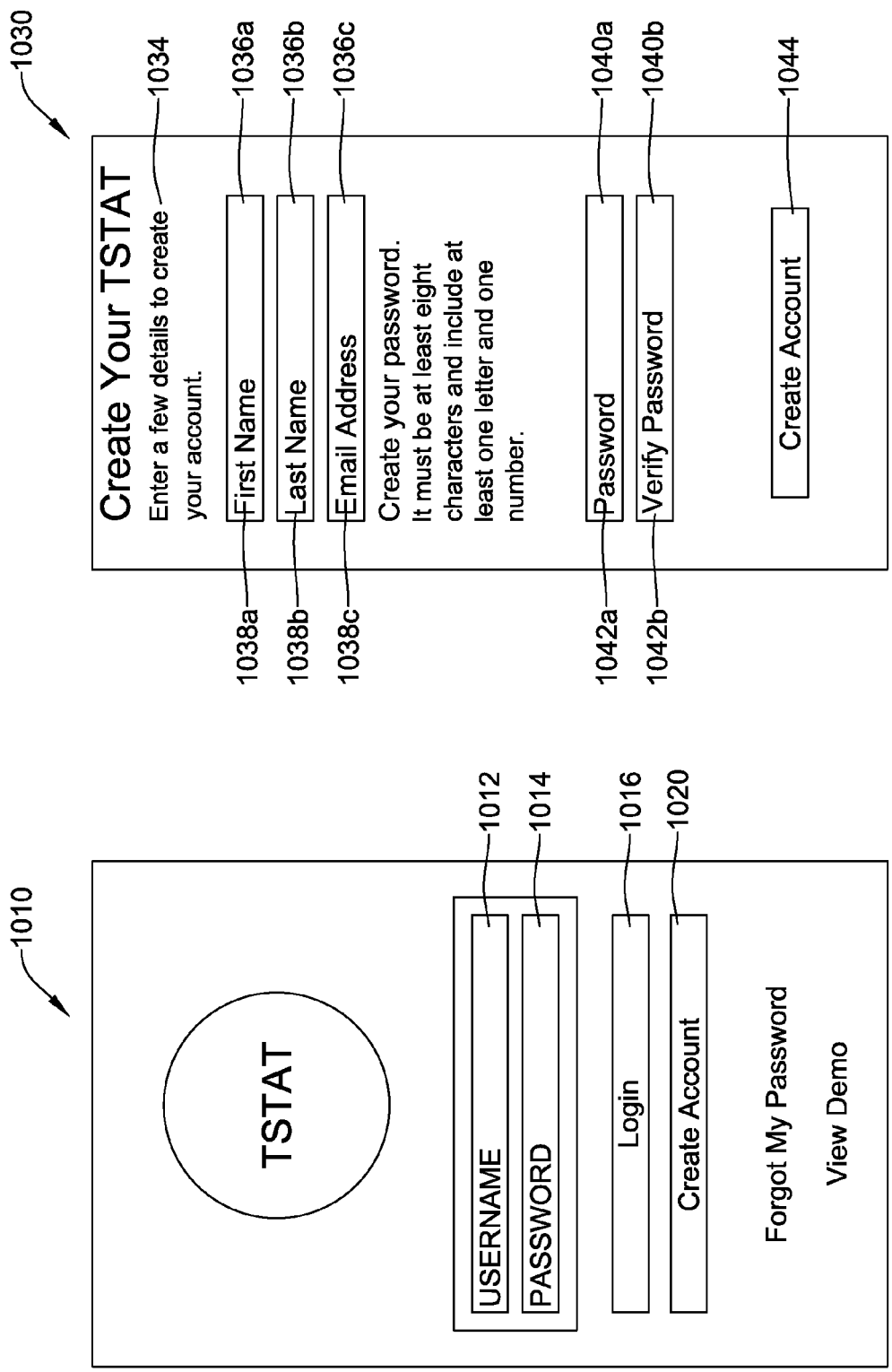

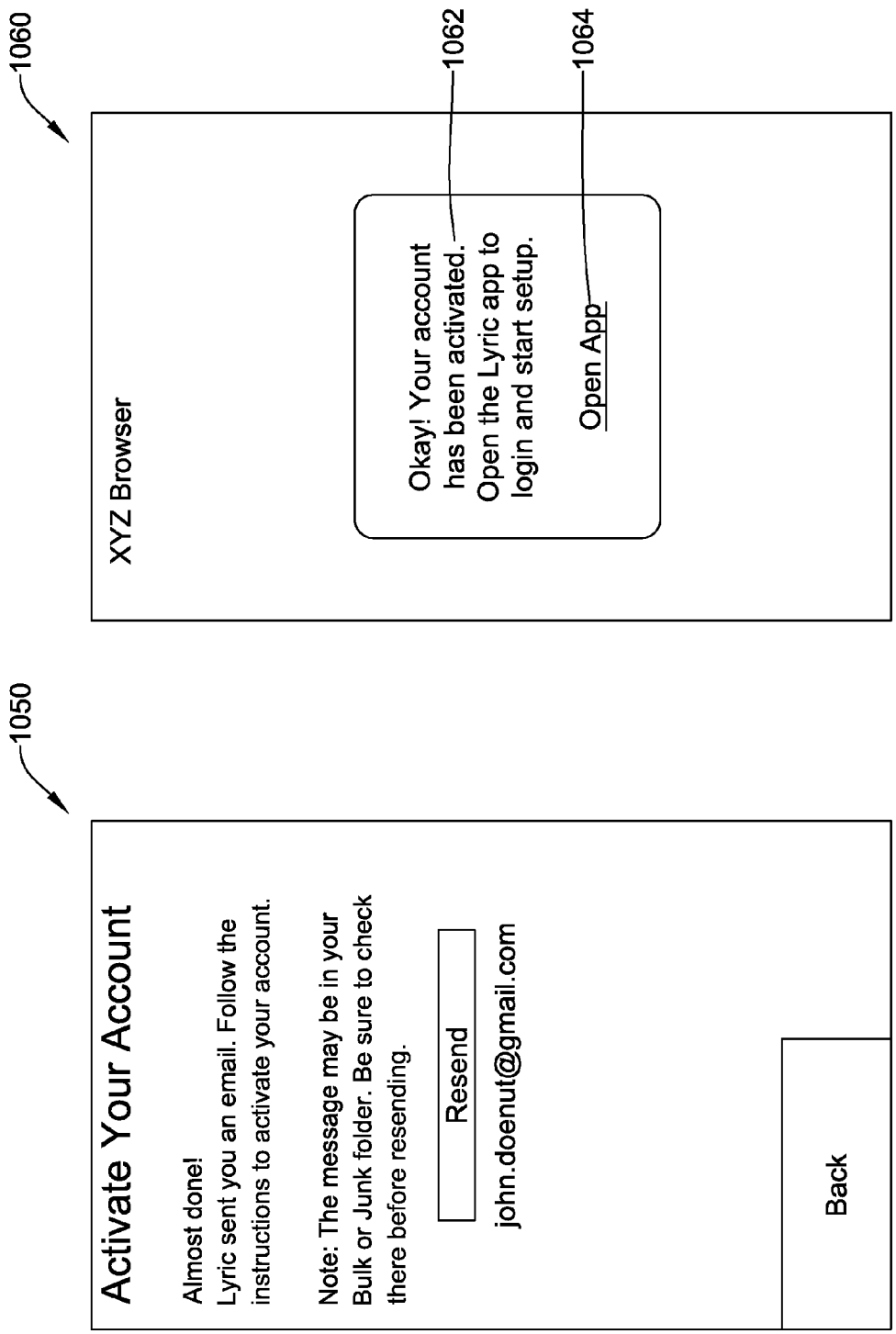

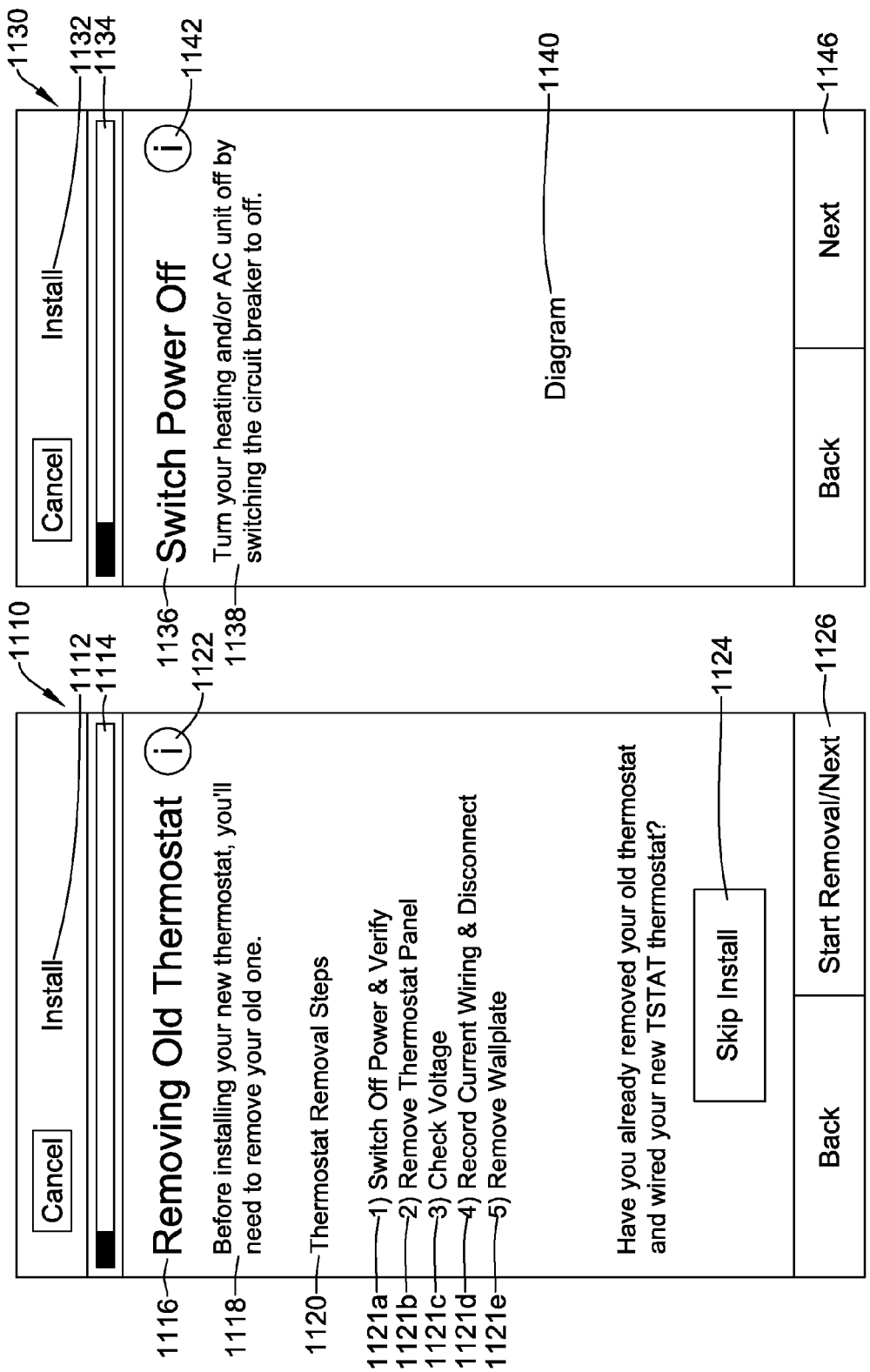

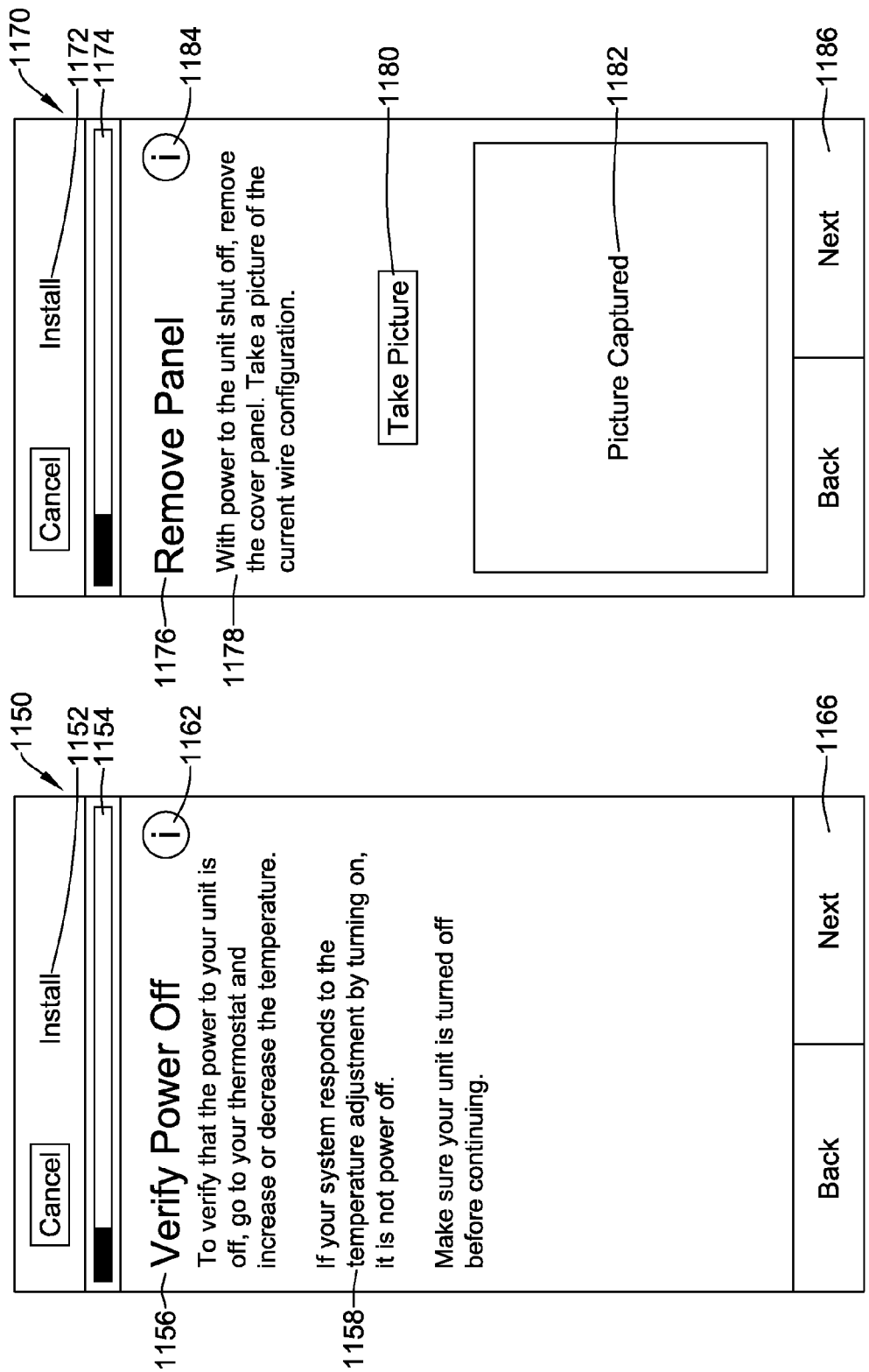

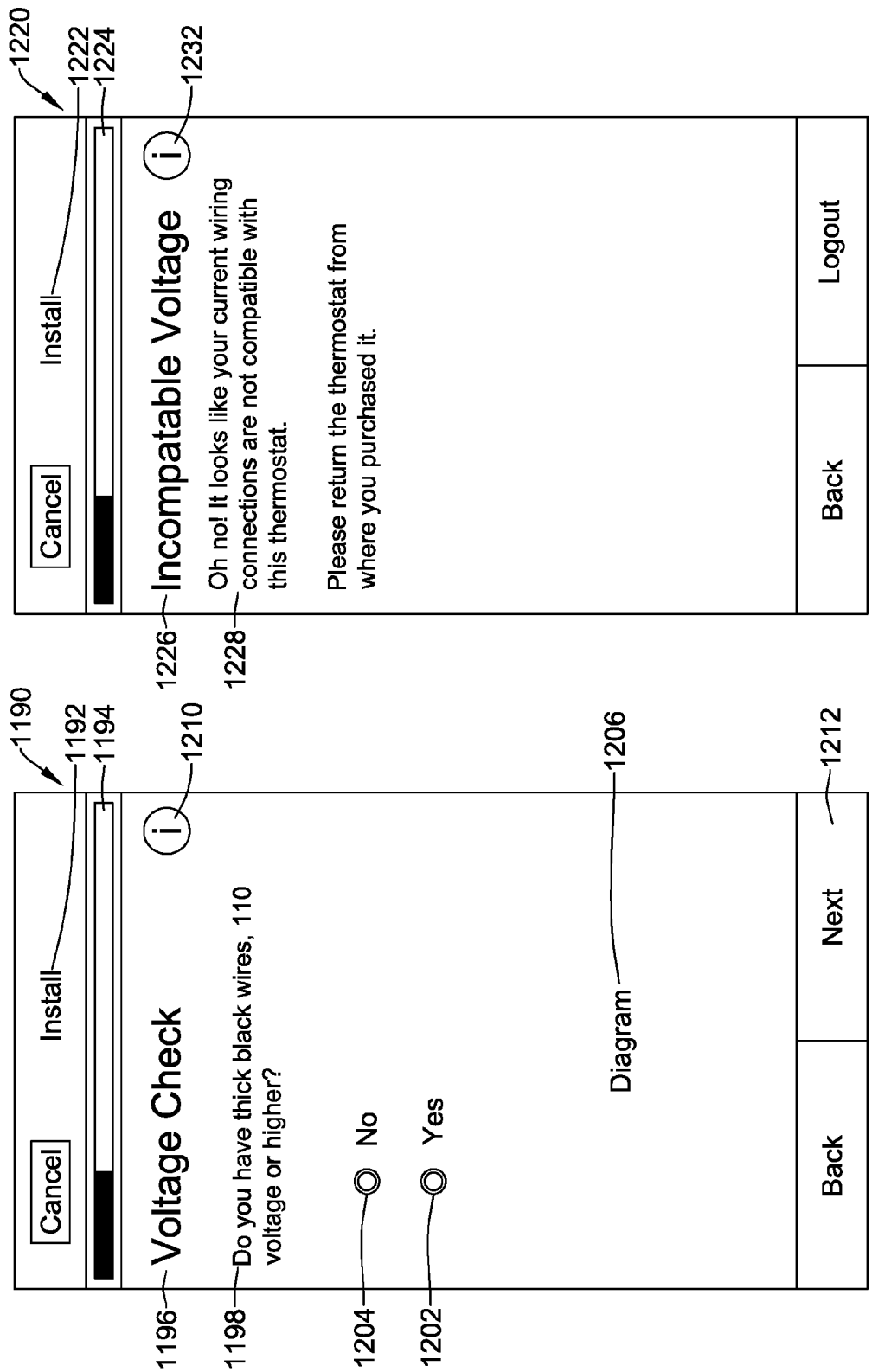

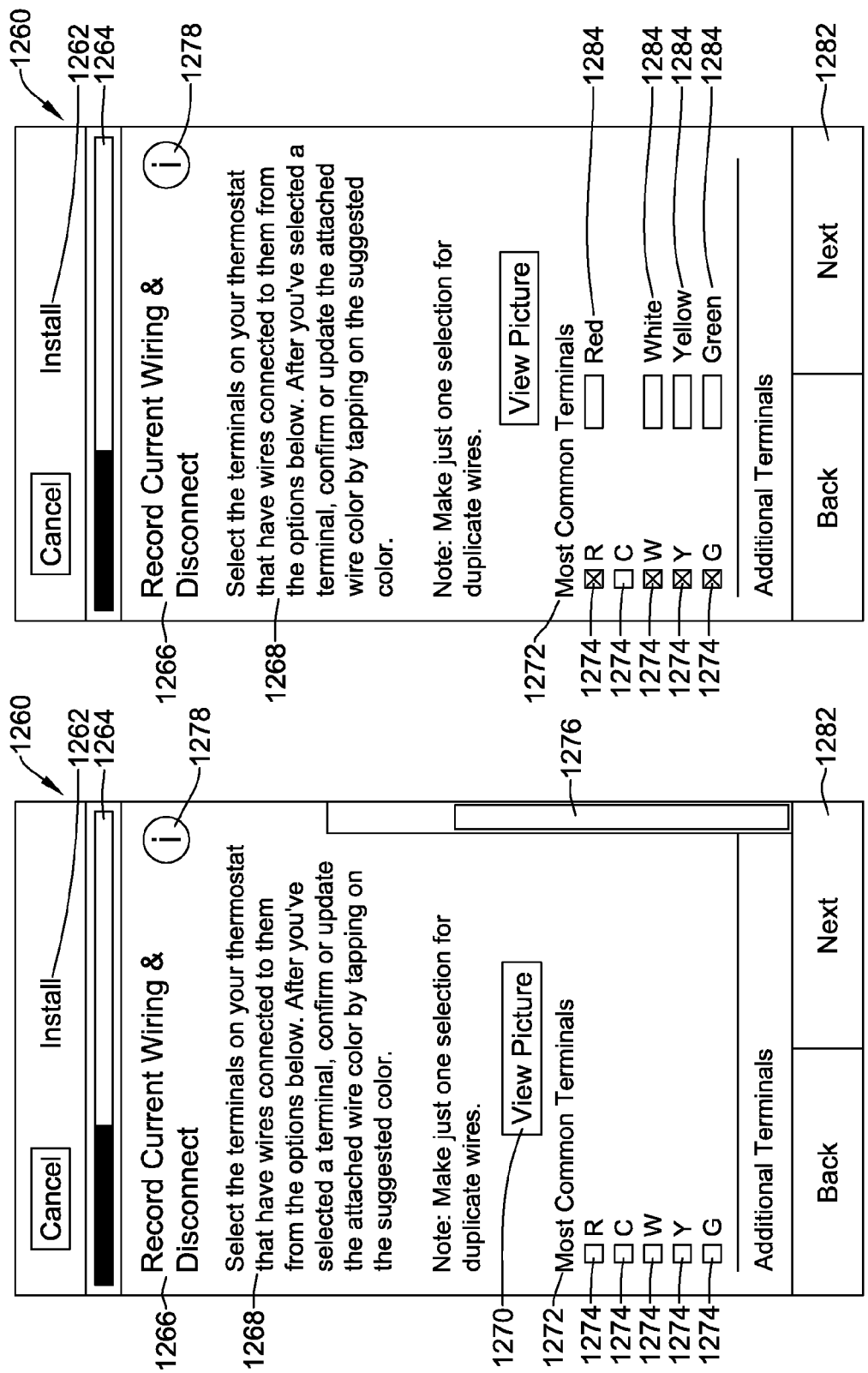

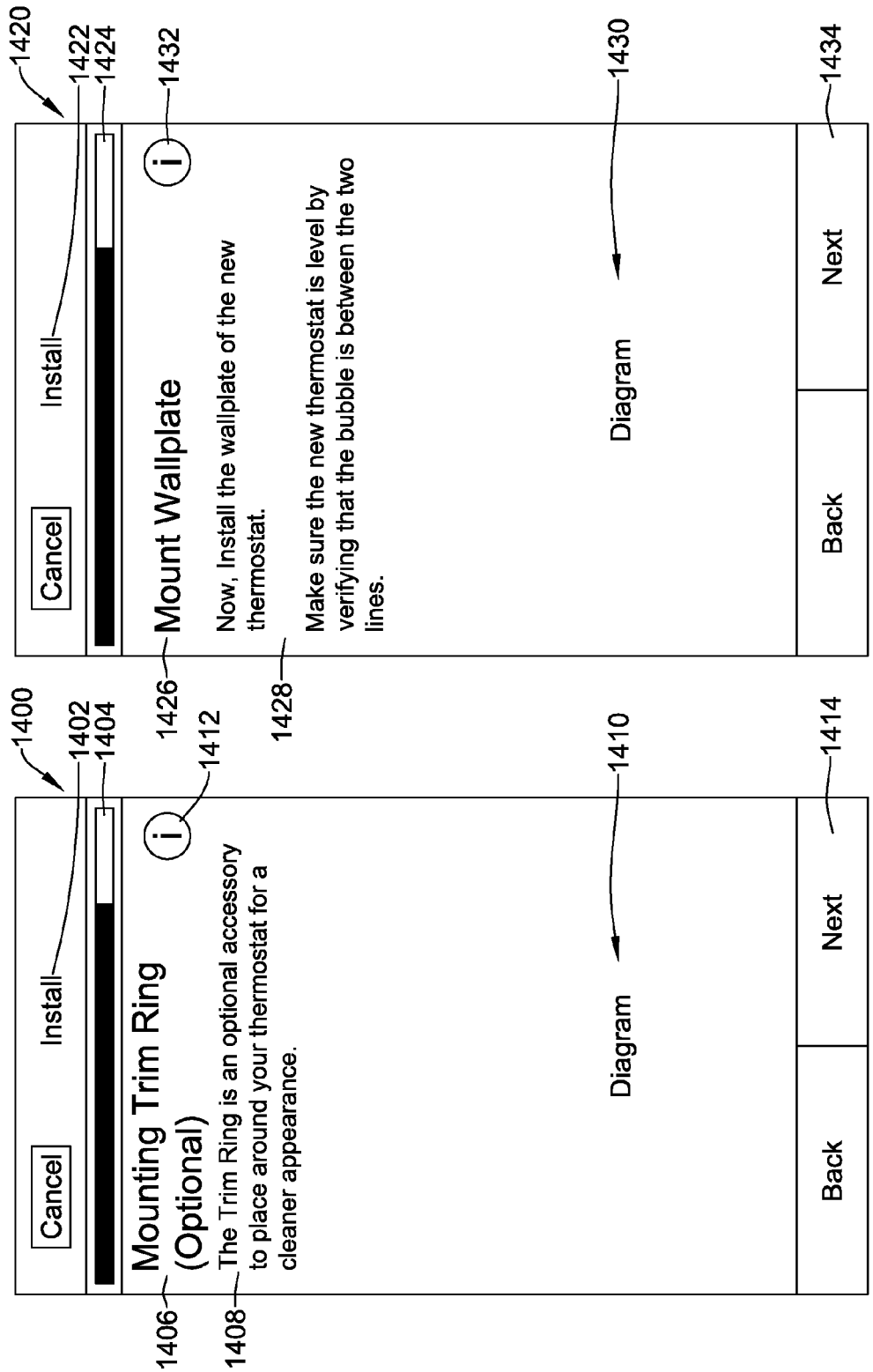

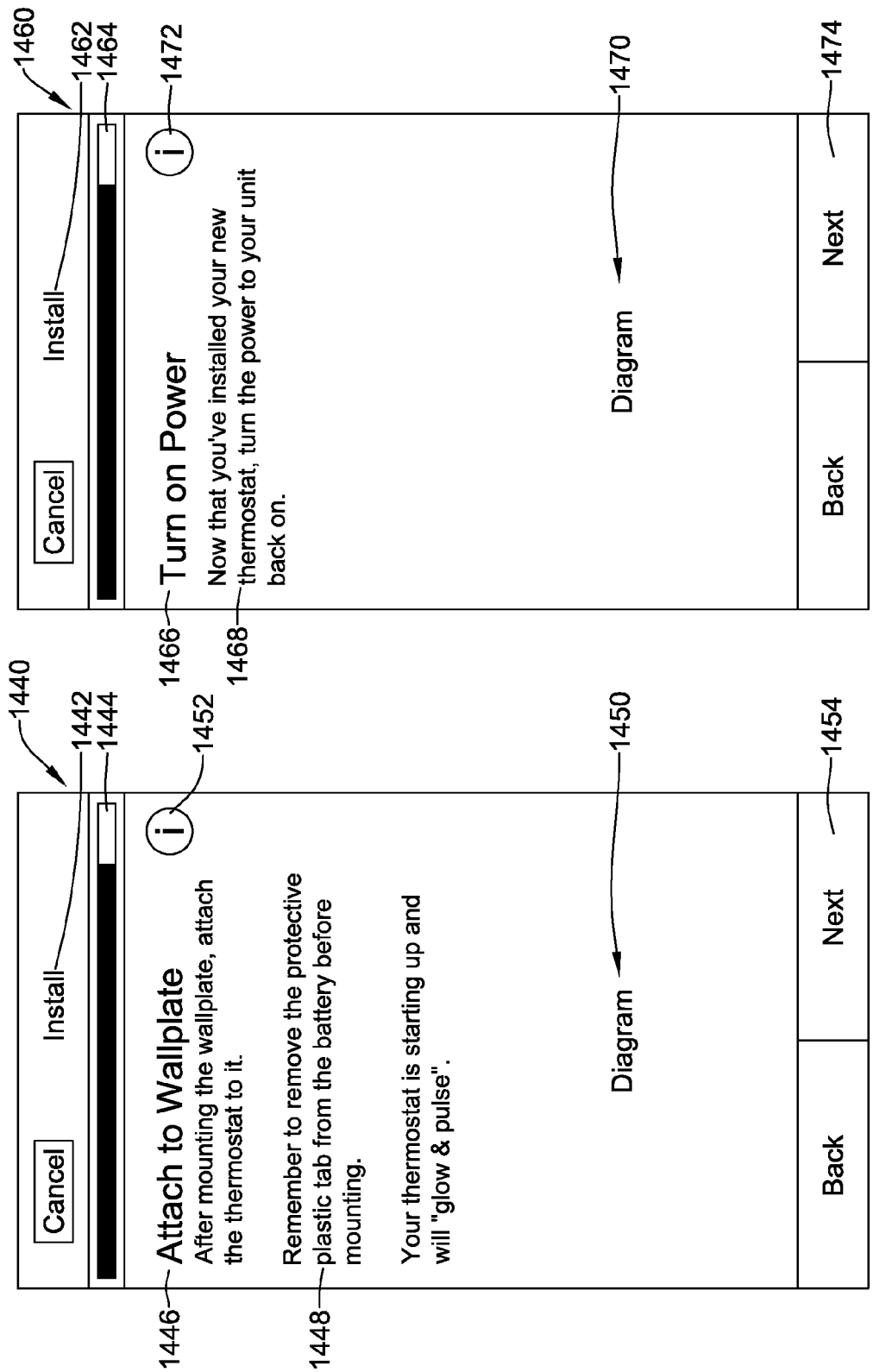

| Cancel |

Personalize

ⓘ

Personalize

Let's give your thermostat a location and a name, so you can easily reference it later.

\* Required Fields

Location Name

| Example: "Home", "Cabin", "Condo" | \*

Thermostat Name

| Example: "Upstairs", "Basement" | \*

| Back | Next |

*Figure 80*

[Cancel]  Personalize — 2060
▮▮▮▮▮░░░░ — 2062, 2064

Register — 2066

Lastly, complete your profile to register your thermostat with Honeywell. — 2068

ⓘ

* Required Fields

Address

[ Use My Location ] — 2072

Street [ * ] — 2070

City [ * ] — 2070

Zip [ * ] — 2070

Country [ ▽ ] — 2070

State [ ▽ ] * — 2070

Time Zone [ ▽ ] * — 2070

✓ Daylight Savings Time

▷ Thermostat Codes — 2074

| Back | Next — 2076 |

*Figure 81*

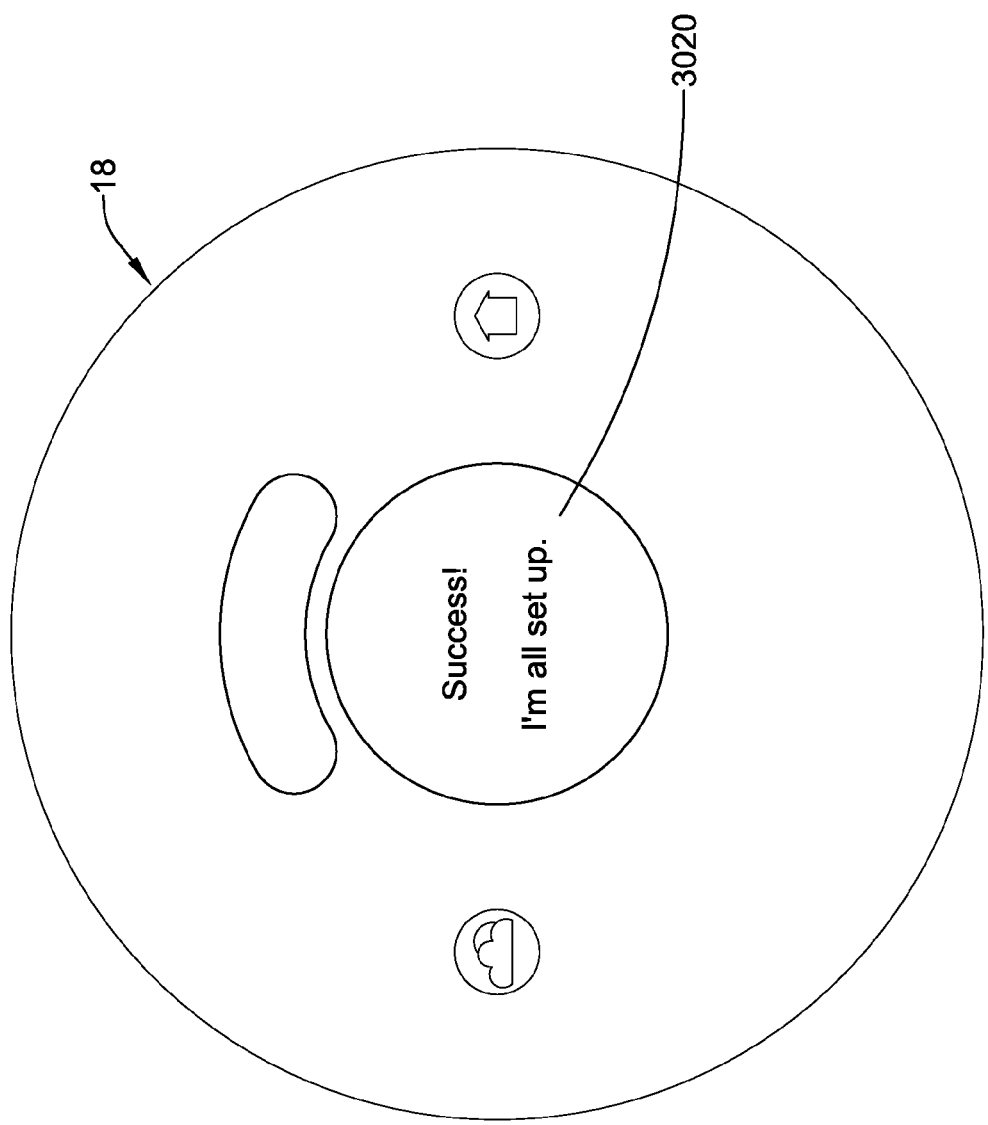

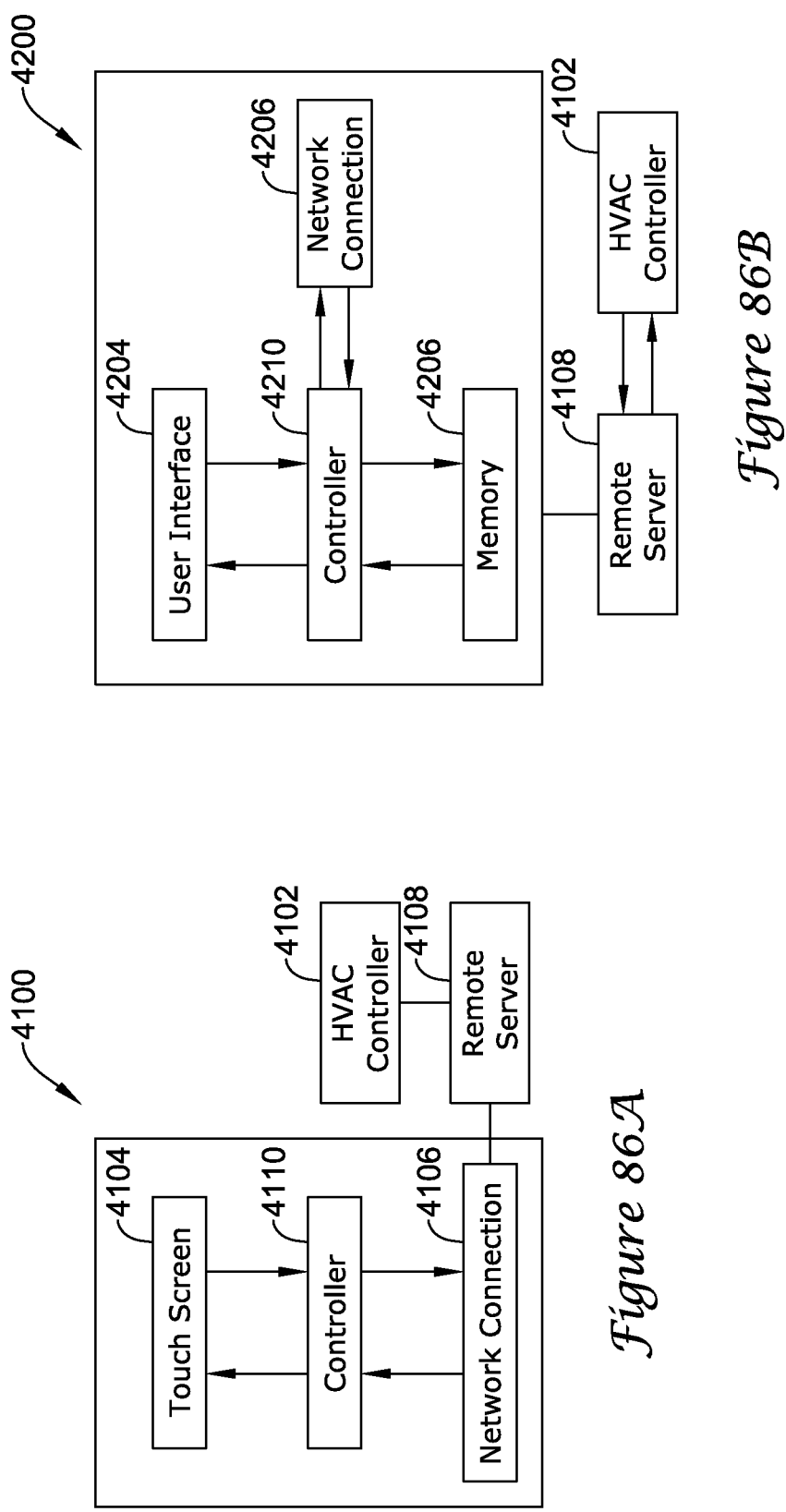

Select Location

What locations do you want contractor information for?

- Location 1 near 14625
- Location 2 near 90210
- Location 3 near 14625

*Figure 87*

| Select Contractor ∨ | |
|---|---|
| Honeywell Approved Contractors near 14625 | |
| Betlem HVAC<br>amy@betlem.com<br>555.555.3335<br>www.thecompany.com | ← 4088 |
| Cheshire Heating & Cooling<br>jamie@chc.com<br>555.555.3333<br>www.cheshireheatingcooling.com | ← 4088 |
| Hawn Heating & Cooling<br>doug@hhc.com<br>555.555.3334<br>www.hawnheatingcooling.com | ← 4088 |

Select Location

∨

What locations do you want to allow
<Contractor name> to have?

Location 1
near 14625 — 5008

Location 2
near 90210 — 5008

Location 3
near 14625 — 5008

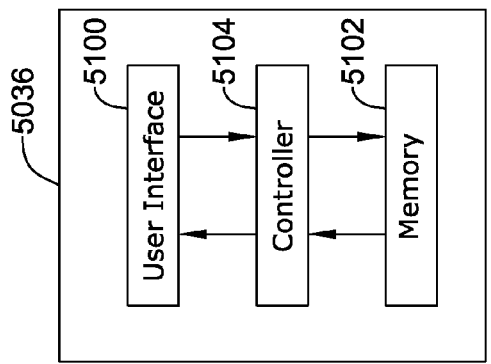
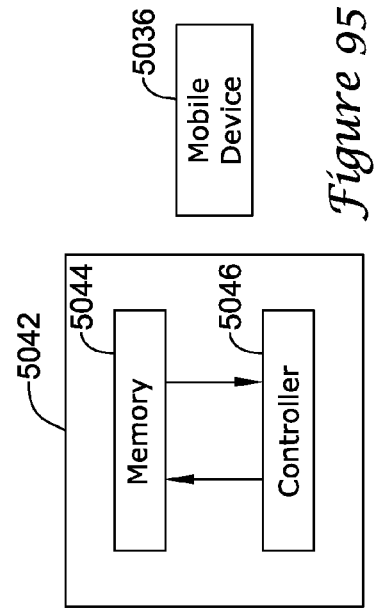
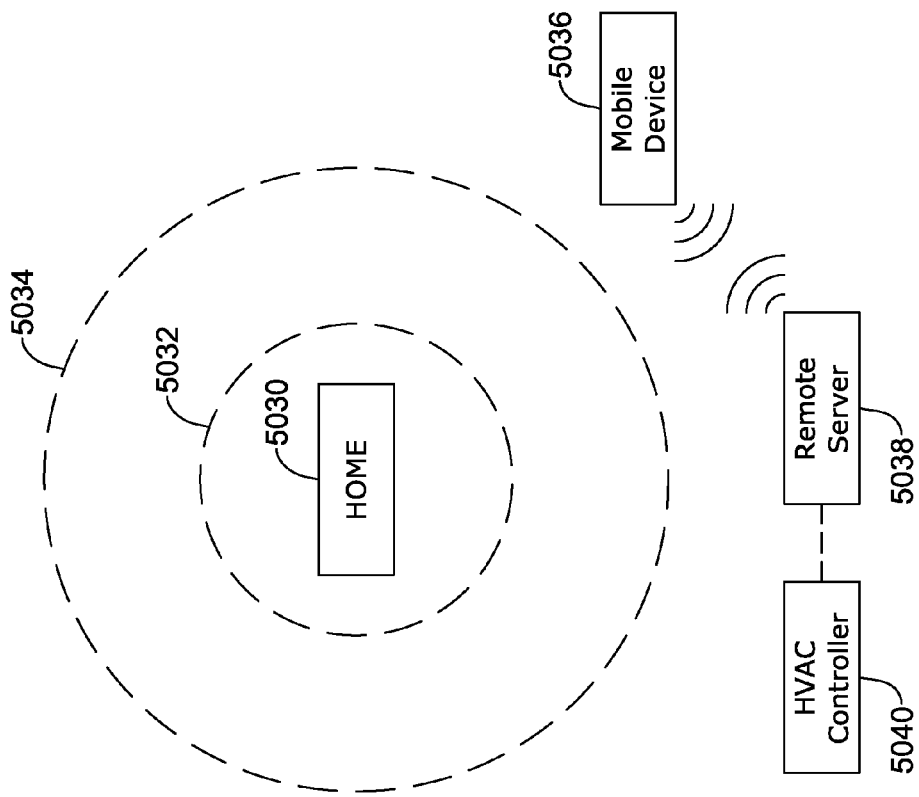

App

Geofence Setup

Based on your daily commute, you should select the small geofence setting under the settings menu. — 5086

App

Geofence Setup

Select the days on which you typically commute.

- ● Monday — 5096
- ● Tuesday — 5096
- ● Wednesday — 5096
- ● Thursday — 5096
- ○ Friday — 5096
- ○ Saturday — 5096
- ○ Sunday — 5096

Done

*Figure 100*

BUILDING AUTOMATION SYSTEM SETUP USING A REMOTE CONTROL DEVICE

RELATED APPLICATIONS

This application claims the benefit of U.S. Provisional Application No. 62/009,856, filed Jun. 9, 2014, and entitled "METHOD AND APPARATUS FOR CONTROLLING AN HVAC SYSTEM", and U.S. Provisional Application No. 61/914,877, filed Dec. 11, 2013, and entitled "METHOD AND APPARATUS FOR CONTROLLING AN HVAC SYSTEM", both of which are incorporated herein by reference.

BACKGROUND

Heating, ventilation, and/or air conditioning (HVAC) systems are often used to control the comfort level within a building or other structure. Such HVAC systems typically include an HVAC controller that controls various HVAC components of the HVAC system in order to affect and/or control one or more environmental conditions within the building. Improvements in the hardware, the user experience, and the functionality of such systems are desirable.

SUMMARY

This disclosure relates to methods and apparatus for controlling an HVAC system. The disclosure also relates to improvements in hardware, user experience, and functionality of an HVAC controller. In some instances, the disclosure relates to a mobile device that may be used to program an HVAC controller having a wireless interface. The mobile device may include a memory, a touch screen display that is configured to display information and to permit a user to enter information, a wireless port and a controller that is in operative communication with the touch screen display and the wireless port. In some instances, the controller may be configured to establish communication to a remote download server via the wireless port and to download an application program code from the remote download server. The application program code may be stored in the memory once downloaded. The controller of the mobile device may establish a direct wireless connection between the wireless port of the mobile device and the wireless interface of the HVAC controller, with the HVAC controller functioning as an access point. In some instances, the controller may execute the application program code, which may provide one or more configuration screens on the touch screen display of the mobile device to aid the user in configuring the HVAC controller via one or more configuration parameters, and then upload the one or more configuration parameters to the HVAC controller via the direct wireless connection between the wireless port of the mobile device and the wireless interface of the HVAC controller.

BRIEF DESCRIPTION OF DRAWINGS

FIG. 7B is a cross-sectional view of an illustrative lens and diffuser for illumination of a window mask stencil region of an HVAC controller;

FIGS. 7F-7H show various illustrative combinations of lens and diffusers for illuminating a window mask stencil region of an HVAC controller;

FIG. 9C is an exploded views showing an illustrative method for joining a button light guide assembly to a window support of an HVAC controller;

FIG. 10 is a perspective view of an illustrative assembly and method for encoding rotation of a turning ring;

FIG. 15A is a perspective view of an illustrative wall plate, showing jumper switch actuators that may be used to selectively block access to wiring terminals;

FIG. 18A is a block diagram of an illustrative building automation system that utilizes user-defined macros;

FIG. 19D-19L schematically illustrates the display of messages related to the operation of a thermostat on a mobile device;

FIG. 20B is a block diagram of another illustrative building automation system;

FIGS. 20D-27 show several illustrative screens that may be displayed to a user via the user interface of a mobile device in connection with downloading of an application program code for installing, setting up and configuring an HVAC controller;

FIGS. 29-41 show illustrative screens that may be displayed on the user interface of a remote device (e.g. mobile device) by an application program code that may guide the user through removal of an existing HVAC controller;

FIGS. 42-49 show illustrative screens that may be displayed on the user interface of a remote device (e.g. mobile device) by an application program code that may guide the user through installation of a new HVAC controller;

FIGS. 79-84 show illustrative screens that may be displayed on the user interface of a remote device by an application program code that may guide a user through personalizing an illustrative HVAC controller;

FIG. 85 shows an illustrative screen that may be displayed on the display of the user interface of the illustrative HVAC controller that is being setup after completion of the setup process;

FIG. 86A is a schematic block diagram of an illustrative building automation system;

FIG. 86B is a schematic block diagram of another illustrative building automation system;

FIGS. 87-91 show illustrative screens that may be displayed on the user interface of a remote device (e.g. mobile device) by an application program code through which a user may identify and connect to an HVAC contractor;

FIG. 93 is a schematic diagram of an illustrative method for utilizing geofencing in a building automation system;

FIG. 94 is a schematic block diagram of an illustrative building automation system that may be used with geofencing;

FIG. 95 is a schematic block diagram of another building automation system that may be use with geofencing;

FIG. 97 shows an illustrative screen that may be displayed on the user interface of a remote device (e.g. mobile device) by an application program code through which a user may select between a small and a large proximity boundary setting for geofencing;

FIGS. 98-101 show illustrative screens that may be displayed on the user interface of a remote device (e.g. mobile device) by an application program code that may guide a user through selecting an appropriate proximity boundary;

Figure 1:
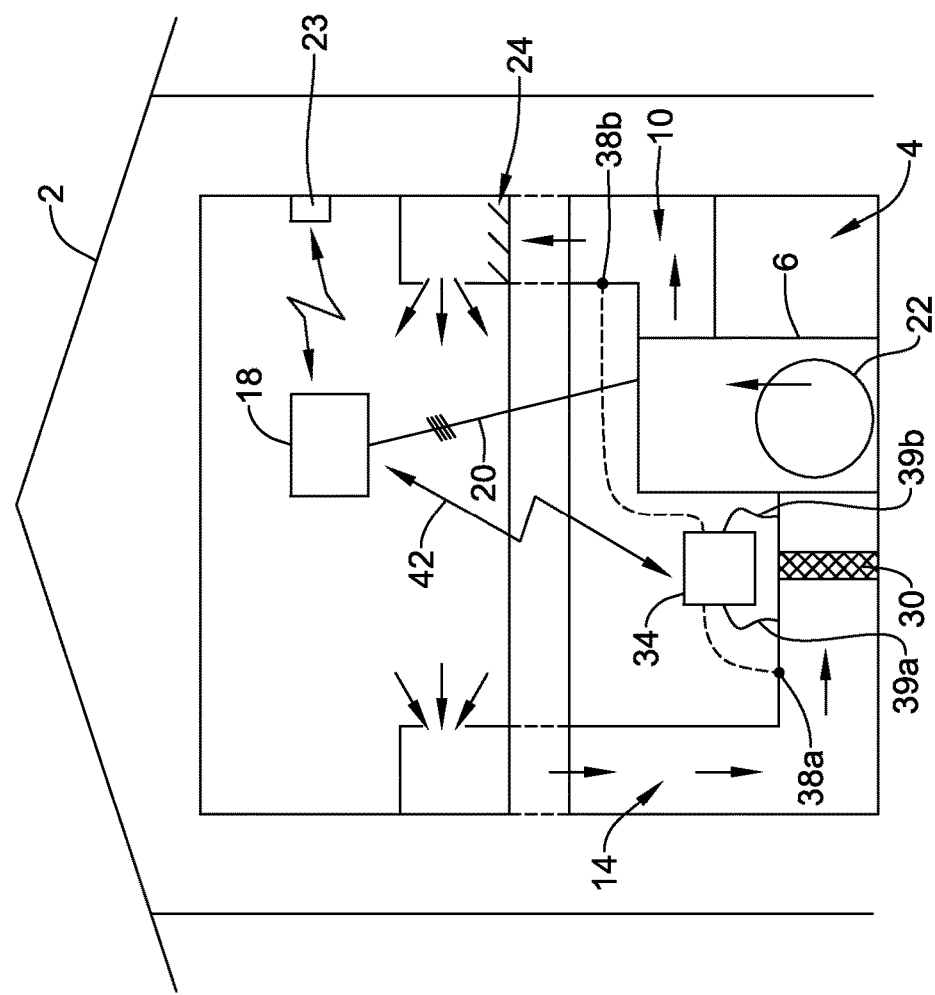
FIG. 1 is a schematic view of an illustrative HVAC system servicing a building or structure.

While the disclosure is amenable to various modifications and alternative forms, specifics thereof have been shown by way of example in the drawings and will be described in detail. It should be understood, however, that the intention is not to limit aspects of the disclosure to the particular illustrative embodiments described. On the contrary, the intention is to cover all modifications, equivalents, and alternatives falling within the spirit and scope of the disclosure.

DESCRIPTION

The following description should be read with reference to the drawings wherein like reference numerals indicate like elements. The drawings, which are not necessarily to scale, are not intended to limit the scope of the disclosure. In some of the figures, elements not believed necessary to an understanding of relationships among illustrated components may have been omitted for clarity.

All numbers are herein assumed to be modified by the term "about", unless the content clearly dictates otherwise. The recitation of numerical ranges by endpoints includes all numbers subsumed within that range (e.g., 1 to 5 includes 1, 1.5, 2, 2.75, 3, 3.80, 4, and 5).

As used in this specification and the appended claims, the singular forms "a", "an", and "the" include the plural referents unless the content clearly dictates otherwise. As used in this specification and the appended claims, the term "or" is generally employed in its sense including "and/or" unless the content clearly dictates otherwise.

It is noted that references in the specification to "an embodiment", "some embodiments", "other embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is contemplated that the feature, structure, or characteristic may be applied to other embodiments whether or not explicitly described unless clearly stated to the contrary.

The present disclosure is directed generally at building automation system. Building automation systems are systems that control one or more operations of a building. Building automation systems can include HVAC systems, security systems, fire suppression systems, energy management systems and other systems. While HVAC systems are used as an example below, it should be recognized that the concepts disclosed herein can be applied to building control systems more generally.

FIG. 1 is a schematic view of a building 2 having an illustrative heating, ventilation, and air conditioning (HVAC) system 4. While FIG. 1 shows a typical forced air type HVAC system, other types of HVAC systems are contemplated including, but not limited to, boiler systems, radiant heating systems, electric heating systems, cooling systems, heat pump systems, and/or any other suitable type of HVAC system, as desired. The illustrative HVAC system 4 of FIG. 1 includes one or more HVAC components 6, a system of ductwork and air vents including a supply air duct 10 and a return air duct 14, and one or more HVAC controllers 18. The one or more HVAC components 6 may include, but are not limited to, a furnace, a heat pump, an electric heat pump, a geothermal heat pump, an electric heating unit, an air conditioning unit, a humidifier, a dehumidifier, an air exchanger, an air cleaner, a damper, a valve, and/or the like.

It is contemplated that the HVAC controller(s) 18 may be configured to control the comfort level in the building or structure by activating and deactivating the HVAC component(s) 6 in a controlled manner. The HVAC controller(s) 18 may be configured to control the HVAC component(s) 6 via a wired or wireless communication link 20. In some cases, the HVAC controller(s) 18 may be a thermostat, such as, for example, a wall mountable thermostat, but this is not required in all embodiments. Such a thermostat may include (e.g. within the thermostat housing) or have access to a temperature sensor for sensing an ambient temperature at or near the thermostat. In some instances, the HVAC controller(s) 18 may be a zone controller, or may include multiple zone controllers each monitoring and/or controlling the comfort level within a particular zone in the building or other structure.

In the illustrative HVAC system 4 shown in FIG. 1, the HVAC component(s) 6 may provide heated air (and/or cooled air) via the ductwork throughout the building 2. As illustrated, the HVAC component(s) 6 may be in fluid communication with every room and/or zone in the building 2 via the ductwork 10 and 14, but this is not required. In operation, when a heat call signal is provided by the HVAC controller(s) 18, an HVAC component 6 (e.g. forced warm air furnace) may be activated to supply heated air to one or more rooms and/or zones within the building 2 via supply air ducts 10. The heated air may be forced through supply air duct 10 by a blower or fan 22. In this example, the cooler air from each zone may be returned to the HVAC component 6 (e.g. forced warm air furnace) for heating via return air ducts 14. Similarly, when a cool call signal is provided by the HVAC controller(s) 18, an HVAC component 6 (e.g. air conditioning unit) may be activated to supply cooled air to one or more rooms and/or zones within the building or other structure via supply air ducts 10. The cooled air may be forced through supply air duct 10 by the blower or fan 22. In this example, the warmer air from each zone may be returned to the HVAC component 6 (e.g. air conditioning unit) for cooling via return air ducts 14. In some cases, the HVAC system 4 may include an internet gateway or other device 23 that may allow one or more of the HVAC components, as described herein, to communicate over a wide area network (WAN) such as, for example, the Internet.

In some cases, the system of vents or ductwork 10 and/or 14 can include one or more dampers 24 to regulate the flow of air, but this is not required. For example, one or more dampers 24 may be coupled to one or more HVAC controller(s) 18, and can be coordinated with the operation of one or more HVAC components 6. The one or more HVAC controller(s) 18 may actuate dampers 24 to an open position, a closed position, and/or a partially open position to modulate the flow of air from the one or more HVAC components to an appropriate room and/or zone in the building or other structure. The dampers 24 may be particularly useful in zoned HVAC systems, and may be used to control which zone(s) receives conditioned air from the HVAC component(s) 6.

In many instances, one or more air filters 30 may be used to remove dust and other pollutants from the air inside the building 2. In the illustrative example shown in FIG. 1, the air filter(s) 30 is installed in the return air duct 14, and may filter the air prior to the air entering the HVAC component 6, but it is contemplated that any other suitable location for the air filter(s) 30 may be used. The presence of the air filter(s) 30 may not only improve the indoor air quality, but may also protect the HVAC components 6 from dust and other particulate matter that would otherwise be permitted to enter the HVAC component.

In some cases, and as shown in FIG. 1, the illustrative HVAC system 4 may include an equipment interface module (EIM) 34. When provided, the equipment interface module 34 may, in addition to controlling the HVAC under the direction of the thermostat, be configured to measure or detect a change in a given parameter between the return air side and the discharge air side of the HVAC system 4. For example, the equipment interface module 34 may measure a difference in temperature, flow rate, pressure, or a combination of any one of these parameters between the return air side and the discharge air side of the HVAC system 4. In some cases, the equipment interface module 34 may be adapted to measure the difference or change in temperature (delta T) between a return air side and discharge air side of the HVAC system 4 for the heating and/or cooling mode.

The delta T for the heating and cooling modes may be calculated by subtracting the return air temperature from the discharge air temperature (e.g. delta T=discharge air temperature−return air temperature)

In some cases, the equipment interface module 34 may include a first temperature sensor 38a located in the return (incoming) air duct 14, and a second temperature sensor 38b located in the discharge (outgoing or supply) air duct 10. Alternatively, or in addition, the equipment interface module 34 may include a differential pressure sensor including a first pressure tap 39a located in the return (incoming) air duct 14, and a second pressure tap 39b located downstream of the air filter 30 to measure a change in a parameter related to the amount of flow restriction through the air filter 30. In some cases, the equipment interface module 34, when provided, may include at least one flow sensor that is capable of providing a measure that is related to the amount of air flow restriction through the air filter 30. In some cases, the equipment interface module 34 may include an air filter monitor. These are just some examples.

When provided, the equipment interface module 34 may be configured to communicate with the HVAC controller 18 via, for example, a wired or wireless communication link 42. In other cases, the equipment interface module 34 may be incorporated or combined with the HVAC controller 18. In either cases, the equipment interface module 34 may communicate, relay or otherwise transmit data regarding the selected parameter (e.g. temperature, pressure, flow rate, etc.) to the HVAC controller 18. In some cases, the HVAC controller 18 may use the data from the equipment interface module 34 to evaluate the system's operation and/or performance. For example, the HVAC controller 18 may compare data related to the difference in temperature (delta T) between the return air side and the discharge air side of the HVAC system 4 to a previously determined delta T limit stored in the HVAC controller 18 to determine a current operating performance of the HVAC system 4.

Figure 2:
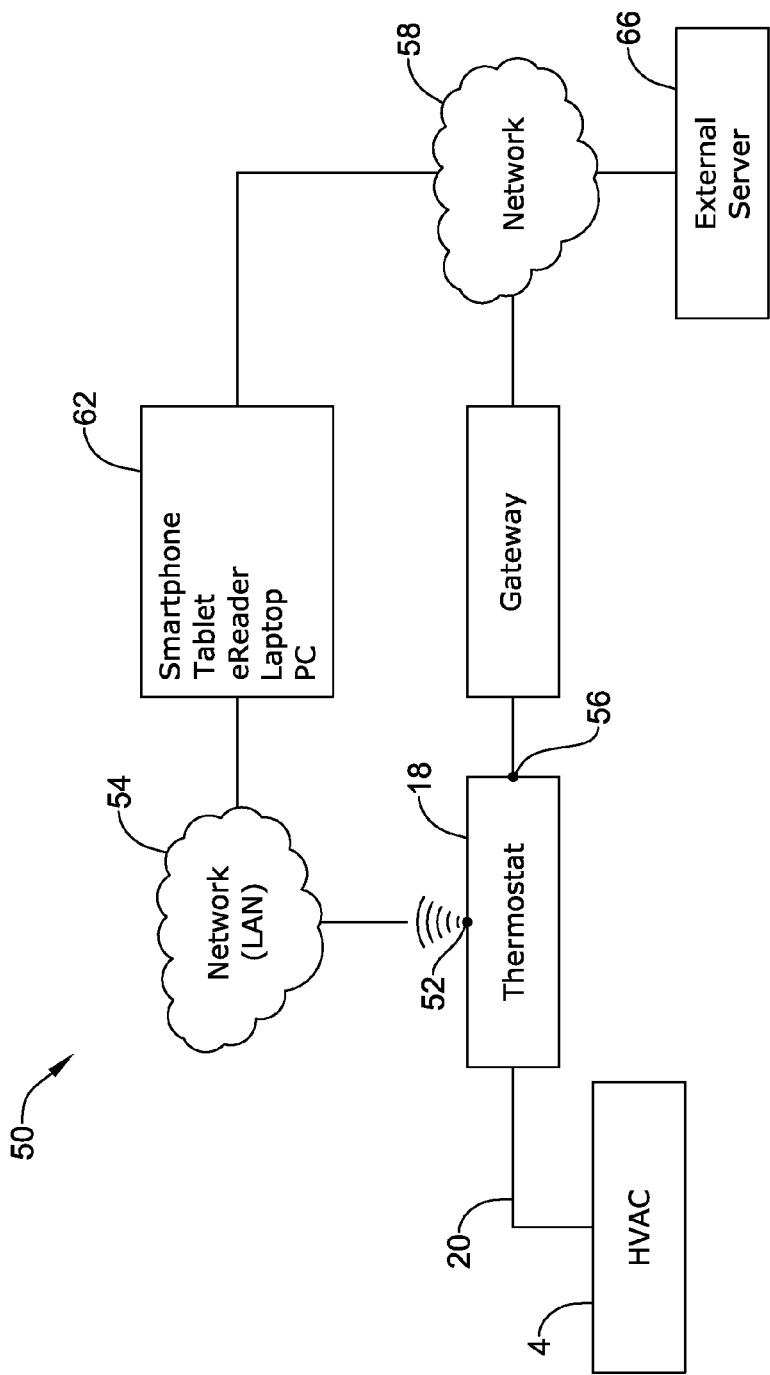
FIG. 2 is a schematic view of an illustrative HVAC control system that may facilitate access and/or control of the HVAC system of FIG. 1.

FIG. 2 is a schematic view of an HVAC control system 50 that facilitates remote access and/or control of the HVAC system 4 shown in FIG. 1. The HVAC control system 50 may be considered a building control system or part of a building control system. The illustrative HVAC control system 50 includes an HVAC controller, as for example, HVAC controller 18 (see FIG. 1) that is configured to communicate with and control one or more HVAC components 6 of the HVAC system 4. As discussed above, the HVAC controller 18 may communicate with the one or more HVAC components 6 of the HVAC system 4 via a wired or wireless link. Additionally, the HVAC controller 18 may communicate over one or more wired or wireless networks that may accommodate remote access and/or control of the HVAC controller 18 via another device such as a smart phone, tablet, e-reader, laptop computer, personal computer, key fob, or the like. As shown in FIG. 2, the HVAC controller 18 may include a first communications port 52 for communicating over a first network 54, and in some cases, a second communications port 56 for communicating over a second network 58. In some cases, the first network 54 may be a wireless local area network (LAN), and the second network 58 (when provided) may be a wide area network or global network (WAN) including, for example, the Internet. In some cases, the wireless local area network 54 may provide a wireless access point and/or a network host device that is separate from the HVAC controller 18. In other cases, the wireless local area network 54 may provide a wireless access point and/or a network host device that is part of the HVAC controller 18. In some cases, the wireless local area network 54 may include a local domain name server (DNS), but this is not required for all embodiments. In some cases, the wireless local area network 54 may be an ad-hoc wireless network, but this is not required.

In some cases, the HVAC controller 18 may be programmed to communicate over the second network 58 with an external web service hosted by one or more external web server 66. A non-limiting example of such an external web service is Honeywell's TOTAL CONNECT™ web service. The HVAC controller 18 may be configured to upload selected data via the second network 58 to the external web service where it may be collected and stored on the external web server 66. In some cases, the data may be indicative of the performance of the HVAC system 4. Additionally, the HVAC controller 18 may be configured to receive and/or download selected data, settings and/or services sometimes including software updates from the external web service over the second network 58. The data, settings and/or services may be received automatically from the web service, downloaded periodically in accordance with a control algorithm, and/or downloaded in response to a user request. In some cases, for example, the HVAC controller 18 may be configured to receive and/or download an HVAC operating schedule and operating parameter settings such as, for example, temperature set points, humidity set points, start times, end times, schedules, window frost protection settings, and/or the like from the web server 66 over the second network 58. In some instances, the HVAC controller 18 may be configured to receive one or more user profiles having at least one operational parameter setting that is selected by and reflective of a user's preferences. In still other instances, the HVAC controller 18 may be configured to receive and/or download firmware and/or hardware updates such as, for example, device drivers from the web server 66 over the second network 58. Additionally, the HVAC controller 18 may be configured to receive local weather data, weather alerts and/or warnings, major stock index ticker data, and/or news headlines over the second network 58. These are just some examples.

Depending upon the application and/or where the HVAC user is located, remote access and/or control of the HVAC controller 18 may be provided over the first network 54 and/or the second network 58. A variety of remote wireless devices 62 may be used to access and/or control the HVAC controller 18 from a remote location (e.g. remote from the HVAC Controller 18) over the first network 54 and/or second network 58 including, but not limited to, mobile phones including smart phones, tablet computers, laptop or personal computers, wireless network-enabled key fobs, e-readers, and/or the like. In many cases, the remote wireless devices 62 are configured to communicate wirelessly over the first network 54 and/or second network 58 with the HVAC controller 18 via one or more wireless communication protocols including, but not limited to, cellular communication, ZigBee, REDLINK™, Bluetooth, WiFi, IrDA, dedicated short range communication (DSRC), EnOcean, and/or any other suitable common or proprietary wireless protocol, as desired.

In some cases, an application program code (i.e. app) stored in the memory of the remote device 62 may be used to remotely access and/or control the HVAC controller 18. The application program code (app) may be provided for downloading from an external web service, such as the web service hosted by the external web server 66 (e.g. Honeywell's TOTAL CONNECT™ web service) or another external web service (e.g. ITUNES® or Google Play). In some cases, the app may provide a remote user interface for interacting with the HVAC controller 18 at the user's remote device 62. For example, through the user interface provided by the app, a user may be able to change the operating schedule and operating parameter settings such as, for example, temperature set points, humidity set points, start times, end times, schedules, window frost protection settings, accept software updates and/or the like. Communications may be routed from the user's remote device 62 to the web server 66 and then, from the web server 66 to the HVAC controller 18. In some cases, communications may flow in the opposite direction such as, for example, when a user interacts directly with the HVAC controller 18 to change an operating parameter setting such as, for example, a schedule change or a set point change. The change made at the HVAC controller 18 may then be routed to the web server 66 and then from the web server 66 to the remote device 62 where it may reflected by the application program executed by the remote device 62.

In other cases, a user may be able to interact with the HVAC controller 18 via a user interface provided by one or more web pages served up by the web server 66. The user may interact with the one or more web pages using a variety of interne capable devices to effect a change at the HVAC controller 18 as well as view usage data and energy consumption data related to the usage of the HVAC system 4. In still yet another case, communication may occur between the user's remote device 62 and the HVAC controller 18 without being relayed through a server. These are just some examples.

Figure 3:
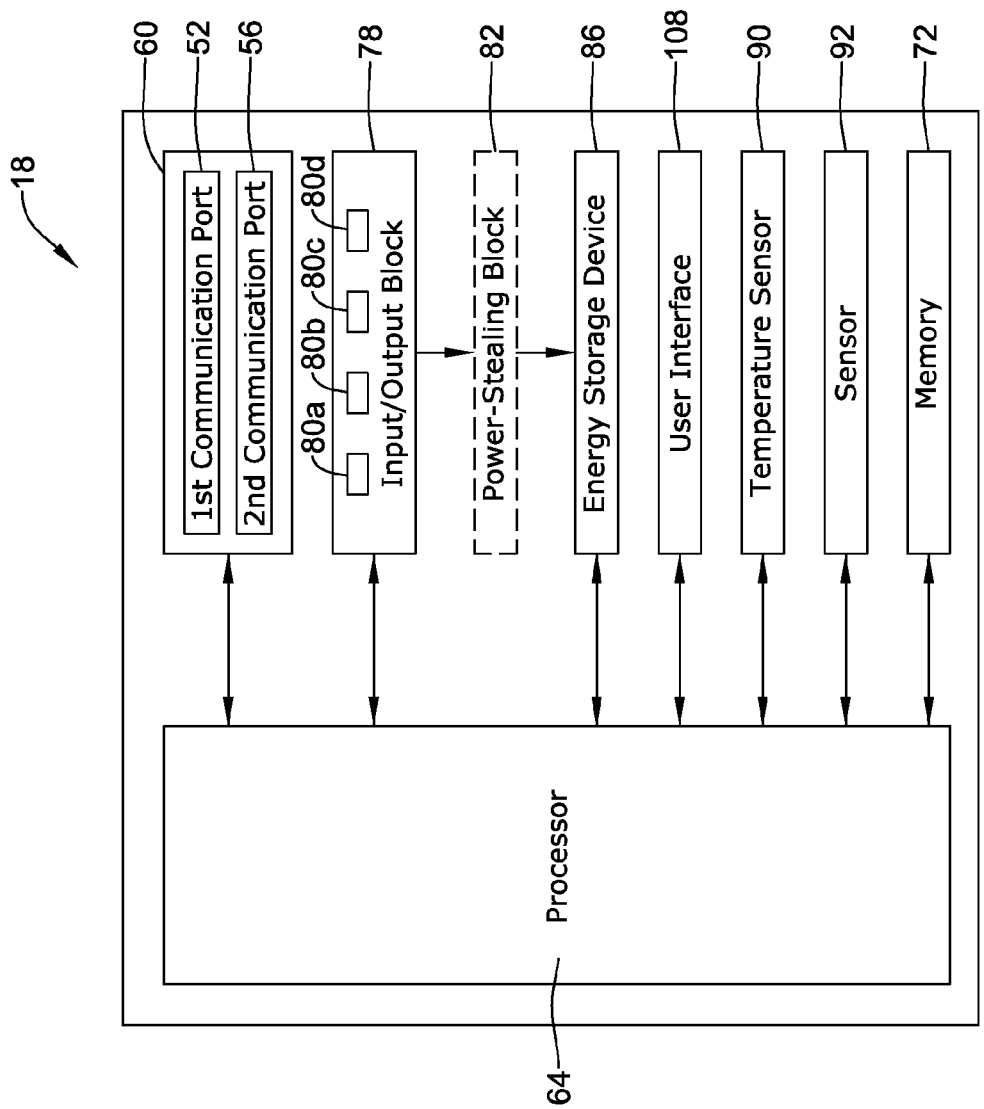
FIG. 3 is a schematic block diagram of an illustrative HVAC controller.

Figure 3 is an illustrative schematic block diagram of the HVAC controller 18 of FIG. 2. As discussed above with reference to FIG. 2, the HVAC controller 18 may be accessed and/or controlled from a remote location over the first network 54 and/or the second network 58 using a remote wireless device 62 such as, for example, a smart phone, a tablet computer, a laptop or personal computer, a wireless network-enabled key fob, an e-reader, and/or the like. In some instances, the HVAC controller 18 may be a thermostat, but this is not required. As shown in FIG. 3, the HVAC controller 18 may include a communications block 60 having a first communications port 52 for communicating over a first network (e.g. a wireless LAN) and a second communications port 56 for communicating over a second network (e.g. a WAN or the Internet). The first communications port 52 can be a wireless communications port including a wireless transceiver for wirelessly sending and/or receiving signals over a first wireless network 54. Similarly, the second communications port 56 may be a wireless communications port including a wireless transceiver for sending and/or receiving signals over a second wireless network 58. In some cases, the second communications port 56 may be in communication with a wired or wireless router or gateway for connecting to the second network, but this is not required. In some cases, the router or gateway may be integral to the HVAC controller 18 or may be provided as a separate device. Additionally, the illustrative HVAC controller 18 may include a processor (e.g. microprocessor, microcontroller, etc.) 64 and a memory 72. The HVAC controller 18 may also include a user interface 108, but this is not required. In some cases, HVAC controller 18 may include a timer (not shown). The timer may be integral to the processor 64 or may be provided as a separate component. The memory 72 of the illustrative HVAC controller 18 may be in communication with the processor 64. The memory 72 may be used to store any desired information, such as the aforementioned control algorithm, set points, schedule times, diagnostic limits such as, for example, differential pressure limits, delta T limits, and the like. The memory 72 may be any suitable type of storage device including, but not limited to, RAM, ROM, EPROM, flash memory, a hard drive, and/or the like. In some cases, the processor 64 may store information within the memory 72, and may subsequently retrieve the stored information from the memory 72.

In many cases, the HVAC controller 18 may include an input/output block (I/O) block) 78 having a number of wire terminals (e.g. 80a-80d) for receiving one or more signals from the HVAC system 4 and/or for providing one or more control signals to the HVAC system 4. For example, the I/O block 78 may communicate with one or more HVAC components 6 of the HVAC system 4. The HVAC controller 18 may have any number of wire terminals for accepting a connection from one or more HVAC components 6 of the HVAC system 4. However, how many wire terminals are utilized and which terminals are wired is dependent upon the particular configuration of the HVAC system 4. Different HVAC systems 4 having different HVAC components and/or type of HVAC components 6 may have different wiring configurations. As such, an I/O block having four wire terminals, as shown in FIG. 2, is just one example and is not intended to be limiting. Alternatively, or in addition to, the I/O block 78 may communicate with another controller, which is in communication with one or more HVAC components of the HVAC system 4, such as a zone control panel in a zoned HVAC system, equipment interface module (EIM) (e.g. EIM 34 shown in FIG. 1) or any other suitable building control device.

In some cases, a power-transformation block 82 may be connected to one or more wires of the I/O block 78, and may be configured to bleed or steal energy from the one or more wires of the I/O block 78. The power bled off of the one or more wires of the I/O block may be stored in an energy storage device 86 that may be used to at least partially power the HVAC controller 18. In some cases, the energy storage device 86 may be capacitor or a rechargeable battery. In addition, the HVAC controller 18 may also include a back-up source of energy such as, for example, a battery that may be used to supplement power supplied to the HVAC controller 18 when the amount of available power stored by the energy storage device 86 is less than optimal or is insufficient to power certain applications. Certain applications or functions performed by the HVAC controller may require a greater amount of energy than others. If there is an insufficient amount of energy stored in the energy storage device 86, then, in some cases, certain applications and/or functions may be prohibited by the processor 64.

The HVAC controller 18 may also include one or more sensors such as for example, a temperature sensor, a humidity sensor, an occupancy sensor, a proximity sensor, and/or the like. In some cases, the HVAC controller 18 may include an internal temperature sensor 90, as shown FIG. 3, but this is not required. The HVAC controller 18 may also communicate with one or more remote temperature sensors, humidity sensors, and/or occupancy sensors located throughout the building or structure. Additionally, the HVAC controller may communicate with a temperature sensor and/or humidity sensor located outside of the building or structure for sensing an outdoor temperature and/or humidity if desired.

In some cases, the HVAC controller 18 may include a sensor 92 that is configured determine if a user is in proximity to the building controller. In some cases, the sensor 92 may be a motion sensor or a proximity sensor such as, for example, a passive infrared (PIR) sensor. In certain cases in which the sensor 92 is a motion sensor or a proximity sensor, the sensor 92 may be located remotely from the HVAC controller 18 and may be in wireless communication with the HVAC controller 18 via one of the communication ports.

In other cases, the sensor 92 may be configured to determine that the user is near or expected to be near the HVAC controller 18 based, at least in part, on the location data provided by a location based service application program executed by a user's remote device 62 that the user utilizes to interact with the HVAC controller 18 from a remote location. The location data generated by the location based services app may be transmitted from the user's remote device 62 directly to the HVAC controller 18 or, in some cases, may be transmitted to the HVAC controller 18 via a server 66 (e.g. Honeywell's TOTAL CONNECT™ server) to which both the HVAC controller 18 and the user's remote device 62 may be connected. In some cases, the sensor 92 may be configured to determine that the user or, more specifically, the user's remote device 62 has crossed at least one of two or more proximity boundaries relative to the location of the HVAC controller 18 based on location data provided by the user's remote device that the user utilizes to interact with the HVAC controller 18. The user's remote device 62 may determine that the user has crossed a proximity boundary by comparing the location data generated by sensor 92 of the user's remote device 62 to a predetermined fixed location or boundary. In some cases, the proximity boundary(s) may be defined by a radius extending outward from a predetermined fixed location. The predetermined fixed location may be the location of the HVAC controller 18 or another selected location such as, for example, the user's workplace. Alternatively, or in addition to, the proximity boundary(s) may be customized by the user and may have any shape and or size that appropriately reflects the user's local and/or daily travel habits. For example, at least one proximity boundary may be configured by the user to have the same general size and/or shape of the city in which their home or workplace is located.

In yet another example, the sensor 92 may be configured to determine that the user is in proximity to or is expected to be in proximity to the HVAC controller 18 upon detecting that the user's remote device 62 is connected to the building's wireless network which, in some cases, may be the same network to which the HVAC controller 18 is also connected. Such functionality is shown and described in U.S. Patent Publication No. 2014/0031989 entitled "HVAC CONTROLLER WITH WIRELESS NETWORK BASED OCCUPANCY DETECTION AND CONTROL", the entirety of which is incorporated by reference herein for all purposes.

In still other cases, the user's remote device 62 may be configured to determine that a user is in proximity to the HVAC controller 18 upon sensing a user's interaction with the HVAC controller 18 via the user interface provided at the HVAC controller 18. For example, the sensor 92 may be configured to sense when the screen of the user interface 108 is touched and/or when a button provided at the user interface 108 is pressed by a user. In some cases, the sensor 92 may be a touch sensitive region provided on the user interface 108 when the user interface 108 incorporates a touch screen display. In other cases, the sensor 92 may be associated with a hard button or soft key that is provided separate from a display of the user interface 108.

In some cases, upon detecting or determining that a user is in proximity to the HVAC controller, the sensor 92 may deliver a signal to the processor 64 indicating that the user is in proximity to the HVAC controller 18. In other cases, the upon detecting or determining that a user is in proximity to the HVAC controller 18, the sensor 92 may be configured to transmit a signal to a remote server 66 over a second network 58 via the communications block 60.

The user interface 108, when provided, may be any suitable user interface that permits the HVAC controller 18 to display and/or solicit information, as well as accept one or more user interactions with the HVAC controller 18. For example, the user interface 108 may permit a user to locally enter data such as temperature set points, humidity set points, starting times, ending times, schedule times, diagnostic limits, responses to alerts, and the like. In one example, the user interface 108 may be a physical user interface that is accessible at the HVAC controller 18, and may include a display and/or a distinct keypad. The display may be any suitable display. In some instances, a display may include or may be a liquid crystal display (LCD), and in some cases an e-ink display, fixed segment display, or a dot matrix LCD display. In other cases, the user interface 108 may be a touch screen LCD panel that functions as both display and keypad. The touch screen LCD panel may be adapted to solicit values for a number of operating parameters and/or to receive such values, but this is not required. In still other cases, the user interface 108 may be a dynamic graphical user interface.

In some instances, the user interface 108 need not be physically accessible to a user at the HVAC controller 18. Instead, the user interface 108 may be a virtual user interface 108 that is accessible via the first network 54 and/or second network 58 using a mobile wireless device such as one of those remote devices 62 previously described herein. In some cases, the virtual user interface 108 may be provided by an app executed by a user's remote device for the purposes of remotely interacting with the HVAC controller 18. Through the virtual user interface 108 provided by the app on the user's remote device 62, the user may change temperature set points, humidity set points, starting times, ending times, schedule times, diagnostic limits, respond to alerts, update their user profile, view energy usage data, and/or the like. In some instances, changes made to the HVAC controller 18 via a user interface 108 provided by an app on the user's remote device 62 may be first transmitted to an external web server 66. The external web server 66 may receive and accept the user inputs entered via the virtual user interface 108 provided by the app on the user's remote device 62, and associate the user inputs with a user's account on the external web service. If the user inputs include any changes to the existing control algorithm including any temperature set point changes, humidity set point changes, schedule changes, start and end time changes, window frost protection setting changes, operating mode changes, and/or changes to a user's profile, the external web server 66 may update the control algorithm, as applicable, and transmit at least a portion of the updated control algorithm over the second network 58 to the HVAC controller 18 where it is received via the second port 56 and may be stored in the memory 72 for execution by the processor 64. In some cases, the user may observe the effect of their inputs at the HVAC controller 18. As discussed herein, the communication rate between the processor 64 and the web server 66 may affect the message latency from when the user interacts with the user interface 108 provided by their remote device 62 to effect a change at the HVAC controller 18 and when a message corresponding to the user's interaction with the user interface 108 provided at their remote device 62 is communicated to the HVAC controller 18. In some cases, the user may experience lower message latencies when the HVAC controller 18 has a full amount of available power stored in the energy storage device. The message latency may increase as less power is available to the HVAC controller 18 from the energy storage device 86, but this is not required.

Rather than a dedicated app, the virtual user interface 108 may include one or more web pages that are transmitted over the second network 58 (e.g. WAN or the Internet) by an external web server (e.g. web server 66). The one or more web pages forming the virtual user interface 108 may be hosted by an external web service and associated with a user account having one or more user profiles. The external web server 66 may receive and accept user inputs entered via the virtual user interface and associate the user inputs with a user's account on the external web service. If the user inputs include changes to the existing control algorithm including any temperature set point changes, humidity set point changes, schedule changes, start and end time changes, window frost protection setting changes, operating mode changes, and/or changes to a user's profile, the external web server 66 may update the control algorithm, as applicable, and transmit at least a portion of the updated control algorithm over the second network 58 to the HVAC controller 18 where it is received via the second port 56 and may be stored in the memory 72 for execution by the processor 64. In some cases, the user may observe the effect of their inputs at the HVAC controller 18.

In some cases, a user may use either the user interface 108 provided at the HVAC controller 18 and/or a virtual user interface 108 as described herein. The two types of user interfaces 108 that may be used to interact with the HVAC controller 18 are not mutually exclusive of one another. However, in some cases, a virtual user interface 108 may provide more advanced capabilities to the user.

Figure 4:
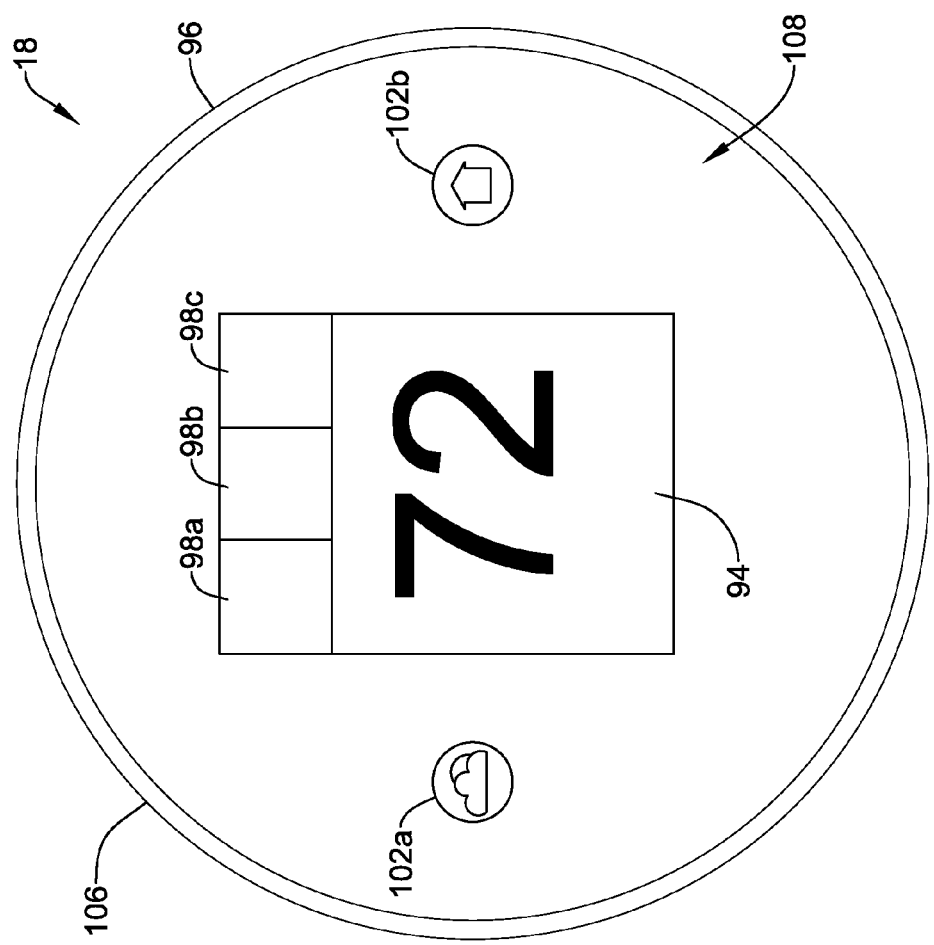
FIG. 4 is a front elevation view of an illustrative HVAC controller.

FIG. 4 is a front elevation view of an illustrative HVAC controller 18 that includes a user interface 108. The user interface 108, provided at the HVAC controller 18, may be provided in addition to or in alternative to a virtual user interface that may be provided by an application program executed by a user's remote device 62 or that may be viewed as one or more web pages served up by a web server 66, as discussed herein. As shown in FIG. 4, the illustrative user interface 108 may include a display 94 disposed within a housing 96. In some cases, the display 94 may be a touch screen display, but this is not required. In the example shown, the user interface 108 may include one or more touch sensitive regions 98a-98c provided on the display 94, each touch sensitive region defining a button through which the user may interact with the HVAC controller 18. Additionally, or alternatively, the user interface 108 may include one or more buttons 102a and 102b that may be provided separate from the display 94 through which the user may interact with the HVAC controller 18. In some cases, the buttons 102a, 102b may be touch sensitive capacitive buttons. In other cases, the buttons 102a, 102b may be hard, physical buttons or soft keys. It will be generally understood that the size and shape of the display as well as the number and location of the various buttons can vary.

The housing 96 may be fabricated from any suitable material. As shown in FIG. 4, the housing 96 may have a generally circular foot print, but this is not required. In some cases, the housing 96 may be a two-part housing a may include a rotating ring 106 which may form part of the user interface 108, and which may provide another mechanism for accepting input from a user. For example, the user may rotate the ring 106 to increase or decrease an operating parameter (e.g. set point) and/or to change information viewed on the display 94 by advancing from a first screen to a second screen displayed on the display 94. In some cases, while the user interface 108 that is provided at the HVAC controller 18 is capable of receiving a user's interactions, a more advanced or detailed user interface 108 for more fully interacting with the HVAC controller 18 may be provided by an application program executed at a user's remote device 62 and/or by one or more web pages served up by a web server such as web server 66, as described herein.

Referring back to FIG. 3, the processor 64 may operate in accordance with an algorithm that controls or at least partially controls one or more HVAC components of an HVAC system such as, for example, HVAC system 4 of FIG. 1. The processor 64, for example, may operate in accordance with a control algorithm that provides temperature set point changes, humidity set point changes, schedule changes, start and end time changes, window frost protection setting changes, operating mode changes, and/or the like. At least a portion of the control algorithm may be stored locally in the memory 72 of the HVAC controller 18 and, in some cases, may be received from an external web service over the second network 58. The control algorithm (or portion thereof) stored locally in the memory 72 of the HVAC controller 18 may be periodically updated in accordance with a predetermined schedule (e.g. once every 24 hours, 48 hours, 72 hours, weekly, monthly, etc.), updated in response to any changes to the control algorithm (e.g. set point change) made by a user, and/or updated in response to a user's request. The updates to the control algorithm or portion of the control algorithm stored in the memory 72 may be received from an external web service over the second network. In some cases, the control algorithm may include settings such as set points.

In some cases, the processor 64 may operate according to a first operating mode having a first temperature set point, a second operating mode having a second temperature set point, a third operating mode having a third temperature set point, and/or the like. In some cases, the first operating mode may correspond to an occupied mode, and the second operating mode may correspond to an unoccupied mode. In some cases, the third operating mode may correspond to a holiday or vacation mode wherein the building or structure in which the HVAC system 4 is located may be unoccupied for an extended period of time. In other cases, the third operating mode may correspond to a sleep mode wherein the building occupants are either asleep or inactive for a period of time. These are just some examples. It will be understood that the processor 64 may be capable of operating in additional operating modes as necessary or desired. The number of operating modes and the operating parameter settings associated with each of the operating modes may be established locally through the user interface 108, and/or through an external web service and delivered to the HVAC controller via the second network 58 where they may be stored in the memory 72 for reference by the processor 64.

In some cases, the processor 64 may operate according to one or more predetermined operating parameter settings associated with a user profile for an individual user. The user profile may be stored in the memory 72 of the HVAC controller 18 and/or may be hosted by an external web service and stored on an external web server. The user profile may include one or more user-selected settings for one or more operating modes that may be designated by the user. For example, the processor 64 may operate according to a first operating mode having a first temperature set point associated with a first user profile, a second operating mode having a second temperature set point associated with the first user profile, a third operating mode having a third temperature set point associated with the first user profile, and/or the like. In some cases, the first operating mode may correspond to an occupied mode, the second operating mode may correspond to an unoccupied mode, and the third operating mode may correspond to a vacation or extended away mode wherein the building or structure in which the HVAC system 4 is located may be unoccupied for an extended period of time. In some cases, multiple user profiles may be associated with the HVAC controller 18. In certain cases, where two or more user profiles are associated with the HVAC controller 18, the processor 64 may be programmed to include a set of rules for determining which individual's user profile takes precedence for controlling the HVAC system when both user profiles are active.

In some cases, the processor 64 may be programmed to execute a guided set-up routine that may guide a user through configuring the HVAC controller 18 to control one or more HVAC components 6 of their particular HVAC system 4. In some cases, the user may have limited knowledge about the particular HVAC system configuration. The guided set-up routine may be configured to guide a user through set-up of the HVAC controller 18 without requiring detailed knowledge of the particular HVAC system and/or without requiring the user to consult a technical manual or guide.

Figure 5:
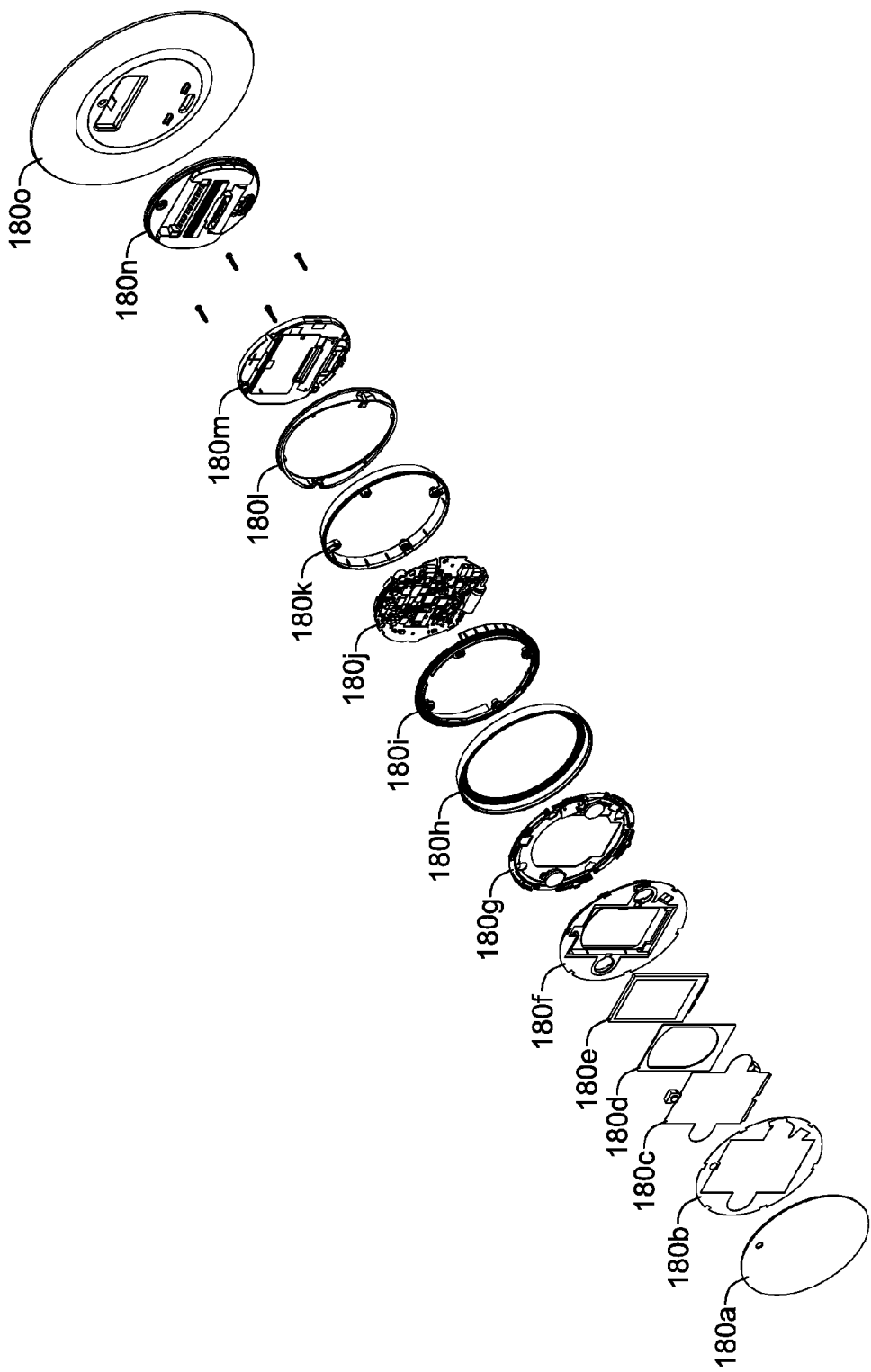
FIG. 5 is an exploded view of the illustrative HVAC controller of FIG. 4.

Within the following disclosure, non-limiting reference will be made to representative components of an illustrative thermostat illustrated in the exploded view of FIG. 5. The major subassemblies are identified generally as follows:

180a display window/mask
180b adhesive
180c capacitive touch element
180d display gasket
180e display
180f window support and IR sensor
180g button light guide assembly/dampener
180h turning ring and code wheel
180i sliding ring
180j printed wiring board (PWB)
180k back ring
180l light ring
180m case back
180n wall plate assembly/level/battery/PWB-2
180o mud ring Not all listed components will receive further detailed attention and not all components contemplated are illustrated in FIG. 5 which serves to indicate the relative locations of components of one illustrative embodiment. It will be appreciated that certain of the components may be omitted, combined, rearranged, or otherwise modified in other embodiments.

Figure 6A:
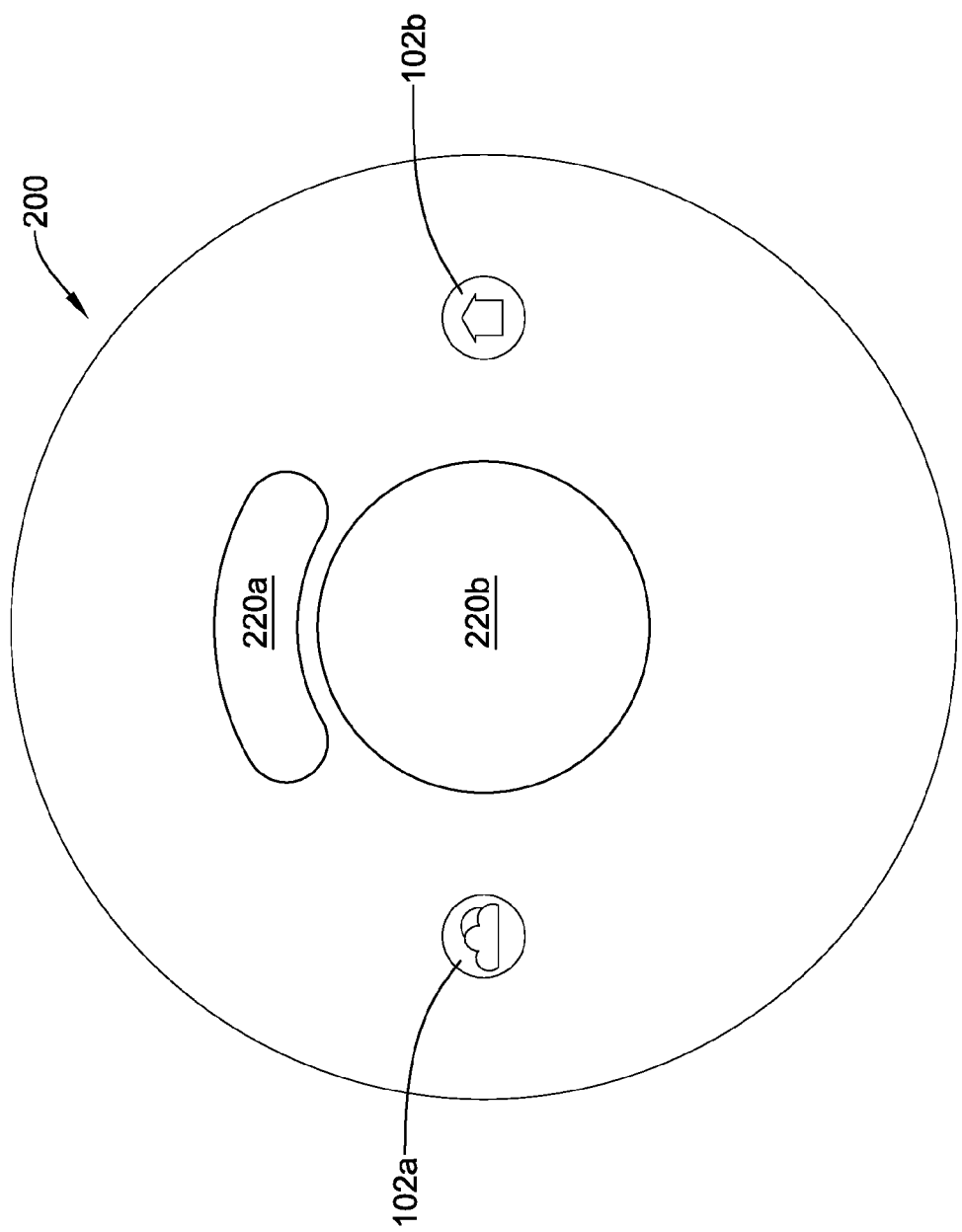
FIG. 6A shows an illustrative display window mask of the HVAC controller of FIG. 4.

In the illustrative embodiment of FIGS. 5 and 6A, related generally to display window 180a of FIG. 5, window display mask 200 of FIG. 6A may allow selected display components to be seen through the window display mask 200 to effect a uniform display appearance as well as to alter the apparent shape(s) of the elements of the overall display without requiring custom display elements. The display window itself may be fabricated from any convenient transparent material such glass, polycarbonate, acrylic, or the like. In one embodiment, the window display mask 200 is formed on the inner surface of the display window and is carefully registered with display elements of the thermostat. The window display mask 200 may be formed by conventional techniques and the opaque regions of the window display mask may be colored black, white, or other colors. In some embodiments, at least a portion of the window display mask may be formed of a material which is largely transparent when backlit and which presents a mirror finish when not backlit. In such embodiments, the portions of the window display mask which are formed of a material which is largely transparent when backlit may be confined to those portions of the window display mask which are not opaque. In certain embodiments, the material which is largely transparent when backlit may include a metallized layer which is substantially nonconductive to minimize interference with radio frequency communication between the thermostat and other components of the system. In certain other embodiments, the material which is largely transparent when backlit may be applied to the inner surface of the transparent material before the mask 200 is applied. This material may also be used as a component of an optical encoder associated with sensing motion and or position of a code wheel or turning ring (see 180h of FIG. 5), but this is not required.

Some portions and apertures 220a-b of the window display mask 200 may overlie a single display element, such as a rectangular color LED display 180e of FIG. 5, so that the user experiences that portion of the color LED display which is seen through aperture 220b as a circular screen element and experiences the arched aperture 220a as a separate arched display element or elements. It will be appreciated that the areas displayed through apertures 220a-b of the window display mask 200 may be further divided into visually distinct display regions such as three user buttons in the area of arched aperture 220a and/or lists in aperture 220b .It will further be appreciated that the visual information displayed within an aperture may change from time-to-time depending upon the state of the thermostat. For example, at a first time, the information displayed through aperture 220b may alternate between the current time and the current temperature. At a second time, the display may provide the current indoor temperature and the current set point through aperture 220b, if those temperatures differ. At a third time, the information displayed may include a list of options from which the user may select using a touch screen capability of the device. At a fourth time, the information displayed through the upper aperture 220a may represent an array of choices such system mode a setting of Heat, Off, Cool, and optionally may change to a centered indication of the selected choice at a fifth time. At a sixth time, the display through aperture 220b may indicate a portion of the pending changes to the list of set point options. Each of these as well as additional display options may be implemented in various embodiments. It will be appreciated that the circular aperture 220b and the arched aperture 220a configurations are only illustrative and non-limiting and may be replaced by more or fewer mask apertures, said apertures having any desired shape(s).

Similarly, certain display elements may be implemented as stencils 102a, 102b overlying a light source which back illuminates the stencil when the associated function is available and/or active and which is dark or grayed when the function is unavailable and/or inactive. Additional information may be conveyed by selecting from among multiple colored light sources. In the example shown in FIG. 6A, stencil 102a may overlie a touch-sensitive element such as capacitive touch-sensitive membrane to request local weather information and the information retrieved by the thermostat may be displayed with color coding of light displayed through the aperture or may be displayed in greater detail through the central aperture 220b. In some cases, one or both touch-sensitive elements associated, for example, with stencil areas 102a and/or 102b may cause one or more options to be displayed and/or selected on the portion of the display visible through aperture 220b.

Figure 6B:
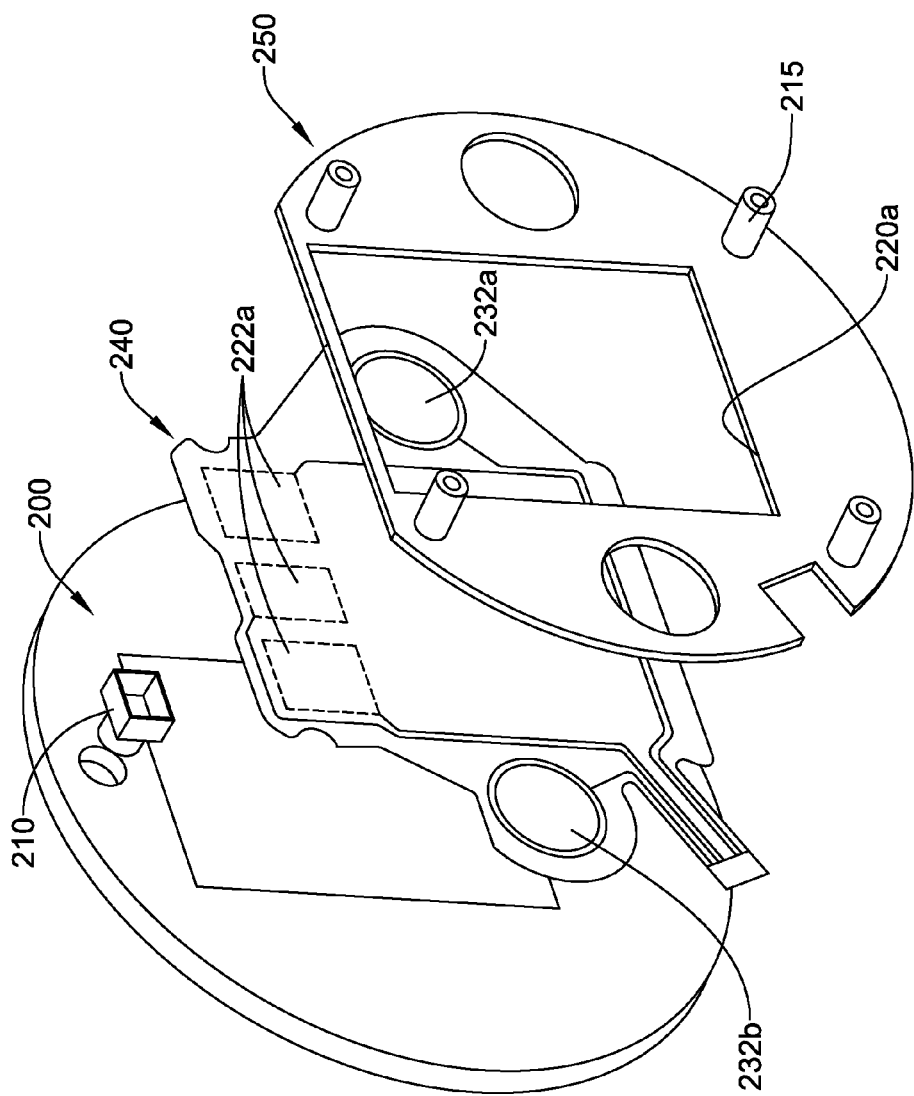
FIG. 6B is an exploded view of a portion of the illustrative HVAC controller of FIG. 4.
Figure 6C:
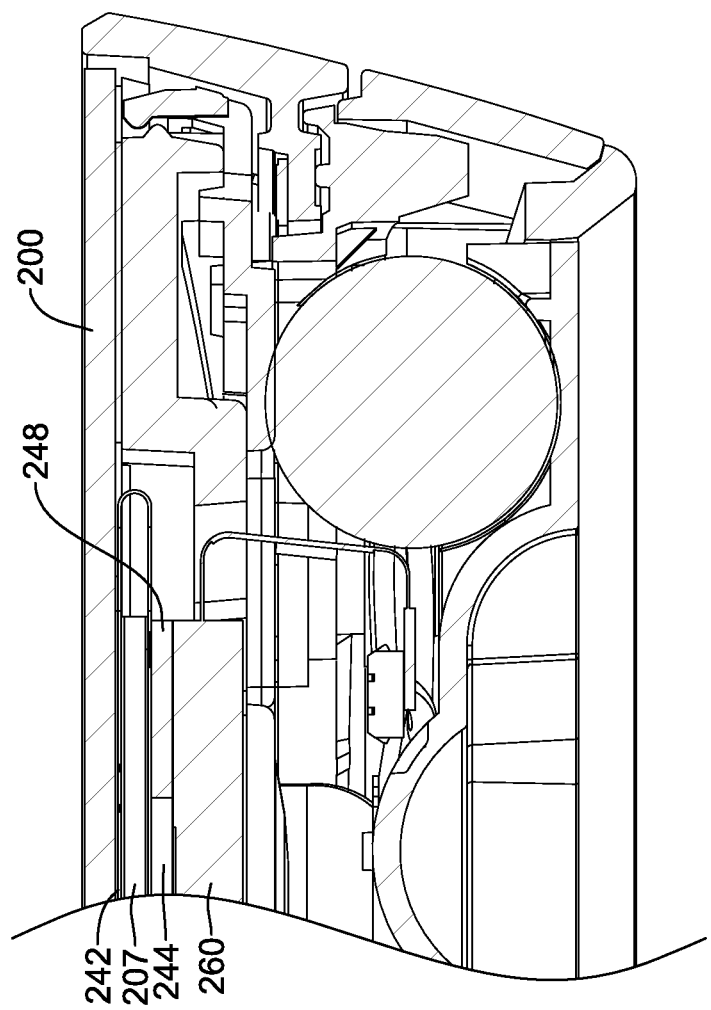
FIG. 6C is a cross-sectional view of the HVAC controller of FIG. 4 showing details of the assembly.
Figure 6D:
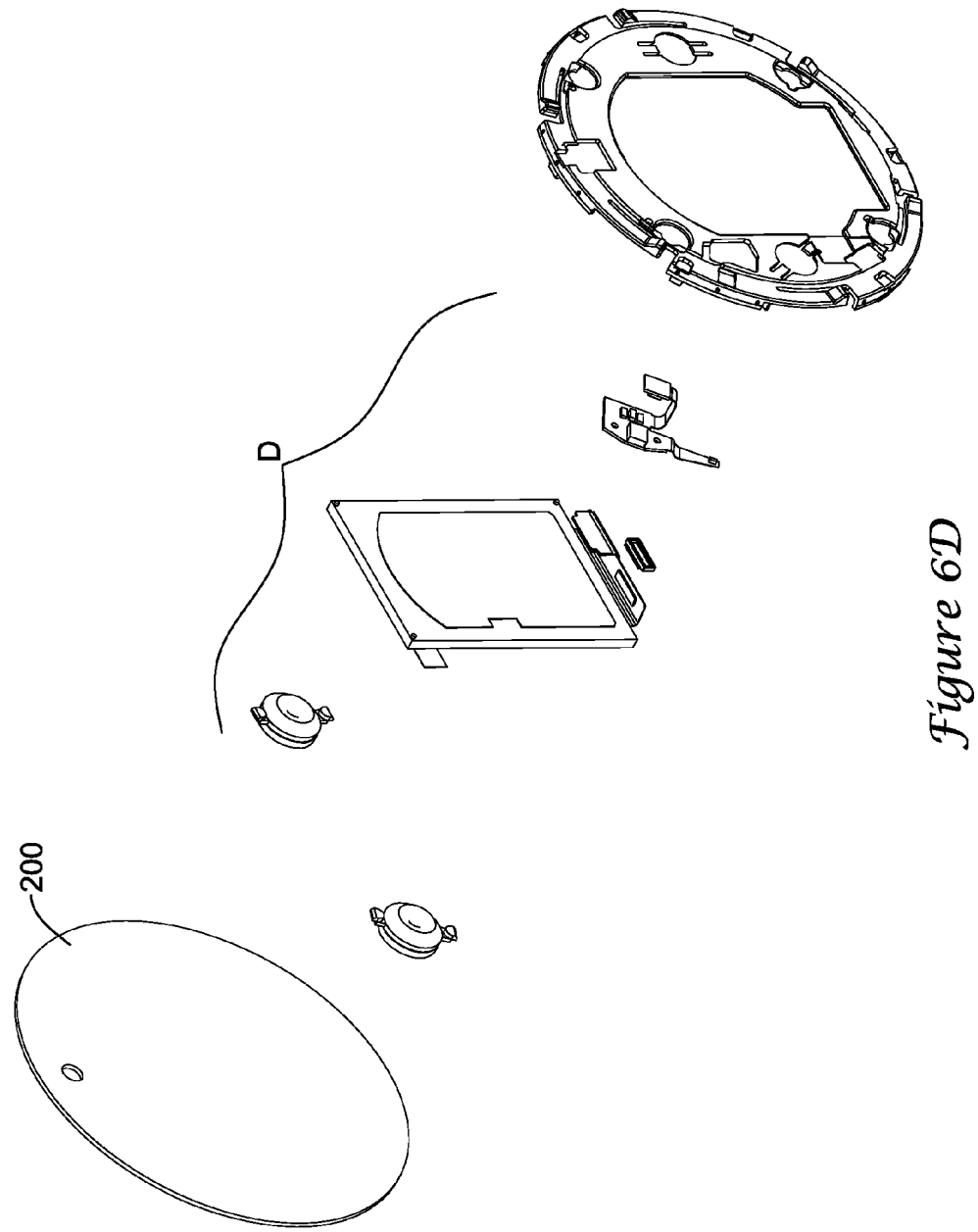
FIG. 6D is an exploded view of the HVAC controller of FIG. 4 showing a window and its relationship to other components.

Referring to FIG. 6B, the window and display mask 200 may be positioned relative to regions 222a, 232a-b (which are on the transparent touch-sensitive element 240, see subassembly 180c of FIG. 5), and are held in registry with the display (not shown in this figure for clarity) by an appropriate adhesive or other mounting fixture. In certain embodiments, an air gap 244 may be introduced between the front surface of the display and the back surface of the touch sensitive element 240 associated therewith by a perimeter spacer 248 (See FIG. 6C). The air gap 244 is believed to enhance the performance of the touch sensitive element 240 and also to help reduce radio frequency noise introduced into the touch sensitive element 240 by the display. The air gap 244 may be employed with or without a touch sensitive element 240 ground plane formed on the back surface of the touch sensitive element 240 and separated therefrom by a dielectric spacer 207.

Portions of touch-sensitive element 240 may be adhesively attached to the display and button light guide assemblies which are also coupled to window support 250 (see, FIG. 5, element 180f)). Aperture 220 in the window support 250 is aligned with touch sensitive button areas 222a and an upper portion of the display. Aperture 220 is also aligned with a touch sensitive region of the touch-sensitive element 240 and overlies a lower portion of the display. Stencil aperture 102a is aligned with a touch-sensitive region 232a and overlies an illumination source (not shown in this view). Similarly, stencil aperture 102b is aligned with a touch-sensitive region 232b and overlies an illumination source (not shown in this view). Window support 250 and adhesive (see, 180b of FIG. 5) may maintain the window and mask 200 in the desired relationship to other elements of the device and may include appropriate apertures for mounting the display and the illumination sources.

In some cases, a mask having generally the same apertures and visual features as described above may be formed on the outer surface of the window. The mask may be applied by any of the standard techniques including, but not limited to lamination or in-mold application. In this instance, other components of the thermostat may be attached to the inner surface of the window without adversely affecting appearance. For example, the molded window and associated mask 200 may include bosses 215 such as are shown in FIG. 6B. The bosses 215, like the window support 250 described above, may serve as an assembly framework which is configured to receive a stacked array of relatively stationary components of the thermostat. In some embodiments, the bosses 215 may be asymmetrically disposed and/or may differ in size or shape to help ensure that subsequently added components during assembly are assembled in the correct front side/backside orientation. In addition, one or more of the bosses may be tapered and/or stepped to ensure that the order of added components is correct during assembly. In certain embodiments, the inner surface of the window may be relieved, for example, to provide a thin section through which an IR sensor may view the room for occupant presence and/or motion with minimal attenuation of the signal by the material of the window when delivered to an optical element 210 that is associated with the IR sensor. In other embodiments, the window and mask may include an aperture that is in registration with an optical element 210 that is associated with an IR sensor.

In some instances, the programmable thermostat may be configured to become activated and powered when it senses the presence of a person in front of the programmable thermostat. This detection may be provided by a passive infrared sensor (PIR) and an associated optical element 210. The sensor may detect thermal radiation of a human body (5-12 micrometers-infrared area [IR]). The sensor may include two separate detector pads. A signal may be generated based on a time-based change of thermal radiation received by the two separate detector pads. When so provided, the IR wavelengths of interest are typically blocked by most common optic materials. One suitable material for an optical window and/or lens may be polyethylene (PE). Glass substantially blocks the wavelengths of interest and so glass windows may need to have an aperture to accommodate a proximity sensor and its lens.

A suitable lens, either positioned in the hole of a glass window or behind a thinned section of a window, may incorporate sloped front surfaces and a corresponding convex rear surface to impart a degree of directionality to the field(s) of view of the sensor. In some embodiments, the use of Fresnel lens designs may be desirable to increase the amount of IR energy which reaches the sensor. In certain embodiments, the light gathering surfaces may desirably differ in size to compensate for transmission differences to equalize sensitivity in different directions. While IR sensors are disclosed here as one example, it is contemplated that any suitable sensor may be used, as desired.

Figure 6E:
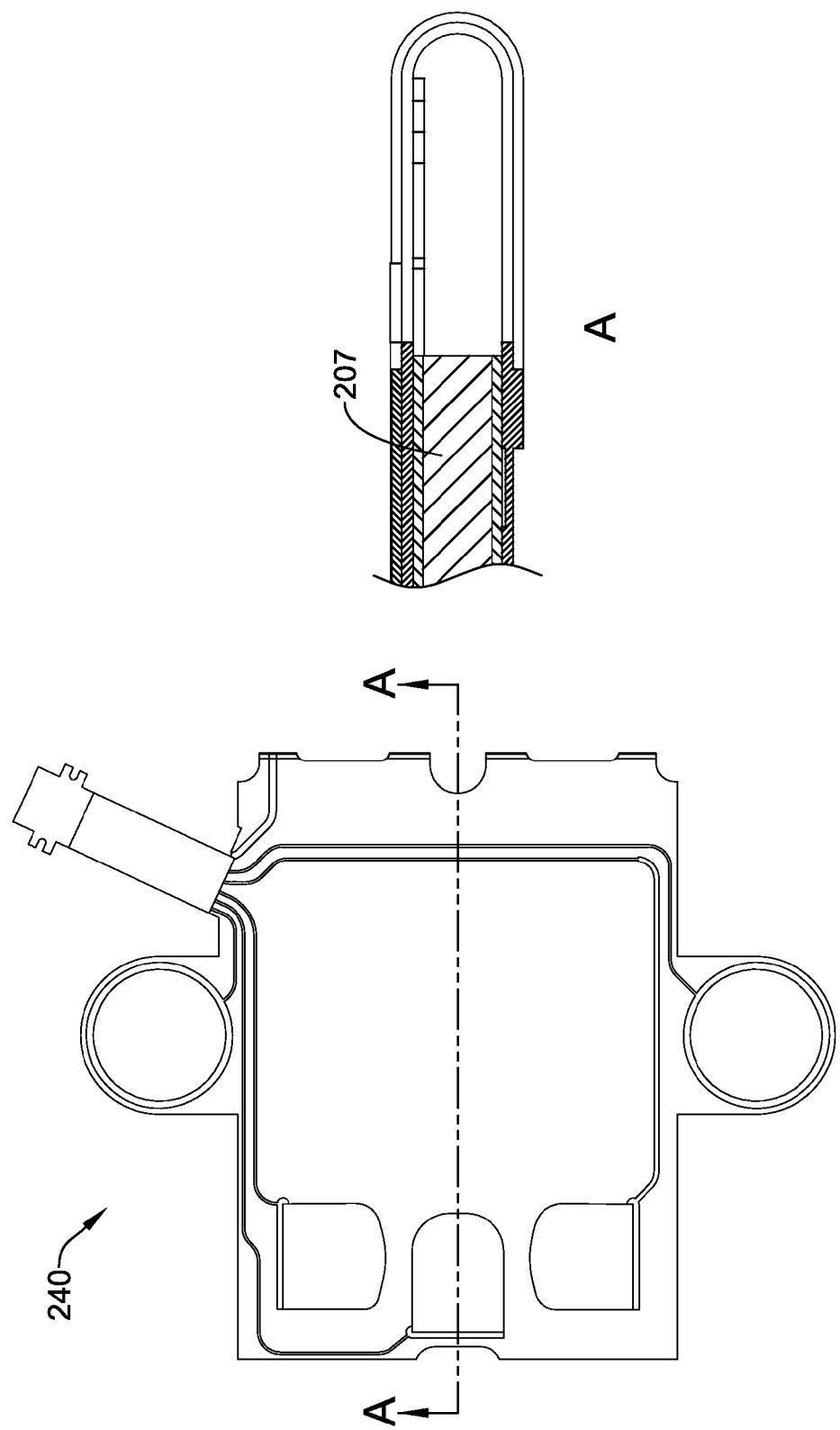
FIG. 6E shows an illustrative a touch sensitive element for use in the HVAC controller of FIG. 4.
Figure 6F:
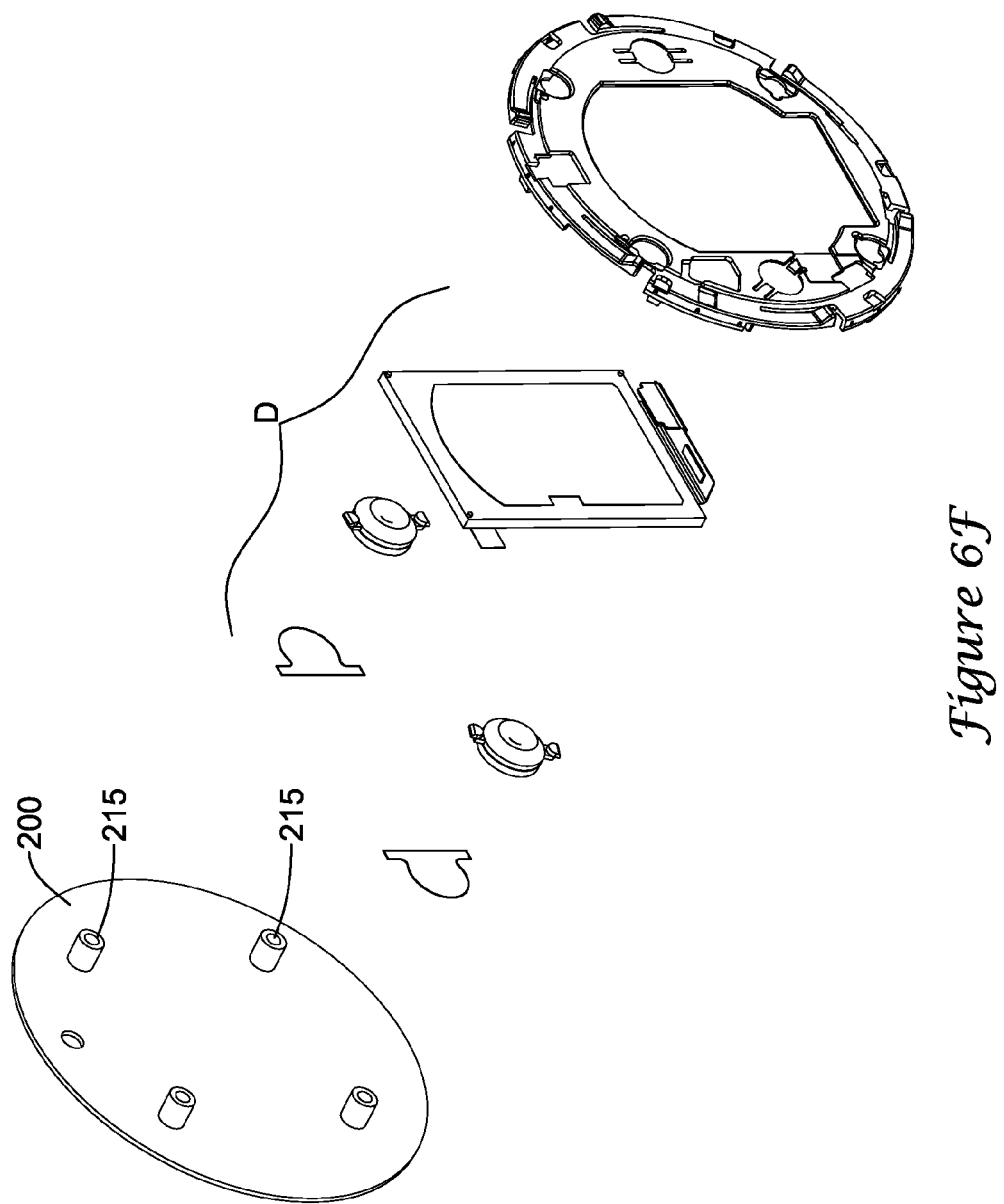
FIG. 6F is an exploded view of the HVAC controller of FIG. 4 showing an alternate window and its relationship to other components.

The capacitive touch element (or elements in some embodiments) may be adhered to the masked window 200 as shown in FIG. 6F. A display element group "D" may be located between the window and the button light guide assembly/dampener 180g which is positioned by the bosses 215. It will be appreciated that the touch sensitive element(s) of the thermostat may each be implemented as a separate element, or may be provided with two or more touch sensitive regions.

An illustrative multi-region touch sensitive assembly is shown in FIG. 6E. In the non-limiting example, the touch sensitive element may be formed from a piece of flexible printed circuit material, which is folded into a U-shape and adhered to opposite sides of a transparent dielectric spacer 207 as may be seen in enlarged detail A of FIG. 6E. A first half of the flexible printed circuit material may form a solid ground plane extending over substantially the entire surface of the dielectric layer 207. The second half of the flexible printed circuit material may form the capacitive elements of the touch sensitive assembly, which may serve as the functional buttons, as well as a generalized touch sensitive region associated with the active portions of the display. As mentioned earlier, the touch sensitive assembly may be adhered to the window and spaced a short distance from the face of the display to improve sensitivity and reduce noise.

Figure 7A:
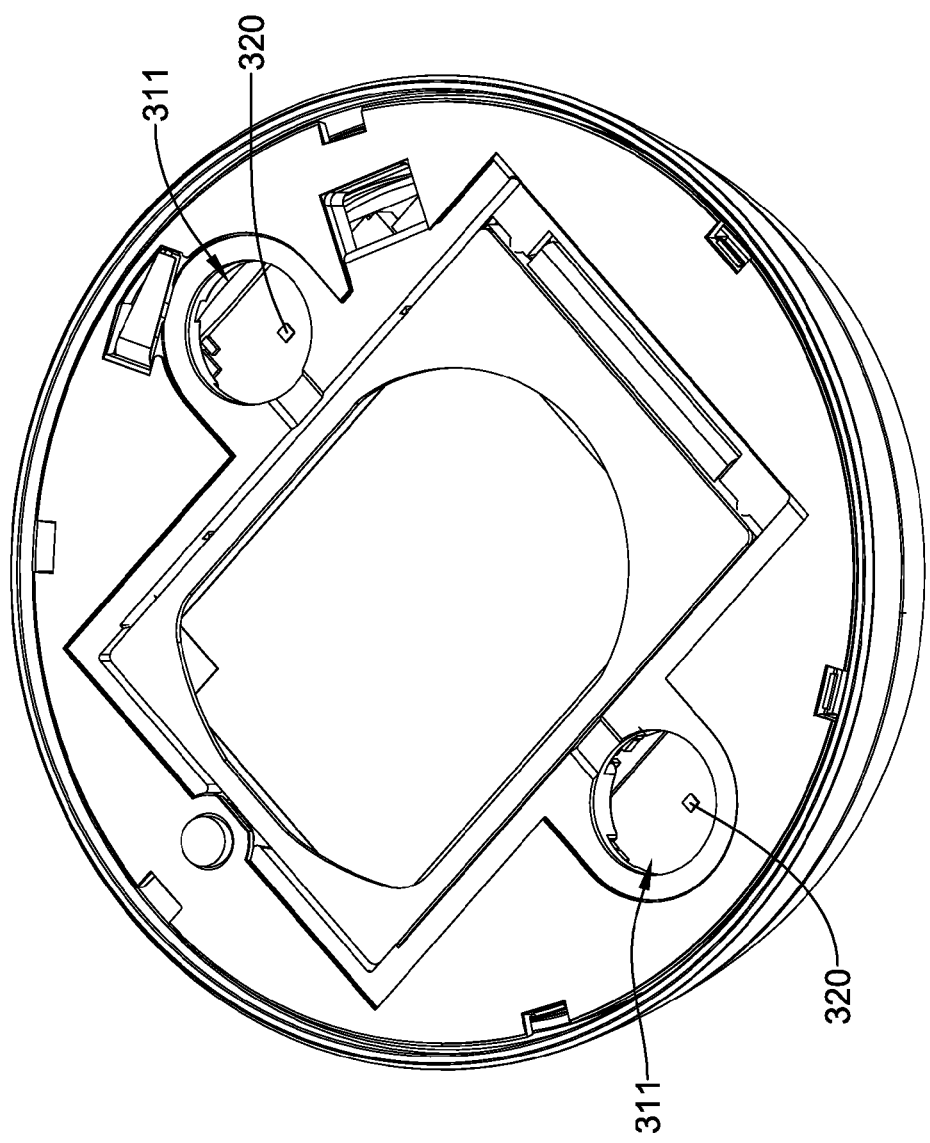
FIG. 7A is a perspective view of light sources for illumination of a window mask stencil region of an HVAC controller.

Backlights such as LED backlights may be used to illuminate the stencil apertures in the window display mask for window 180a of FIG. 5. In some cases, a three color LED may be mated with a custom lens and a diffuser to provide a relatively hot-spot free illumination from LED arrays mounted on a printed wiring board, 180j of FIG. 5. In one example, the area to be illuminated is 14 mm in diameter and is located 6 mm from the printed wiring board. As seen from the window side in FIG. 7A, lens 310 may be mounted to the window support 180f of FIG. 5 at locations 311 and over the LED(s) 320 on the printed wiring board. In some embodiments the lens 310 is combined with a diffuser 310a. An illustrative lens is illustrated in cross-section in FIG. 7B. The LED array (or single LED) may produce light with a distribution cone angle of about 120 degrees which generally corresponds to the desired light output angle from the system. An illustrative ray 330 has been traced through the lens and the diffuser 310a with a resulting output cone 340. Textured and non-textured diffusers formed from polyethylene terephthalate (PET), acrylics, or acetal, each with thicknesses between 0.17 millimeters (mm) and 1.7 mm, have been shown to be functional with good wide angle light output when the film is translucent and/or textured. In other embodiments, the lens 310 may be formed from a translucent or milky material thus combining the light capture/distribution functions with diffusive scattering.

Figure 7C:
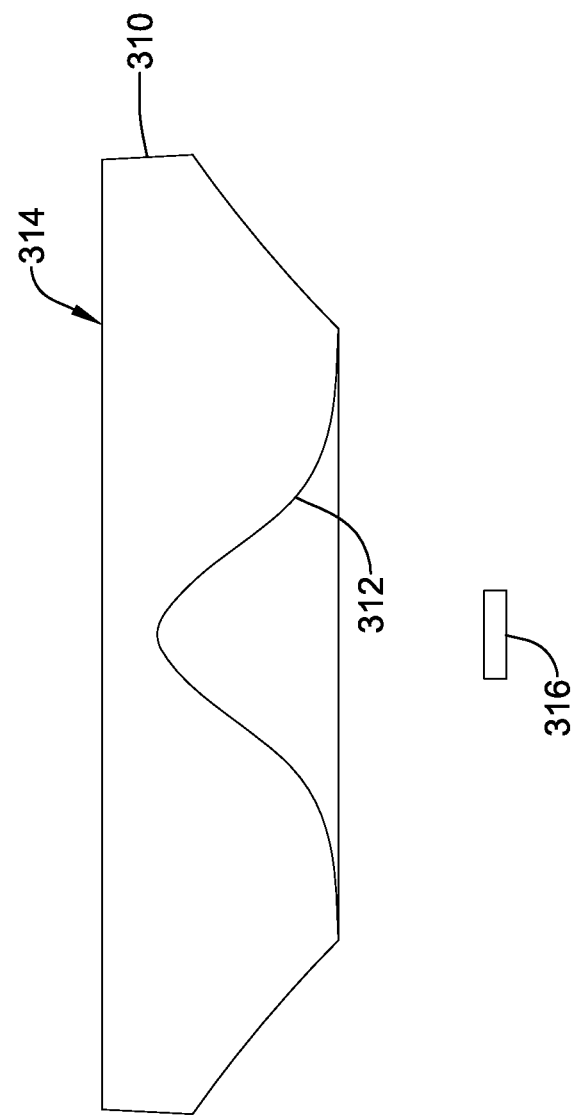
FIG. 7C is a cross-sectional view of an illustrative lens for illumination of a window mask stencil region of an HVAC controller and the spatial relationship between the lens and a light source.
Figure 7D:
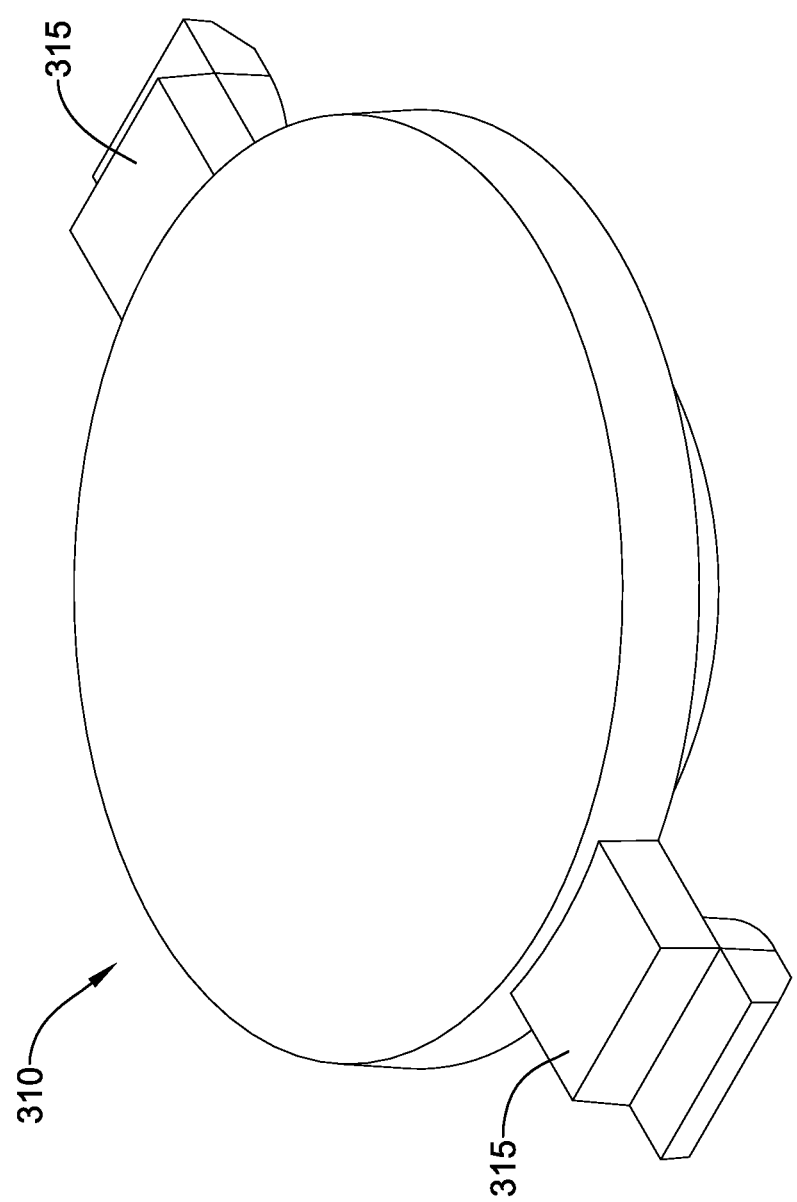
FIG. 7D is a perspective view of an outlet surface of a lens for illuminating a window mask stencil region of an HVAC controller.
Figure 7E:
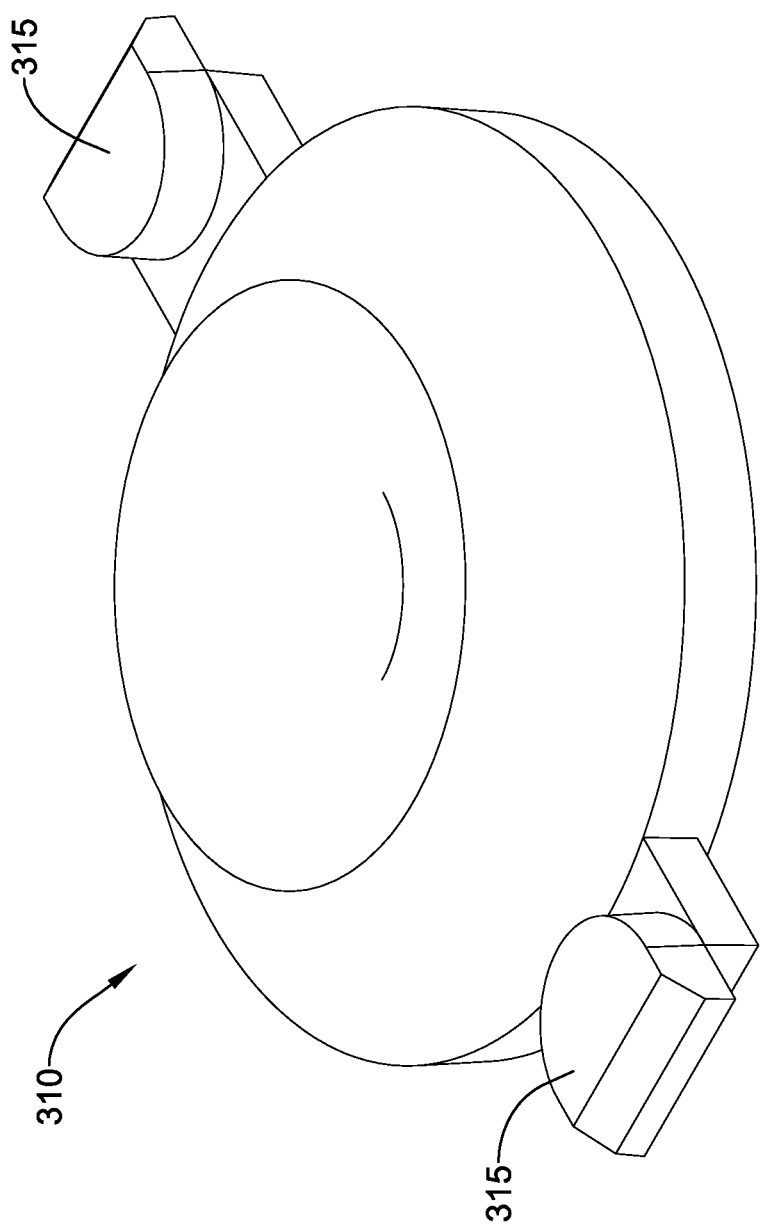
FIG. 7E is a perspective view of an inlet surface of a lens for receiving light from a light source to illuminate a window mask stencil region of an HVAC controller.

FIG. 7C illustrates a lens 310, shown in cross-section, which has an optionally surface-textured inlet surface 312 and an optionally surface-textured outlet surface 314. The position of the light source, such as an LED, is indicated by reference numeral 316. FIGS. 7D and 7E provide perspective views of an illustrative lens 310 output surface and input surface respectively, as well as the associated mounting structures 315. FIGS. 7F-7H illustrate various illustrative combinations of a lens 310 and a diffusion component 312. FIG. 7F shows a lens with a thick diffuser. FIG. 7G shows a lens with a thin diffuser. FIG. 7H shows a lens with an integral or combined diffuser.

For a thermostat, it is often important to have an accurate indication of the ambient air temperature surrounding the thermostat. However, in a thermostat that includes active electronics in a housing that has a sealed appearance, it can be difficult to position a temperature sensor within the device where the influence of internally generated heat is minimized and where motion of housing components does not complicate connecting the sensor to an appropriate PWB or daughter board. Of the available options in the illustrative design, the fixed window is an attractive locale. In some cases, a thermistor may be thermally bonded to the inside surface of the fixed window with a thermal grease to help overcome the variations in positioning which may result from the assembly process.

Figure 8A:
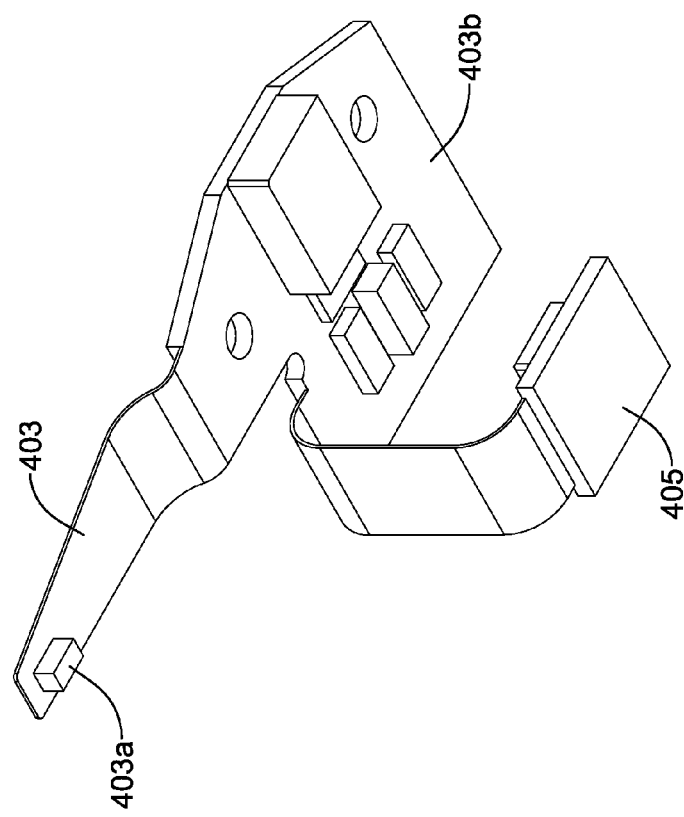
FIG. 8A is a perspective view of an illustrative thermistor mount of an HVAC controller.
Figure 8B:
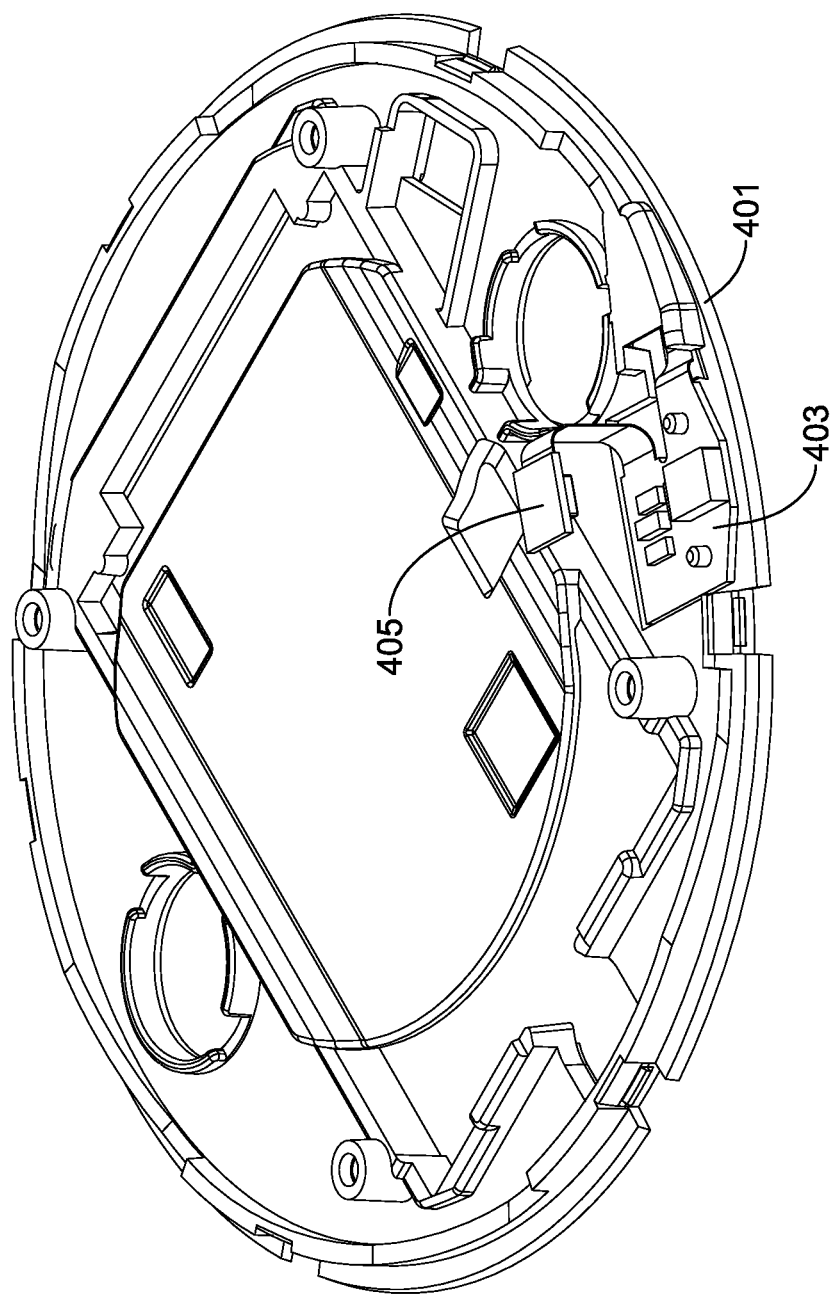
FIG. 8B is a perspective view of the position of the illustrative thermistor mount of FIG. 8A relative to a window support of an HVAC controller.
Figure 8C:
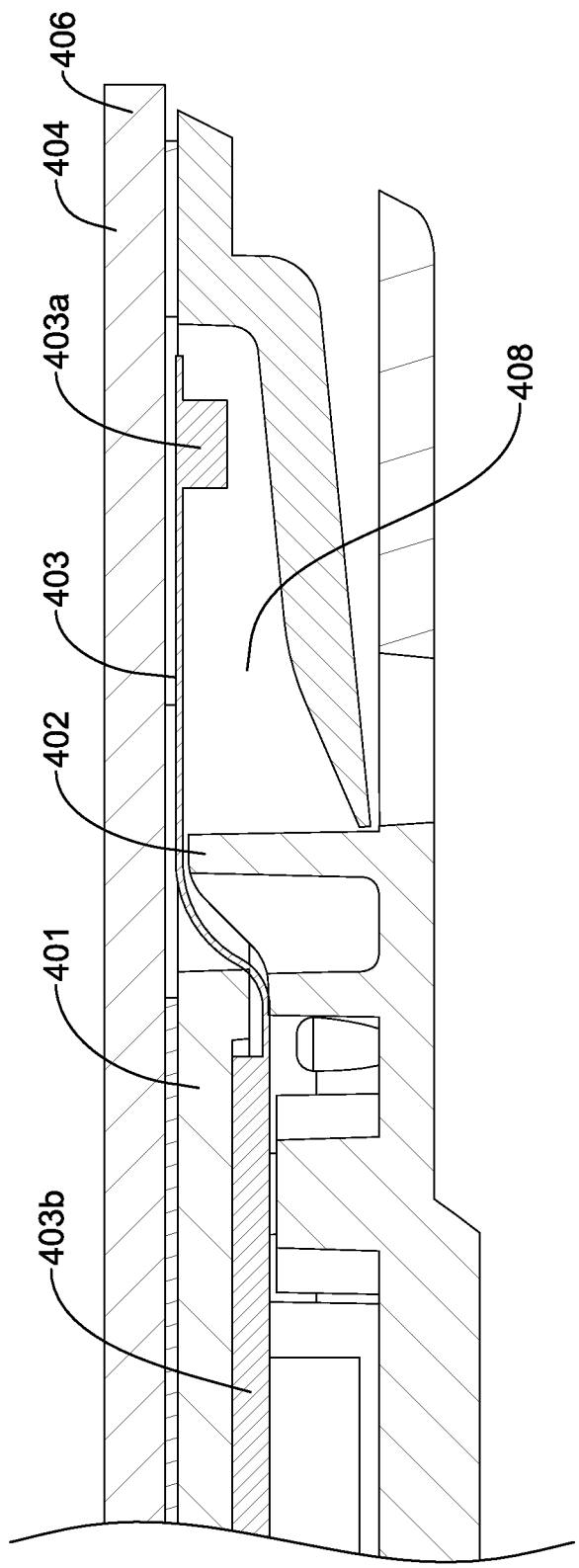
FIG. 8C is a cross-sectional view showing the position of the illustrative thermistor mount of FIG. 8A relative to additional components of an HVAC controller.

In some instances, a temperature sensor such as thermistor 403a is mounted on a flexible circuit member 403 (FIG. 8A) extending from daughterboard 403b, which is connected in turn to the printed wiring board 180j of FIG. 5 by connector 405 as illustrated in FIG. 8B. The daughterboard 403b may be mounted to window support 401 (see, 180f of FIG. 5) such that the circuit member 403, extending from daughterboard 403b, is inserted into an isolation pocket formed between window 404, the window support 401, and other internal structure(s) such as, for example dampener 402 as may be seen in FIG. 8C. In some embodiments, window 404 may be considered as providing an outer housing wall 406 such that a pocket 408 is formed behind the outer housing wall 406. Daughterboard 403b may extend beyond dampener 402 into pocket 408. Accordingly, and in some embodiments, thermistor 403a is thermally connected to outer housing wall 406 and is thermally isolated from the rest of the interior of the thermostat. It will be appreciated that the thermostat includes a plurality of heat producing components, and the thermistor 403a is positioned within pocket 408 such that thermistor 403a is isolated from the plurality of heat producing components.

In some embodiments, contacts between the pocket forming structures and the flexible circuit member 403 flex the flexible circuit member mounted thermistor 403a against the window 404, reducing or eliminating the need for manual positioning of a lead mounted thermistor 403a and the need for thermal contact grease. In some embodiments, flexible circuit member 403 is configured to provide a bias force toward a non-flexed state when flexed. In some embodiments, the bias force of flexible circuit member 403 biases the thermistor 403a against outer housing wall 406.

As indicated above, a rotatable ring may form part of the outer surface of the HVAC controller. In some embodiments, an optical encoder, such as a reflective optical encoder, may be employed to detect rotation of the rotatable ring.

In one example, a flange of the rotatable ring (see, 180*h* of FIG. 5) may be captured between a fixed sliding ring (see, 180*i* of FIG. 5) and a loading surface which includes 3 to 8 pressure applying paddles as components of the button light guide assembly (see, 180*g* of FIG. 5). Grease dots may be applied between the fixed sliding ring and the rotatable ring to provide a desired degree of drag while keeping the grease on the opposite side of the assemblies from the optical ring rotation encoder, if present.

Figure 9A:
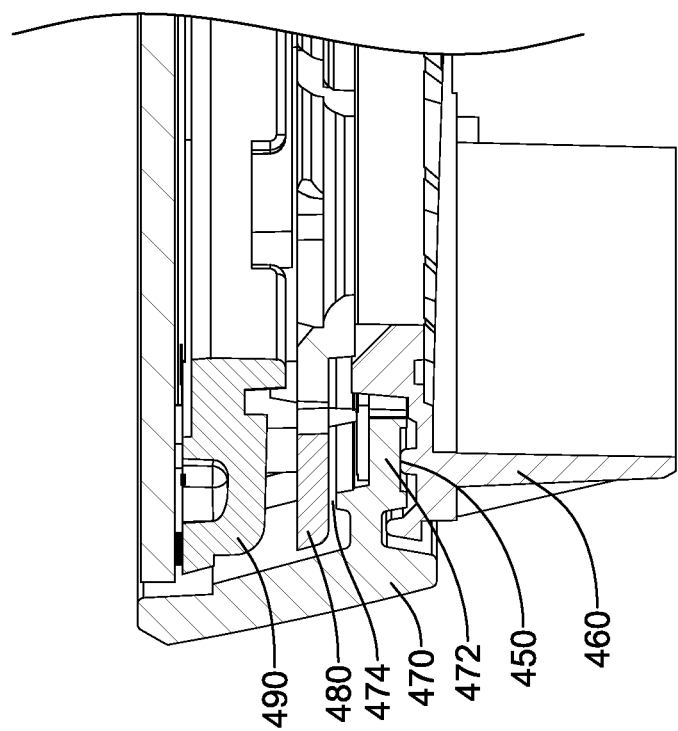
FIG. 9A is a cross-sectional view of an illustrative HVAC controller showing an illustrative rotational damping assembly.

One such example is shown in FIG. 9A. A flange 472 of a rotating ring 470 extends inward and rides against a fixed sliding ring 460, sometimes with grease 450 at the interface. In some embodiments, ridges and corresponding relief portions of the rings 460, 470 provide a labyrinth seal which helps confine the grease 450 to the desired sliding interface between the two rings.

Figure 9B:
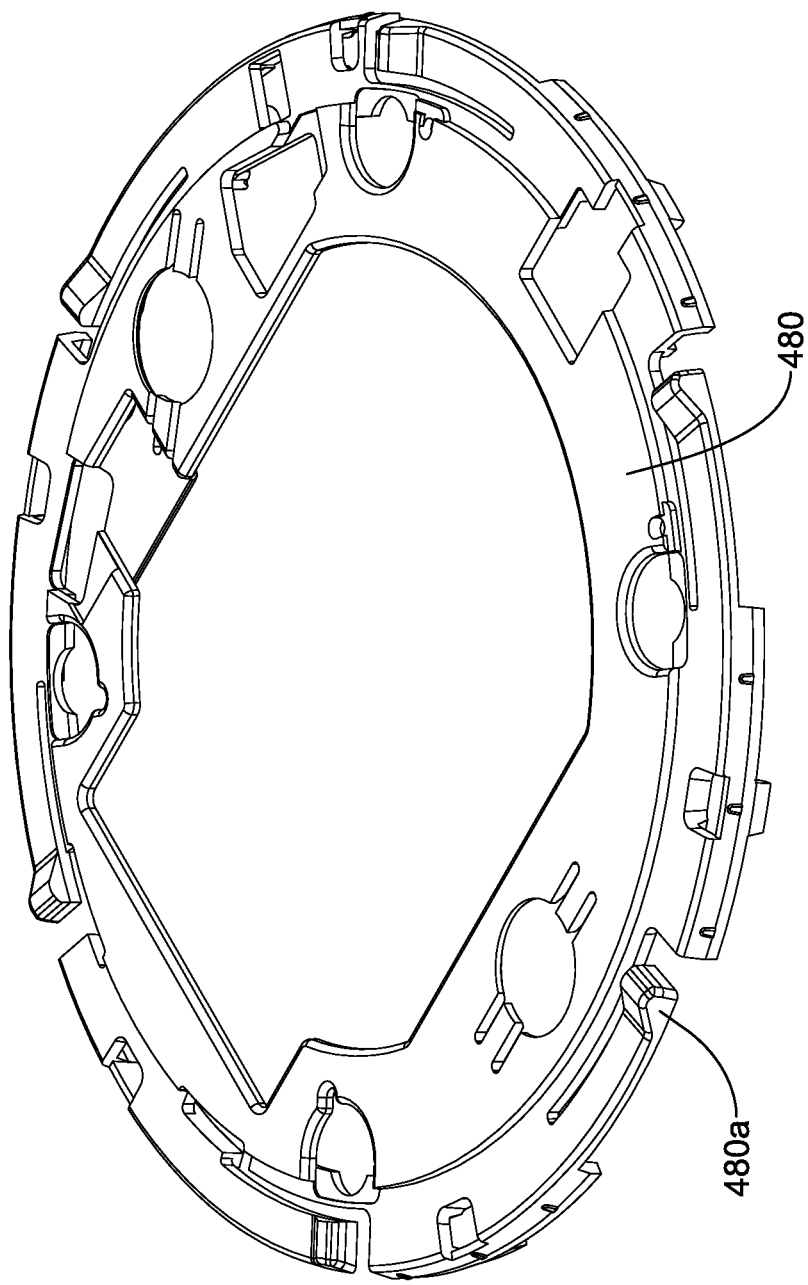
FIG. 9B is a perspective view of illustrative dampeners of the rotational damping assembly of FIG. 9A.

In the example shown, cantilevered dampeners 480*a* are positioned along the perimeter of button light guide assembly 480 and each dampener 480*a* applies a light pressure to a raised surface 474 of the flange 472 of the rotating ring 470. Although the deflection of the beams of cantilevered dampeners 480*a* is often sufficient to provide the desired pressure, it will be appreciated that in some cases, pressure may be supplied by, or supplemented by, wire springs, wound springs, sheet metal springs, a wave washer, and the like (not shown). In FIG. 9B, six illustrative cantilevered dampeners 480*a* are shown formed around the perimeter of the button light guide assembly 480 (see, 180*g* of FIG. 5). In some instances, the button light guide assembly 480 is conveniently mounted to trap the rotating ring 470 (omitted for clarity) between button light guide assembly 480 and fixed sliding ring 460.

Figure 10A:
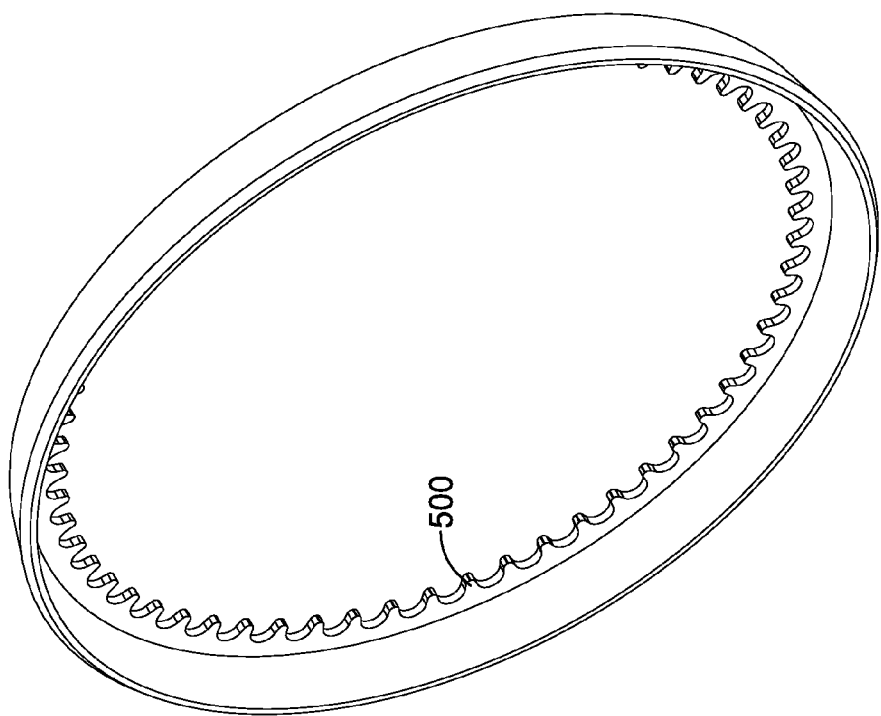
FIG. 10A is a perspective view of an illustrative code wheel or turning ring.

To sense the degree and direction of rotation of the rotating ring (see, 180*h* of FIG. 5), a surface of the rotating ring may be patterned, for example by metalizing, to provide a reflective code ring to be sensed by an optical encoder capable of sensing rotational increments as pulses or the like and further capable of sensing direction of rotation. In an alternate embodiment, the rotating ring may include a plurality of teeth distributed around an inner or outer perimeter thereof as in the form of a planetary, bevel, or ring gear adapted to mate with a complementary gear to drive an encoder which provides signals related to incremental rotation and direction. See FIG. 10 for a non-limiting example of a planetary gear 500 driving a spur gear 510, the shaft 520 of which may be coupled to an encoder (not shown for clarity). FIG. 10A is illustrative of a rotating ring adapted for use with the gear and encoder arrangement. Other encoding methods may be used. In some cases, the metalized pattern may not form a continuous conductive ring around the rotating ring to help minimize interference with radio frequency communication between the thermostat and other components of the building automation system. Such a construction may help RF communications between an external device and an internal antenna of the thermostat.

Figure 10B:
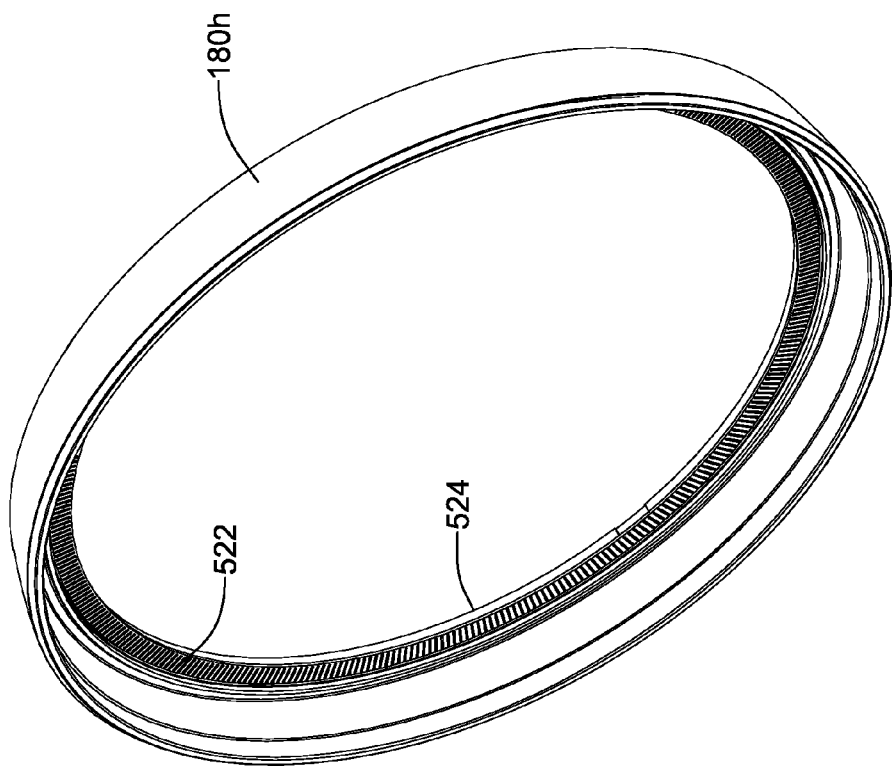
FIG. 10B is a perspective view of another illustrative code wheel with a reflective code mounted to an inner extending flange.
Figure 10C:
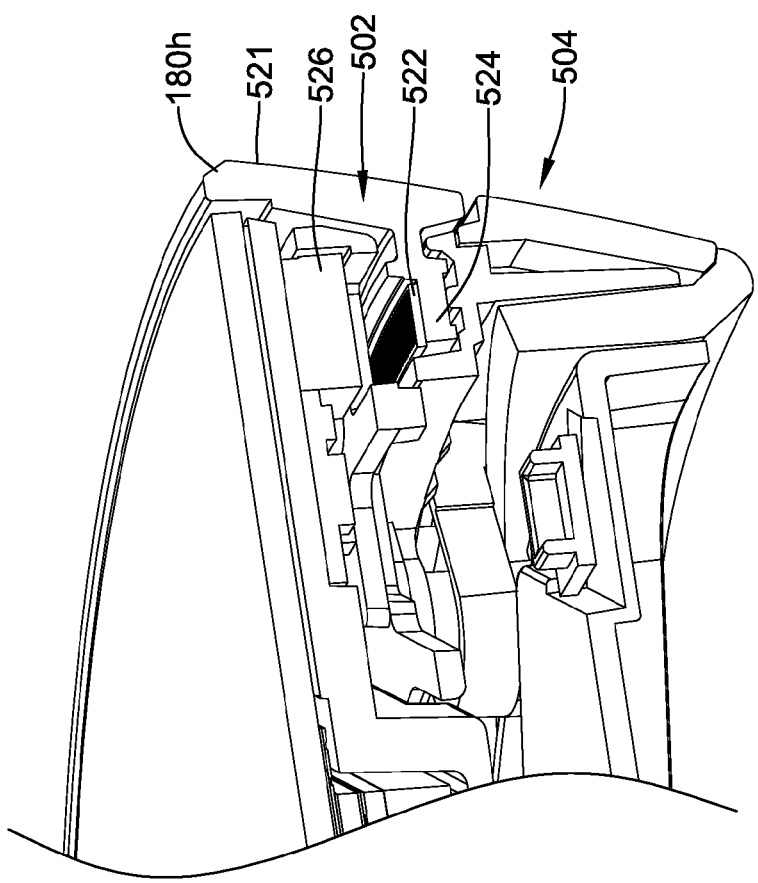
FIG. 10C is a cross-sectional perspective view of the illustrative code wheel of FIG. 10B mounted in an HVAC controller, such as the HVAC controller of FIG. 4.
Figure 10D:
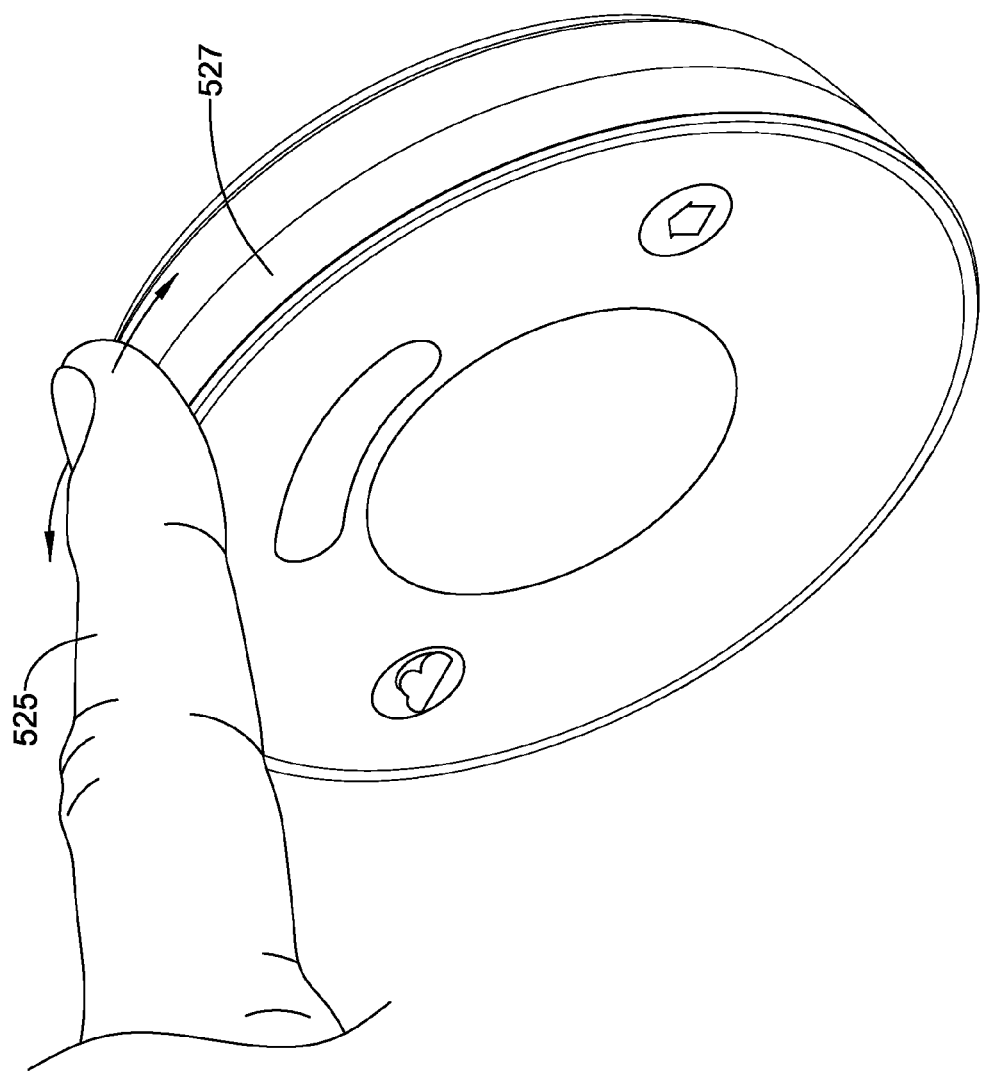
FIG. 10D is a perspective view of a user's finger turning an outer ring of an illustrative HVAC controller, such as the HVAC controller of FIG. 4.

FIG. 10B illustrates an illustrative code wheel 180*h* with a reflective code 522 mounted on an inward extending flange 524 of the code wheel 180*h*. FIG. 10C shows the illustrative code wheel 180*h* installed in an HVAC controller, such as the HVAC controller shown in FIGS. 4-5. In some embodiments, the code wheel 180*h* is a rotatable ring, and is disposed between a first stationary housing component and a second stationary housing component. For example, the first stationary housing component may include the button light guide assembly/dampener 180*g* (FIG. 5) and the second stationary housing component may include the sliding ring 180*i* (FIG. 5). It will be appreciated that either the first stationary housing component and/or the second stationary housing component may include one or more additional components in combination with the aforementioned button light guide assembly/dampener 180*g* and the sliding ring 180*i*. The code wheel 180*h* has an outer exposed surface that a user can use to rotate the code wheel 180*h*.

In some embodiments, the rotatable ring or code wheel 180*h* has a first side 502 and an opposing second side 504. In the example shown in FIG. 10C, the first side 502 of the code wheel 180*h* is configured to slide along a surface of the first stationary housing component and the second side 504 of the code wheel 180*h* is configured to slide along a surface of the second stationary housing component when the code wheel 180*h* is rotated. The first side 502 of the code wheel 180*h* includes an inward extending flange 524 that extends towards a rotation axis of the code wheel 180*h* and may be considered as having an encoded surface including a reflective code 522. In some embodiments, the reflective code 522 may be considered as facing towards a front of the thermostat, or away from a back of the thermostat.

The inward extending flange 524 may define an upward facing (in the illustrated orientation of FIG. 10C) surface that the reflective code 522 may be mounted on. It is contemplated that the reflective code 522 may be deposited, printed, adhered, etched or otherwise secured or formed on the upward facing surface of the inward extending flange 524. In some embodiments, the reflective code 522 may include a reflective repeating pattern that optionally varies with respect to rotational position on the encoded surface.

An encoder 526 is shown disposed over the inward extending flange 524 of the code wheel 180*h*. In some embodiments, the encoder 526 may be considered as facing towards the back of the thermostat, or away from the front of the thermostat. In some embodiments, the encoder 526 is an optical encoder. The encoder 526 is shown mounted above the upward facing surface of the inward extending flange 524 of the code wheel 180*h*. The encoder 526 may detect the reflective code 522 as the code wheel 180*h* is rotated by the user, and may output a signal that is indicative of rotation of the code wheel 180*h* that may be used as an input to the thermostat, such as to adjust a temperature setpoint or the like. In some embodiments, the output signal of the stationary encoder 526 indicates how far and in which direction the rotatable ring 180*h* was rotated by the user. It will be appreciated that in some instances, a user may rotate the rotatable ring 180*h* in order to instruct the thermostat to change a temperature setpoint. The user may rotate the rotatable ring 180*h* in a first direction in order to increase a temperature setpoint, for example, and may rotate the rotatable ring 180*h* in a second, opposite direction, in order to decrease a temperature setpoint.

In other embodiments, the encoding element providing the function associated with the rotating ring or code wheel 180*h* may be a capacitive or other touch-sensitive element. See FIG. 10D in which the movement of a user's finger 525 near or along an element of the perimeter of the thermostat is sensed to determine direction and degree of motion and encoded to acquire the input information. In such embodiments, a capacitive or other touch-sensitive element 527 with which the user interacts may, or may not, be configured to physically move while being manipulated. For example, in some instances, a capacitive or other touch sensitive element 527 may be configured to remain stationary to simplify the mechanical design of the thermostat, and to possibly improve reliability of the user interface of the thermostat. When so provided, a capacitive change may be caused by an interaction (e.g. touch or near touch) between the capacitive or other touch sensitive element 527 and a user's finger 525. This capacitive change may be correlated to a direction and degree of motion of the user's finger 525 along the capacitive or other touch-sensitive element 527, and thus correlated to a desired input of the user. In one non-limiting example, the relative and/or absolute position of the user's finger 525 may be detected by heterodyning the frequency of a fixed frequency oscillator with a variable frequency oscillator whose frequency is altered by changes in capacitance caused by changes in position of the user's finger along the capacitive or other touch-sensitive element 527.

In some instances, a turning ring or the like may be provided, and may present a desired mechanical feel such as a damped turning ring feel as discussed above with reference to FIG. 9. In some cases, such a rotating ring may be positioned adjacent to a capacitive or other touch-sensitive element 527. In some instances, the rotating ring may include one or more conductive elements that function similar to the user's finger 525 discussed above. That is, the one or more conductive elements of the rotating ring may be sensed (e.g. capacitively) by the capacitive or other touch-sensitive element 527.

In some instances, a rotating ring may include one or more magnets, and one or more stationary magnetic sensors may be used to detect the relative and/or absolute position of the rotating ring. In yet another example, the encoding function associated with a rotating ring or code wheel 180*h* may be provided by a rotational potentiometer or rotational capacitor, if desired.

In some instances, a rotating ring may be provided with markings along an inward extending flange 524. The markings may be part of a regular pattern, or may be random or pseudo-random. The optical encoder 526 may periodically capture an image of the markings. The optical encoder may then compare a previous image of the markings with a more recent image of the markings, and may determine movement (i.e. direction and displacement) of specific markings, and thus movement of the rotating ring. Such an optical encoder may be the same or similar to that used in many optical mice.

To help secure the thermostat to a wall mounting plate, it is contemplated that one or more magnets may be used. This may help provide a clean aesthetic appearance, sometimes without the need for protrusive latches or exposed screw heads/holes. Non-limiting illustrative embodiments of suitable magnetic mounts are illustrated in FIG. 11A-D. A thermostat 512 may be removably secured to a wall plate 533. The wall plate 533 may be secured to a wall. The thermostat 512 may include a controller housing 532 that is releasably securable to the wall plate 533. One of the controller housing 532 and the wall plate 533 may include a permanent magnet while the other of the controller housing 532 and the wall plate 533 may include a magnetically attracted material such that the controller housing 532 may be releasably secured to the wall plate 533 based, at least in part, upon the magnetic attraction between the permanent magnet and the magnetically attracted material. In some embodiments, the magnetically attracted material is a ferromagnetic material such as steel. In some embodiments, the magnetically attracted material is another permanent magnet. It will be appreciated that in instances employing two magnets, each magnet will be oriented to present an opposite polarity to its paired magnet in order to provide an attractive force.

Figure 11A:
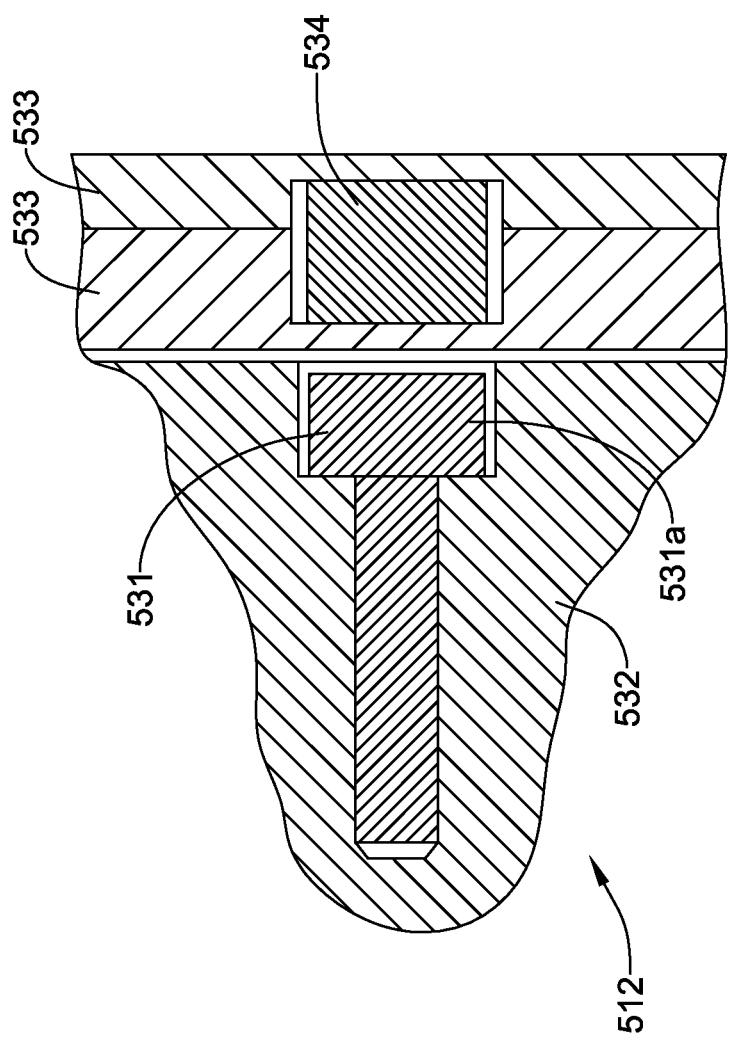
FIG. 11A-D illustrate several magnetic mounting configurations for mounting a thermostat housing to a thermostat mounting plate.
Figure 11B:
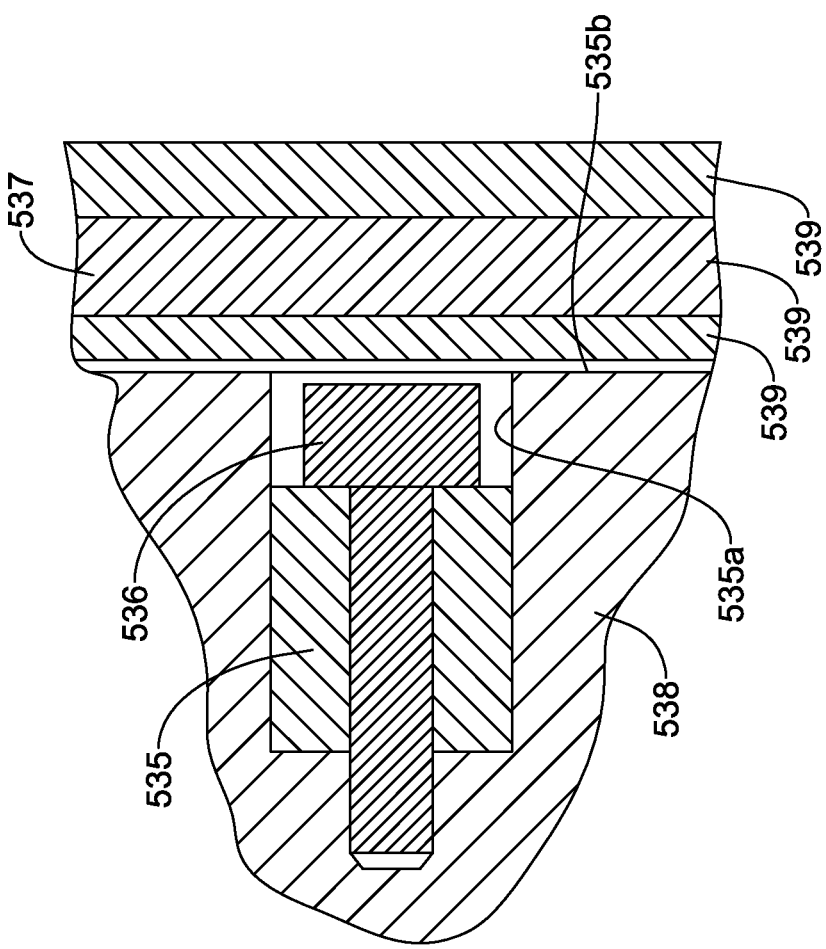
Figure 11D:
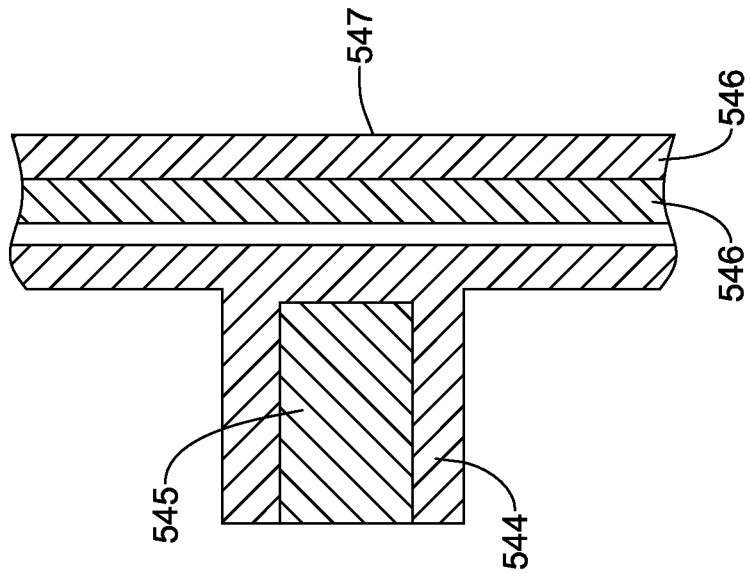
Figure 11C:
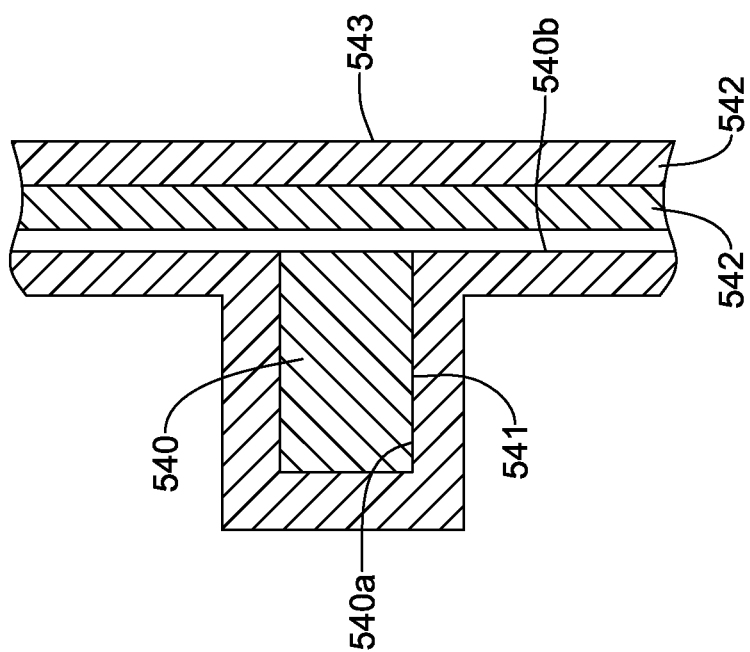

In the illustrative embodiment of FIG. 11A, the controller housing 532 includes screws 531 having a ferromagnetic head 531*a* which are attracted by a magnet 534 built into the wall plate 533. Other screws (not illustrated) may hold the wall plate 533 to the wall. In the embodiment of FIG. 11B, tubular magnets 535 are disposed within a recess 535*a* formed in a back surface 535*b* of the body of the thermostat 538 and are mounted about screws 536 in the body of thermostat 538 such that a magnetic circuit attracts a ferromagnetic plate 537 built into the wall plate 539. In the embodiment of FIG. 11C, a magnet 540 is pressed or glued into a pocket 540*a* formed in a back surface 540*b* of thermostat casing 541 and attracts a ferromagnetic plate 543 which is part of wall plate 542. In some embodiments, the magnet 540 is frictionally held within the pocket 540*a*, or with an adhesive. In the embodiment of FIG. 11D, a magnet 545 is placed in thermoplastic casing 544 and attracts ferromagnetic plate 547 which is a part of wall plate 546.

It will be appreciated that more than one of these embodiments may be present in any given thermostat/wall plate combination. In those embodiments which include more than one magnet, the ferromagnetic plate may interact with more than one magnet in the manner of a keeper. It will further be appreciated that in some embodiments (not illustrated separately), the magnet(s) may be associated with the wall plate and the ferromagnetic plate may be an element of the thermostat. In yet other embodiments, both the thermostat and the wall plate may contain magnets and those magnets may attract each other pairwise and/or may attract corresponding ferromagnetic elements in the opposed wall plate or thermostat. In addition to holding the thermostat to the wall plate, the magnetic interactions described may serve to properly orient the thermostat relative to the wall plate. Although the illustrated embodiments include single linear magnets, it will be appreciated that "horseshoe" magnets and magnet arrays may be used.

In some embodiments, there may be an alignment feature that is cooperatively formed between the wall plate and the controller housing. For example, the case back 180*m* (FIG. 5) and the wall plate 180*n* (FIG. 5) may, in combination, form an alignment feature. In some embodiments, the wall plate 180*n* includes a terminal block having a rectangular shape formed around the terminal block. Likewise, the case back 180*m* includes a portion that fits into the rectangular shape. This interaction helps properly align the case back 180*m* with the wall plate 180*n*.

Figure 12B:
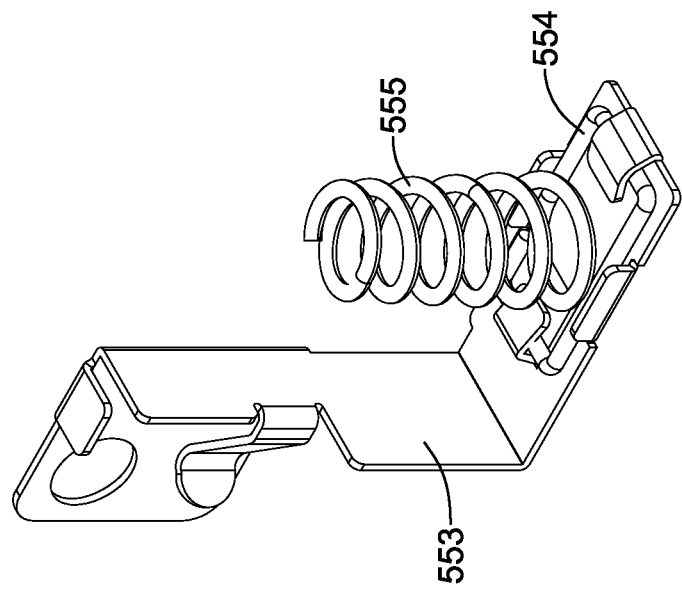
FIG. 12B illustrates an improved battery terminal.
Figure 12A:
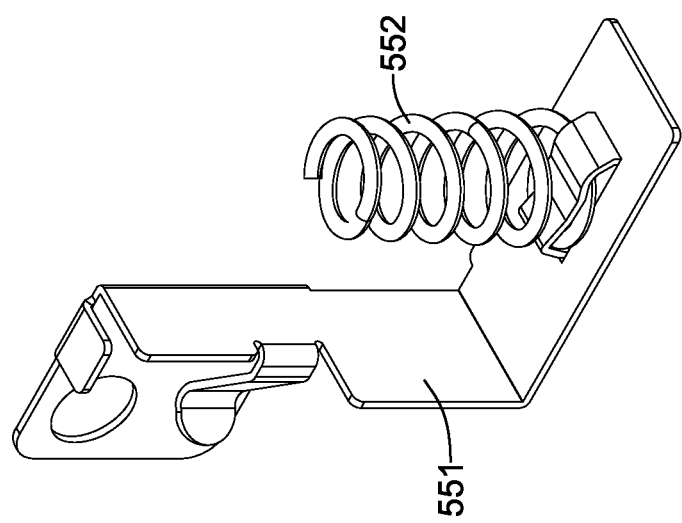
FIG. 12A illustrates a battery terminal of the prior art.
Figure 12C:
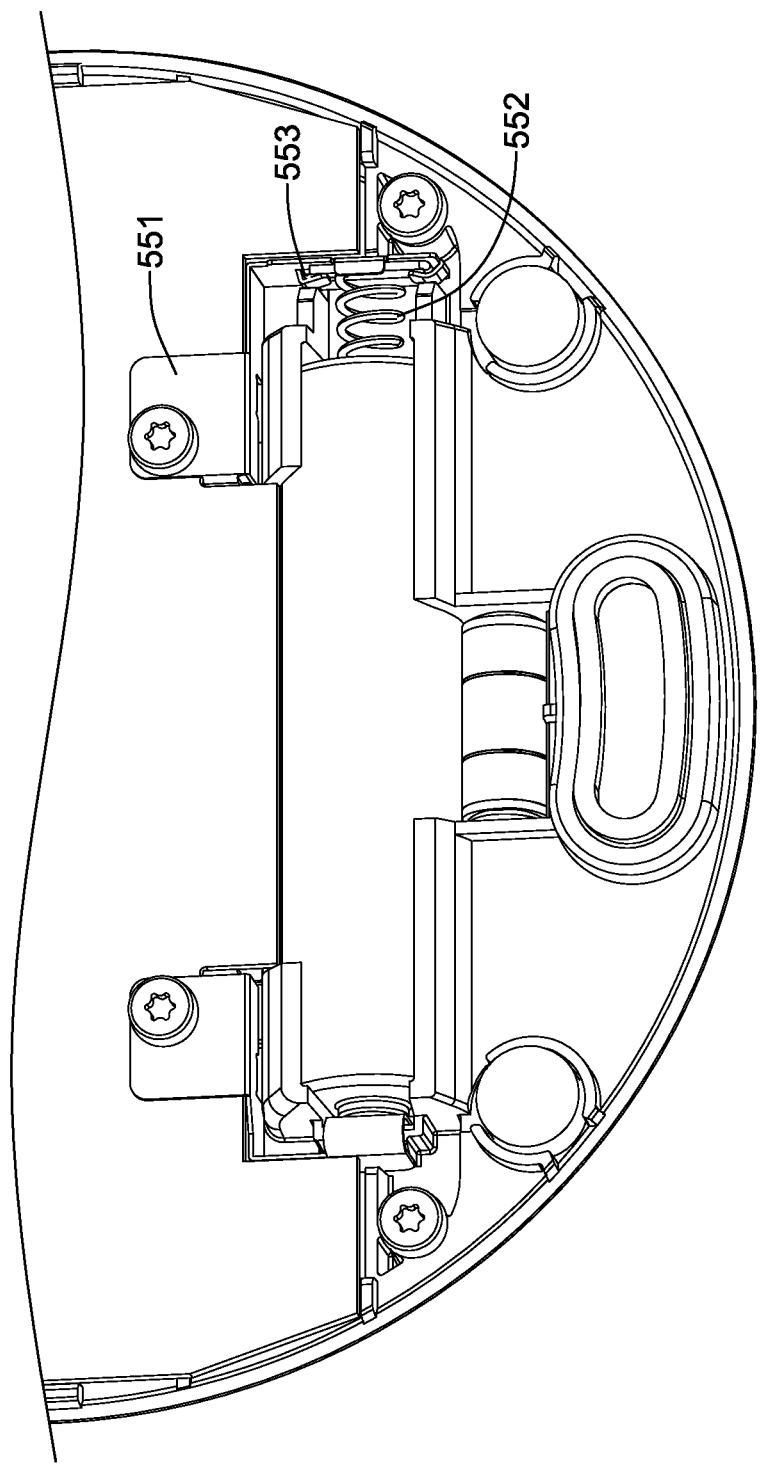
FIG. 12C is a perspective view of the illustrative battery terminal of FIG. 12B installed on a printed wiring board.

An improved battery terminal for a thermostat or other device is shown in FIGS. 12B-12C. In some instances, a thermostat may employ a user replaceable battery. Conventional coiled spring battery terminals must accommodate variations in battery length as well as provide for easy insertion of the battery into the battery holder. FIG. 12A shows a conventional coiled spring battery terminal secured to a base 551. When so provided, the coiled spring battery terminal tends to tilt undesirably as a result of the pitch of the helical spring 552 at the attachment to the base 551.

To help overcome this, and in some cases, a coiled spring battery terminal 553 may include an end that is bent into an extended planar base 554, which helps ensure that the coiled portion 555 of the coiled spring battery terminal remains oriented substantially perpendicular to the base to which it is attached. The extended base 554 of the coiled spring battery terminal 553 may be secured to a base plate by crimping, welding, soldering, and/or the like. In some embodiments, the extended base 554 of the coiled spring battery terminal 553 may be substantially rectangular as shown in FIG. 12B, while in other embodiments, the extended base 554 may be round or have the form of a polygon. A device employing the improved battery terminal is illustrated in FIG. 12C. The improved battery terminal base 553 may be attached to the printed wiring board (see, 180*j* of FIG. 5) by any mechanism including screws, rivets, adhesives, clips, and the like. In some instances, the attachment may provide an electrical connection between the battery terminal and the printed wiring board. In certain embodiments, the battery holder may position the battery at least partially within the plane of the printed wiring board, but this is not required.

Figure 13:
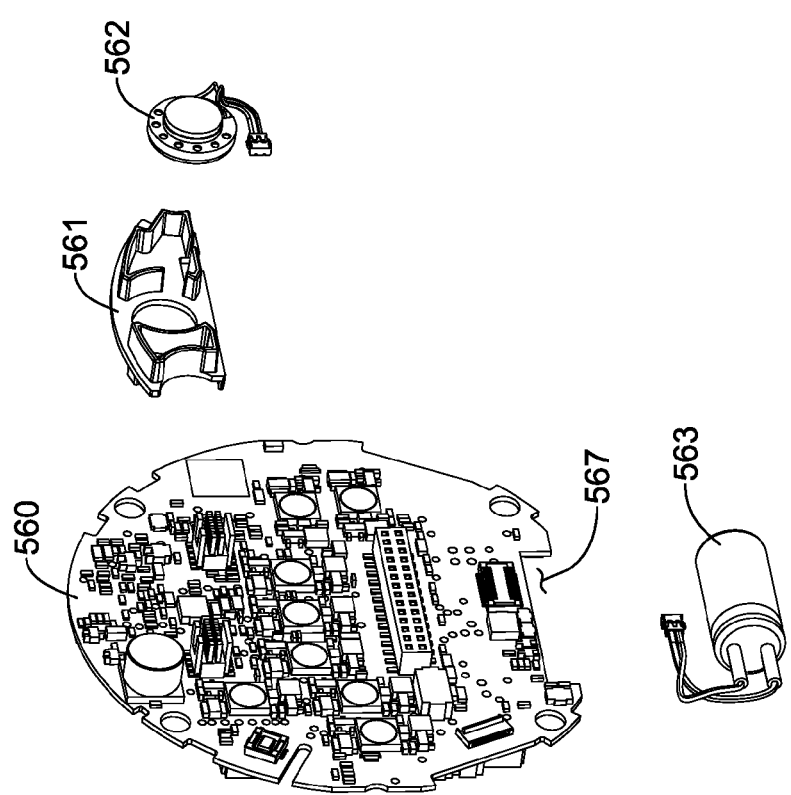
FIG. 13 is a perspective view of an illustrative mounting arrangement for certain components of a printed wiring board of an HVAC controller, such as the HVAC controller of FIG. 4.

Greater ease of assembly and overall reduction of thermostat thickness may be attained by proper location of parts with regard to the printed wiring board (see, 180*j* of FIG. 5). For example, a supercapacitor 563 used to maintain electrical power to the thermostat in the event of a power failure and/or battery failure, often is manufactured with leads extending from an end face thereof. Accordingly, mounting a supercapacitor 563 directly to the printed wiring board 560 may cause the supercapacitor 563 to extend away from the plane of the printed wiring board to an undesirable degree or may require the use of a daughterboard mounted at right angles to the printed wiring board which requires undesirable assembly costs. In addition, a supercapacitor 563 often is somewhat sensitive to heat damage when soldering is used to directly attach the supercapacitor 563 to a printed wiring board 560 or daughterboard. These problems may be addressed by positioning the supercapacitor 563 at least partially within the plane of the printed wiring board 560 and connecting the supercapacitor 563 to the printed wiring board 560 with wire leads and an optional connector as best shown in FIG. 13. In FIG. 13, the supercapacitor 563 may extend at least partially into relief 567 that is located along the bottom of the printed wiring board 560.

A similar problem related to mounting a speaker 562 without suppressing sound generation and without damaging the speaker 562 during a soldering operation may be addressed by mounting speaker 562 on a carrier 561 which is, in turn, mounted to the printed wiring board 560, and by connecting the speaker 562 to the printed wiring board 560 with leads as also shown in FIG. 13.

In some instances, a thermostat may employ an illuminated light ring element (see, 180*l* of FIG. 5), which in some cases can be used to indicates a current operating condition of the device, for example: heating equipment on, cooling equipment on, or neither heating or cooling equipment on. Each operating condition may be indicated by the display of a different color, which may be augmented by other audio and/or visual cues, if desired. In one example, colored lighting presented on the device front panel and from the device back side may be coordinated to indicate the current operating condition. For example, matching front and back side illumination may be orange to indicate that the heating equipment is currently activated, blue illumination may indicate cooling equipment is currently activated, and the absence of illumination may indicate neither the heating equipment or cooling equipment is activated. These visual indications may be further supplemented and reinforced by the display of, for example, a distinctive colored icon such as an (orange) sun when heating and a (blue) snowflake when cooling, and/or by projecting an appropriate color light from the illuminated ring out along the back side of the thermostat onto an adjacent wall or mud ring. In certain embodiments, the color-keyed display features may persist if external power is available, and optionally may fade to a lower brightness level after a pre-determined duration. When external power is not available, the display brightness and duration may be diminished or even eliminated quickly. In such low power consumption circumstances, illumination may be confined to one of the window feature(s) and the illuminated ring element near the thermostat base.

In an illustrative embodiment, orange is used to indicate heating operation, and may be represented by an orange temperature set point, an orange sun icon, and an orange light ring or halo around the device's base. Blue is used to indicate cooling operation and may be represented by a blue temperature set point, a blue snowflake, and a blue light ring around the device's base. When neither heating nor cooling is on, the word Off may be displayed on the front display.

A user can press anywhere in the area designated for the color temperature set point and color icon to select among the three operating modes. Once pressed, the temperature set point disappears and is replaced by the icons for the three selectable modes—a sun for heating mode, a snowflake for cooling mode and Off for an off mode. There may be an audio cue along with visual indication(s) to indicate to the user that the thermostat is now in a mode selection state. The currently selected mode will be displayed in color while the two non-selected modes may be grayed out. The user can select a new mode, or return to the current mode, by pressing one of these three options. The currently selected option may then be display in its designated color. At the center of the display, the actual temperature may disappear and may be replaced by visual and/or written cues that provide further an explanation of the currently selected mode.

By pressing the mode a second time, the user confirms that they want the device to switch to that mode. This mode choice can be confirmed after a short period of touch-press inactivity. There may be audio cues associated to the initial selection and confirming button press actions. When the mode is confirmed, the two grayed out mode options may disappear. For heating and cooling operation, the associated temperature set point may appear in its designated color, alongside the matching colored icon for the selected mode. The device's light ring may also change to that color for a short period of time. This reaffirms to the user that the mode has been locked into this particular operation. If the heating or cooling equipment turns on, the colored icon for that mode may animate in a way that indicates to the user that the heat or cooling equipment is on. For example, the temperature and/or the appropriate heat/cool icon may appear to shimmer. Also, the device's light ring may illuminate with the corresponding color. For the Off mode, the user does not have a temperature set point being controlled to, and thus it does not appear. The word Off remains while the grayed out snowflake and sun disappear. The device's light ring may not illuminate in the Off Mode.

The light ring may be implemented as a circular light guide. In some cases, the light ring may direct light along a defined strip that extends around at least a majority of the perimeter of the device housing. In some cases, the defined strip is on the front face of the device that is facing away from the all. In other cases, the defined strip may extend along the side wall of the device, wherein the side wall extends from the front face back toward the wall. In yet other cases, the defined strip may be on the back face of the device and may project light toward the wall to light up the wall, sometimes forming a light halo around the device.

Light extraction from the light guide may be tailored to provide a uniform glow around the perimeter without significant bright or dark spots or, if desired, may be patterned.

In some cases, light sources that illuminate the light guide may be LEDS, including three color devices to allow custom color mixing under program control. Although a default color scheme has been described above, it will be appreciated that other color schemes may be employed and, in some embodiments, may be user specified.

Figure 14A:
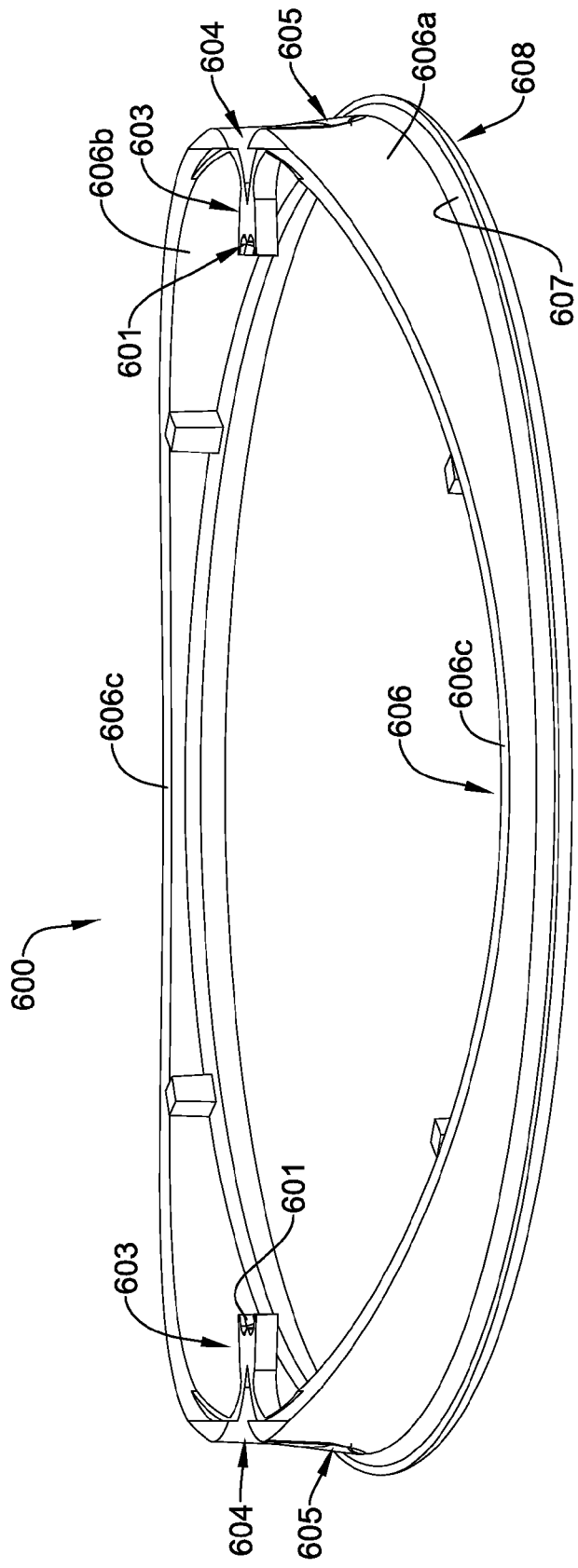
FIG. 14A is a perspective view of an illustrative light guide ring for an HVAC controller, such as the HVAC controller of FIG. 4.

An illustrative light guide 600 is illustrated in FIG. 14A, corresponding to element 180*l* of FIG. 5. In some embodiments, as illustrated, the light guide 600 has an annular shape that partially fits within the housing of the thermostat and partially extends outside of the housing of the thermostat. With particular reference to FIG. 5, it can be seen that the light guide 600 has an annular shape that fits within the back ring 180*k*. In some embodiments, a bulk of the light guide body 606 (discussed below) fits within the back ring 180*k* while the output section of the light guide 600 extends to a radial position about equal to an outer surface of the back ring 180*k*.

The illustrative light guide includes two shaped light input pockets 601 adapted to capture light from a light source (not illustrated in FIG. 14A) which allows the light guide to project light of desired colors onto a wall or mud ring to which the thermostat is mounted. In some embodiments, the light input pockets 601 may include a compound curved surface 601*a* (FIG. 14B), as illustrated, that faces the light source. In some embodiments, at least a portion of the light source may be positioned within the light input pockets 601.

Figure 14B:
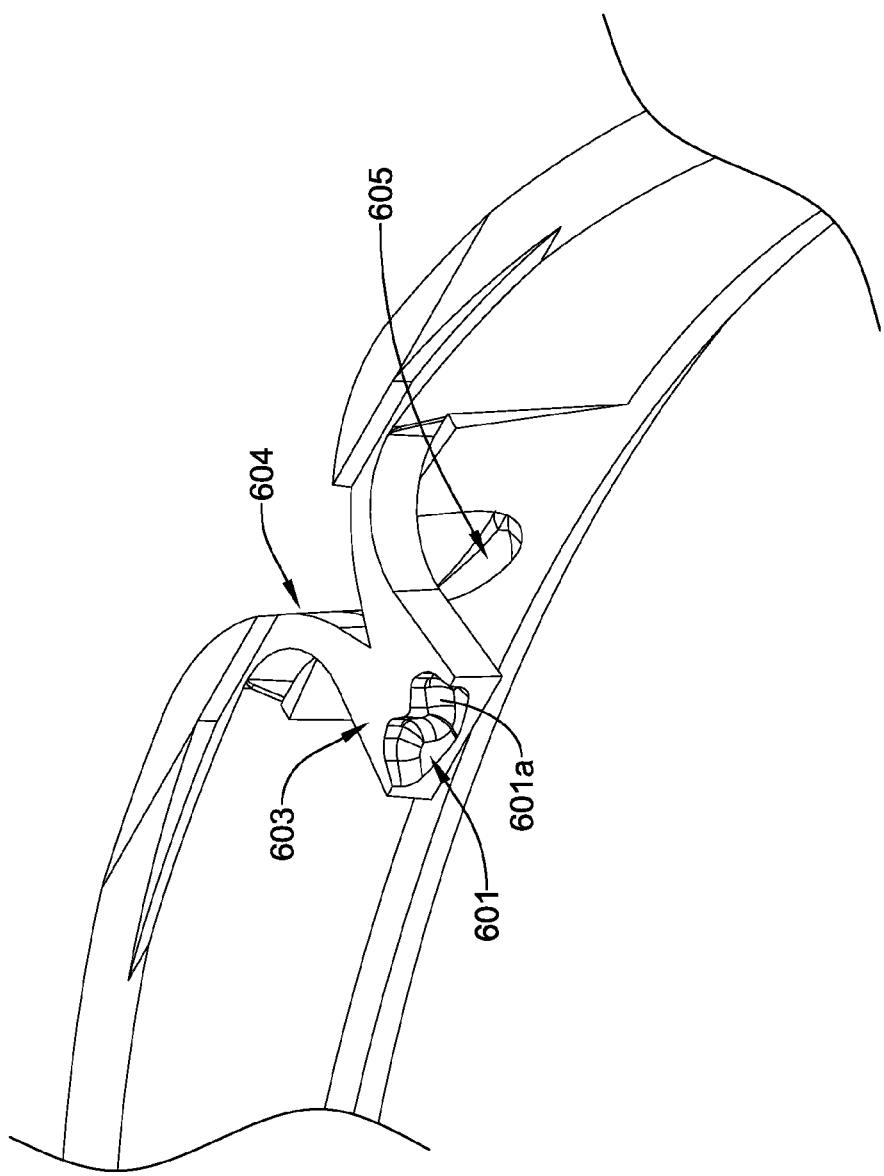
FIG. 14B is a detailed view of a light input region of the light guide ring of FIG. 14A.
Figure 14C:
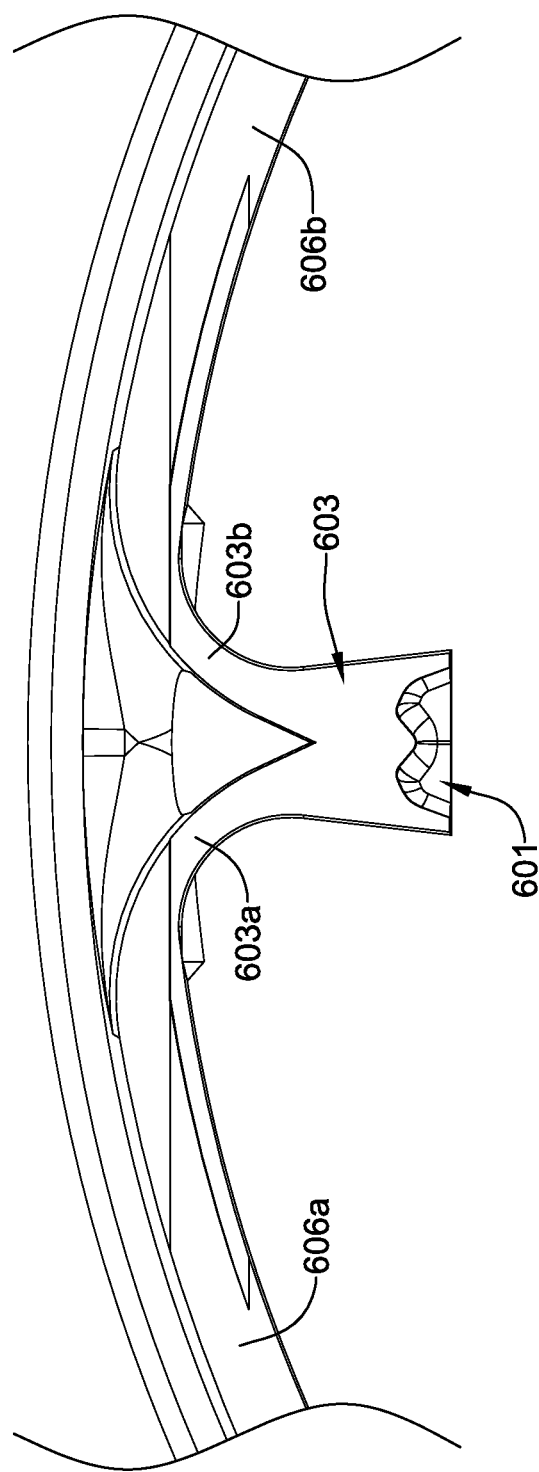
FIG. 14C is another detailed view of the light input region of the light guide ring of FIG. 14A.

The light guide 600 includes long bifurcated sections 603 that are adjacent to the shaped light input pockets 601. The bifurcated sections 603 accept light from the shaped light input pockets 601 and distribute the light into a light guide body 606 that extends around the light guide 600. FIGS. 14B and 14C provide additional views of the bifurcated sections 603. In addition to the distribution function, the long inlet section 603 may help improve color mixing. In some embodiments, a portion of the light guide may be coated with a reflective material 604 to improve retention of light in the transition region between the long inlet section 603 and the light guide body 606.

Region 605 of the light guide 600 may help reduce what would otherwise be an unduly bright spot adjacent to that portion of the light guide 600 and redirects excess illumination into the ring portion of the light guide 600. In some embodiments, the surrounding components of the thermostat, such as a light reflective ring, also may contribute to uniform distribution of light within the light guide.

In some embodiments, as illustrated, the bifurcated section 603 includes a first leg 603*a* curving in a first direction and a second leg 603*b* curving in a second, opposing, direction. In some embodiments, the light guide body 606 includes a first light guide body portion 606*a* that is optically coupled to the first leg 603*a* and a second light guide body portion 606*b* that is optically coupled to the second leg 603*b*. In some embodiments, as illustrated, the light guide body 606 has a contoured profile to aid in uniform light distribution. With illustrative reference to the first light guide body portion 606*a*, it may be seen that the first light guide body portion 606*a* may have a maximum height or volume proximate the bifurcated section 603 and a minimum height or volume at a point 606*c* that is spaced away from the bifurcated section 603. In some cases, as illustrated, the minimum height or volume at point 606*c* occurs at a position that is midway between two equally spaced bifurcated sections 603.

Figure 14D:
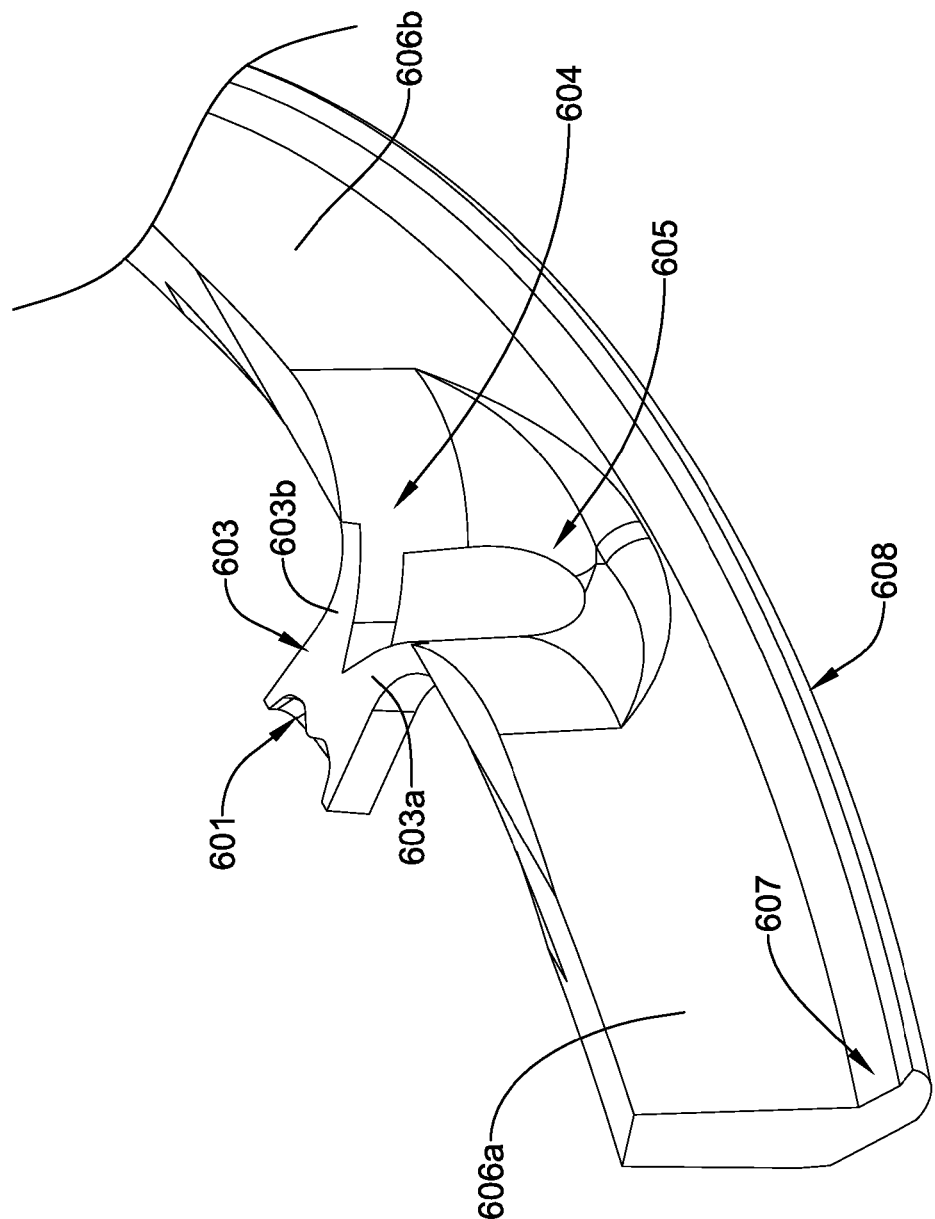
FIG. 14D is a detailed view of the light extraction region of the light guide ring of FIG. 14A.

The output section of the light guide is illustrated in greater detail in FIG. 14D, which illustrates an output turn 607 adapted to direct light toward the output surface 608.

The output surface 608 may be a textured surface to enhance uniform light leakage to illuminate, for example, the wall or mud ring (not shown) behind the thermostat. In some embodiments, the light guide 600 may be secured to the thermostat housing such that the output surface 608 may face the wall or other vertical surface to which the thermostat is securable. In an alternate embodiment, the light guide may be adapted to produce a modulated illumination such that several brighter illuminated regions may be produced, for example gradually reaching greatest brightness at 3, 6, 9, and 12 o'clock positions and diminishing in between for decorative effect or may be modulated to produce a generally uniform background illumination with bright spots distributed around the illuminated region. These are just some example variations.

Figure 14E:
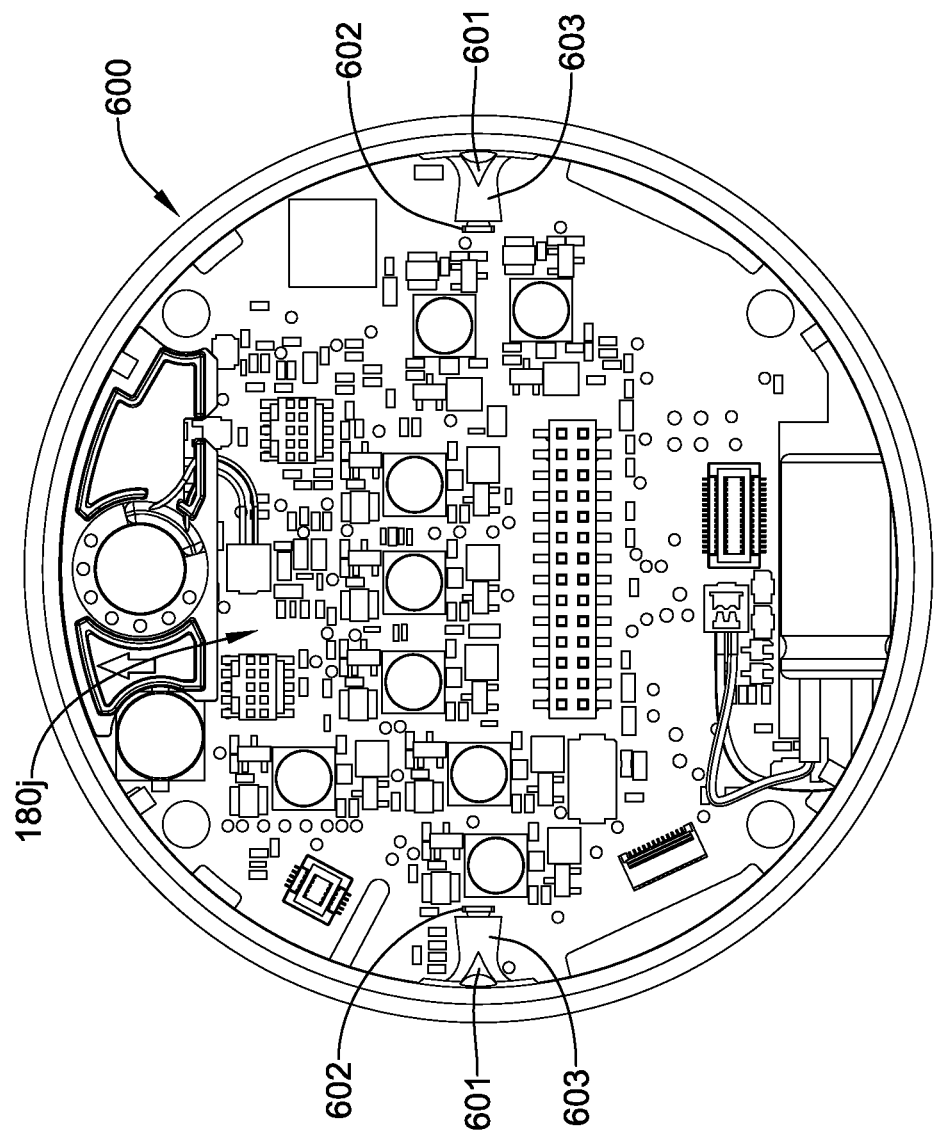
FIG. 14E is an elevation view of the light guide ring of FIG. 14A mounted in relation to a printed circuit board.

FIG. 14E illustrates the light guide 600 in combination with the printed wiring board 180*j* (FIG. 5). In the example shown, the printed wiring board 180*j* includes a pair of light sources 602. As illustrated, each of the pair of light sources 602 are equidistantly spaced apart from one another, about 180 degrees apart, and are positioned on the printed wiring board 180*j* such that each of the light sources 602 are positioned adjacent a corresponding input pocket 601 and bifurcated section 603. Accordingly, light emanating from each of the light sources 602 may enter an input pocket 601 and bifurcated section 603, and thus pass into the light guide body 606. The light sources 602 may be any desired light source. In some embodiments, each of the light sources 602 includes one or more light emitting diodes (LED). In some cases, each of the light sources 602 may be a multicolor selectable LED.

Figure 14F:
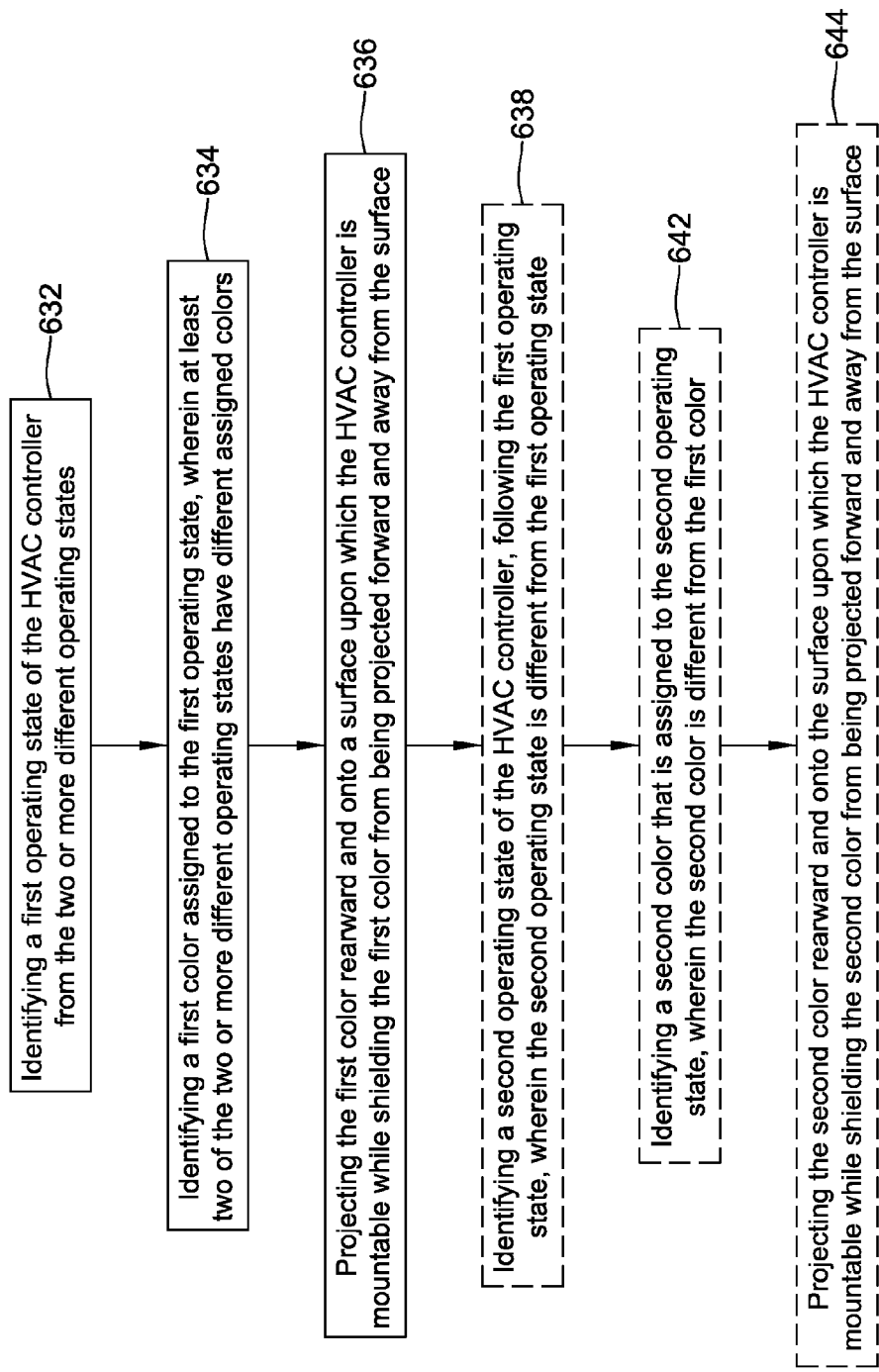
FIG. 14F is a flow diagram showing an illustrative method for illuminating a light guide ring, such as the light guide ring of FIG. 14A.

FIG. 14F illustrates a lighting method that may be carried out using an HVAC controller that controls one or more HVAC components. A first operating state of the HVAC controller may be identified, as generally indicated at block 632. In some cases, the HVAC controller may have two or more distinct operating states. At block 634, a first color that is assigned to the first operating state may be identified. In some embodiments, each of the two or more distinct operating states may have different assigned colors. The first color may be projected rearward and onto a surface upon which the HVAC controller is mountable, as generally indicated at block 636. In some cases, the first color is shielded from being projected forward and away from the surface. In some embodiments, projecting the first color includes projecting an annular light ring on the surface upon which the HVAC controller is mountable. In some cases, the annular light ring is substantially circumferentially uniform in intensity (e.g. halo).

In some embodiments, and as optionally indicated at block 638, a second operating state of the HVAC controller, different from the first operating state, may be identified. A second color, different from the first color, assigned to the second operating state may be identified as optionally indicated at block 642. As optionally indicated at block 644, the second color may be projected rearward and onto the surface upon which the HVAC controller is mountable while shielding the second color from being projected forward and away from the surface.

In some embodiments, the first operating state corresponds to the HVAC controller causing an HVAC heating component(s) to be energized. The second operating state may correspond to the HVAC controller causing an HVAC cooling component(s) to be energized. In some embodiments, a third operating state corresponds to the HVAC controller not causing either the HVAC heating component or the HVAC cooling component to be energized (off state).

In some cases, when the HVAC controller is in the third operating state, no color is projected rearward and onto the surface upon which the HVAC controller is mountable.

As alluded to above, the programmable thermostat may optionally include a "mud ring" adjacent the back side of the thermostat body and covering a portion of the wall around the thermostat body. A "mud ring" is a larger decorative plate that fits between the wall and the thermostat and may cover a wall opening and/or an unpainted or mismatched wall surface. In some embodiments, the mud ring may have an additional function in that it may be large enough and shaped to cover that portion of the wall or an opening in the wall which had been covered by a previous thermostat installation. A mud ring that provides this function may minimize the need to renew the decorative and aesthetic aspects of the wall in the vicinity of the thermostat. In other embodiments, the mud ring may be a decorative element of the thermostat installation. In such embodiments, the mud ring may also serve as a suitable field upon which the light from a light guide described herein may be projected and in those embodiments it may be desirable to select the color and texture of the mud ring to help ensure that the light projected on the mud ring has the desired visual impact. In some cases, the mud ring may have a textured surface to help reflect the incoming light forward toward a user. In some case, the textured surface may itself be patterned, such as having one or more annular shaped textured surfaces around the thermostat on a generally non-textured mud ring.

In yet other embodiments, the mud ring may be omitted and light from the thermostat may be directed onto the wall itself. It will be appreciated that the mud ring may assume one of a variety of shapes and sizes. In certain embodiments, the installation package for the thermostat may include several optional mud rings to allow selection of a size, shape and/or color that is best suited to the need for wall coverage and/or aesthetics.

Figure 15:
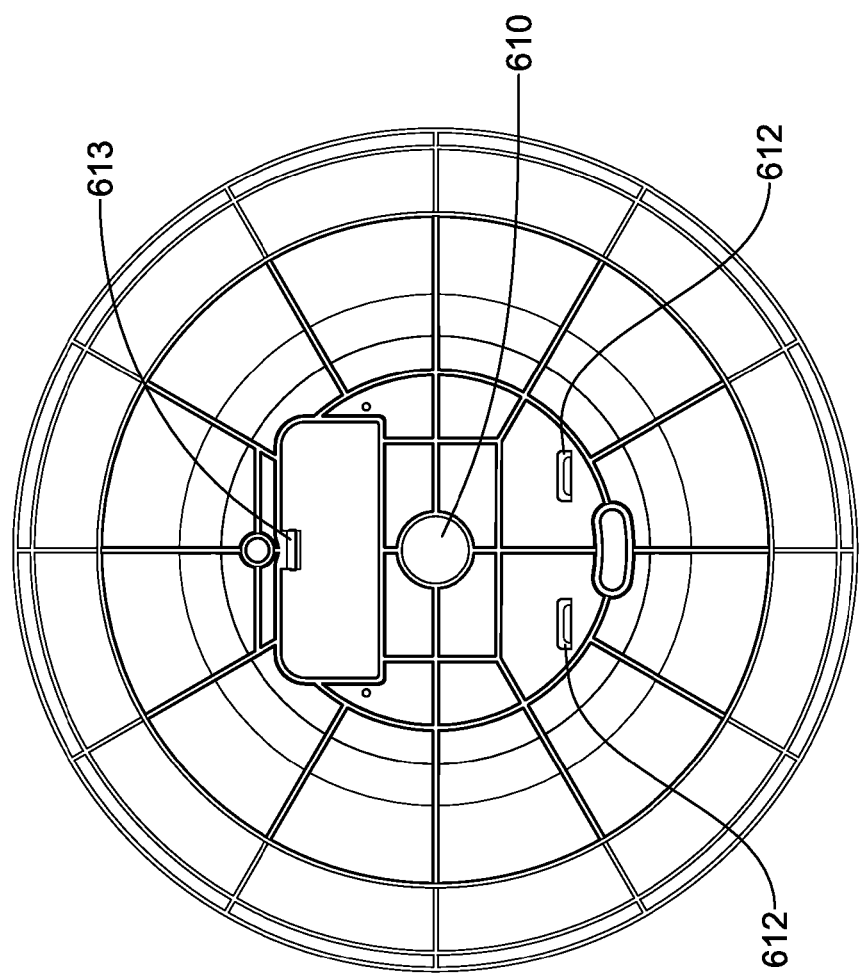
FIG. 15 is an elevation view of the wall side view of a mud ring.

The mud ring of the disclosure, if used, may be configured to mate with the back of the wall plate assembly (see, 180n of FIG. 5) before or after mounting the wall plate assembly to the wall. In those installations which employ a mud ring, the mud ring may be provided with apertures to match corresponding features of the wall plate assembly, such as the wiring hole, screw holes, battery access openings, and the like. In the illustrative embodiment of FIG. 15, the mud ring 610 may be attached to the wall plate assembly (not visible) by two orienting posts or hooks 612 and a latch 613 which maintain alignment between the mud ring and the wall plate assembly. Other attachment elements such as a flange with latch portions, bayonet engagement features, screws, and/or any other suitable attachment mechanism may be used.

In some cases, the wall mount assembly may include features configured to simplify initial wiring of the system. For a single transformer installation, a jumper may be used to connect the "R" and "Rc" terminals together at the wall plate, and the single transformer is connected to the R terminal. In dual transformer systems, the jumper wire is typically removed, and wiring from one transformer is connected to an "R" terminal and the other transformer is connected to the "Rc" terminal.

Single transformer systems are most common, so a jumper can be included by default. This requires that installers take the step of removing the jumper when wiring to the Rc terminal in a duel transformer installation. If this jumper is not removed, then the two transformers may be shorted together in a way that could cause equipment damage. This is especially an issue in the Do-It-Yourself (DIY) market. Furthermore, the jumper designs often require larger terminals that can contain both a jumper and the wire to the transformer at the same time.

Some thermostats support configurable accessory outputs. Accessories that have their own transformer often require two terminal connections so that the thermostat can complete the circuit enabling the accessory. Accessories that use the HVAC system transformer often require only one terminal connection because the connection to the system transformer is made within the thermostat. This presents a problem for installers because to use a single universal output that supports two possible connections on a system that requires only one requires extra wiring and system knowledge.

To address this, the jumper between the R/Rc terminals may be eliminated by including a switch in the wall plate that has a physical actuator 609A (FIG. 15A) that blocks access to the Rc terminal in the default position (e.g. single transformer), and can be moved to expose the Rc terminal. When the physical actuator 609A blocks the Rc terminal, the switch may automatically connect R and Rc and no external jumper wire may be required. When the user wishes to connect a wire to Rc, the physical actuator 609A is moved to expose the Rc terminal, which changes the switch position to disconnect the jumper connection between R and Rc at the switch.

The configuration of the accessory output may be accomplished by including a switch in the wall plate that has a physical actuator 609B that blocks access to the second accessory terminal in the default position, and can be moved to expose the second accessory terminal. When the physical actuator 609B blocks the second accessory terminal, the switch automatically forms an internal connection so that the thermostat can switch the first accessory terminal using the HVAC system transformer. When the user wishes to connect a wire to the second accessory terminal, the physical actuator 609B may be moved to expose the second accessory terminal, which changes the switch to disconnect the connection to the HVAC system transformer and allows the thermostat to switch power from the external transformer. The switches of the disclosure may continue to perform their function even if the thermostat is operating on battery power, if desired.

Figure 16A:
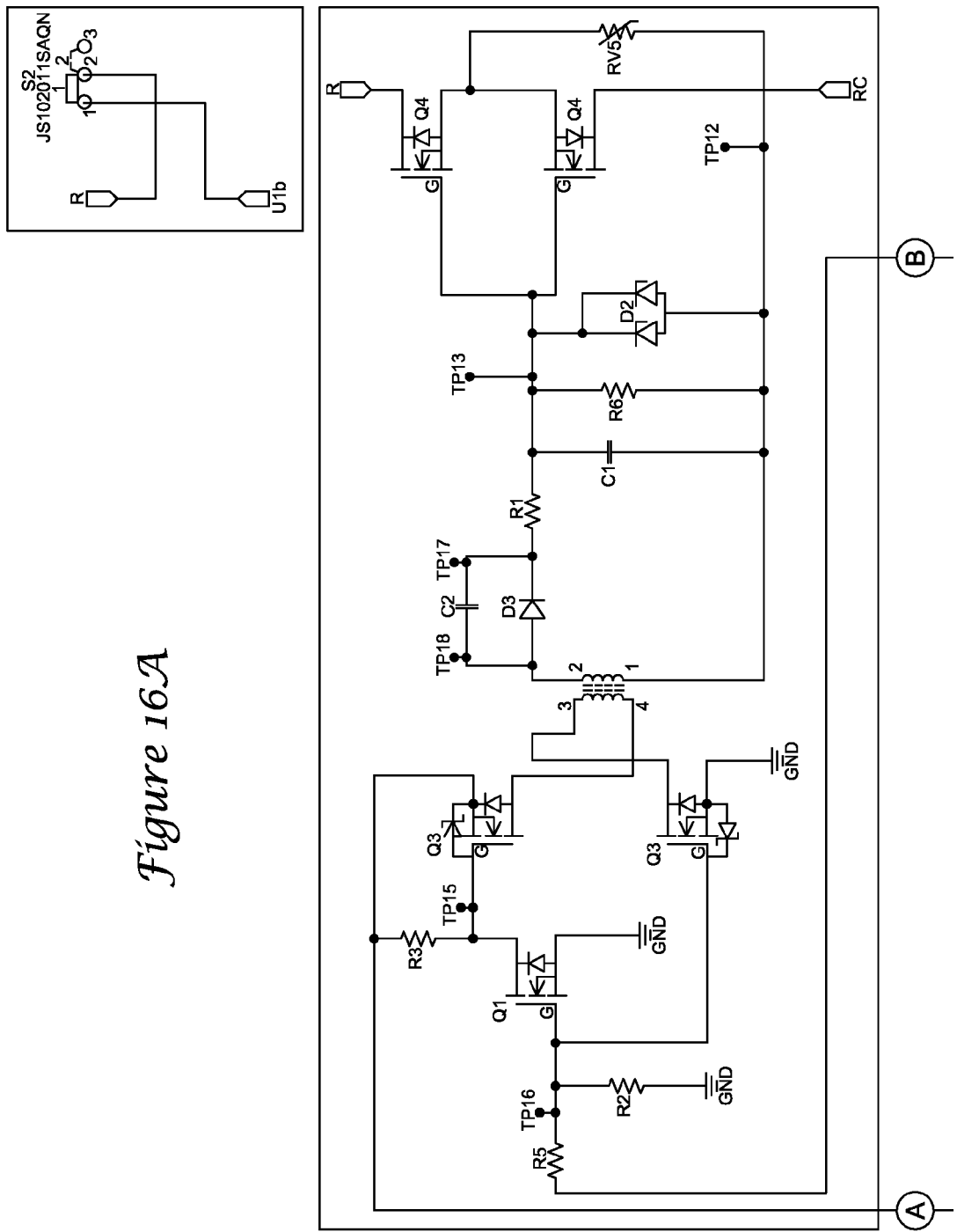
FIGS. 16A-16B are a schematic diagram of an illustrative circuit for switching between single transformer and two transformer operation.
Figure 16B:
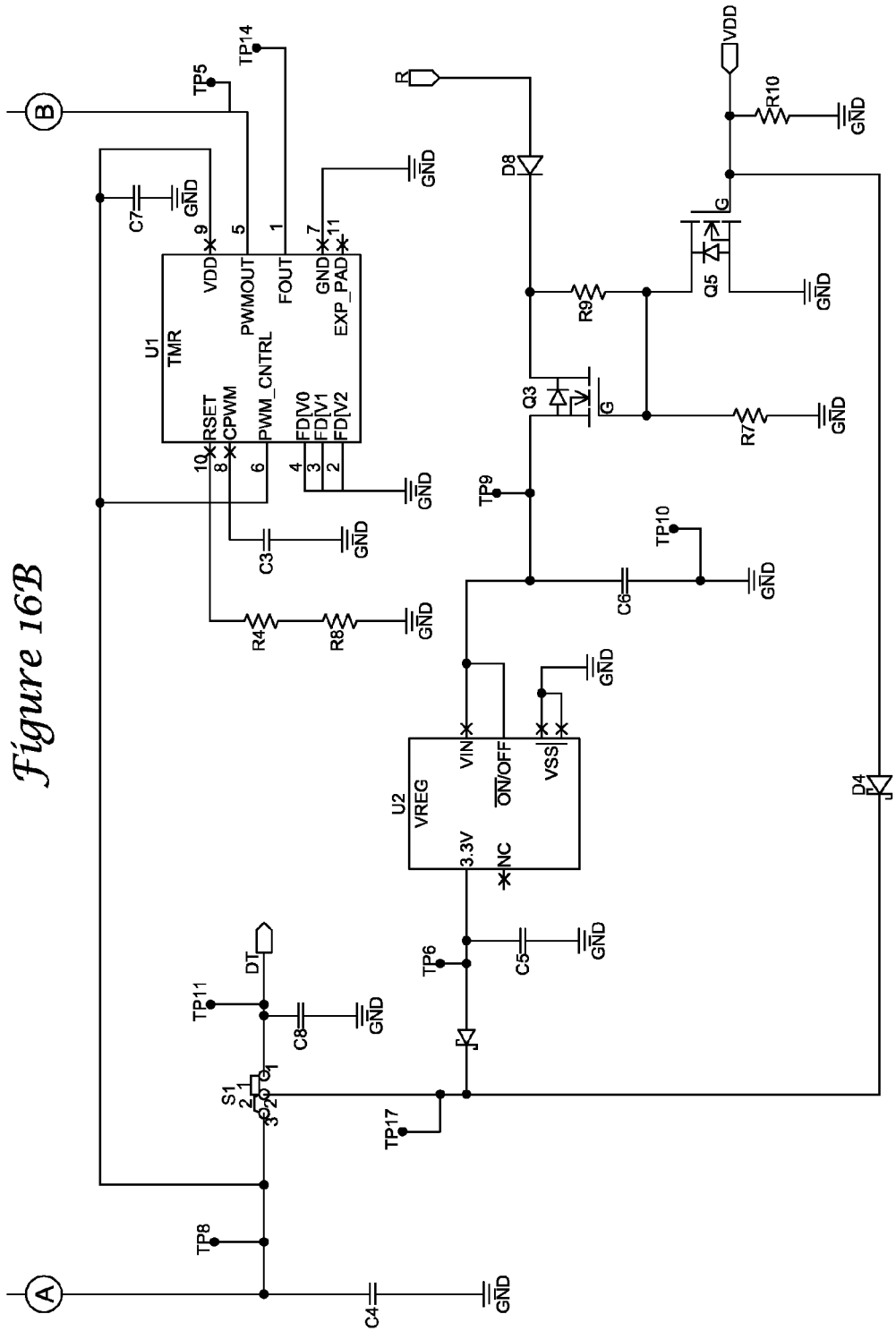

FIGS. 16A, 16B, 16C and 16D show switching function which may be accomplished by switching the loads directly with a switch, or using the switch as a signal in a TRIAC, FET, relay or other circuit. With reference to FIGS. 16A and 16B, when FETs are used for R & RC connections, pins 2 and 3 of the S1 switch are connected to each other when using the single transformer, R-24VAC. 24VAC is applied to the R terminal and the peak voltage is supplied to drain of Q2 through fast recovery diode D8. At the same time, 3.3V generated by U2, voltage regulator IC, S-1142B and Q2, 2N7002, is applied to U1, TS3005 timer IC and FET SW VCC. Energy is stored and is transferred into D3, R1, and Q4 through L1 when a pulse signal is at pin 5 of U1, TS3005 timer IC is applied to gate of Q1. Once energy is applied to Q4, Q4 is switched on and stays on. 24VAC applied to R transfers to RC through Q4 and the thermostat starts working. After the thermostat functions, another 3.3V is generated and is applied to VDD and 3.3VDC produced from R-24VAC is cut off by Q2 on and Q5 off. Under this mode of operation, the leakage current flows only through D8, R9, and Q5. The thermostat CPU recognizes that the device is powered by R through 0 volt applied to pin 1 of S1 and turns on the power transformation circuitry powered by R-24VAC.

Pins 1 and 2 of S1 switch are connected to each other when using the dual transformer, RC-24VAC. The 3.3VDC produced from the R-24VAC is cut off, the entire jumper circuit stops working, and the thermostat is powered by RC-24VAC. Under this operation, the thermostat CPU recognizes that the device is powered by RC-24VAC through 3.3 volts applied to pin 1 of switch S1, and turns on the power transformation circuit powered by RC-24VAC and turns off the power transformation circuit powered by R-24VAC.

Figure 16C:
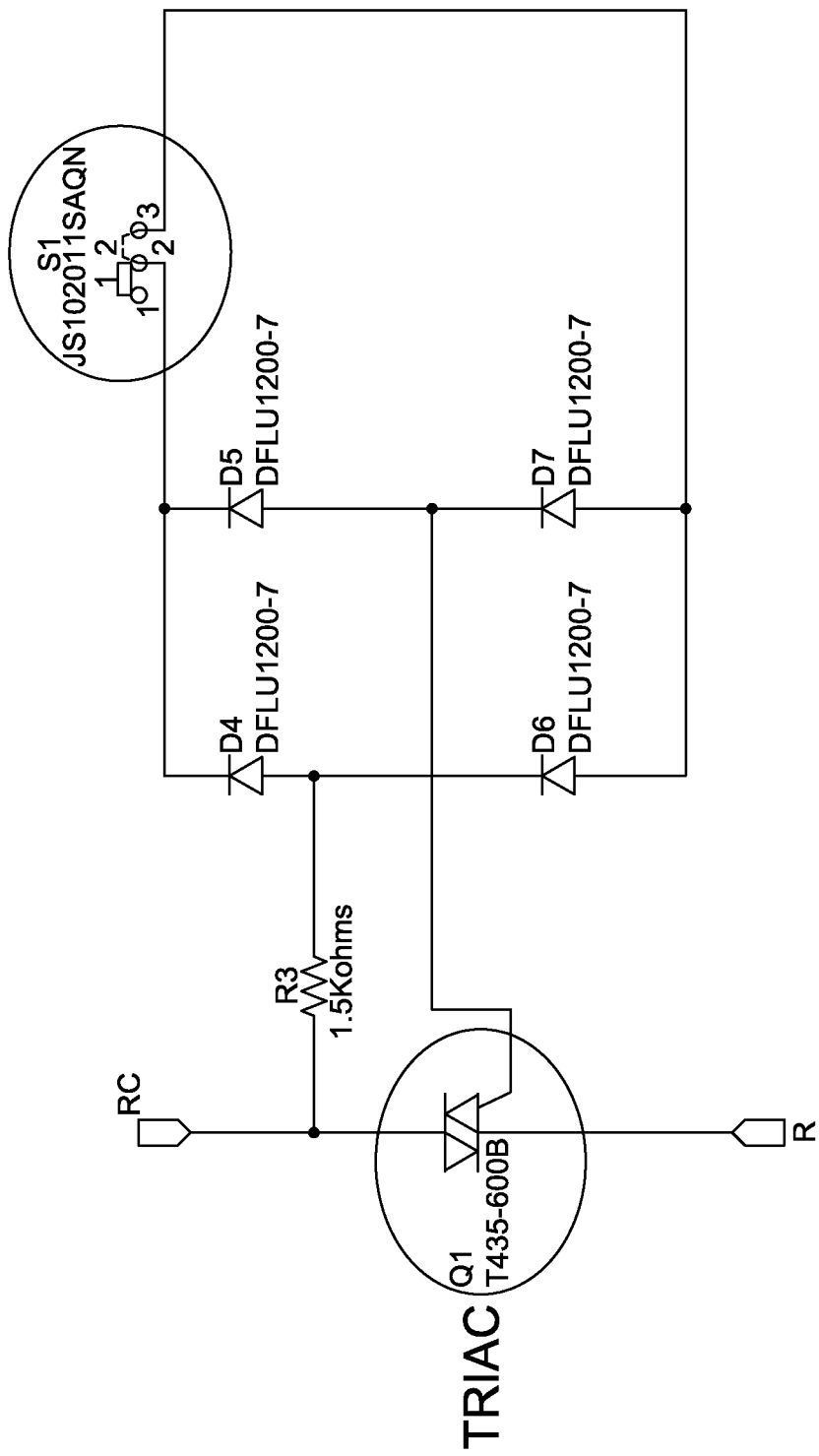
FIG. 16C is a schematic diagram of another illustrative circuit for switching between single transformer and two transformer operation.

As shown in FIG. 16C, when a TRIAC is used for the R & RC connections and the switch is in default position, the TRIAC is fired by 4 diodes and the R and RC terminals are connected together. When the switch is in the dual transformer position, the R and RC terminals are effectively disconnected.

Figure 16D:
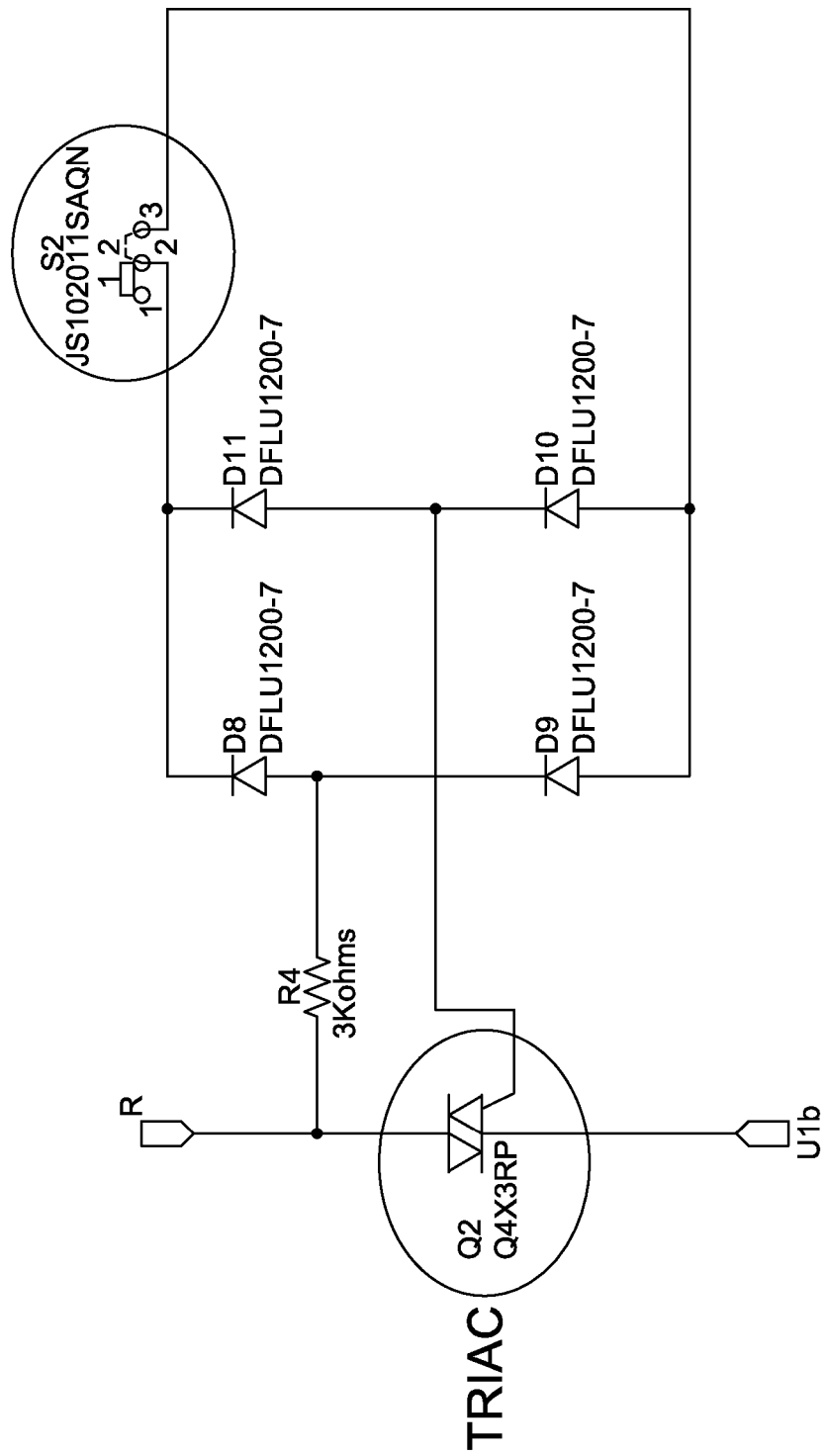
FIG. 16D is a schematic diagram of another illustrative circuit for providing an optional utility terminal.

As shown in FIG. 16D, when a TRIAC is used as a switch for R & U1*b* connections and the switch is in the default position, the TRIAC is not fired, and the R & RC are disconnected. When the switch is moved from the default position, the TRIAC is fired by 4 diodes, and the R and U1*b* terminals are connected together.

When relays are used for the R & RC or U1*b* connections, such as in cases where the switch is insufficient to carry the required current load, the switch can be wired in series with a coil of a relay such that the operation of the switch activates or deactivates the relay coil so that the relay switches the load appropriately.

In some instances, the thermostat may provide services beyond utilitarian control of an HVAC system. For example, and in some cases, the user can view today's weather forecast through one button press on the device. When the thermostat is approached as determined by, for example, an IR sensor, motion sensor, contact with a touch sensitive region of the window, or rotation of the turning ring, the device may highlight interaction points for the user using visual and/or audio cues, so that the user is intuitively guided through the experience. One of these highlighted interaction points may be an icon that represents weather. By pressing this point (e.g. a weather button such as weather button 102*b*), the display of an actual temperature, temperature set point, and system mode may be replaced by today's current weather conditions, weather anticipated in 6 hours, and weather anticipated in 12 hours. Each of these time points may provide an icon on the main display that is associated with current conditions or with anticipated future conditions in the area. There may also be a current and/or expected temperature and humidity numeric value. When available from the weather source or readily calculable, the display may include a comfort index. The single button press may provide a comprehensive outlook of the short term expected weather so users can plan their day quickly, and in some cases, optionally choose to activate a one-touch activity. By pressing the weather button 102*b* a second time, the weather information may disappear, restoring the home screen (e.g. actual temperature, temperature set point and currently selected system mode icon). If the user does not press the weather button 102*b* a second time, the device may automatically return to the home screen after a period of time.

While in the weather display mode, the device may allow the user to scroll through today's weather, historic weather, anticipated weather, and/or severe weather alert notifications using, for example the rotatable dial or gestures on the touch screen, to activate a scroll through the options depending upon availability of that information from a networked source. In some embodiments, the thermostat may have access to an exterior air sensor and may be capable of displaying parameters of the exterior air such as temperature and/or humidity.

The thermostat may convey details related to how the user's HVAC system has typically operated when similar outside weather (be it today's, historic, or future) is presented. For example, on a day where high temperatures are expected to top 100° F., the device may display that typically the air conditioner runs 12 hours to maintain 'x' degree temperature inside where 'x' may be the currently programmed set point. Along with this display of typical operation parameters, there may be an indication, based on the current utility rates, of what the expected cost associated with the indicated setting for this outside condition may be. In some cases, there may be an indication, based on the current utility rates, of how much the user may save in cooling costs if the user were to increase the set point by, for example, 3 degrees. This may provide additional information to the user upon which to base adjustments to temperature, in addition to maintaining basic indoor comfort. In some cases, the user may specify a daily cost budget for cooling the building, and the device may set the set point temperature so that the expected cooling costs for that day stay under that budget.

In some embodiments, the programmable thermostat may include a selection button which, when pressed, activates a first program module adapted to send a query to a source of local weather information; a second program module adapted to receive weather information related to one of local weather conditions and anticipated local weather; a third program module adapted to convert received weather information to one or more of displayable representations of alphanumeric data and icons; and a display driver for displaying the displayable representations of one or more of alphanumeric data and icons on a display associated with the programmable thermostat. In related embodiments, the programmable thermostat may generate a query under program control for weather information which may be sent to a source of local weather information. Upon receiving a response to the query or in response to receipt of weather information generated by a source of local weather information without an initiating query, the second module may be adapted to convert the received weather information to a displayable form and to initiate display of weather information at the thermostat. In certain embodiments, the programmable thermostat may be adapted to play a sound associated with received weather information.

Figure 17:
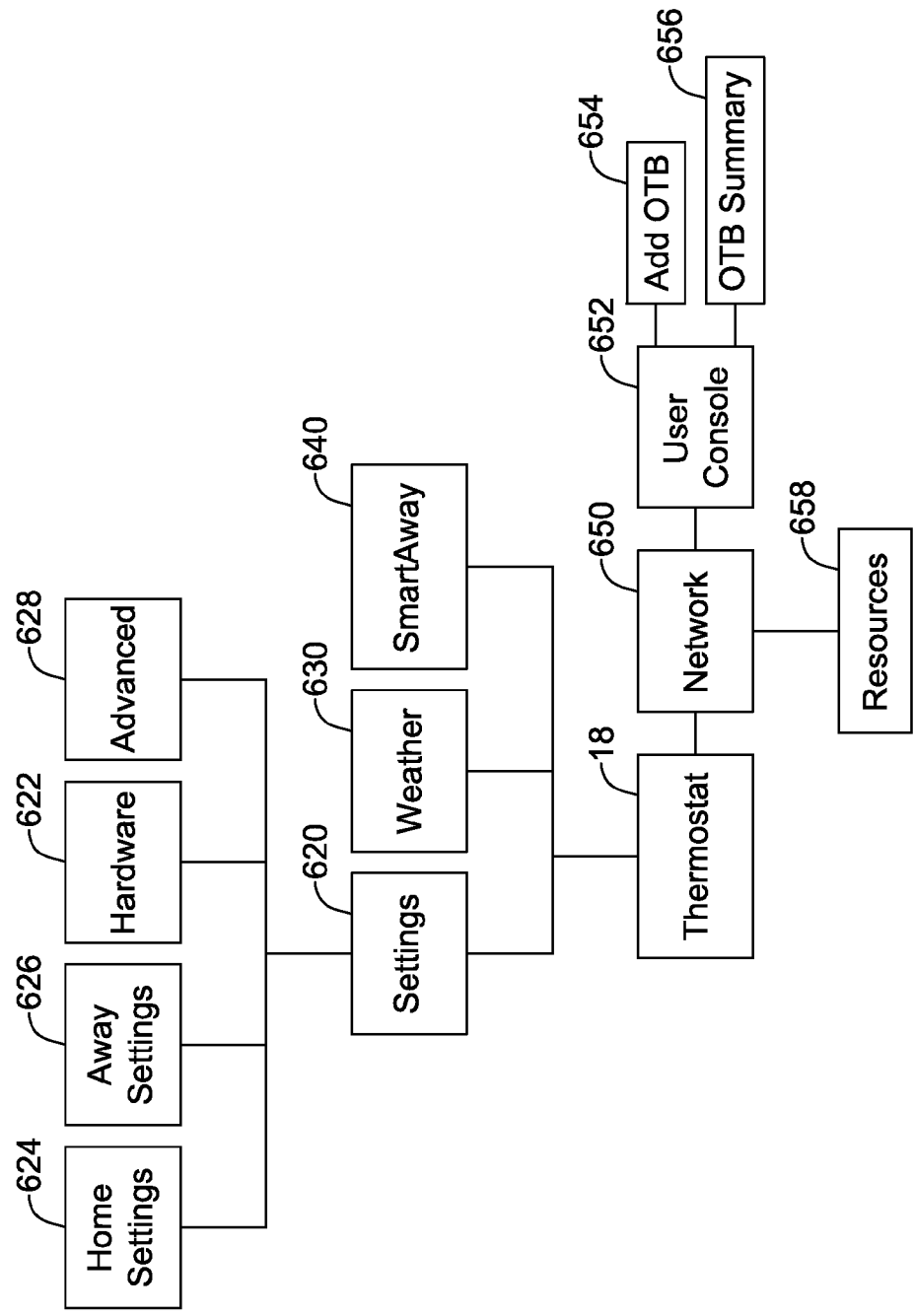
FIG. 17 is a block diagram of principal settings for an illustrative thermostat and its interactions with networked components.

The overall organization of an illustrative HVAC system is shown in FIG. 17. At a first level, the HVAC system may include a thermostat 18 and a user console 652. The user console 652 may be remote and only intermittently available through network 650. The network 650 may provide additional resources 658. As discussed previously, the network 650 commonly will include a WiFi network as an initial link; however other components may be employed, for example, the Internet, cellular communication, REDLINK™, ZigBee, Bluetooth, IrDA, dedicated short range communication (DSRC), EnOcean, and their functional equivalent. In certain embodiments, portions of the network, including the initial link, may be hard wired components, fiber optics, and the like and connections to additional resources 658 often may be through hard wired components, fiber optics, and the like.

Within the thermostat 18, modules adapted to manage settings 620, weather related data and activities 630, and Smart Away functions 640 associated with the window displays and controls may be present. Reference will be made to the illustrative thermostat shown in FIG. 17A. The settings module 620 may include a hardware block 622, which may be used to store and manage hardware settings for the thermostat and/or HVAC components. Blocks 624 and 626 store and manage home settings and away settings, while block 628 provides control of advanced features.

Figure 17B:
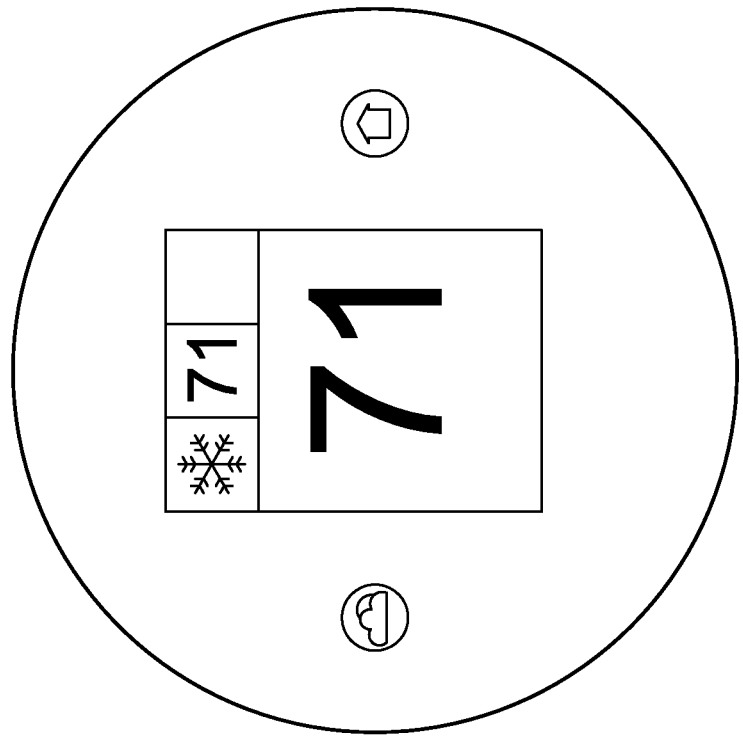
FIGS. 17B-17I are front elevation views of the front face of the illustrative thermostat of FIG. 17A under a variety of operating conditions.
Figure 17A:
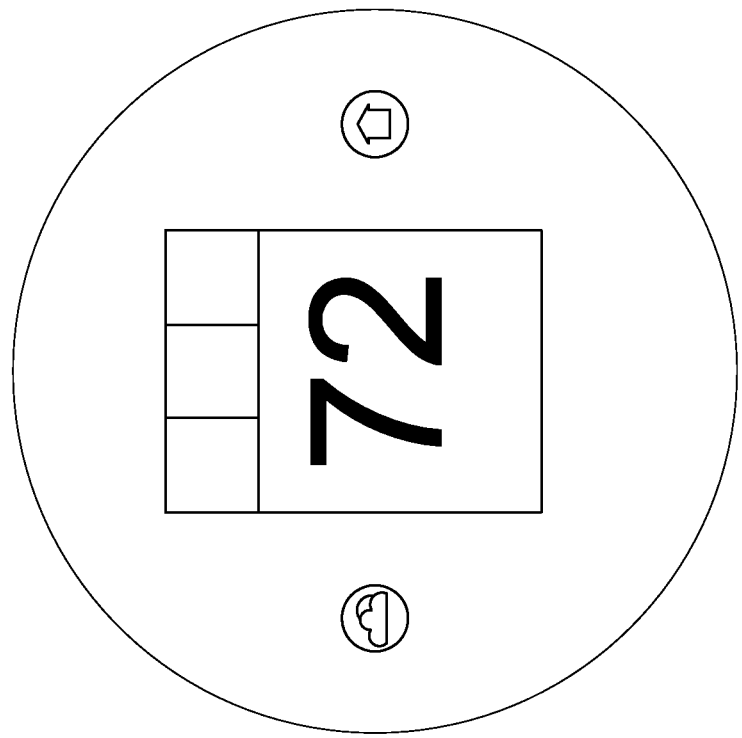
FIG. 17A is a front elevation view of the front face of an illustrative thermostat.

Features associated with the weather module 630 may be accessed by touching one of the stencil areas adjacent to the main display, which may present a weather related icon such as a sun partially obscured by a cloud. In some embodiments, the weather related icon may be illuminated by, for example, different colored lighting to indicate whether the features are enabled and being viewed or enabled, but not being viewed. When the weather related icon is not illuminated, the weather related features are not enabled. In FIG. 17A, the weather related icon is shown to the left of the main display. Similarly, features associated with the Smart Away module 640 may be accessed by touching a stencil area which presents an icon associated with that function, for example, a home (see FIG. 17A). In FIG. 17A, the Smart Away icon is shown to the right of the main display.

In some embodiments, the hardware module 622 may be accessed by touching an upper region optionally defined by a display mask to allow the user to alter basic system functions such as the selection of operating mode, for example Cool/Off/Heat, with appropriate visual and/or audible cue accompaniment. (See FIG. 17B). In some embodiments, the cooling function may be accessed by touching an icon such as a snow flake; the heating function may be accessed by touching an icon such as a sun (not shown in FIG. 17B); and the HVAC functions may be turned off by touching the word OFF (also not shown in FIG. 17B).

In the discussion of user interface functions that follows, the details of steps of routine user interactions through the hardware module and to or among the modules will be omitted to simplify the descriptions, but will be understood to occur in the background as necessary to implement the commands. During periods with no user interaction, the thermostat display may dim to a preset level, for example 30% of maximum brightness, as illustrated by dotted lines in FIG. 17E. When the thermostat senses that interaction is desired or pending, as exemplified by activation of a touch control, activation by a cellphone or PC application, or upon sensing the presence of a person in the room with the thermostat, the thermostat display may assume an active state, for example, that of FIG. 17B or 17D for the cooling mode, and increases display brightness to 100%. In FIG. 17B, cooling is off because the temperature is near the set point (perhaps within 1 degree). The cooling icon, a blue snowflake, is static, and the current cooling set-point (71 degrees), also displayed in blue for cooling, are displayed in the upper portion of the display. The current room temperature (72 degrees) is displayed in the lower or main display window.

Figure 17D:
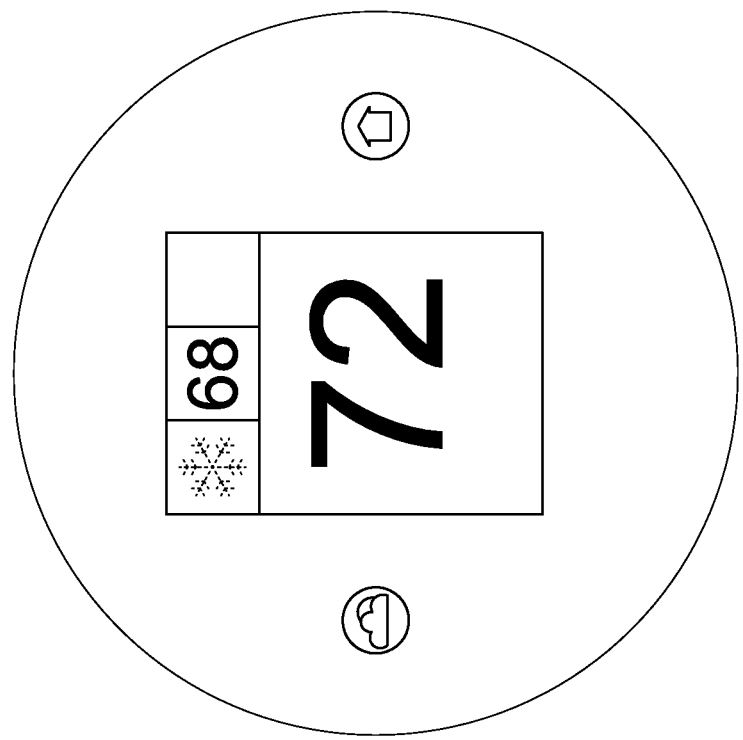
Figure 17C:
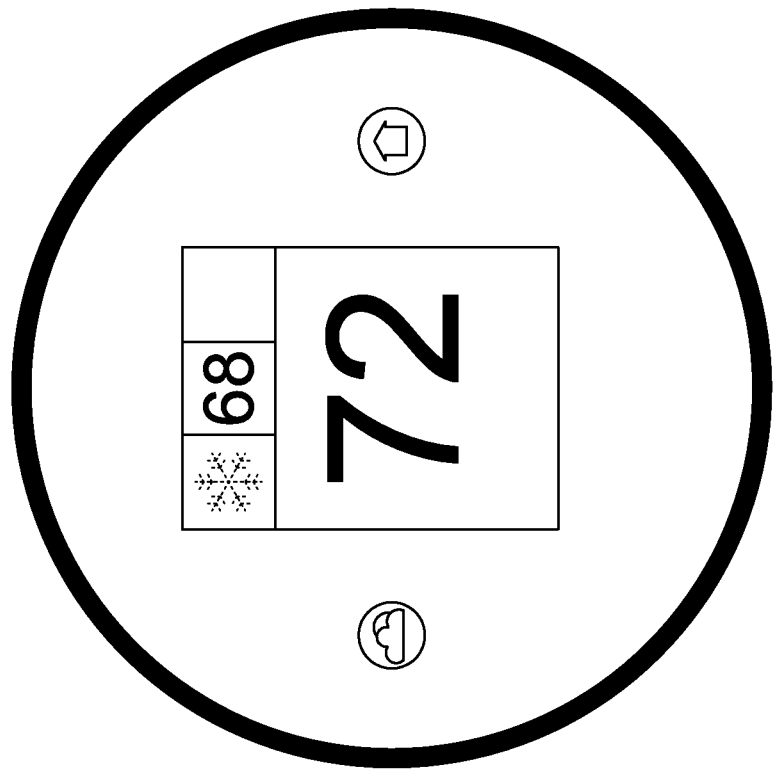
Figure 17F:
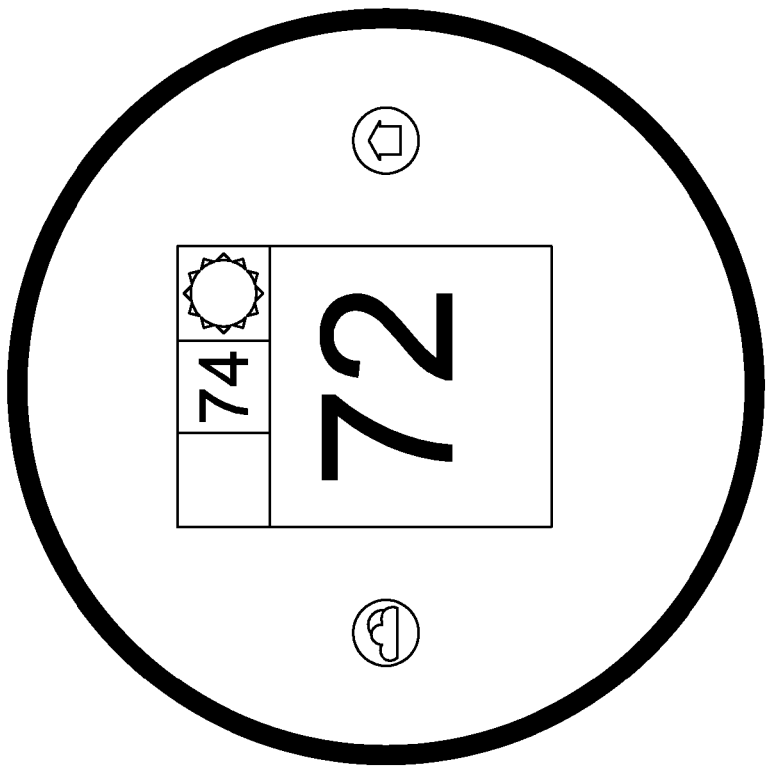
Figure 17E:
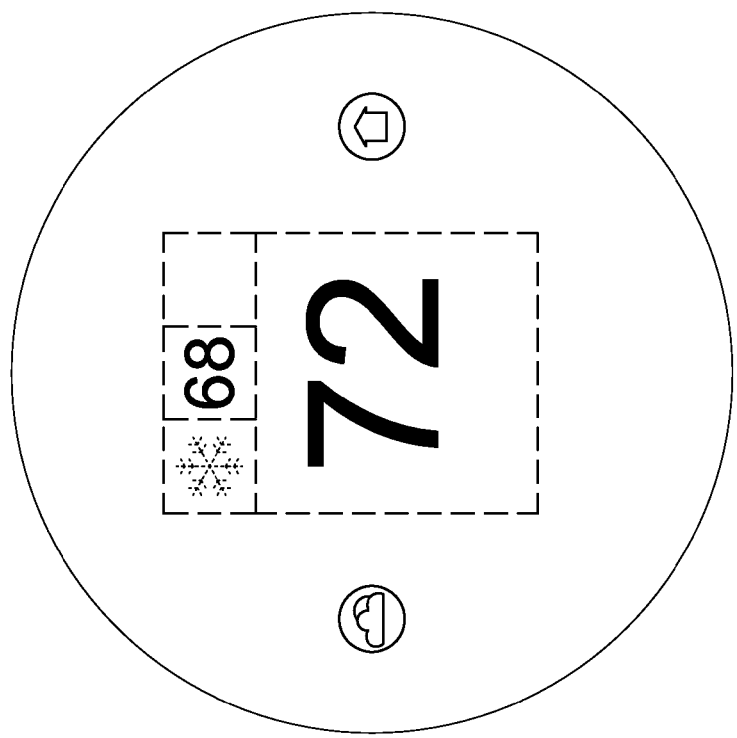

In FIG. 17C, the outer ring of the thermostat has been rotated by the user (or the set-point has been changed by an external source such as a cell phone or PC application or the action of a One-Touch button) to lower the set-point to the now displayed 68 degrees, whereupon a blue light ring illuminates the wall or mud ring adjacent to the thermostat to acknowledge the change and the blue snowflake animates. The illumination of the light ring is illustrated by the thick black line extending around the perimeter of the thermostat. After a preset time, the light ring extinguishes, as shown in FIG. 17D, but the blue snowflake continues to animate, for example by shimmering, as illustrated in FIG. 17E, while the cooling hardware is active. Analogous actions may occur in heat mode, activated by touching the sun icon in the upper mode display area, as shown in FIG. 17F in which the set-point has been changed to 74 degrees such that the new set-point temperature, 74 degrees and the sun are displayed in orange to indicate heating mode, the light ring glows orange for a preset time to acknowledge the change, and the orange sun animates, for example by shimmering, while the heating hardware is active.

Figure 17H:
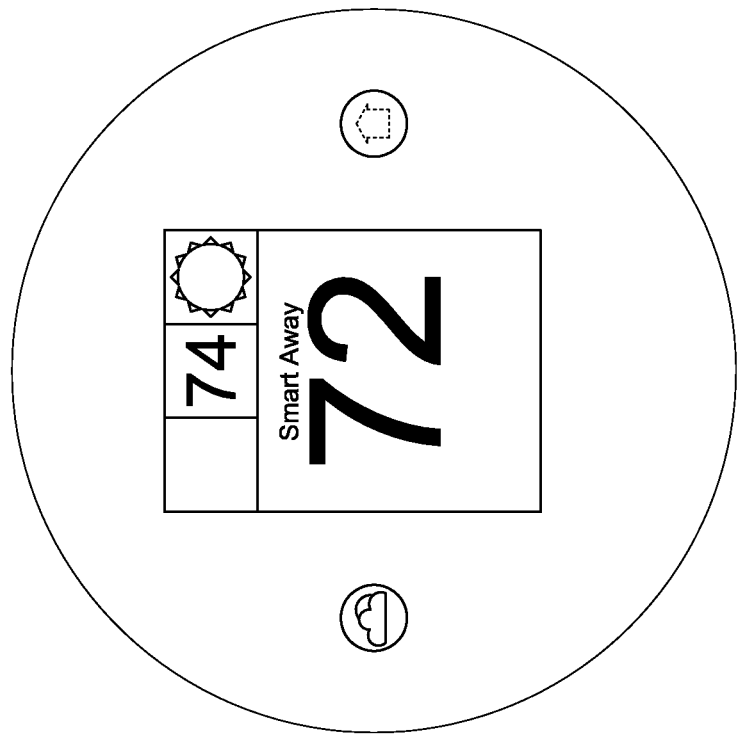
Figure 17G:
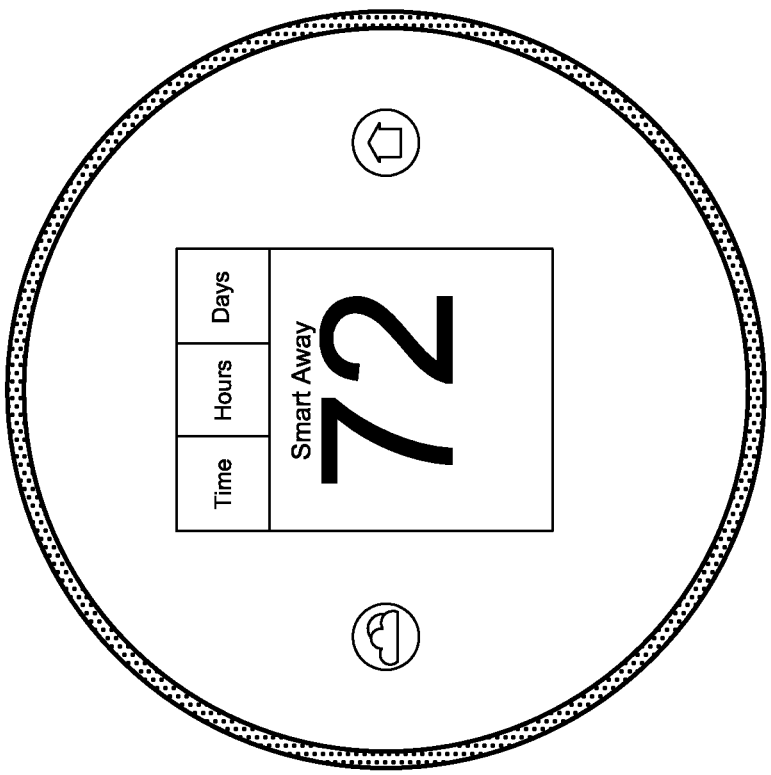

In some embodiments, pressing one of the touch sensitive stencil areas adjacent to the main display, in this example, the house stencil icon to the right of the main display, activates a Smart Away feature, governed by Smart Away module 640, which provides simplified short-term modification of the normally active program settings. When activated, the Smart Away feature may acknowledge the selection of the Smart Away module 640 by changing the color of the illumination of the house stencil icon and optionally changing the color of the light ring illumination, adding "Smart Away" text to the main display, storing the current state of the thermostat (for example, Cool/OFF/Heat and set-point) and replacing the upper window or portion of the display with three options in the upper display area or window with the default being "Time" and the remaining options being "Hours" and "Days", as shown in FIG. 17G. The dotted pattern around the perimeter of FIG. 17G is used to indicate a color change of the light ring illumination.

In the default Time—Smart Away mode, the main display indicates the current time plus one hour and the time may be increased in 15 minutes by rotating the outer ring. To accept the displayed return time, the user may press the house stencil icon a second time or Auto Accept by waiting a specified amount of time such as 9 seconds.

A second Smart Away mode, Hours—Smart Away, initially displays a default two hour Smart Away period which may be adjusted from, for example 1-24 hours in half hour increments by rotating the outer ring. As before, to accept the displayed away time, the user may press the house stencil icon a second time or Auto Accept by waiting a specified amount of time such as 9 seconds.

A third Smart Away mode, Days—Smart Away, starts with a display of the current day of the week and current time and advances in three hour increments to an anticipated return time and date by turning the outer ring. As before, to accept the displayed away time, the user may press the house stencil icon a second time or Auto Accept by waiting a specified amount of time such as 9 seconds.

Once the Smart Away mode has been set and accepted, the house stencil icon may be illuminated to indicate that a Smart Away mode is active and the light ring may illuminate the wall or mud ring with an appropriate color cue for a specified length of time. In some embodiments, the house stencil icon illuminates at reduced brightness when Smart Away actions are active and may fade to off periodically to indicate that the function is engaged, as shown by the dashed home icon in FIG. 17H. In certain embodiments, an audio cue may be played when the house stencil icon is touched, when the Smart Away setting is accepted, and/or when the outer ring is turned to alter the displayed setting. It will be appreciated that each action and/or display change may be accompanied by appropriate animation and/or playing of audio cues. Audio cues are especially useful for visually impaired users. After a period of inactivity within the room, the display may return to sleep mode to conserve battery power.

When entering a Smart Away mode, the thermostat may remember the current settings to be reinstated at the termination of the Smart Away mode and may, if desired, remember the current Smart Away settings for use as the default to be displayed when re-entering the Smart Away mode at a later date.

If desired, the user may set the operating mode to Cool or Heat and set a temperature set-point before entering the Smart Away mode. In the alternative, a Cool mode increment and/or Heat mode decrement may be entered as a default during system installation or by using a cell phone or PC application. In certain embodiments, the thermostat may learn the users' preferences and use those as suggested temperature set-points when entering the Smart Away mode. In certain other embodiments, the user may elect to allow a remote manufacturer's server to select and/or alter the temperature to be maintained based upon, for example, one or more of the anticipated or actual weather in the vicinity, energy consumption considerations, historical data regarding the rate of temperature recovery in various conditions, and the like. Such server controlled temperature settings may be provided through the networking capability of the thermostat. Further, the user may override the temperature setting in anticipation of, for example, an early return, by using a cell phone or PC application.

An active Smart Away mode may be turned off at the thermostat by touching the house stencil icon, turning the outer ring, and/or changing the Cool/OFF/Heat mode manually. This may be acknowledged on the main display and by turning off the house stencil icon illumination. When a Smart Away activity expires or is turned off, the system may restore the previously stored state of the thermostat, for example mode and set-point, and may return to normal operation.

A weather module 300 may be accessed through the hardware module 202 by touching the one of the stencil areas adjacent to the main display which presents a weather related icon. Some illustrative features of such a module are as follows.

Typically, if the thermostat is not currently connected to a network, the weather related icon may not be illuminated. When the weather related icon is illuminated and touched, the thermostat may acknowledge the selection of the weather module 300 by changing the color of the illumination of the weather related icon and optionally the light ring illumination, stores the current state of the thermostat (for example, Cool/OFF/Heat and set-point) and replaces the upper window or portion of the display with options such as "Now" and "12 Hour" with the default "Now" selected. With "Now" selected, the main display may continue to display the current temperature of the room and in addition may display the outdoor temperature, relative humidity, and an icon representing the current weather as obtained through a network connection from a selected local weather source. In some embodiments, the display may include, or in the alternative display, the expected high and low temperature for the day. In addition, any severe weather alerts may be displayed as text and/or an icon.

Figure 17J:
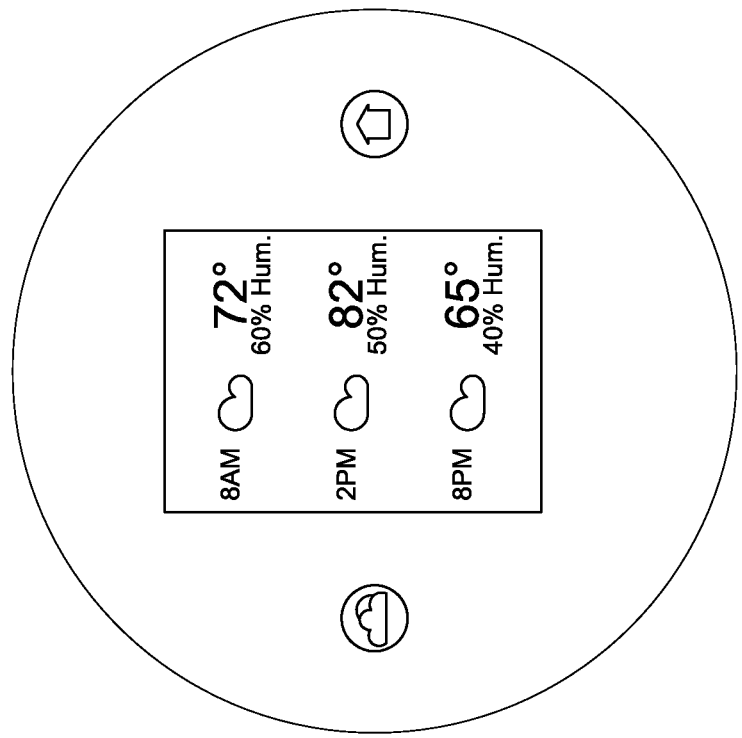
FIGS. 17J-17L are front elevation views of the front face of the illustrative thermostat of FIG. 17A illustrating optional presentation modes for weather related information.
Figure 17I:
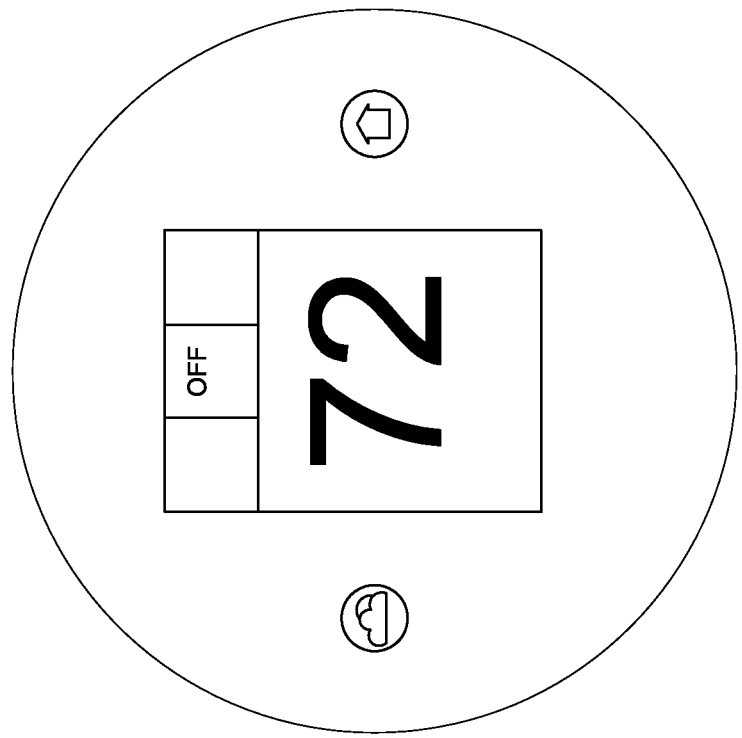

When the "12 Hour" option is selected by the user, the main display may be replaced by three rows of information indicating conditions at the current time to the nearest hour, the current time plus 6 hours, and the current time plus 12 hours. As before, the current weather information and forecast may be obtained through a network connection from a local weather source. Each of the three rows of information, in addition to the appropriate time, may display an outdoor temperature and an icon indicating the expected weather conditions for that time. In some embodiments, the thermostat may restore the previous state of the thermostat after a preselected interval such as 9 seconds. In other embodiments, the thermostat may restore the previous state of the thermostat after the preselected interval following a failure to detect motion in the room with an IR motion sensor. The display in the Off mode is illustrated in FIG. 17I.

Figure 17L:
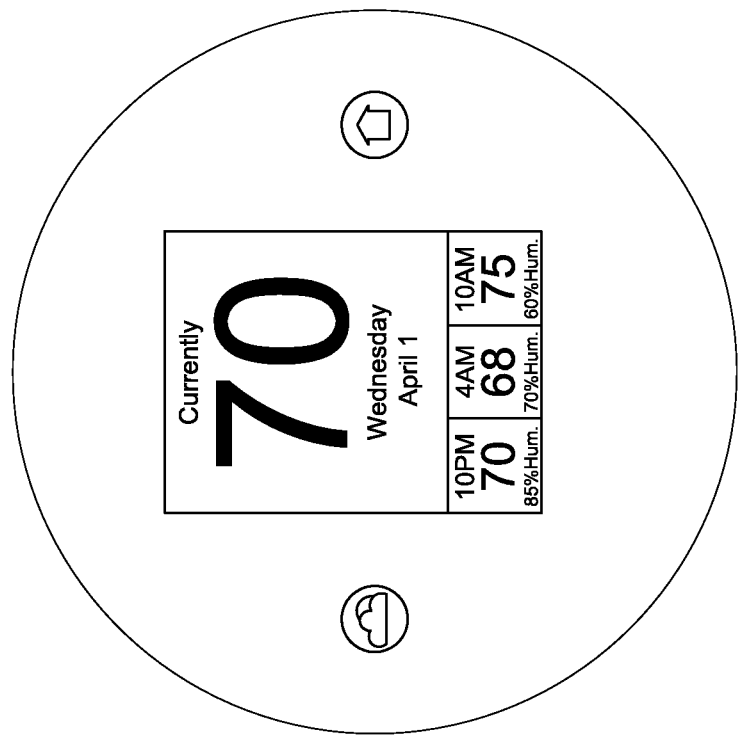
Figure 17K:
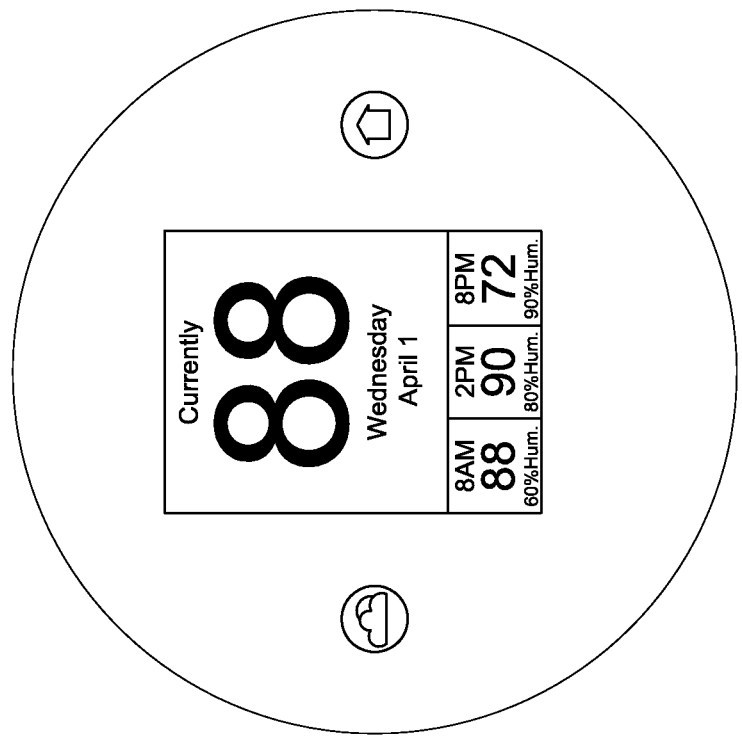

It will be appreciated that the actions and display changes may be accompanied by appropriate animation and/or playing of audio cues. It will be further appreciated that the display of weather information may take on any of a number of alternate forms, a few of which are illustrated in FIGS. 17J-17l.

In addition to the functions discussed herein, the thermostat may include additional display capabilities, such as reporting system status, and/or may initiate other actions. For example, the thermostat may detect a low battery condition and send a message via WiFi or other link to the network and thence to a cell phone and/or PC application, perhaps by SMS text message or e-mail, to warn of the low battery condition. In the event of a very low battery condition, the thermostat may display a low battery icon. In a survival mode, the thermostat may blank the display to conserve power, send additional messages via the WiFi or other link to the network and thence to a cell phone and/or PC application, perhaps by SMS text message or e-mail, and continue to control the HVAC equipment, perhaps in a state of delayed responsiveness to further conserve power.

If a WiFi enabled thermostat loses contact with the WiFi network for a significant period of time, perhaps three attempts to make contact at 30 minute intervals, the display may include a "No WiFi" message and/or icon. In the absence of WiFi or other network connection, the thermostat's user interface may disable certain features which depend upon network connection(s). For example, if the weather module is activated by touching the weather related stencil, if a pre-programmed action needs weather information, or if the Smart Away function requests weather information, perhaps through a manufacturer's or other server, the thermostat may display a message indicating that the requested function is not available, perhaps with an indication of the time at which the loss of connection was noted and/or an appropriate icon. In general, the thermostat may resume the default operation profile after competing any currently active Smart Away or one-touch operation which does not require a network connection. In some embodiments, the thermostat may suggest corrective actions such as restarting the router, calling the ISP, or calling the manufacturer of the thermostat. After a pre-selected time interval, the thermostat may resume the normal display mode and/or the normal display mode with a "No WiFi" message and/or icon. Following such actions, the thermostat may sense a lack of activity in the usual manner and enter a sleep mode after a specified time interval.

Other icons and/or text messages may be used to convey error conditions and/or the receipt and installation of firmware updates or instructions from the cell phone, PC, or manufacturer's server, as desired.

In some cases, user configurable one-touch actions may be provided. Such one-touch actions may be setup or activated at the thermostat itself, via a network such as by a cellular phone network, the Internet, a local WiFi network, and/or the like or combinations thereof. In some cases, access to a list of available one-touch actions may be provided by pressing a button or stencil on the window of the thermostat. In certain embodiments, the button or stencil may be double-touched to access one-touch actions and single-touched to access other functions such as Smart Away. In other embodiments, the one-touch actions may be accessed by maintaining contact with the button or stencil for a predetermined length of time (e.g. holding the button in for 5 seconds). When a one-touch menu is accessed at the thermostat, the upper display area of the thermostat may include two touch-activated regions for navigating the list of available one-touch commands and a touch-activated region for activating the selected command. The upper display area may include appropriate icons, for example up and down arrows and an ">" character, and activation(s) may be accompanied by appropriate audio and/or visual cues.

One-touch actions may be particularly for those people who do not live life by a set schedule and have a need for a HVAC system that easily accommodates modification of routine operation of the HVAC system by introducing pre-programmed or readily programmed macros that allow rapid and unique personal customization on a one-time or recurring basis. In some cases, the interface may allow one-touch activation of previously configured macros that may be provided for primarily time-based and/or non-time-based events as well as for non-time-based activities with a known time component.

Time-based events may include those events with at least one of a designated start time, a designated end time, and a duration designation in conjunction with a function, such as heat, cool, fan-on, and the like. In some events, the function may be inferred by the indicated direction of temperature change. Actions to be initiated by such events may be specified in a variety of ways. As a non-limiting example, an event may lower the current set point of the thermostat by 7 degrees for a period of 20 minutes starting at the current time. As another non-limiting example, the event may raise the set point 5 degrees for two hours starting at 3:40 PM on Tuesdays, Thursdays, and Fridays until further notice. The latter instance may, for example, be useful to better accommodate a student who is engaging in after school activities for a semester.

Non-limiting examples of non-time-based actions or activities include interests, weather, lifestyle, level of activity, home efficiency, number of occupants, detected presence of specific individual(s), and the like. Associated displays may include a clock, HVAC activity, outdoor conditions, alerts, and communications. In certain embodiments, the actions or activities may include conditional logic, for example, increase the set point by 5 degrees at 4:30 AM Monday-Friday IF the outdoor temperature is less than 20° F. AND the home is unoccupied. Some actions may simply increase or decrease the current set point by a few degrees until the next regularly scheduled temperature change to increase comfort if the user feels chilly or warm at the moment.

One-touch actions may be viewed as personalized modifications, or macros, added to a background program which typically has been fixed by programming temperatures to be maintained between fixed times within a daily profile. One-touch actions may introduce convenient variations or over-rides to a daily schedule which persist for a fixed time interval or until the next pre-programmed daily schedule action. For example, if a user occasionally decides in the morning to exercise in the home gym after work, a one-touch button activated in the morning may direct the system to lower the set point by 5° F. at 5:00 PM to accommodate the increased activity level. If, on the other hand, the user decides to go shopping before going home, the onset of a previously programmed temperature change may be delayed by 1.5 hours to save energy by activating a one-touch action.

In some embodiments, one-touch actions may provide incremental changes in the current set point while in other embodiments one-touch actions may initiate a change in a set point to a specified value. For users who frequently travel, a one-touch action may toggle the daily program from one group of temperature settings for time intervals to a corresponding group of "away from home" settings. The one-touch actions may specify qualifiers such as days of the week and absolute or relative times. One-touch actions may be conditionally based upon external or internal data. The thermostat may query a local weather service and, for example, raise the set point by five degrees for fifteen minutes when users are expected to arrive if the external temperature is below zero degrees to compensate for the introduction of cold air into parts of the house remote from the thermostat and to greet the user with a warm home if desired. The thermostat may also be responsive to the presence of users in the room or home at times when the house is expected to be unoccupied. This information may come from a variety of sources. For example, an IR sensor in the thermostat may determine that people are moving in the room, or may be aware of motion sensors associated with an alarm system for the house through a wired or wireless connection. In addition, the thermostat may be aware of the presence or even the approach to the home of one or more users through signals from cell phones or tablet computers which have an enabled location service such that the one-touch action may alter the current set point to prepare the house for occupancy.

A simplified programming environment may be used to pre-program aspects of the operation of a thermostat and to implement pre-programmed aspects of the operation of a thermostat. Within an application running on, for example a cell phone, tablet computer, or personal computer, a user may create one-touch actions that are relevant to them and create a unique set of home comfort conditions that are ideal for them. Once programmed, the one-touch actions may be transmitted to a WiFi enabled thermostat via a network such as by a cellular phone network, the Internet, a local WiFi network, and/or the like or combinations thereof for storage at the thermostat. The one-touch actions may be invoked (over-ride the currently programmed schedule) remotely and/or at the thermostat. In some embodiments, as the thermostat "learns" which one-touch actions are more frequently used, the thermostat may order the list of available one-touch actions or macros to present the available actions in frequency-of-use order. In other embodiments, the list of available one-touch actions may be presented or ordered by other criteria such as by who created the action or may be presented or ordered according to their date of creation. In still other embodiments, the one-touch commands may be ordered chronologically according to the order in which certain events are expected to occur such as, for example: wake, leave, home, sleep. Other less frequently used one-touch actions such as one-touch actions related to comfort settings for a party or economy settings for a vacation may appear towards the end of the list of one-touch actions that are displayed. Other groupings and/or ordering by a user configurable drag-and-drop list may be employed.

At the thermostat, consumers can choose to display available one-touch actions such that they are actionable and available to the consumer by pressing a window button. When engaged, these actions may drive conditions within the house to pre-configured settings with one consumer touch or may alter or over-ride the underlying basic schedule such that the change is implemented at some future time. These actions may be customized and chosen by the consumer so that they have controls and functionality which are time or non-time based and which are relevant to them. While "one-touch" is used as a descriptor to indicate ease of use, it is contemplated that more than one touch may be required to activate the action, depending on the implementation.

In one example one-touch action, the user or users may configure a one-touch action for when people will or won't be at home to maximize comfort when home and maximize savings when away. A user may, if desired, configure a group of one-touch actions to conserve energy when they decide to leave the house for an extended period of time such as a 3, 4, 5, or 6 hour temperature set back, for example to dine and attend a movie or concert. In other embodiments, the away from home options may be a partially or completely pre-programmed system option. The user may also configure lifestyle or level of activity actions, such as exercise room work out time. When turning this action on, for example, the home may be cooled, or allowed to cool, more than normal by lowering the set point and the fan may be set to circulate more, since people typically feel hotter when using an exercise room. Such actions may be implemented to start immediately or at a specified time. In some cases, such one touch actions can be implemented for only a selected zone or selected zones of a zoned HVAC system.

In addition, at the thermostat, consumers can choose to have simple information displayed to them which are unique and/or relevant to them, such as weather, clock, or HVAC activity. These one-touch actions and information displays may be configured and displayed alongside or instead of other one-touch actions such that operation remains intuitive.

The option to configure one-touch actions using a cell phone, tablet, or personal computer application allows the user experience to be richer and more intuitive in view of the greater display and input options. The larger application display area may, for example, display categories of actions and fully displayed lists of options for selection rather than requiring stepping through menus. Similarly, some inputs may be more conveniently entered directly from a keyboard or a pull-down list rather than up or down stepping. For example, a scrolling list may be somewhat limited as to the reasonable number of time increments whereas a user may enter a time such as 4:23 directly from a keyboard, if desired, rather than being limited to, for example, 10 minute increments in a list.

Figure 18B:
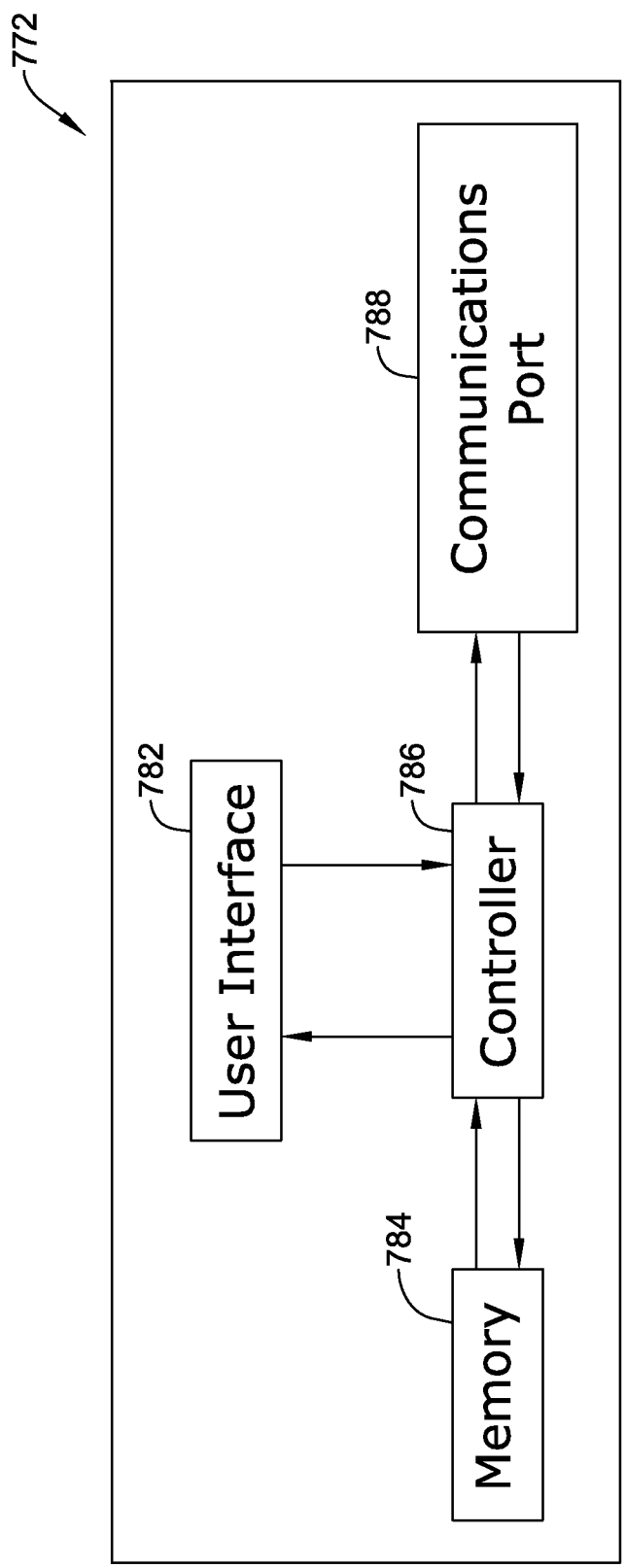
FIG. 18B is a block diagram of a remote user device that can be utilized with the building automation system of FIG. 18A.

The one touch actions may be considered user defined macros. In some cases, each of the macros may include a user selected trigger, and a corresponding user selected action. FIG. 18A provides a block diagram of a building automation system 770 while FIG. 18B provides a block diagram of a remote user device 772 that can be used in conjunction with the building automation system 770.

In some embodiments, the building automation system 770 includes a memory 776 for storing one or more user defined macros and a controller 776 that is operably coupled to the memory 776. For each of the user defined macros, the controller 774 may be configured to determine when a user selected trigger occurs, and in response, outputs one or more control signals to achieve the corresponding user selected action. In some embodiments, at least one of the user defined macros has a name that is user defined, and wherein the user defined name is displayed on a display. The display may be part of the building automation system 770 and/or the remote user device 772, among others.

In some embodiments, for a particular user defined macro, the user selected trigger may be selected from a plurality of predefined triggers. Illustrative but non-limiting examples of suitable triggers include activation by a user, activation at a specified time, activation when no one is home, and activation when someone is home. In some embodiments, for a particular user defined macro, the user selected action may be selected from a plurality of predefined actions. In some cases, the plurality of predefined actions may be programmed into the building automation system 770, for example. Illustrative but non-limiting examples of predefined actions include lowering the temperature by a specified amount, raising the temperature by a specified amount, lowering the temperature by a specified amount for a specified length of time, raising the temperature by a specified amount for a specified length of time, changing the temperature to a specified value, changing the temperature in one or more specified zones, lowering the humidity by a specified amount, raising the humidity by a specified amount, lowering the humidity by a specified amount for a specified length of time, raising the humidity by a specified amount for a specified length of time, activating a fan to circulate air, deactivating a fan to not circulate air, activating a heat exchanger, deactivating a heat exchanger, activate a security system, deactivate a security system, turn on lights, turn off lights, open a garage door, close a garage door, turn on a pool pump, turn off a pool pump, turn on an appliance, and turn off an appliance.

In some embodiments, the building automation system 770 may include a communications port 778 that is operably coupled to the controller 774 and that is configured to receive input from a user. In some cases, the input from a user includes but is not limited to a user selected trigger and a corresponding user selected action for at least some of the one or more user defined macros. In some cases, the communications port 778 is configured to receive input from a user's remote device such as a smart phone, a tablet computer, a laptop computer and a personal computer. In some embodiments, a user's remote device may include the remote user device 772 (FIG. 18B).

In some embodiments, the communications port 778 is configured to output one or more control signals for controlling building automation equipment (not illustrated). In some embodiments, the memory 776, the controller 774 and the communications port 778 may be part of a server, but this is not required. In some cases, the communications port 778 may be configured to output the one or more control signals to a building controller such as a building controller 780. In response, the building controller 780 may provide one or more control signals for controlling building automation equipment. Illustrative but non-limiting examples of building automation equipment include HVAC equipment, security equipment, lighting equipment and the like.

The remote user device 772 (FIG. 18B) may, as noted above, represent a variety of different devices, including but not limited to a smart phone, a tablet computer, a laptop computer, and a personal computer. The remote user device 772 may include a user interface 782 and a memory 784 for storing one or more user defined macros, each of which include a user selected trigger and a user selected action. A controller 786 is operably coupled to the memory 784, the user interface 782 and a communications port 788. In some cases, the communications port 788 is a wireless communications port, but this is not required.

In some embodiments, the controller 786 may be configured to accept, via the user interface 782, a definition for a new user defined macro. The controller 786 displays a plurality of triggers via the user interface 782 and accepts a selection of a user selected trigger for the new user defined macro. The controller 786 then displays a plurality of actions via the user interface 782, and accepts a selection of a user selected action for the new user defined macro. The new user defined macro is stored in the memory 784 and is transmitted to a remote location, optionally a remote server, via the communications port 788.

Figure 18C:
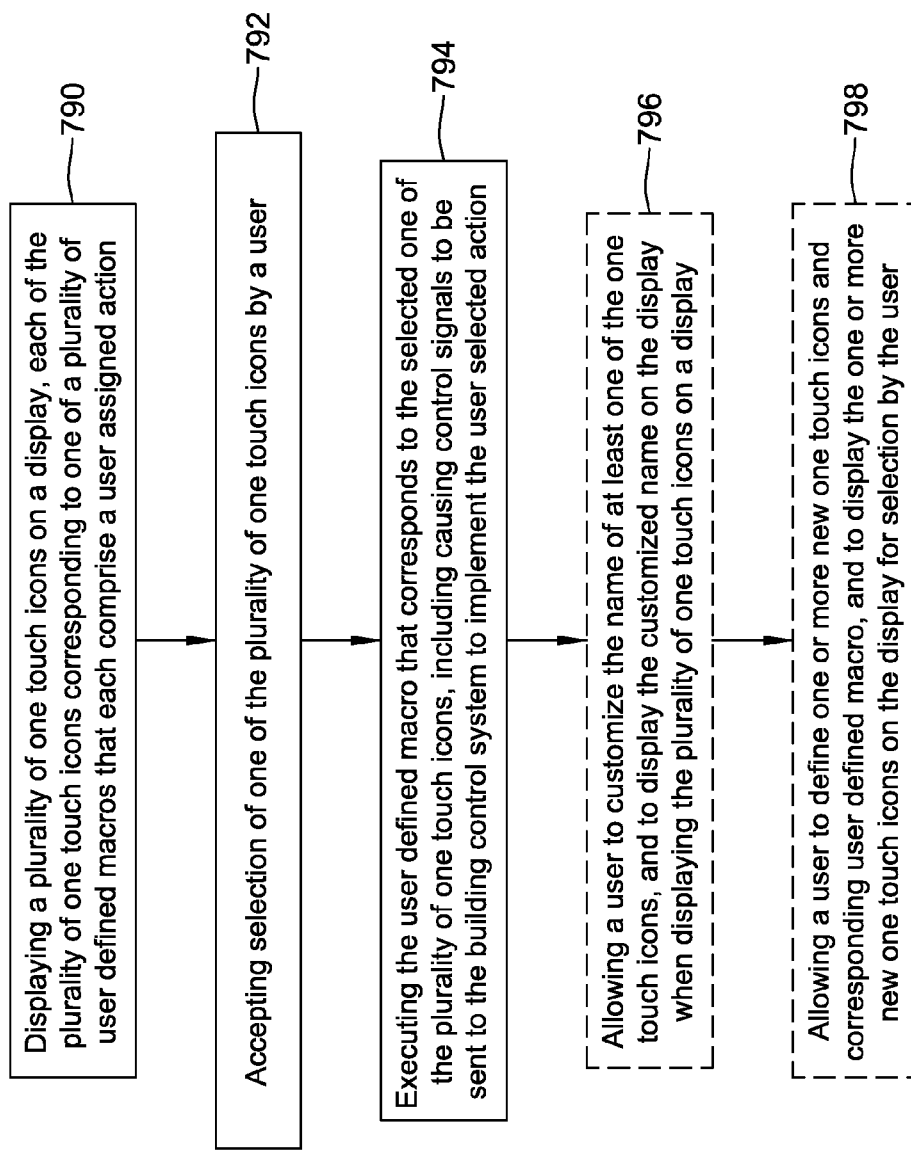
FIG. 18C is a flow diagram showing a method that may be carried out using the building automation system of FIG. 18A and the remote user device of FIG. 18B.

FIG. 18C is a flow diagram of an illustrative method that may be carried out using the building automation system 770 (FIG. 18A) and/or the remote user device 772 (FIG. 18B).

As generally shown at block 790, a plurality of one touch icons may be displayed on a display, each of the plurality of one touch icons corresponding to one of a plurality of user defined macros that each includes a user assigned action. One of the plurality of one touch icons may be selected by a user, as indicated at block 792. The user defined macro that corresponds to the selected one of the plurality of one touch icons may then be executed, including causing control signals to be sent to the building control system to implement the user selected action as generally indicated at block 794. In some cases, the displaying step of block 790 and/or the accepting step of block 792 may be performed on a remote user device such as the remote user device 772 (FIG. 18B), which as noted may be a smart phone, a tablet computer, a laptop computer or a personal computer.

In some embodiments, and as indicated at optional block 796, a user may be allowed to customize the name of at least one of the one touch icons, and to display the customized name on the display when displaying the plurality of one touch icons on a display. In some cases, and as indicated at optional block 798, a user may be allowed to define one or more new one touch icons and corresponding user defined macro, and to display the one or more new one touch icons on the display for selection by the user.

Figure 18D:
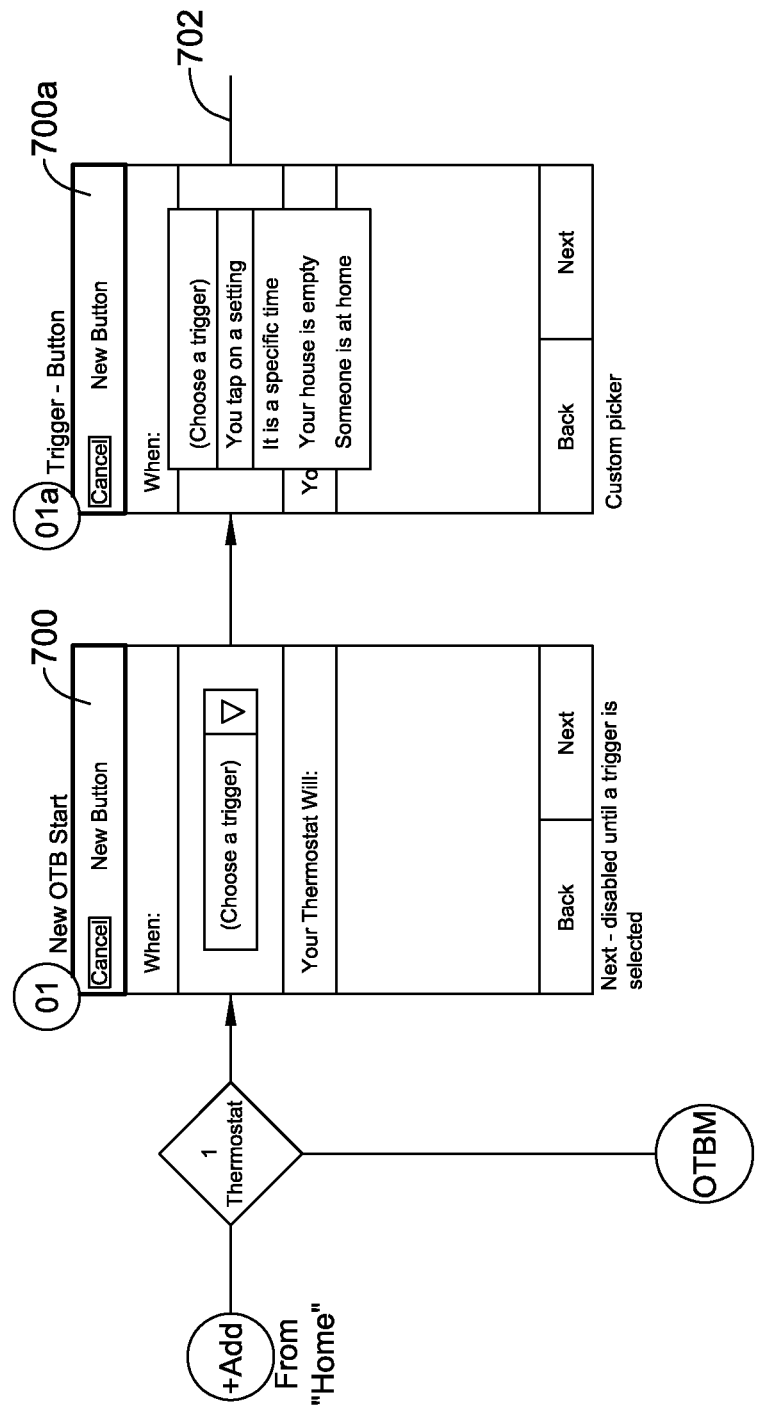
FIGS. 18D-18J are an illustrative flow diagram of programming one-touch actions (e.g. macros)
Figure 18E:
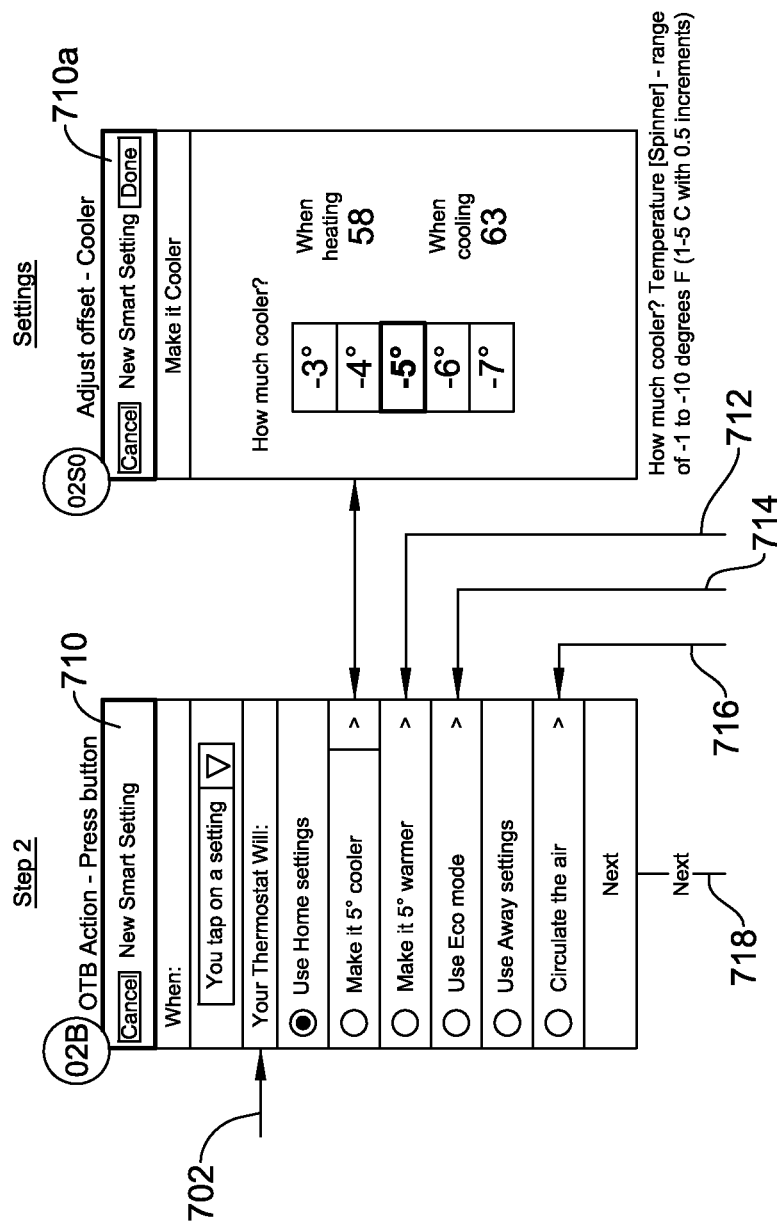
Figure 18F:
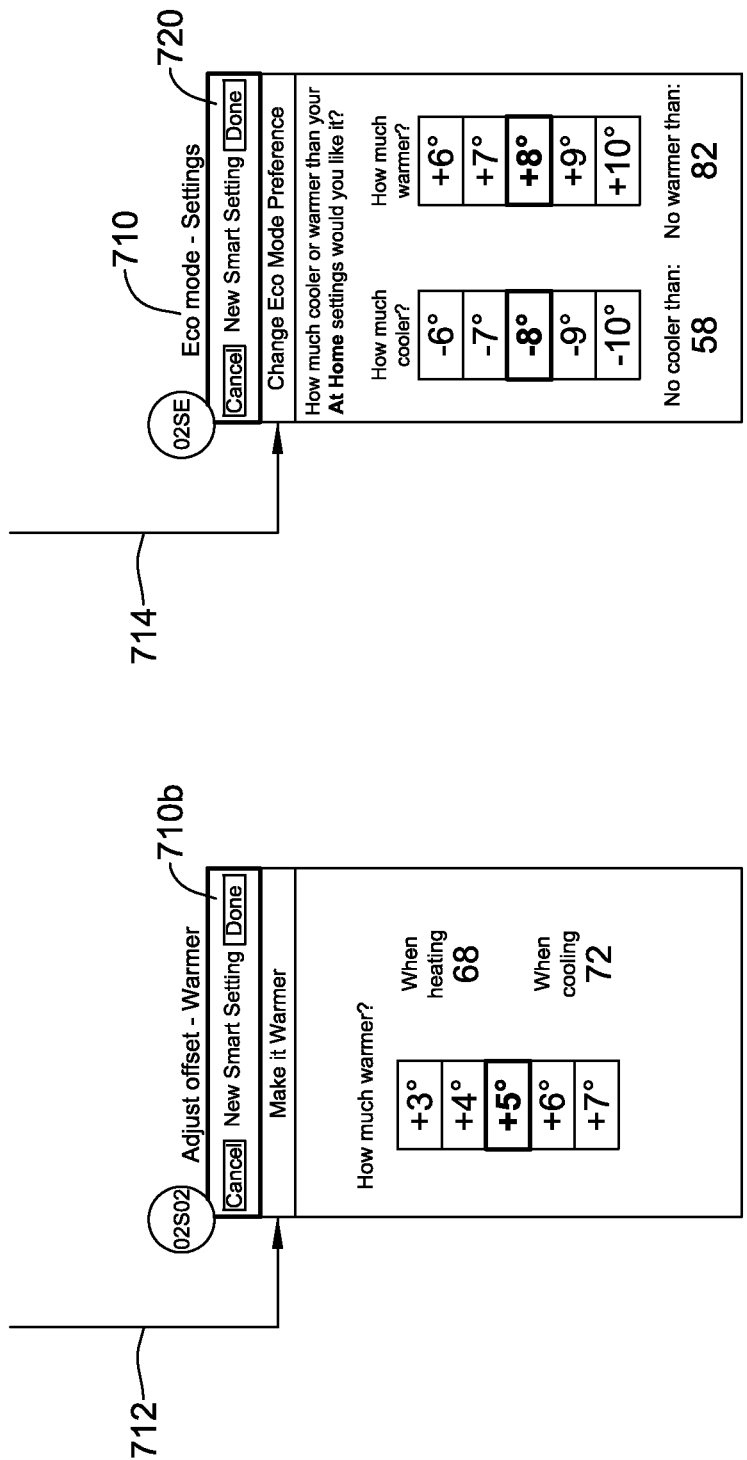
Figure 18G:
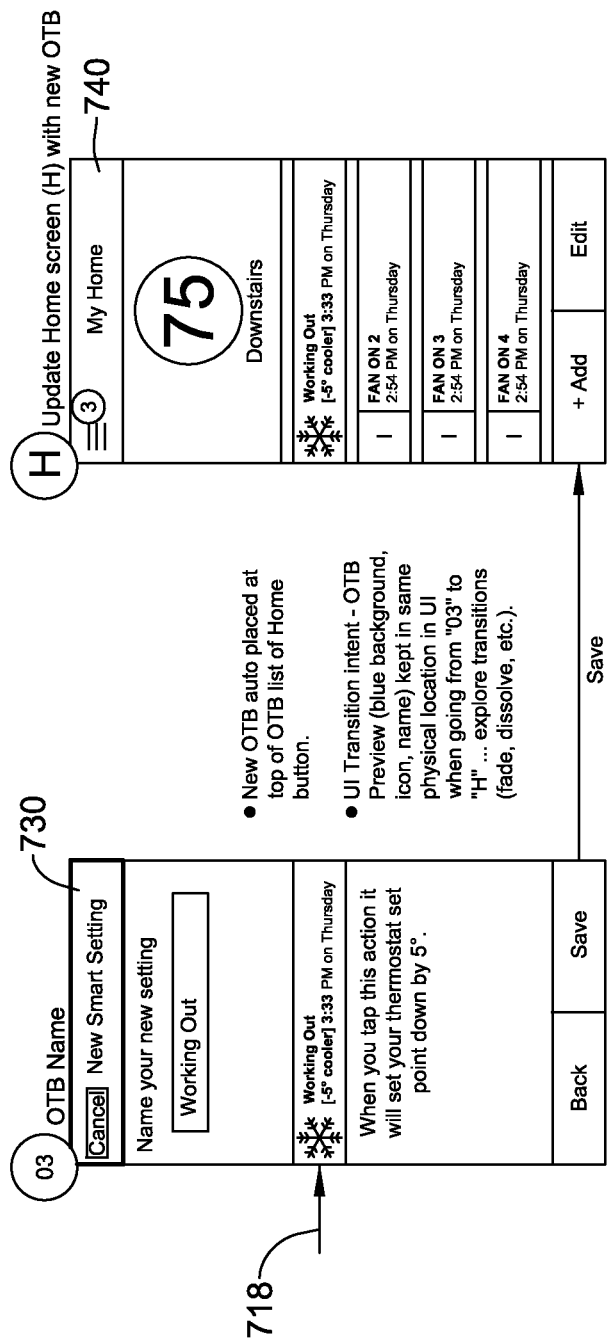

FIGS. 18D-18J provide illustrative but non-limiting examples of screens from an illustrative remote user device. It will be appreciated that these screens provide additional examples of user defined triggers and corresponding user defined actions. In FIG. 18D, an initial screen 700 may present the user with options for triggering the one-touch action which may include a "You Tap on a setting", "It is a specified time", "Your house is empty", "Someone is at home", and the like at 700*a*. If the user selects "You Tap on a setting", the programming application may present common options such as "Use at home settings", "Make it 5 degrees cooler", "Make it 5 degrees warmer", "Use economy settings", "Use Away settings", "Circulate the air", and the like at 710 (see FIG. 18E). Within those common options, in addition to the option to accept a presented default, the application may present additional opportunities for customization as seen at 710*a*, 710*b*. For example, following selection of one of the "Make it 5 degrees cooler" and "Make it 5 degrees warmer" options, the application may provide a button which presents an additional menu with the option to provide finer control of the temperature offset and conditions for applying the offset. In some embodiments, the application may present options for the offset in 1 degree increments from 1 degree to 10 degrees, or other convenient range, and allow the user to specify whether the action applies when heating or cooling. In other embodiments, the application may present the offset as a display of the temperature to be maintained. Alternatively, the application program code may display an adjusted temperature setpoint adjacent a temperature offset. The adjusted temperature setpoint is reflective of the temperature setpoint that results after the temperature setpoint is applied. In certain embodiments, those buttons which admit of further options in addition to a default value may include a sub-icon such as an arrow which if selected provides further options. In such embodiments, selection of the button which admits of further options may require confirmation of the selection in the form of, for example, a double-tap or selection of a "Next" button within the display.

When the "use eco mode" is selected via screen 710, the screen 720 may be displayed. As can be seen, the application may set upper and lower limits on a departure from the set-point temperature in screen 720. Once the desired conditions for the new one-touch action have been selected, the user may be presented with the option to name the new setting 730 and to add it to the list of available one-touch actions 740 and the information may be shared with other devices which may initiate one-touch actions within the system such that the newly created action is available from all devices associated with the thermostat.

When the triggering event "It is a specified time" on screen 700*a* (FIG. 18D), the application may specify the triggering time(s) and day(s) of the week for the action and pass control to the previously described temperature modification options and following selection of those options to the naming and distribution functions described above.

Figure 18H:
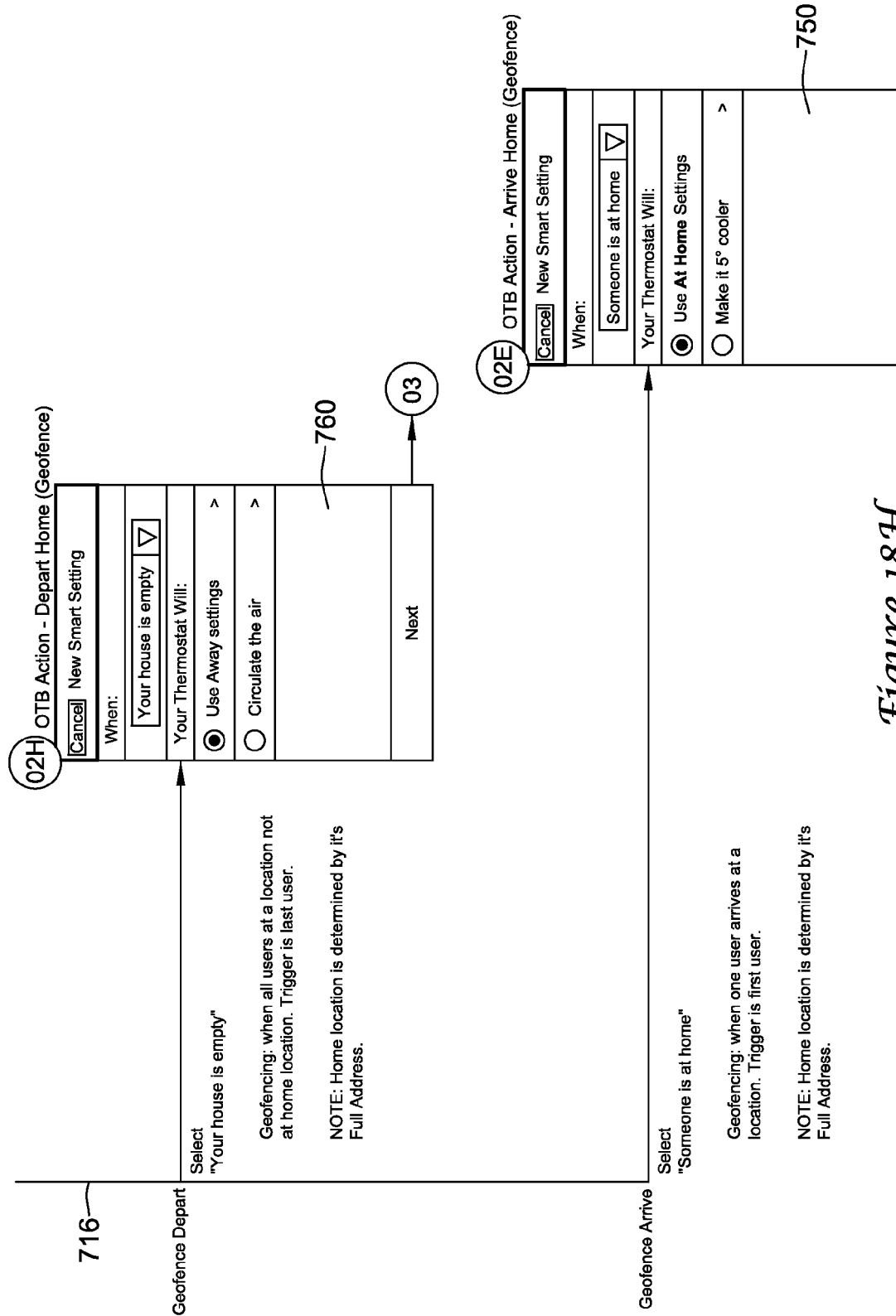

The one-touch actions may also be programmed to be responsive to the presence 750 or absence 760 of occupants within the house and/or, in some embodiments, within a user specified distance from the house. See FIG. 18H. As can be seen in FIG. 18H, in some instances, the location of the house may be defined by its full address. In some cases, this may be a street address. In other cases, the full address may be a GPS position and/or a position identified via a cellular network. In some instances, the full address may refer to longitude and latitude values. These are just some examples.

As discussed herein, the thermostat may employ an IR sensor and associated optical element 210 within the thermostat to determine that people are moving in the room, or may be aware of motion sensors associated with an alarm system for the house through a wireless connection. The system may determine that all occupants are absent by the failure to sense an occupant for a specified length of time. In addition, the thermostat may be aware of the presence or even the approach to the home of one or more users through signals from a cell phone or tablet computer which has an enabled location service. Such user related location services may be generalized such that the departure of all registered users or the departures of each member of a subgroup of registered users may trigger the specified settings. Similarly, the approach or presence of any registered user or of one or more specific individual registered users may trigger the specified settings.

Figure 18I:
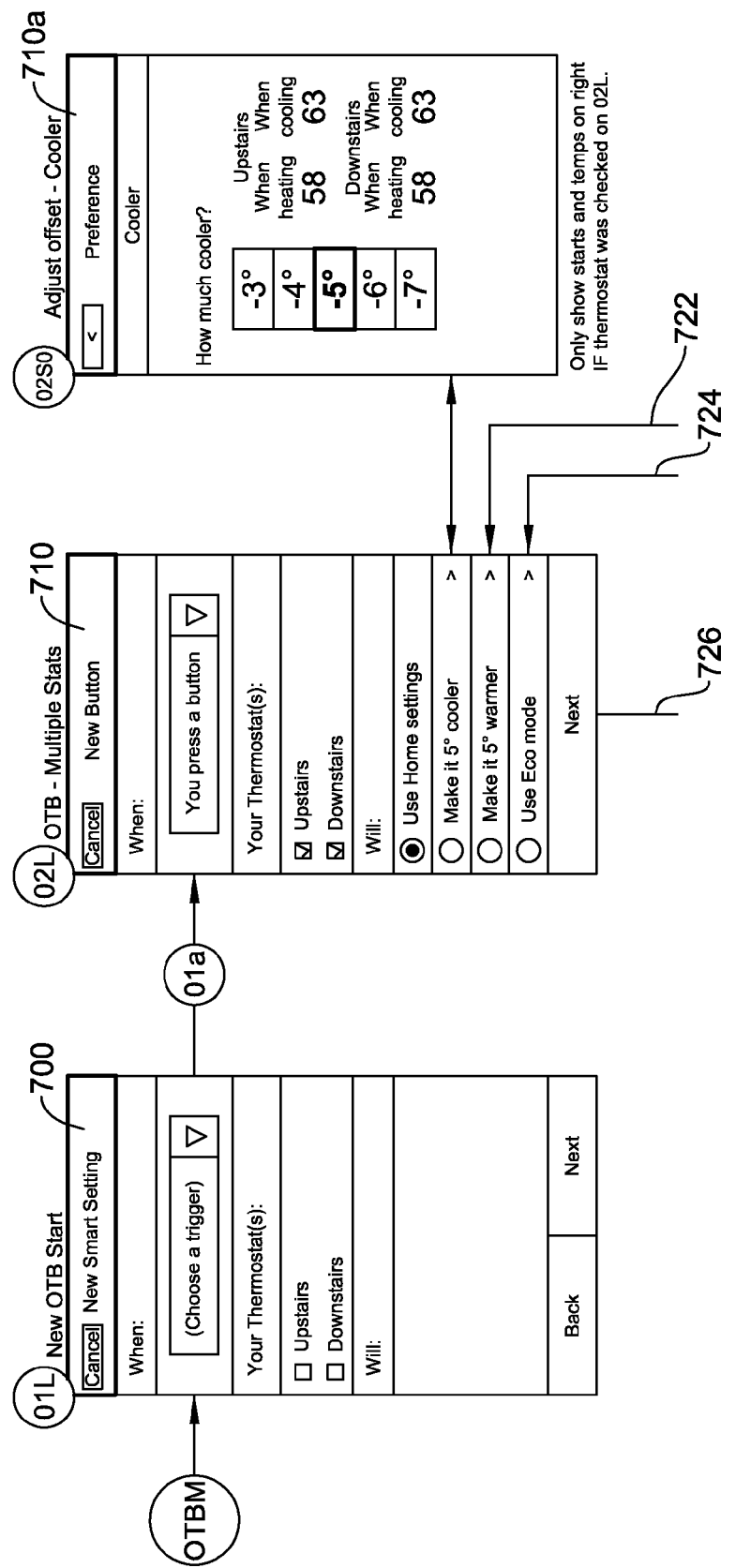
Figure 18J:
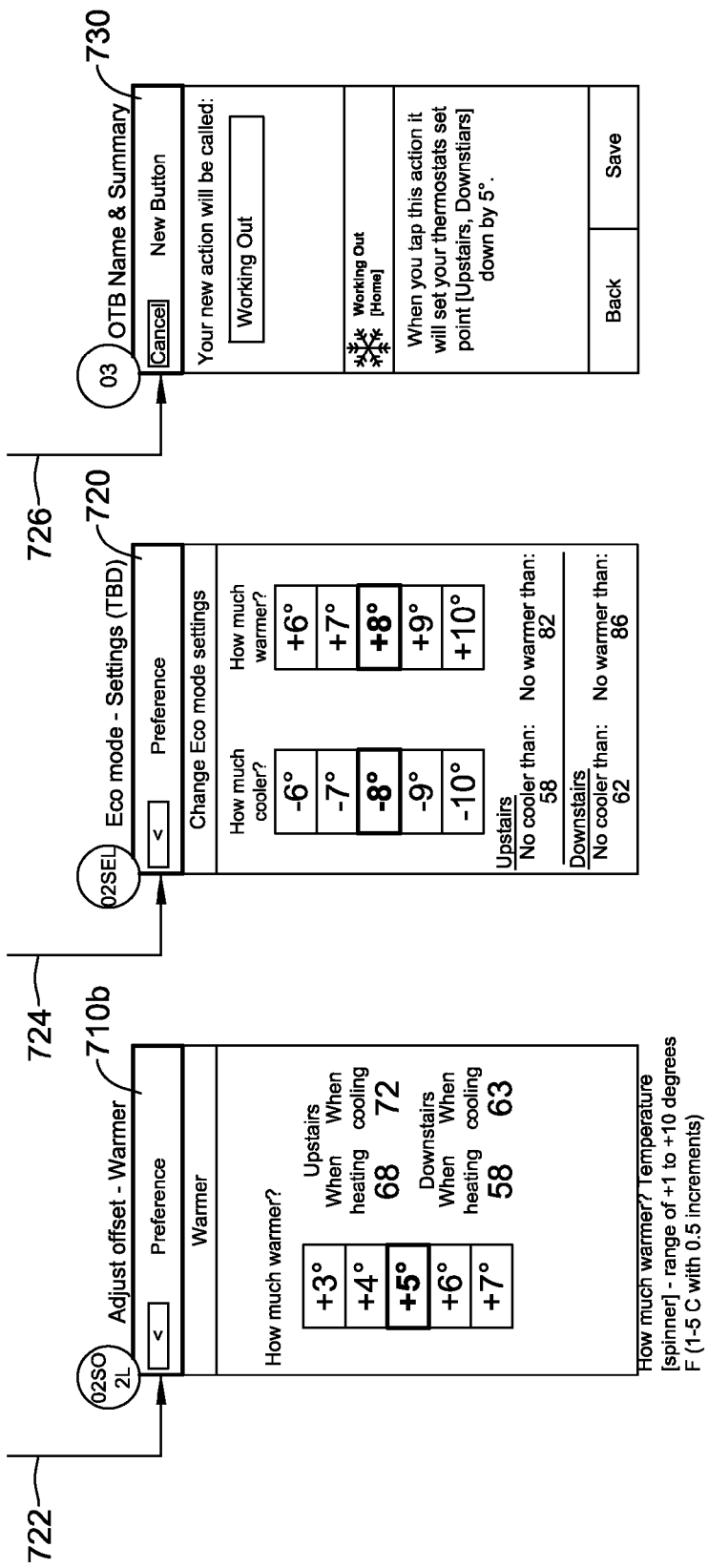

An example of programming one touch actions for a zoned system (e.g. upstairs and downstairs) is shown in FIGS. 18I-18J.

In addition to the expressly described programming functions, the application(s) will be understood to include the ordinary editing, cancelation, deleting, etc. actions of a user interface as well as screens for presenting, selecting, and activating one-touch actions. The application may include the capability of providing comments or other information for display when a one-touch application is active. In some embodiments, such additional information may be in the form of a user supplied graphic and/or may be accompanied by an audio cue.

Once configured, whether at the device or at a remote application location, one-touch actions may be activated at the device or at remote application location(s). In addition, simple information may be displayed on the device and optionally may be accompanied by audio cues.

In some instances, the thermostat may transfer operational data to an application or applications which reside on one or more of a cell phone, personal computer, and remote server for analysis and compilation of reports for the user. As discussed herein, the data transfers involved may be accomplished via wireless communication links, wired connections, or combinations of wireless communication links and wired connections using one or more of the commonly employed communication protocols. In some embodiments, the information may be accumulated and transferred to one or more of a cell phone, personal computer, or remote server from another component of the HVAC system such as an equipment interface module. Such transfers may be initiated by either the information collecting equipment (the thermostat or equipment interface module) or by a receiving application running on the one or more of a cell phone, personal computer, and remote server. The transfer of information may occur on a regular schedule, upon the occurrence of a triggering event within the system, or may be initiated by the user. Illustrative sources driving the transfer of information and/or the delivery of a message may include, but are not limited to: user behavior; historical behavior, neighborhood/local trends in behavior (e.g. local trends in energy usage); local weather and impending weather events; energy consumption; HVAC controller status (e.g. loss of network connection, low batter, etc.); HVAC system status; smartphone location; and/or events occurring at the HVAC controller. In some instances, one of the information collecting equipment, the one or more of a cell phone, personal computer, or remote server may not be on-line or otherwise available to participate in an exchange of data, alerts, or reports at the time that such exchanges would normally occur. In such instances, the system components may periodically attempt to establish communication and/or may deposit a message for later retrieval, such as an e-mail or text message, to ensure that data exchange(s) occurs when direct communication is reestablished.

In some instances, consumers lack information on the performance and health of their HVAC system, which may lead to unexpected changes in utility bills and/or undesirable delays in performing routine or other maintenance. Using data from the HVAC system, such as system run time, settings, sensor readings, maintenance schedules, and functional alerts as well as Web-based information such as climate data, daily weather data, utility rates, maintenance schedules, manufacturer's bulletins, and the like, an application may assemble periodic reports, on-demand reports, and/or alerts to be delivered to the consumer, for example by a message center on a server to a smart phone or personal computer application or by e-mail to a smart phone or personal computer.

For the purpose of discussion, the examples provided will focus primarily on delivery to a smart phone application having a touch screen. However, it will be appreciated that other delivery methods may employ different display characteristics and interactions due to conventions associated with the operating environments.

Figure 19A:
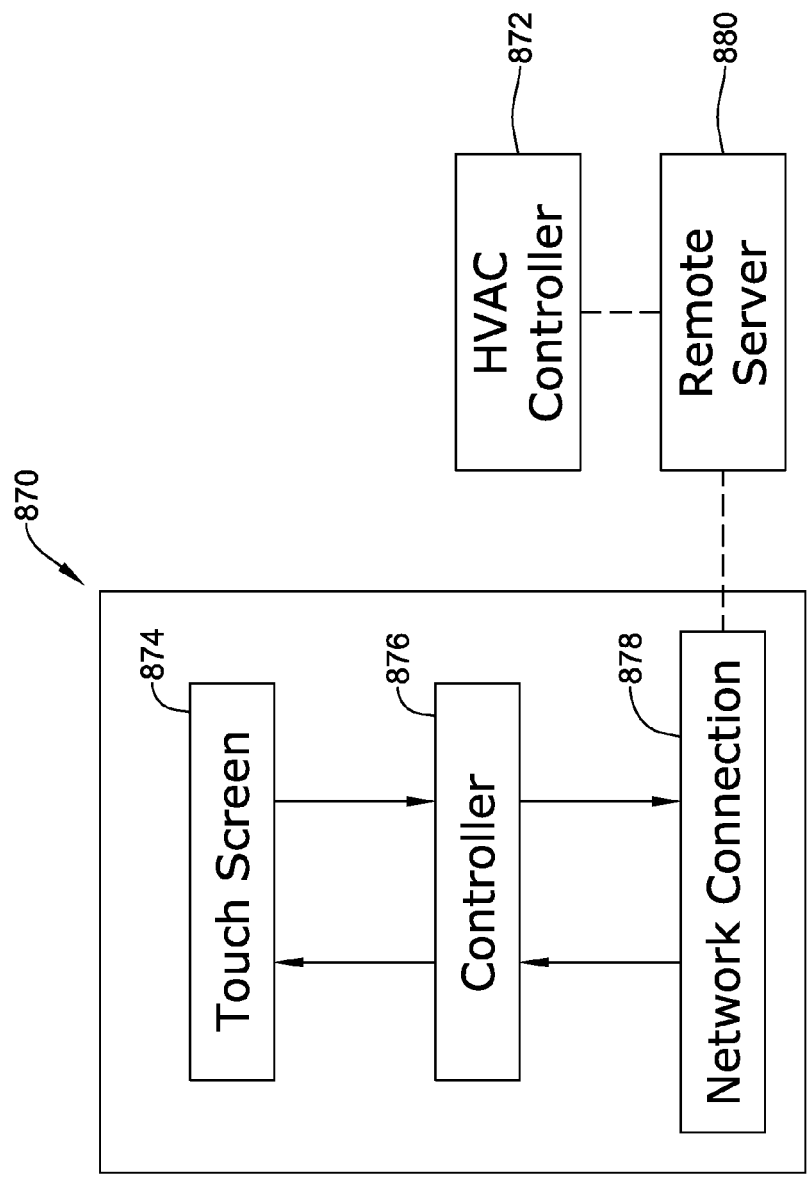
FIG. 19A is a block diagram of an illustrative mobile device that can be used to program an illustrative HVAC controller of a building automation system.
Figure 19B:
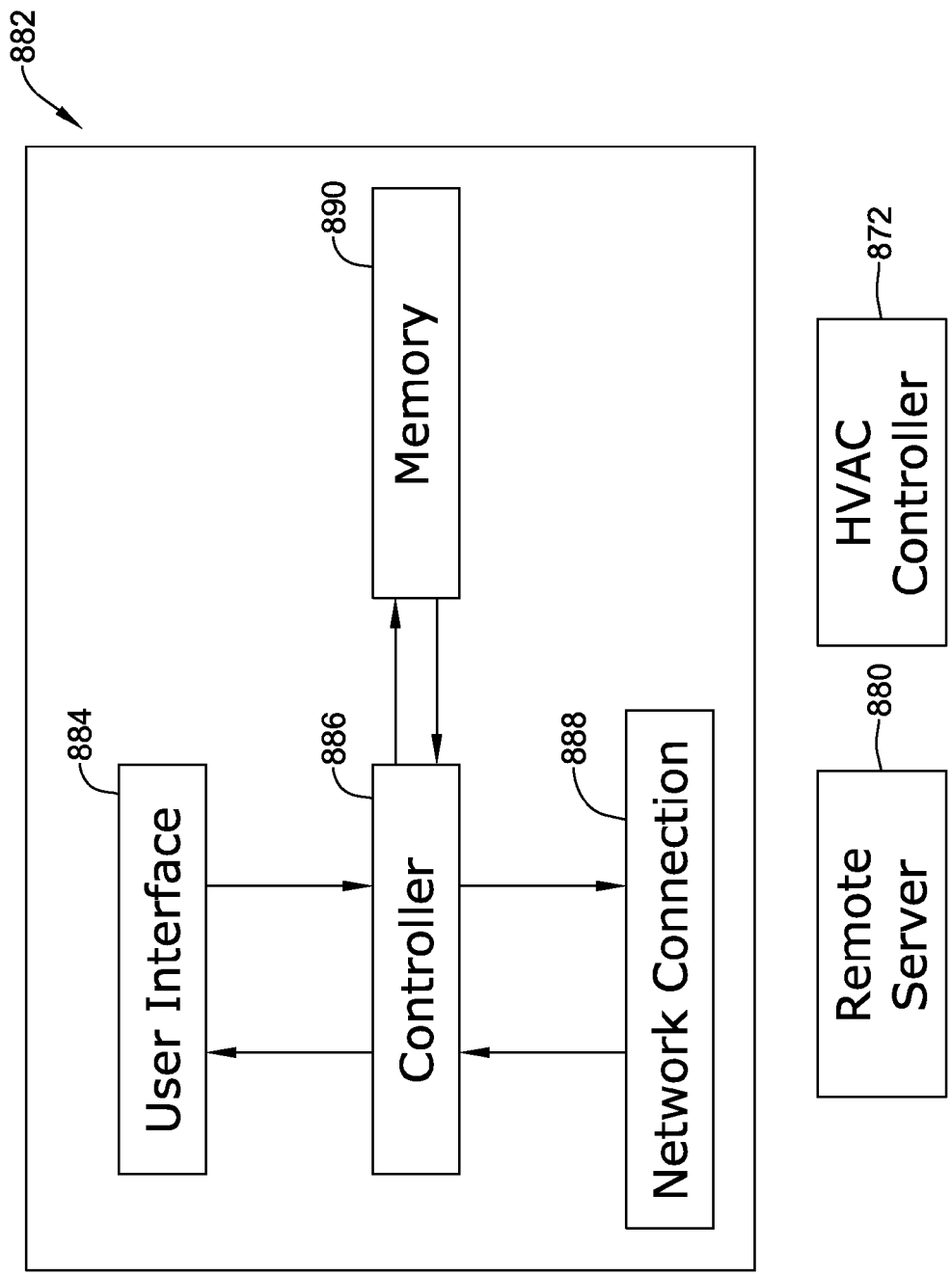
FIG. 19B is a block diagram of another illustrative mobile device that can be used to program an illustrative HVAC controller of a building automation system.
Figure 19C:
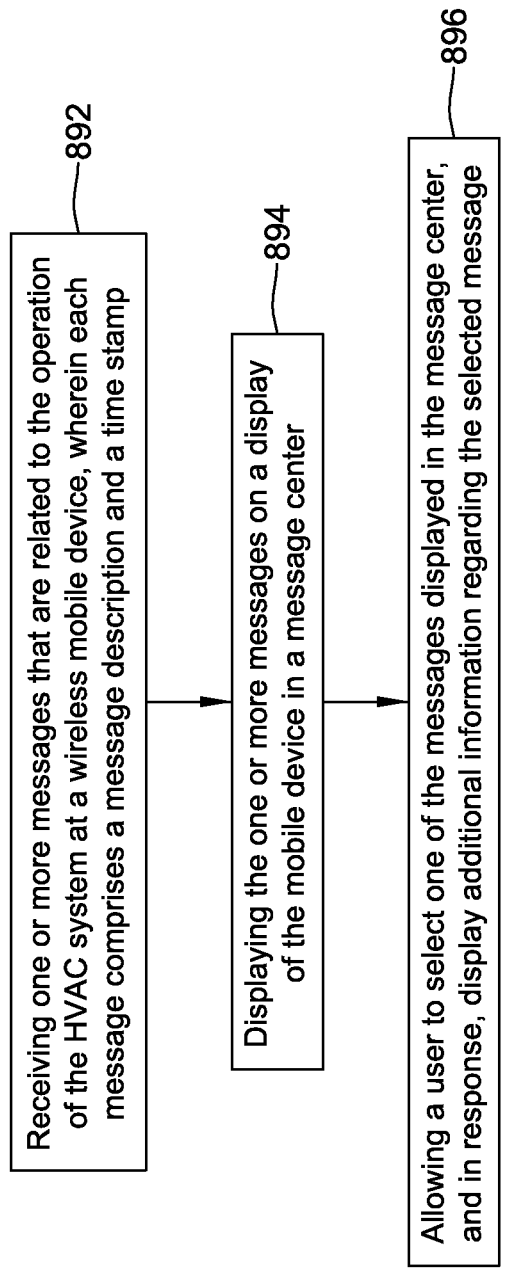
FIG. 19C is a flow diagram of an illustrative method that may be carried out using the mobile devices of FIG. 19A and/or FIG. 19B.
Figure 19D:
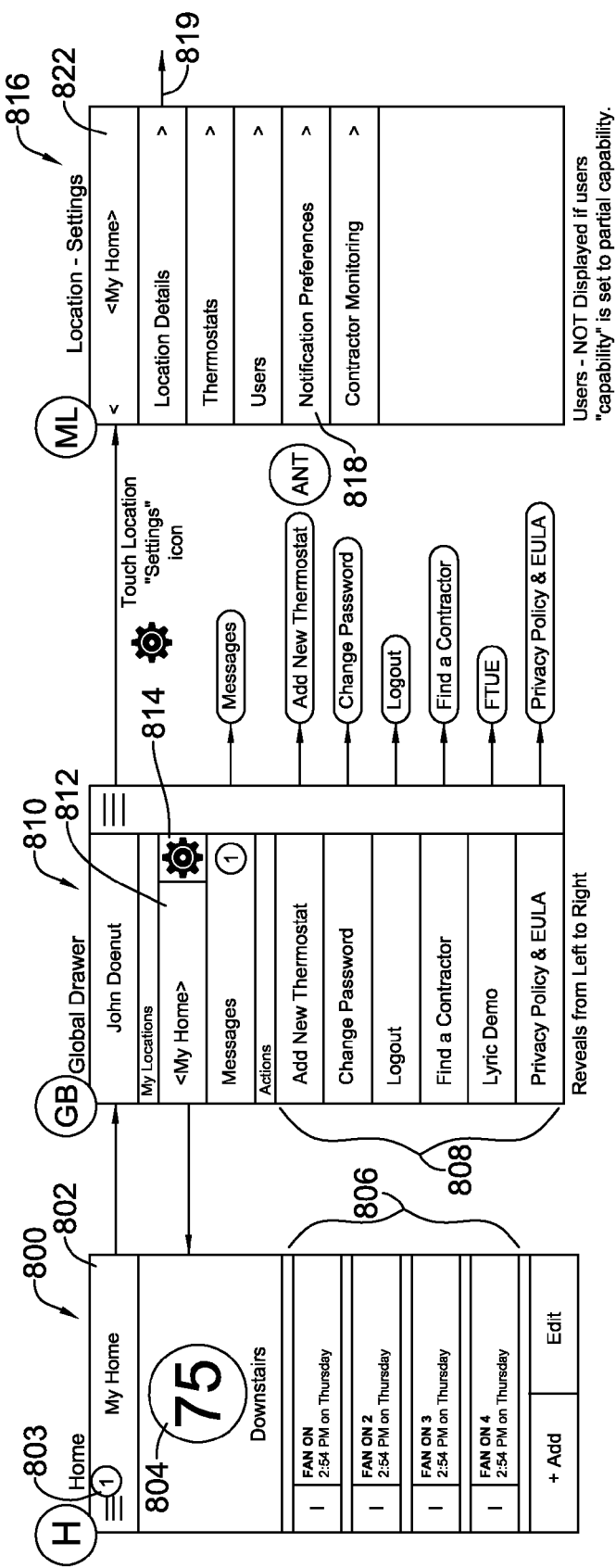

When a user opens the application, a home screen 800 may open, for example, with a user provided identifier 802 for a default thermostat location, a summary of the current state 804 of the selected thermostat, a scrolling list of recent system actions in reverse chronological order 806, and selectable options 808, as shown in FIG. 19D. In some embodiments, home screen 800 may include an indication 803 of the number of recent system actions which have not been reviewed. Touching the identifier 802 may provide an options screen 810, which may allow the user to specify a thermostat at a different location 812 which typically would return the display to the home screen 800 with the information for the selected thermostat displayed. In the alternative, the user may select from the list provided on options screen 810. Many of the displayed options are self-explanatory and/or have been described previously. Of the illustrative examples, the "Messages" option will be discussed below.

Figure 19E:
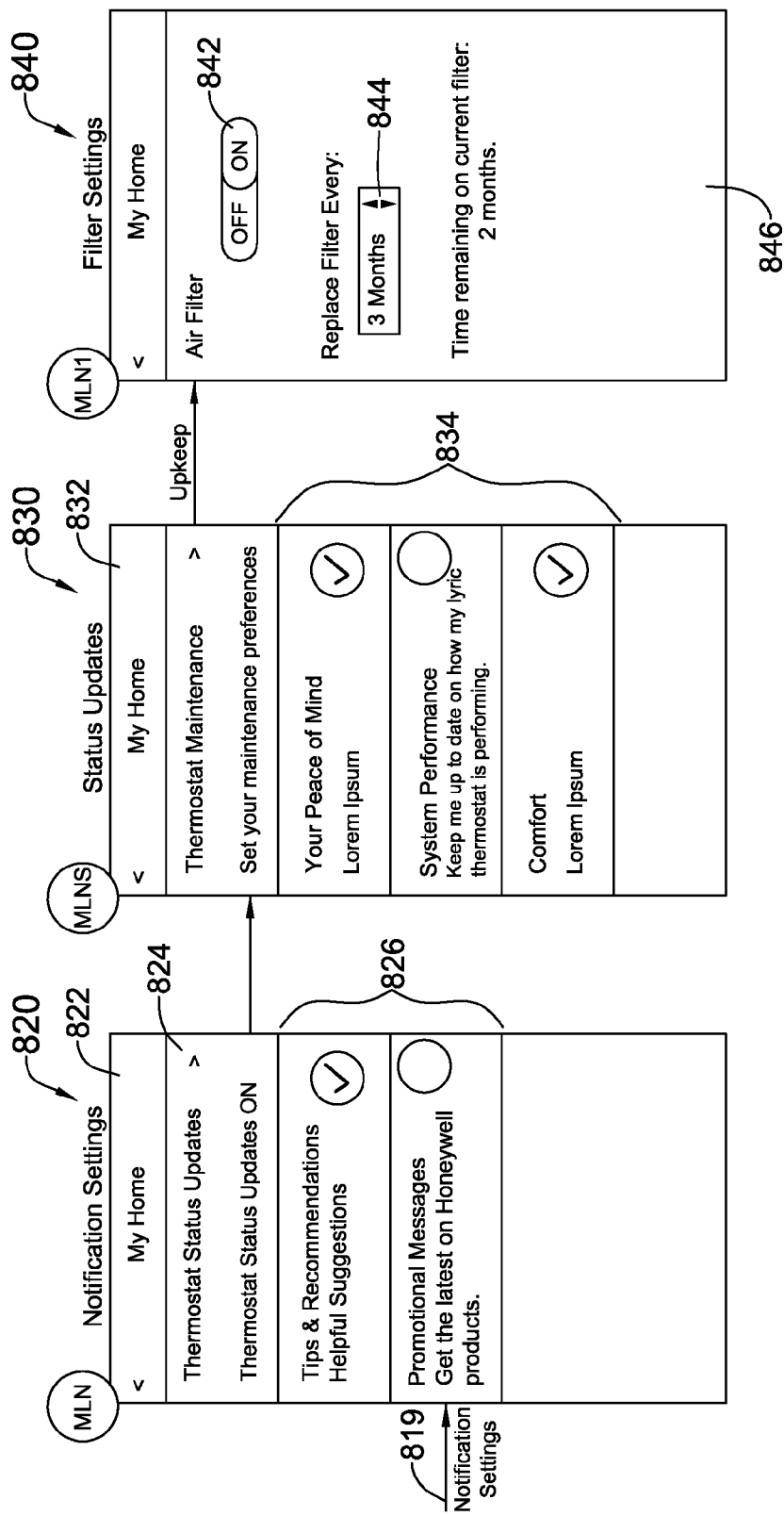

Selecting the Settings icon 814 may direct the application to display screen 816, which confirms the location 822 for which the preferences will be selected and permits updating various settings pertaining to the selected location. Among those settings may be "Notification Preferences" which when selected calls up screen 820 shown in FIG. 19E. The illustrated screen 820 provides a toggle for turning status updates on and off, and a list 826 of other possible notification categories that the user may elect to receive and/or suppress. Typically the list 826 of possible notification categories will indicate visually which categories are currently selected by displayed text, a check box, radio button, highlighting, or the like.

When thermostat status updates are turned on, the application displays screen 830 which again confirms which location is currently selected at 832. Screen 830 also displays a set of selectable categories which may be selected and indicates visually which categories are currently selected by displayed text, a check box, radio button, highlighting, or the like. An illustrative example of the Thermostat Maintenance status category is shown on screen 840 which includes a toggle for the reminder and a user selectable reminder indicator. In some embodiments, the display may also indicate the time remaining until maintenance is suggested.

With brief reference to FIG. 2, the HVAC controller 18 may be configured to communicate with a remote device such as the remote device 62. The HVAC controller 18 may send information to the remote device 62, and the remote device 62 may send information to the HVAC controller 18, sometimes via an intervening remote server. FIG. 19A provides a schematic block illustration of a mobile device 870 that may be used in programming an HVAC controller 872 of an HVAC system. In some embodiments, the mobile device 870 is a smartphone or tablet computer, but this is not required. In some embodiments, the mobile device 870 may be considered as an example of the remote device 62 (FIG. 2).

The mobile device 870 may include a touch screen display 874 that is configured to display information and to permit a user to enter information. A network connection 878 may be configured to communicate with a remote server 880 that is itself in operative communication with the HVAC controller 872. The mobile device 870 includes a controller 876 that is in operative communication with the touch screen display 874 and the network connection 878. The controller 876 is configured to receive one or more messages related to the operation of the HVAC system via the network connection 878, and to display the one or more messages on the touch screen display 874.

In some embodiments, one or more messages are displayed in a message center, sometimes in a list format. When so provided, the most recent messages may be displayed at the top. Alternatively, the most serious or urgent messages may be displayed at the top. In some cases, each message has a message description and a time stamp displayed. Optionally, each message has an indicator that indicates if the message has already been selected and read by the user. In some embodiments, at least one of the messages in the message center are selectable, and once a message is selected, the controller 876 may be configured to display on the touch screen display 874 display additional information regarding the selected message. In some cases, the messages in the message center can be deleted by the user. In some embodiments, the controller 876 executes an application program, and the message center is implemented by the application program.

A variety of messages may be displayed in this manner. For example, in some embodiments, at least one of the messages may be an alert that alerts the user to a failure of a component of the HVAC system. In another example, at least one of the messages may be a suggestion that suggests an alternative setting for the HVAC system. In another example, at least one of the messages may be a maintenance reminder for the HVAC system. In another example, at least one of the messages may relate to usage or usage patterns of the HVAC system.

FIG. 19B provides a schematic block illustration of a mobile device 882 that may be used in programming an HVAC controller 872 of an HVAC system. It will be appreciated that there may be significant similarities between the mobile device 882 (FIG. 19B) and the mobile device 870 (FIG. 19A). The mobile device 882 may be considered as an example of the remote device 62 (FIG. 2). In some embodiments, the mobile device 882 is a smartphone or tablet computer, but this is not required. The mobile device 882 includes a user interface 884 that is configured to display information and to permit a user to enter information. A network connection 888 is configured to communicate with a remote server 880 that is itself in operative communication with a HVAC controller 872. The mobile device 882 includes a memory 890 for storing an application program. A controller 886 is in operative communication with the user interface 884, the network connection 888 and the memory 890.

The application program, stored in the memory 890, may enable a user to remotely program one or more functions of the HVAC controller 872 via the user interface 884 and to output one or more programmed functions to the remote server 880 via the network connection 888 when the application program is executed by the controller 886. In some embodiments, the application program may be further configured to receive one or more messages related to the operation of the HVAC system via the network connection 888, and to display the one or more messages via the user interface 884.

In some embodiments, each message has a message description and a time stamp displayed. In some cases, at least one of the messages includes an alert that alerts the user to a failure of a component of the HVAC system, a suggestion that suggests an alternative setting for the HVAC system, a maintenance reminder for the HVAC system, or a usage message indicating the usage of the HVAC system. In some embodiments, the one or more messages are displayed in a message center, wherein the one or more messages are displayed in the message center in a list format, with the most recent or most urgent messages are displayed at the top. Optionally, at least one of the messages in the message center are selectable, and once a message is selected, the application program is configured to display via the user interface additional information regarding the selected message.

FIG. 19C is a flow diagram of an illustrative method that may be carried out using the mobile device 870 (FIG. 19A) or the mobile device 882 (FIG. 19B). One or more messages that are related to the operation of the HVAC system may be received at the wireless mobile device as generally indicated at block 892, where each message includes a message description and a time stamp. As shown at block 894, the one or more messages may be displayed on a display of the mobile device in a message center. A user may be allowed to select one of the messages displayed in the message center, and in response, additional information regarding the selected message may be displayed, as generally indicated at block 896. In some embodiments, at least one of the messages includes an alert that alerts the user to a failure of a component of the HVAC system, a suggestion that suggests an alternative setting for the HVAC system, a maintenance reminder for the HVAC system, or a usage message indicating the usage of the HVAC system.

Figure 19F:
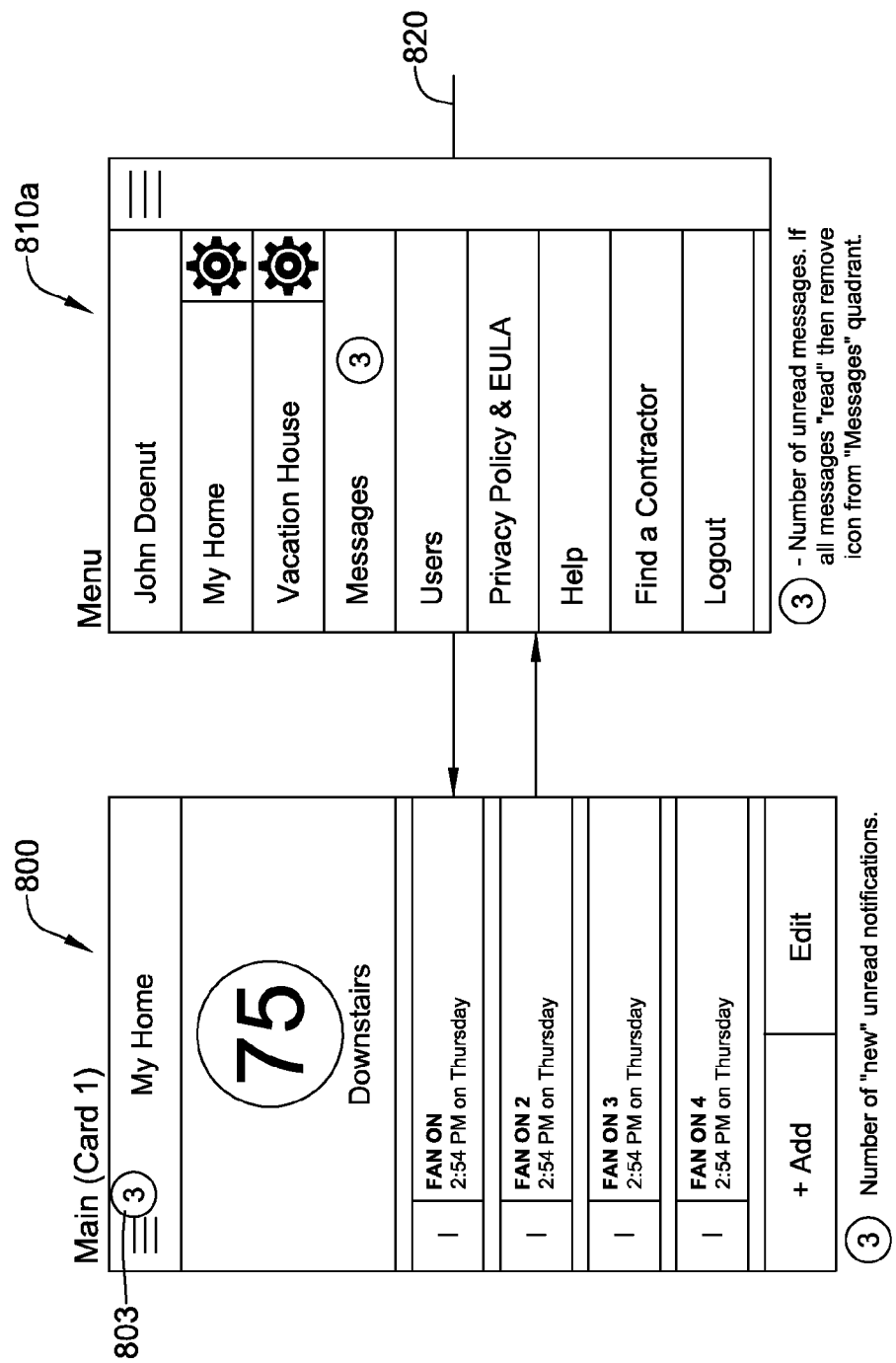
Figure 19G:
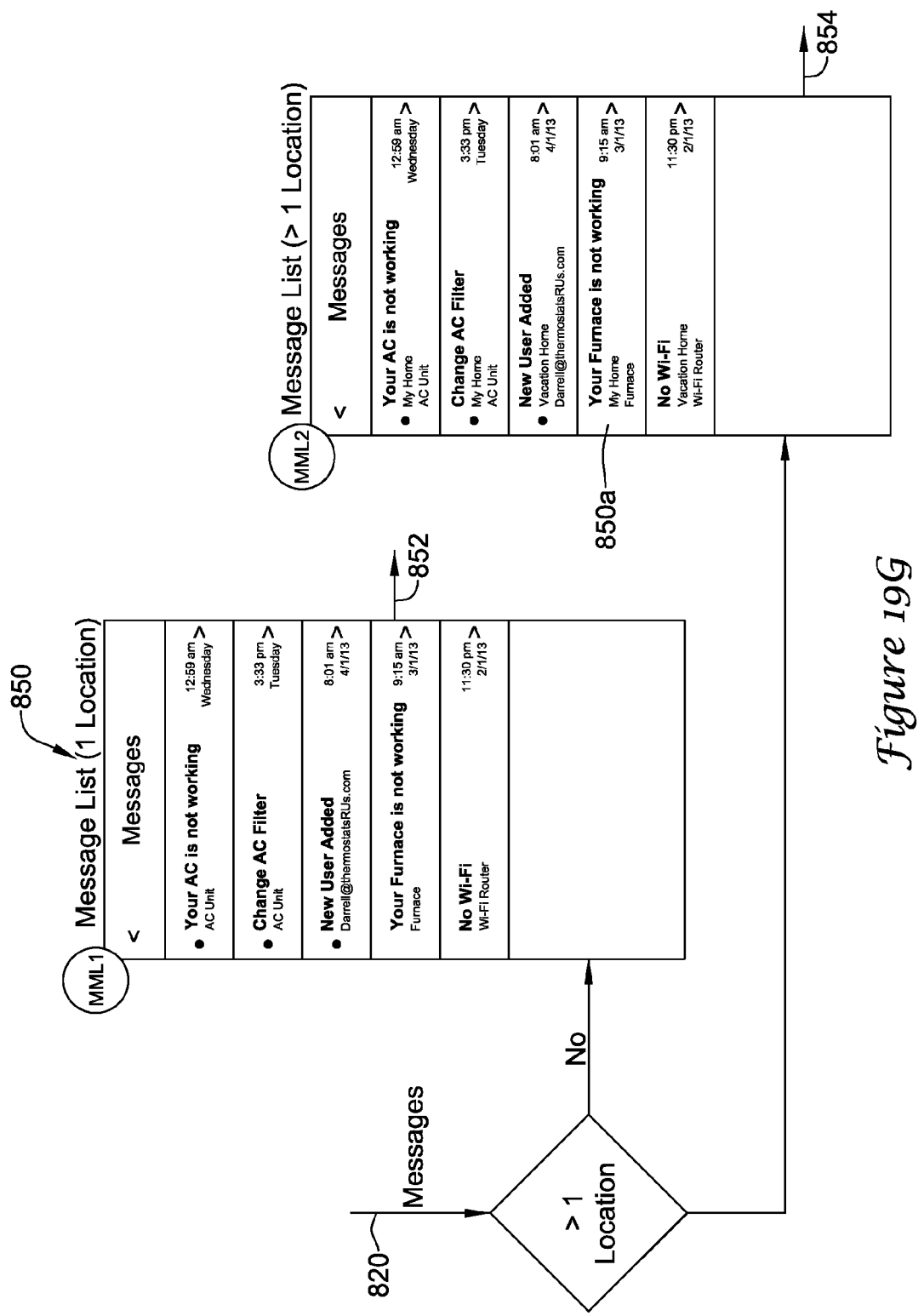
Figure 19H:
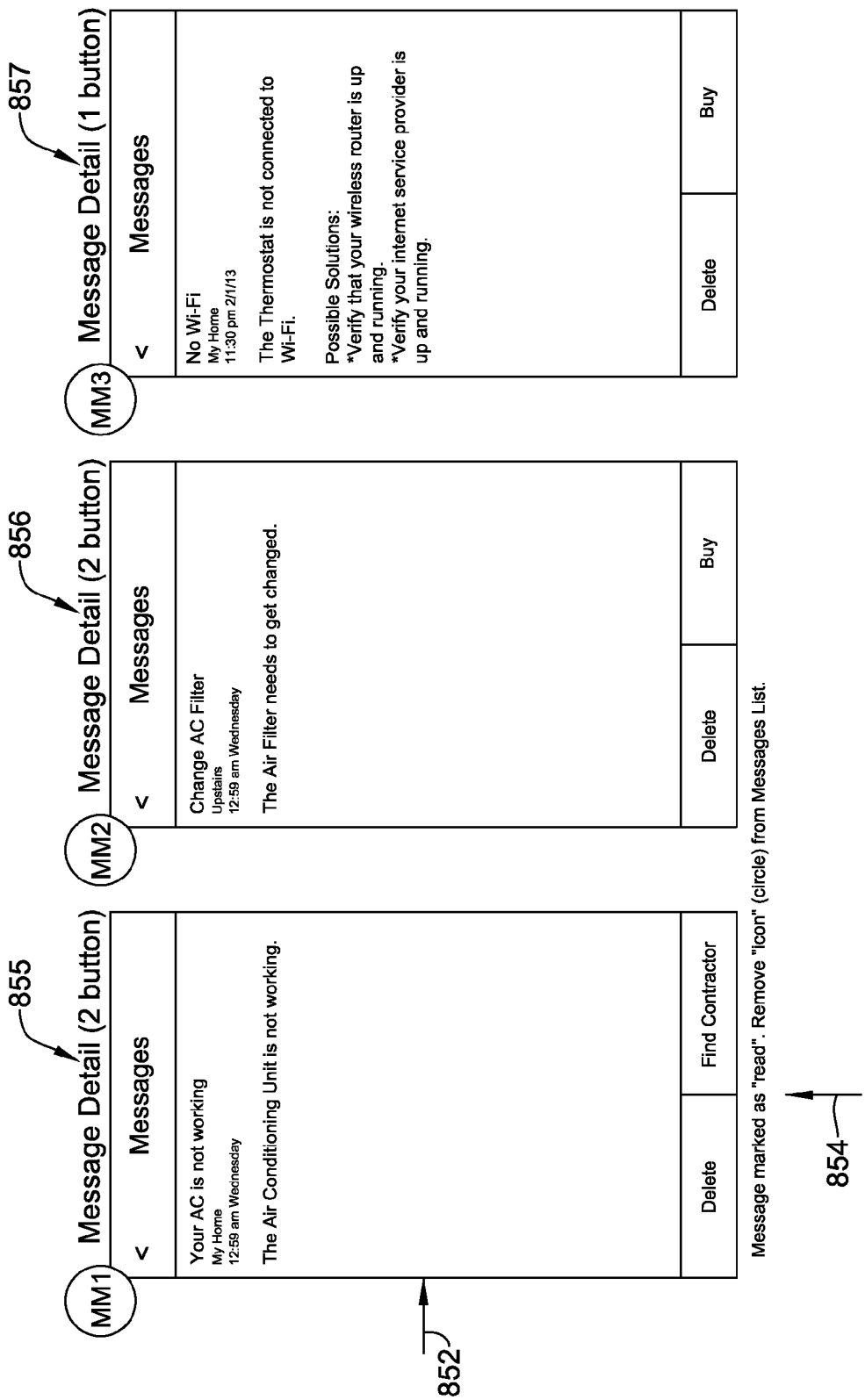

FIG. 19F illustrates an illustrative interaction with a message center which may serve two thermostat locations and which may present messages in reverse chronological order with messages from multiple locations mingled and identified by location. As before, the display of home screen 800 identifies a location for which selection attributes may be altered and presents options for further user interaction on screen 810*a*. Those interactions may proceed generally as detailed above. If the Messages option is selected, data presentation may depend upon whether one or more thermostats are currently configured as shown on screen 850 and 850*a* of FIG. 19G. Note in FIG. 19G, the messages may include an indicator (bullet) which shows which messages have been reviewed by the user and those messages which have not been reviewed. Selecting an individual message from either screen 850, 850*a* may display a screen such as 855, 856, or 857 of FIG. 19H with additional information regarding the message and one or more options for addressing and/or dismissing the message.

Figure 19L:
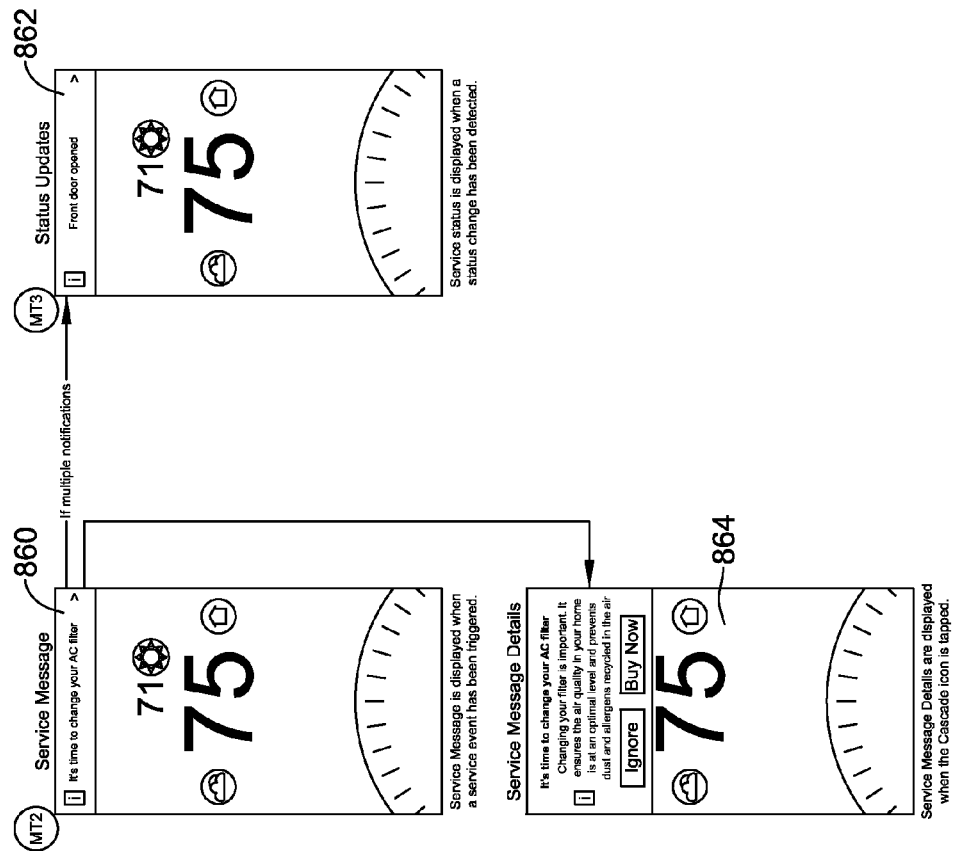

In some embodiments, the message center may assign priorities to messages and select an appropriate manner of bringing selected messages to the user's attention. As shown in FIG. 19I, an urgent message may be transmitted through an appropriate network path to a smart phone and/or thermostat and may result in a pop-up message being displayed on the screen of the smart phone and/or the thermostat. In the case of an urgent message displayed on the screen of the thermostat, additional cues such as audible alarms and/or flashing of the light ring may serve to attract a user's attention. A pop-up message may suggest an action or allow the message to be dismissed (see FIG. 19I). Other display configurations such as those of FIGS. 19J, 19K and 19L may also be employed. As shown in FIG. 19L, an initial screen may be presented that provides access to multiple messages 862 and/or a linked screen to provide additional details 864 of the messages.

Other types of messages that may be displayed to a user via the message center by the application program code may include, but are not limited to, messages related to alerts, maintenance, tips/advice, promotions, and usage. An alert message may indicate that something is not functioning properly, and may require immediate attention or some action to be taken by the user. For example, in some cases, an alert message may indicate that the HVAC controller has become disconnected from a server or the local wireless area network. In other cases, an alert message may warn of an impending dead battery or may alert the user to an unsafe temperature. A maintenance message may remind the user of a needed or recommended filter change based on a timer or a system load or may remind the user to change the battery. The maintenance message may include the part number or other description of the recommended filter or other part, so that the user can pick one up when convenient.

A tips/advice type of message may provide a user with information and/or recommend one or more actions that a user may take to improve the performance and/or efficiency of the HVAC system, and/or improve their comfort level. In one example, a tips/advice type of message may inform the user that the system performance has degraded and may recommend to the user to have the air ducts cleaned. In another example, the tips/advice message may recommend a schedule based on the user's manual setpoint changes. Alternatively, or in addition, the message may include a recommendation to the user to use the geofencing feature (described else wherein herein) if the user's manual setback changes do not follow a clear pattern. In yet another example, the message may display a recommendation to open one or more windows based on the outdoor temperature matching the desired indoor temperature setpoint, sometimes taking into account humidity, air quality and/or other factors inside and/or outside of the house.

A promotions message may include information about additional solutions, products, or services that a certified contractor currently offers that may be of interest to the user, sometimes based on actual historical performance data of the HVAC system and/or user interactions with the HVAC system. For example, if the humidity of the inside space is low in the winter months, a promotions message may be provided recommending the installation of a humidifier to increase the comfort of the user.

Usage messages may contain information about automated or manual system state changes. For example, a usage message may inform the user that the HVAC controller has entered a "Home" mode or setting because a user has activated the one-touch action labeled "Home" or because a user has crossed a proximity boundary indicating that they have arrived or are about to arrive at home. In another example, a usage message may inform the user that the HVAC controller has entered the "Home" mode according to a programmed schedule.

In some cases, the application program code may be programmed to display or transmit an informative message to a user based on the user's behavior or their interactions or frequency of interactions with certain features of the HVAC controller and/or HVAC system. For example, the application program code executed by the remote device 62 may be programmed to periodically poll the HVAC controller for selected information about the use of specific features such as, for example, an auto changeover feature or geofence feature. If the data received from the HVAC controller by the application program code indicates that the auto changeover feature has never been used by the user, the application program code may display a message to the user containing useful information about the auto changeover feature and how and when to use the auto changeover feature. Similarly, if the data received by the application program code from the HVAC controller indicates that the user is not using a geofence (e.g. proximity boundary) to trigger activation of an "away" setting or an "at home" setting by the HVAC controller, the application program code may display or transmit a message to the user about geofencing, how to activate a geofence, and/or how to select a geofence appropriate for their lifestyle. These are just some examples.

The application program code (or app) running on the remote device (e.g. smartphone, tablet, laptop, etc.) may be downloaded from an external Web service. In some cases, the application program code may be downloaded from Apple Inc.'s ITUNES™ or Google Play. In other cases, the application program code may be available for download from a web service that is provided to support use of the HVAC controller 18. An example of such a web service is Honeywell's TOTAL CONNECT™ web service. The application program code may be stored in the memory of a user's remote device 62 and may contain a set of instructions for execution by a processor related to the installation, configuration, connection, and personalization of the HVAC controller 18. The user's remote device 62 may be any one of the remote devices described herein. In some cases, the application code may be stored in the memory of a user's smartphone or tablet computer for execution by the smartphone or tablet computer's processor to carry out various functions to facilitate the installation, configuration, and setup of the newly installed HVAC controller 18. In other cases, the application program code may be stored in the memory of a user's personal or desktop computer for execution by the computer's processor to carry out various functions that may facilitate the installation, configuration, connection and personalization of the HVAC controller 18. Additionally, once the HVAC controller 18 is successfully installed and configured to control the HVAC system 4, the application program code may also facilitate control of the HVAC controller 18 from a remote location other than at the user interface provided at the HVAC controller 18.

In some cases, the application program code may provide a uniform installation setup interface across multiple platforms (e.g. HVAC controller 18, remote device, web service) for accessing and interacting with the HVAC controller 18. The application code may utilize a simple communication protocol that allows the application program code to be executed by multiple platforms (e.g. web, HVAC controller, and smartphone/tablet application). For example, the web service and the HVAC controller may utilize the same installation setup logic by executing the same code from the same code base. In some cases, the installation setup code may be compiled for use by the HVAC controller 18, a web service, and/or an application program code. For example, in some cases, for example, the web service, the application program code, and the HVAC controller each contain the same installation setup definitions. However, in some cases, the application program code executed by the user's remote device may be programmed to determine how to display each feature of the installation setup to the user via the device's user interface. This may permit the application program code executed by a user's remote device (e.g. smartphone or tablet) to connect to either the web service associated with the HVAC controller 18 or to the HVAC controller 18 directly. This feature also may permit a user to interact with the HVAC controller 18 across multiple platforms with minimal differences in the installation setup process and the overall user experience.

Figure 20A:
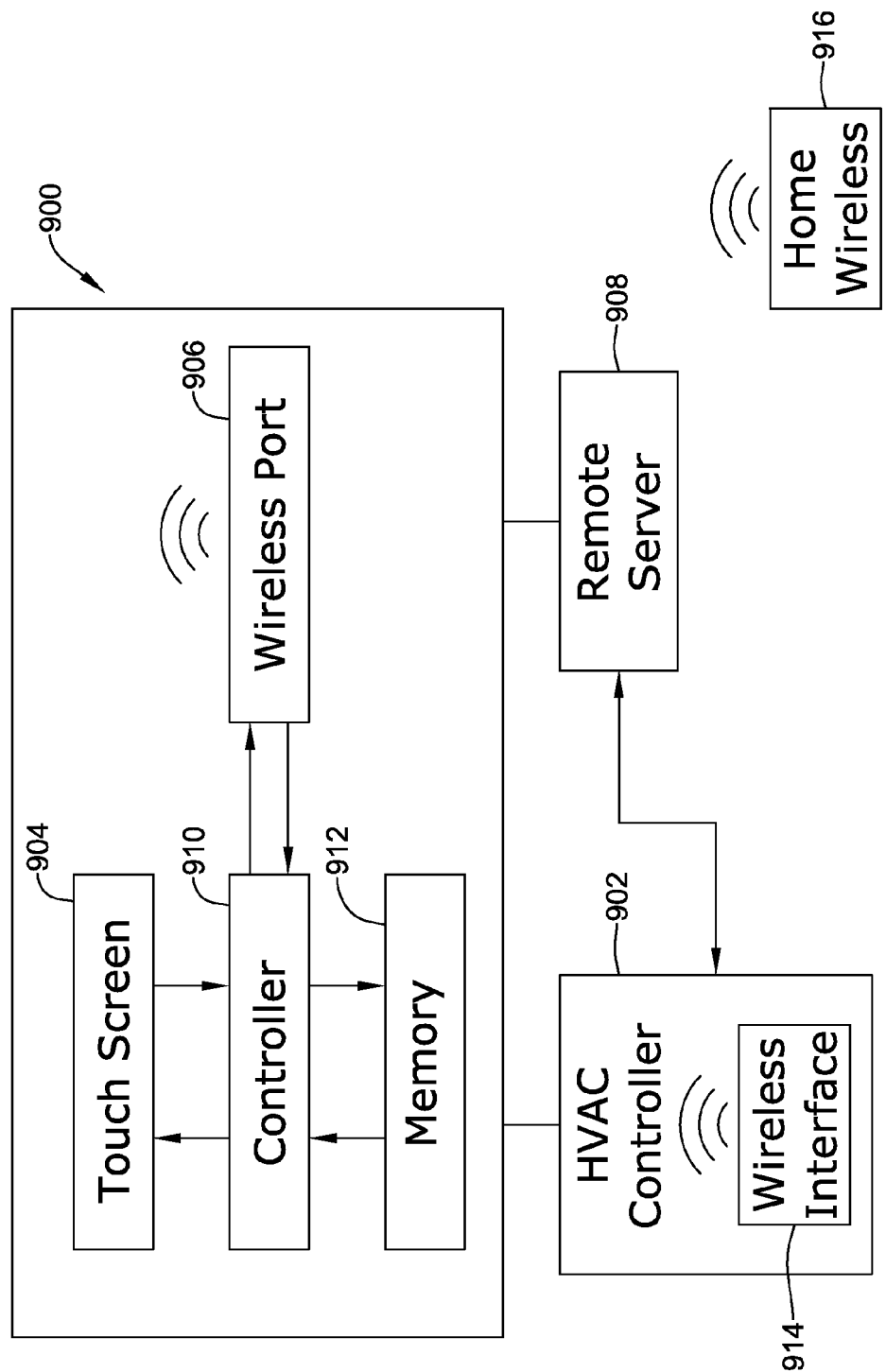
FIG. 20A is a block diagram of an illustrative building automation system.

Turning now to FIG. 20A, which is a schematic block illustration of a mobile device 900 that may be used in programming an HVAC controller 902 of an HVAC system. In some cases, the HVAC controller 902 includes a wireless interface 914. In some embodiments, the mobile device 900 is a smartphone or tablet computer, but this is not required. It will be appreciated that in many instances, the mobile device 900 is similar to those described with respect to previous drawings and may be considered as an example of the remote device 62 (FIG. 2).

The mobile device 900 may include a touch screen display 904 that is configured to display information and to permit a user to enter information. A wireless port 906 is configured to communicate with a remote download server 908 that is itself in operative communication with the HVAC controller 902. The mobile device 900 includes a controller 910 that is in operative communication with the touch screen display 904 and the wireless port 906. The controller 910 is configured to establish communication with the remote download server 908 via the wireless port 906 and to download an application program code from the remote download server 908. The mobile device 900 includes a memory 912 that is configured to store the application program code once downloaded from the remote download server 908.

In some embodiments, the controller 910 is configured to establish a direct wireless connection between the wireless port 906 of the mobile device 900 and the wireless interface 914 of the HVAC controller 902, with the HVAC controller 902 functioning as an access point. In some cases, the controller 910 may be configured to execute the application program code, which provides one or more configuration screens on the touch screen display 904 of the mobile device 900 to enable the user to configure the HVAC controller 902 via one or more configuration parameters. The controller 910 may be further configured to upload the one or more configuration parameters to the HVAC controller 902 via the direct wireless connection between the wireless port 906 of the mobile device 900 and the wireless interface 914 of the HVAC controller 902.

In some embodiments, after the controller 910 uploads the one or more configuration parameters to the HVAC controller 902 via the direct wireless connection between the wireless port 906 of the mobile device 900 and the wireless interface 914 of the HVAC controller 902, the mobile device 900 is configured to drop the direct wireless connection between the wireless port 906 of the mobile device 900 and the wireless interface of the HVAC controller 902. In other words, the direct wireless connection is only used for initial setup and configuration of the HVAC controller 902. In some cases, after the mobile device 900 drops the direct wireless connection between the wireless port 906 of the mobile device 900 and the wireless interface 914 of the HVAC controller 902, the mobile device 900 establishes communication with a remote monitoring server 908, and wherein the HVAC controller 902 also establishes communication with the remote monitoring server 908. In some embodiments, the remote monitoring server 908 is the same server as the remote download server 908, but this is not required. In some cases, one or more of the configuration parameters provided by the mobile device 900 to the HVAC controller 902 include communication parameters that are necessary for setting up communication between the HVAC controller 902 and the remote monitoring server 908, sometimes via a home wireless network 916. In some cases, one or more of the configuration parameters may include the home WiFi network name (Service Set Identifier—SSID) and/or password. In some cases, one or more of the configuration parameters may include an address, ID and/or password for connecting to a remote monitoring server 908.

In some embodiments, the application program code is also configured to display one or more install screens, wherein the one or more install screens include information on removing an old thermostat (not illustrated) as part of a process to install the HVAC controller 902. In some cases, the application program code may be configured to also display one or more install screens, wherein the one or more install screens include information on wiring the HVAC controller 902 as part of a process to install the HVAC controller 902. FIGS. 29-41, for example, show illustrative install screens.

In some instances, the one or more configuration screens include a screen soliciting the user to input information regarding equipment configuration. In some cases, the one or more configuration screens include a screen soliciting the user to input information regarding comfort preferences.

FIG. 20B is a schematic block diagram of an illustrative HVAC controller 920 that is configured to be at least partially set up or configured using an application program code running on a mobile device 922. The mobile device 922 may, for example, be a smartphone or a tablet. In some cases, the mobile device 922 may be the mobile device 900 described with respect to FIG. 20A, but this is not required, and may be considered as an example of the remote device 62 (FIG. 2).

The illustrative HVAC controller 920 includes a user interface 924 that is configured to display information to be viewed by a user and to accept inputs from the user and is optionally a touch screen. A controller 926 is operably coupled to the user interface 924 and an on board wireless interface 930 is operably coupled to the controller 926. The controller 926 is configured to establish on board wireless interface 930 as an access point for creating a direct communication path with the wireless mobile device 922 for initially configuring the HVAC controller 920, including for initially configuring the HVAC controller 920 for communication with a wireless gateway (e.g. in-home wireless router). This may include, for example, a Service Set Identifier (SSID) of the wireless gateway and/or password. The controller 926 is configured to accept the configuration information from the mobile device 922 via the direct communication path established between the on board wireless interface 930 and the wireless mobile device 922.

It is contemplated that the direct communication path may be a WiFi connection. However, in some instances, the direct communication path may be any suitable wireless connection including, but not limited to, cellular communication, ZigBee, REDLINK™, Bluetooth, WiFi, IrDA, dedicated short range communication (DSRC), EnOcean, and/or any other suitable common or proprietary wireless protocol. In some instances, the direct communication path may be a wired communication path.

In some embodiments, the controller 926 may be configured to display, via the user interface 924, a screen instructing a user that the HVAC controller 920 is wirelessly coupled to the mobile device 922, and to utilize the mobile device 922 to configure the HVAC controller 920. The controller 926 may also be configured to display, via the user interface 924, a screen instructing a user to utilize the mobile device 922 to initially configure the HVAC controller 920 for communication with a wireless gateway (e.g. in-home wireless router).

In some cases, while displaying screens to help instruct the user with installation, the HVAC controller 920 may receive a type of HVAC equipment as configuration information from the user via the wireless mobile device 922 and the direct communication path. In some embodiments, the HVAC controller 920 may receive comfort settings as configuration information from the wireless mobile device 922 via the direct communication path.

It will be appreciated that the application program code referenced above may be stored on the remote server 908. In some embodiments, the application program code may be manifested in a computer readable medium that contains program instructions for facilitating a user of a wireless mobile device in configuring a wireless HVAC controller. After download to a wireless mobile device, execution of the program instructions by one or more processors of the wireless mobile device may cause the wireless mobile device to carry out a number of illustrative steps, such as shown in FIG. 20C.

Figure 20C:
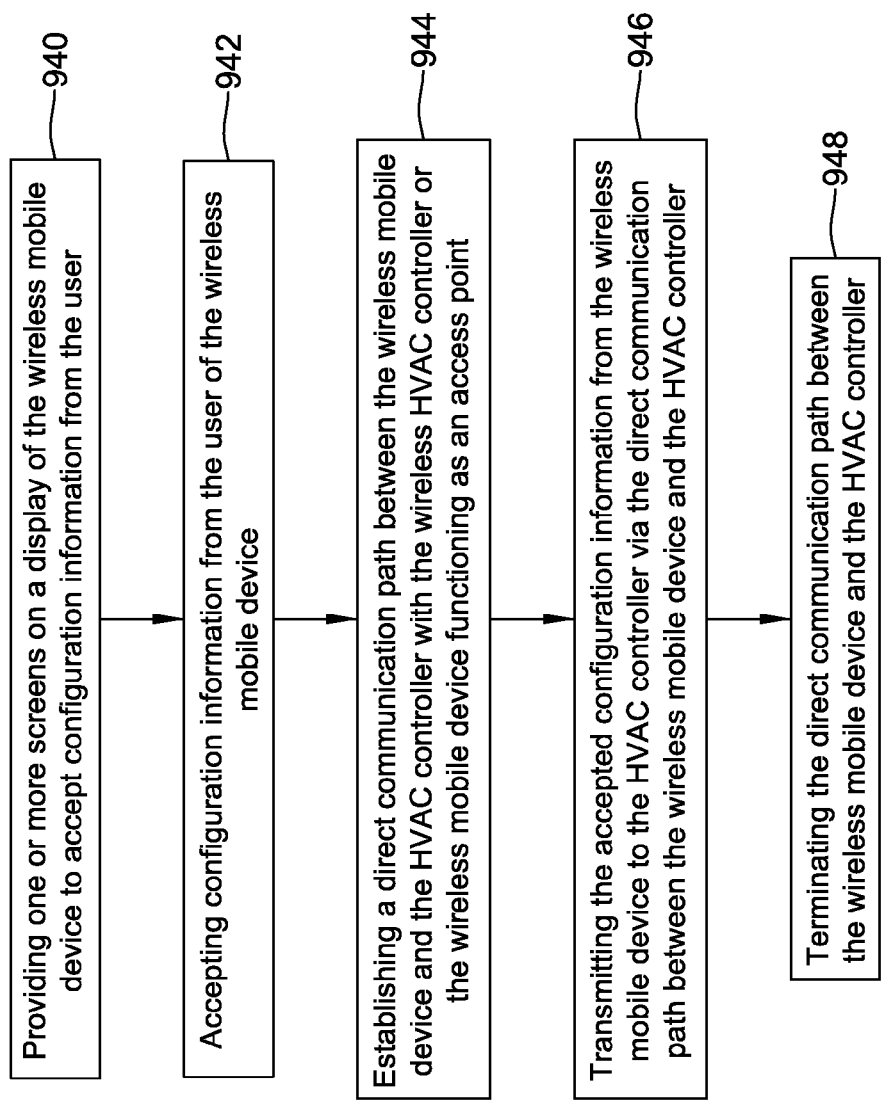
FIG. 20C is a flow diagram of an illustrative method that may be carried out using the illustrative building automation systems of FIG. 20A and/or FIG. 20B.

With reference to FIG. 20C, and starting at block 940, one or more screens may be provided on a display of the wireless mobile device, such as the mobile device 922, to accept configuration information from the user. Configuration information is accepted from the user of the wireless mobile device, as shown at block 942. A direct communication path is established between the wireless mobile device 922 and the HVAC controller 920 (FIG. 20B) with the wireless HVAC controller 920 or the wireless mobile device 922 functioning as an access point, as generally seen at block 944. The accepted configuration information is transmitted from the wireless mobile device 922 to the HVAC controller 920 via the direct communication path between the wireless mobile device 922 and the HVAC controller 920, as indicated at block 946. The direct communication path between the wireless mobile device 922 and the HVAC controller 920 is then terminated, as indicated at block 948. In some embodiments, the accepted configuration information may include configuration information for configuring communication between the wireless HVAC controller 920 and a local wireless gateway. In some cases, the accepted configuration information may include HVAC equipment configuration and/or comfort settings.

FIGS. 20D-27 show several illustrative examples of screens that may be displayed on the display of the user interface of a user's mobile device in connection with downloading and installing an application program code for setting up an HVAC controller 18 according to an installation setup process which may include installing, configuring, connecting the HVAC controller 18 to a web service using a network connection, and personalizing the HVAC controller 18.

Figure 20E:
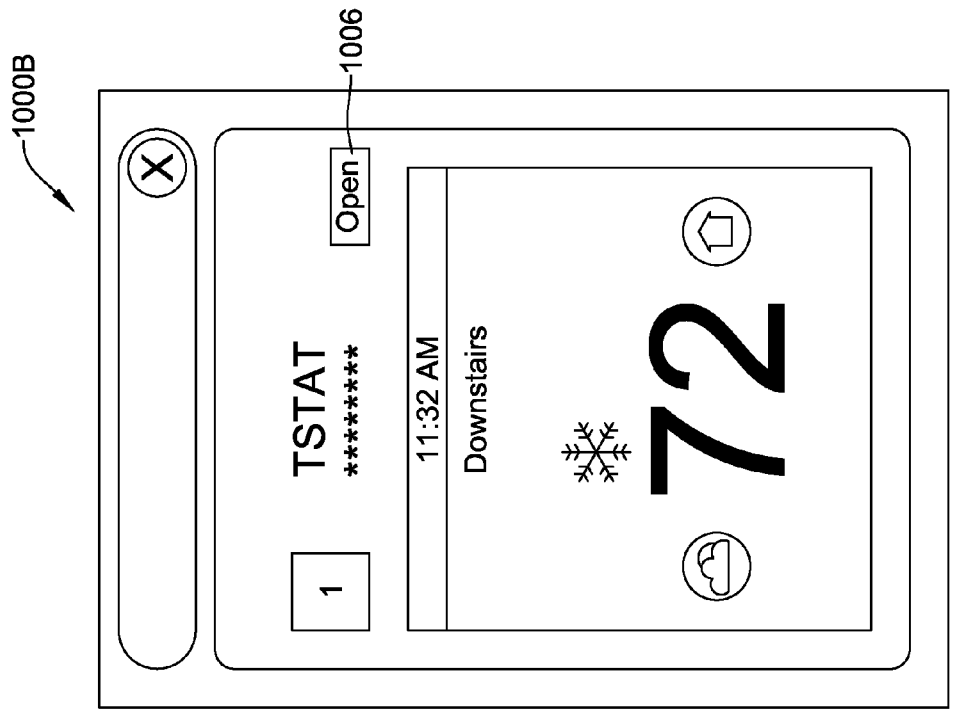
Figure 20D:
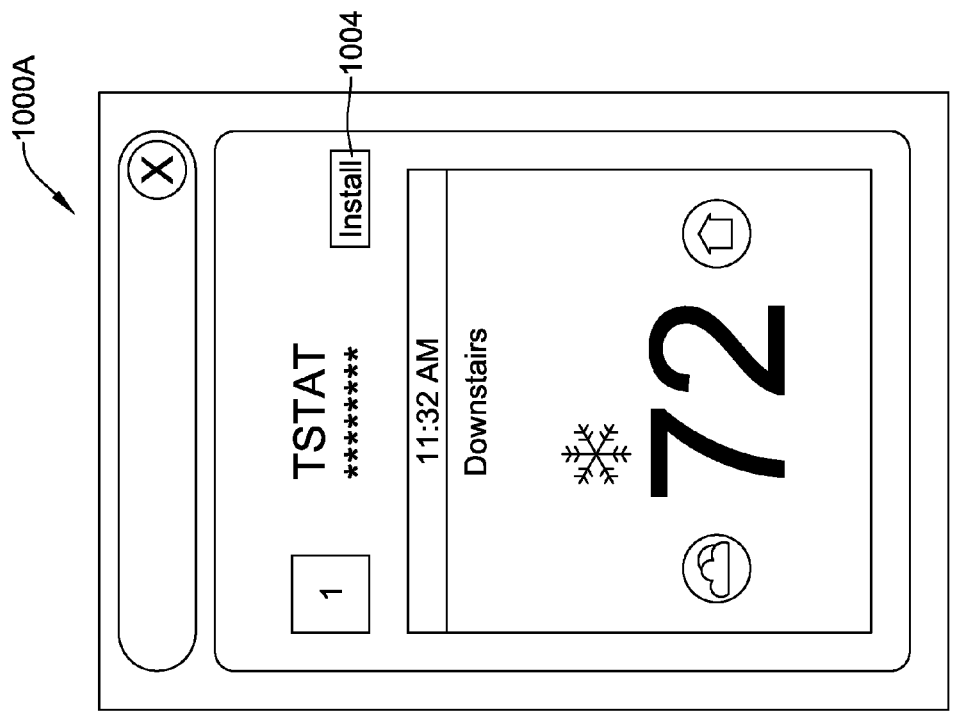
Figure 26:
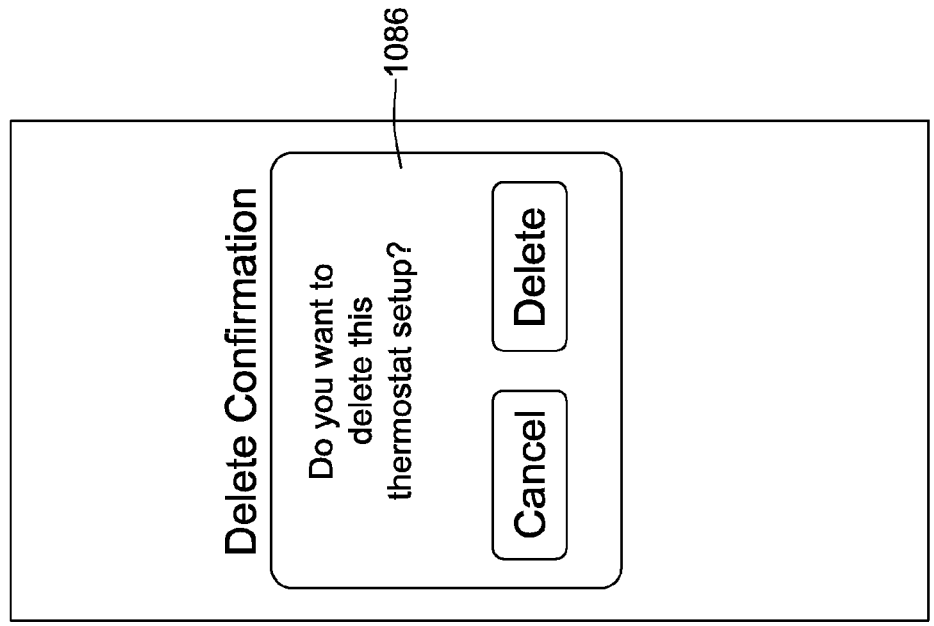

FIGS. 20D and 20E each show illustrative screens 1000A, 1000B that may be displayed to a user via the display of the user interface of the user's remote device 62 (e.g. smartphone or tablet) when interacting with an external web service to initially obtain and open the application program code. FIG. 20D shows an initial screen 1000A that may be displayed to the user via the user interface of the user's remote device after the user has successfully located the application program code in the external web service's application program code database using an appropriate search function. As can be seen in FIG. 20D, screen 1000A includes a user prompt 1004 that prompts the user to install (i.e. download) the application program code. Screen 1000B shown in FIG. 20E may be displayed to a user via the user interface of the user's remote device 62 after successful installation of the application program code on the user's remote device.

As can be seen in FIG. 20E, screen 1000B includes a button 1006 labeled "open" that may prompt the user to open the application program code and initiate execution of the application program code by the user's remote device 62. Selection of the button 1006 labeled "open" by a user may cause the application program code to display a login prompt screen 1010 to the user via the user interface of the user's remote device 62, as shown in FIG. 21. Login prompt screen 1010 may include a first entry field 1012 for accepting a username from a user and a second entry field 1014 for accepting a password associated with the user name entered in the first entry field 1012. Upon entering an appropriate username and password combination, the user may then select the button 1016 labeled login, which will cause the application program code to display one or more screens associated with the user's account. In some cases, screen 1010 may also include an additional option 1022 labeled "forgot my password" that, when selected by a user, may initiate a sequence of screens that may facilitate retrieval of a user's password.

Alternatively, if the user has not already established a user account, the user may instead select the option 1020 labeled "create account" which will cause the application program code to display one or more screens for facilitating the creation of a user account. The one or more screens may guide the user through setting up and activating their user account. In some cases, the application program code may cause the user's remote device to transmit the user's account information to a web service hosted by a web server that is associated with the HVAC controller 18. An example of such a web service is Honeywell's TOTAL CONNECT Web Service™. The user's account information may be stored in a database in the server memory and may be accessed by the user via the application program code executed by the user's remote device (e.g. smartphone or tablet). This feature may allow a user to access and make changes to their account and/or the HVAC controller 18 from a variety of remote locations on a number of different computing platforms (e.g. smartphone, tablet, personal computer, internet, HVAC controller 18, etc.). For example, the user may begin configuring their HVAC controller 18 using the application program code executed by their smartphone, and finish configuring their HVAC controller 18 through a web site hosted by the web service associated with the HVAC controller 18. This is just one example.

FIG. 22 provides an example of a screen 1030 related to the creation of a user account that may be displayed to the user via the user interface of the user's remote device 62. As shown in FIG. 22, screen 1030 may include a first user prompt 1034 that may prompt a user to enter selected details for creation of their account in the appropriate text entry fields 1036a-1036c. Each of the text entry fields 1036a-1036c may be labeled with an appropriate label 1038a-1038c identifying the requested information. For example, as shown in FIG. 22, text entry fields 1036a-1036c are labeled "first name", "last name" and "email address" prompting a user to provide their first and last name and a valid email address in the appropriate entry fields 1036a-1036c. It will be generally understood, that fewer or additional fields may be provided prompting the user to provide fewer or additional details, as appropriate. Additionally, screen 1030 may include a second user prompt 1038 that may prompt a user to create a password using the appropriate text entry fields 1040a, 1040b. Each of the text entry fields 1040a, 1040b may be labeled with an appropriate label 1042a, 1042b prompting the user to enter and verify a newly created password.

Selection of button 1044 labeled "create account" provided on screen 1030 may cause the application program code to display a next screen 1050 related to the creation of the user's account via the user interface of the user's remote device 62. FIG. 23 provides an example of a screen 1050 that may be displayed in response to the user having selected the button 1044 labeled "create account" provided on screen 1030. Screen 1050 relates to activation of the user's newly created account. As shown in FIG. 23, screen 1050 can include a user prompt 1052 that may prompt a user to check their email account associated with the email address provided during creation of their user account for an instructional email and follow the instructions provided in the email. In some cases, the email may be transmitted by the application program code executed by the user's remote device. If, after having checked their email account, the user has not received the instructional email, the user may select button 1054 labeled "resend" prompting the application program code to send another instructional email to the email account associated with the user's account.

Screen 1060, shown in FIG. 24, may be displayed to the user via the user interface of the user's remote device upon successful activation of a user's account. Screen 1060 may include a user message 1062 confirming successful activation of the user's account. Additionally, in some cases, screen 1060 may include a prompt or link 1064 that, when selected by the user, may cause the application program code to complete the launch of the application program code for setting up the HVAC controller 18.

Figure 25:
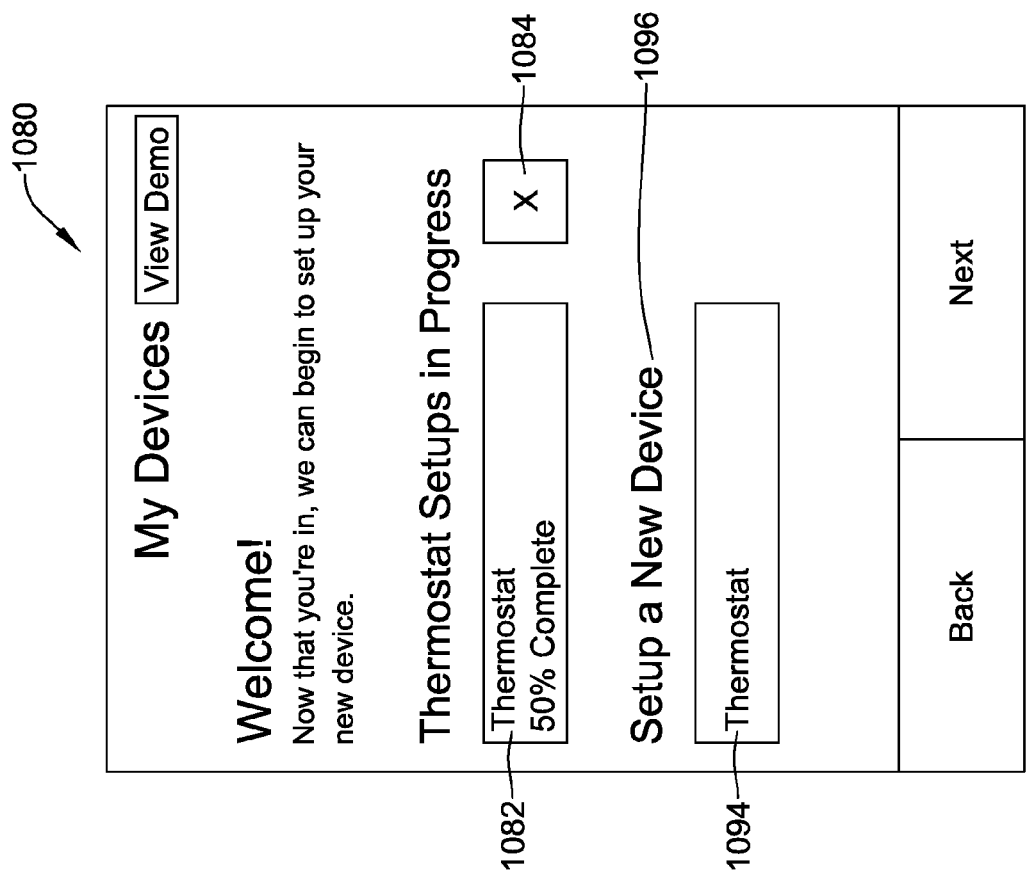

FIG. 25 provides an example of a screen 1080 that may be displayed upon selection of prompt or link 1064 displayed on screen 1060 (FIG. 24) for launching the application program code. Screen 1080 may include a first field 1082 identifying the current status of a current setup processes that is in progress and, in some cases, may include an adjacent checkbox 1084 that, when selected by a user, may cause the current setup process to be cancelled. In some cases, selection of the checkbox 1084 by a user may cause a screen 1086, shown in FIG. 26, to be displayed to the user including a user query 1088 that asks the user to confirm cancellation or deletion of the previous HVAC controller setup process. In some cases, the screen 1086 may be provided as a pop-up or floating window that may be displayed over screen 1080. In other cases, screen 1086 may be displayed as a separate screen. Selection of either button 1090 labeled "cancel" or button 1092 labeled "delete" may cause the application code to display the previous screen 1080.

In addition, as shown in FIG. 25, screen 1080 may also include a second field 1094 that may include an adjacent user prompt 1096 that may prompt the user to identify a new HVAC device to be setup using the application program code executed by the user's remote device 62 as will be described in greater detail below.

Figure 27:
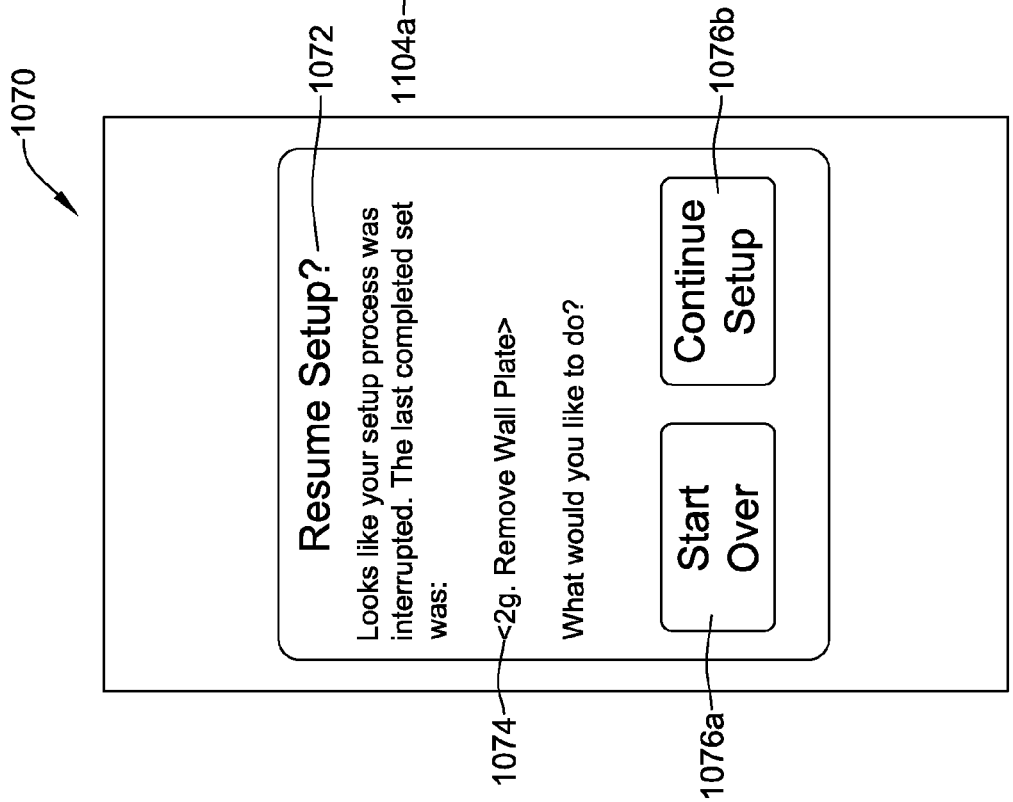
Figure 36:
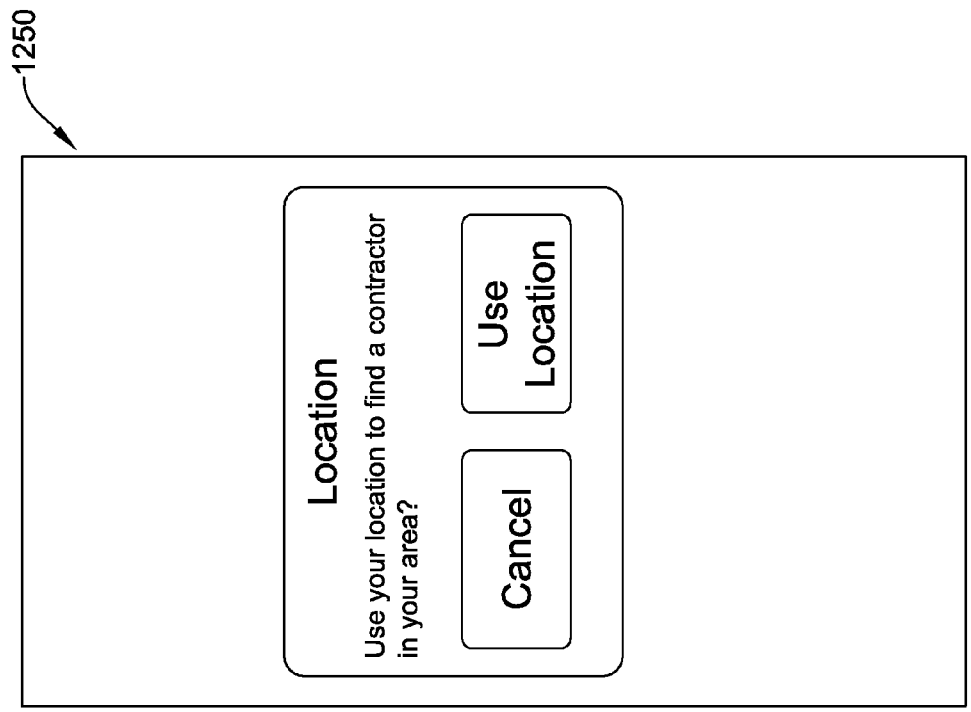

Referring now back to FIG. 21, in some cases, the user may have already created and activated a user account in which case, the user may enter the required user name and password into the appropriate text entry fields 1012, 1014 and select button 1016 labeled "login" to login into the user account via the application program code executed by their remote device 62. In such cases, if the user has already begun the setup process for installing and/or configuring the HVAC controller 18, the application program code may display a screen 1070 that queries the user about resuming the already previously initiated setup of the HVAC controller 18. For example, as shown in FIG. 27, screen 1070 may include a user prompt 1072 that questions the user "Resume setup?" In some cases, screen 1070 may include additional information 1074 such as, for example, the last identified step in the setup process that was previously completed by the user during setup of the HVAC controller 18. In addition, screen 1070 may include a first option 1076a labeled "start over" or "no" and a second option 1076b labeled "continue setup" or "yes" that may be selected by the user to either cancel the previous setup process and start over or to continue the setup process from the last identified step in the setup as provided in the additional information 1074 displayed on screen 1070. Selection of second option 1076b may cause the application program code to resume the setup process at the last identified step.

Figure 28:
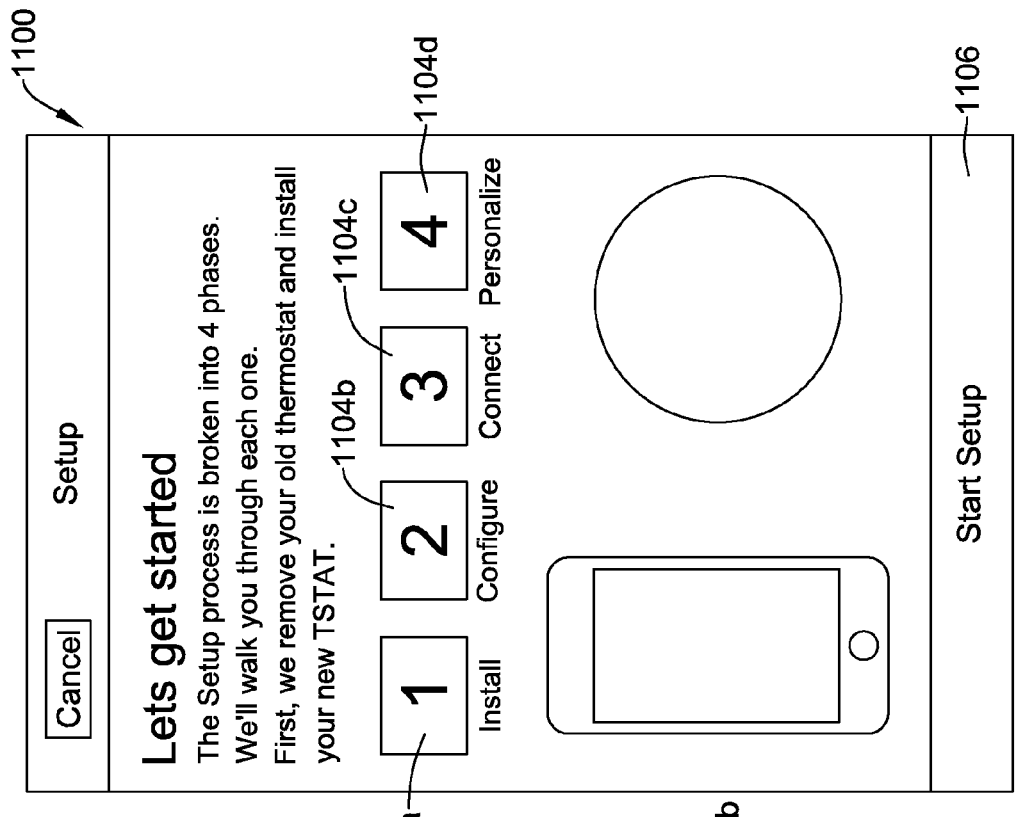
FIG. 28 shows an illustrative screen that may be displayed upon successful launch of an application program code for setting up an HVAC controller.

The installation setup process may be divided into at least four different chapters or phases. In some cases, the application program mode may be configured to display a screen to a user that introduces and/or identifies the current phase of the installation setup process. FIG. 28 provides an example of such a screen 1100. As shown in FIG. 28, screen 1100 includes icons 1104a-1104d identifying each of the four phases of the setup process, which in this example are "install", "configure", "connect" and "personalize". In addition, the icon 1104a identifying the current phase of the setup process may be grayed-out, bolded, or otherwise highlighted to visually indicate to the user that it is the current phase of the setup process. Once that phase of the setup process is complete the icon 1104a may include a dot or a checkmark in a corner of the icon 1104 to indicate that the phase has been completed. The user may initiate the setup process by selecting the button 1106 labeled "start setup" provided on screen 1100.

Upon initialization of the installation setup process, the application program code may be configured to display one or more screens to the user via the user interface of the user's remote device 62 that may guide a user through removal of an existing thermostat. In some cases, the one or more screens may be displayed in a pre-determined sequence of screens having a predefined order. The user may move backward and forward within the predetermined sequence of screens by the selection of appropriate buttons provided on the screen for this purpose. In other cases, the user may navigate backward and forward within the predetermined sequence of screens by dragging their finger from side to side across the display of their remote device 62 or through some other gesture. These are just some examples.

FIGS. 29-41 show several illustrative screens that may be displayed to the user via the user interface of the user's remote device 62 by the application program code, as described herein, that may guide the user through the removal of an existing HVAC controller.

FIG. 29 shows an example of a first screen 1110 that may be displayed in the sequence of screens related to the removal of an existing HVAC controller. In some cases, as discussed herein, the sequence of screens may be a predetermined sequence of screens having a predetermined display order, although this is not required. As shown in FIG. 29, screen 1100 includes a first label 1112 that identifies the current phase of the setup process. A status bar indicator 1114 may also be provided that shows the status of the installation phase. In addition, screen 1110 may include a brief text string 1116 identifying the current step of the installation phase. For example, as shown in FIG. 29, the brief text string 1116 identifies the current step as "Removing Old Thermostat." A user message 1118 may also be displayed on screen 1110. The user message 1118 may contain information that may aid the user in the current phase of the setup process. In some cases, the user message 1118 may provide a brief explanation of the current step of the installation phase identified by the brief text string 1116. Screen 1110 may also provide an overview 1120 of the current phase of the setup process. In some cases, the overview 1120 may list the individual steps 1121a-1121e of the current phase of the installation process. Selection of any of the individual steps 1121a-1121e provided in the overview 1120 may cause the application program code to jump to that step in the current phase of the setup process. An information icon 1122 may be provided that, when selected by a user, may cause the application program code to display an additional screen including detailed information about the current step of the installation phase, sometimes including a video demonstration. Additionally, in some cases, screen 1110 may include a button 1124 labeled "skip" or "skip install" that may be selected by a user if the use has previously removed an existing thermostat and/or previously wired the new HVAC controller 18. Selection of the button 1126 labeled "start removal" or "next' may cause the application program code to display the next screen in the sequence of screens related to the removal of an existing HVAC controller.

FIG. 30 shows an example of another screen 1130 that may be displayed as part of the sequence of screens related to the removal of an existing HVAC controller. In some cases, as discussed herein, the sequence of screens may be a predetermined sequence of screens having a predetermined display order. As shown in FIG. 30, screen 1130 includes a first label 1132 that identifies the current phase of the setup process. A status bar indicator 1134 may also be provided that shows the status of the installation phase. In addition, screen 1130 may include a brief text string 1136 identifying the current step of the installation phase. For example, as shown in FIG. 30, the brief text string 1136 identifies the current step as "Switch Power Off." A user message 1138 may also be displayed on screen 1130. The user message 1138 may contain information that may aid the user in the current phase of the process. In some cases, the user message 1138 may provide a brief explanation of the current step of the installation phase identified by the brief text string 1136. Screen 1130 may also provide a diagram 1140 that provides a visual demonstration to the user how the power may be turned off. An information icon 1142 may be provided that, when selected by a user, may cause the application program code to display an additional screen including detailed information about the current step of the installation phase, sometimes including a video demonstration. Selection of the button 1146 labeled "start removal" or "next' may cause the application program code to display the next screen in the sequence of screens related to the removal of an existing HVAC controller.

FIG. 31 shows an example of another screen 1150 that may be displayed as part of the sequence of screens related to the removal of an existing HVAC controller. In some cases, as discussed herein, the sequence of screens may be a predetermined sequence of screens having a predetermined display order. As shown in FIG. 31, screen 1150 includes a first label 1152 that identifies the current phase of the setup process. A status bar indicator 1154 may also be provided that shows the status of the installation phase. In addition, screen 1150 may include a brief text string 1156 identifying the current step of the installation phase. For example, as shown in FIG. 31, the brief text string 1156 identifies the current step as "Verifying Power Off." A user message 1158 may also be displayed on screen 1150. The user message 1158 may contain information that may aid the user in the current phase of the process. In some cases, the user message 1158 may provide a brief explanation of the current step of the installation phase identified by the brief text string 1156. An information icon 1162 may be provided that, when selected by a user, may cause the application program code to display an additional screen including detailed information about the current step of the installation phase, sometimes including a video demonstration. Selection of the button 1166 labeled "next' may cause the application program code to display the next screen in the sequence of screens related to the removal of an existing HVAC controller.

FIG. 32 shows an example of another screen 1170 that may be displayed as part of the sequence of screens related to the removal of an existing HVAC controller. In some cases, as discussed herein, the sequence of screens may be a predetermined sequence of screens having a predetermined display order. As shown in FIG. 32, screen 1170 includes a first label 1172 that identifies the current phase of the setup process. A status bar indicator 1174 may also be provided that shows the status of the installation phase. In addition, screen 1170 may include a brief text string 1176 identifying the current step of the installation phase. For example, as shown in FIG. 32, the brief text string 1176 identifies the current step as "Remove Panel." A user message 1178 may also be displayed on screen 1170. The user message 1178 may contain information that may aid the user in the current phase of the process. In some cases, the user message 1178 may provide a brief explanation of the current step of the installation phase identified by the brief text string 1176. In some cases, as shown in FIG. 32, screen 1170 may include a user prompt 1180 that may prompt or instruct the user to take a picture of the panel before it is removed. The user may utilize the camera on their remote device 62 (if present) or utilize a separate camera. In some cases, the user may utilize the current method provided by the operating system of their remote device 62 to integrate the picture of the panel that the user just captured using the remote device's camera into the application program code. This is just one example. Additional steps for integrating the photo of the panel into the application program code may be necessary if the photo was captured using a device (e.g. digital camera) separate from the remote device 62. After successful integration of the captured photo into the application program code, the application program code may display the capture photo 1182 in a region on screen 1170, as shown in FIG. 32. An information icon 1184 may be provided that, when selected by a user, may cause the application program code to display an additional screen including detailed information about the current step of the installation phase, sometimes including a video demonstration. Selection of the button 1186 labeled "next' may cause the application program code to display the next screen in the sequence of screens related to the removal of an existing HVAC controller.

FIG. 33 shows an example of another screen 1190 that may be displayed as part of the sequence of screens related to the removal of an existing HVAC controller. In some cases, as discussed herein, the sequence of screens may be a predetermined sequence of screens having a predetermined display order. As shown in FIG. 33, screen 1190 includes a first label 1192 that identifies the current phase of the setup process. A status bar indicator 1194 may also be provided that shows the status of the installation phase. In addition, screen 1190 may include a brief text string 1196 identifying the current step of the installation phase. For example, as shown in FIG. 33, the brief text string 1196 identifies the current step as "Voltage Check." A user message or user query 1198 may also be displayed on screen 1190. As shown in FIG. 33, the user message or query 1198 may query the user about their current voltage. For example, the user query 1198 asks the user "Do you have thick black wires, 110 voltage or higher? In some cases, screen 1190 may provide a first selectable option 1202 labeled "yes" and a second selectable option 1204 labeled "no" for respond to the query presented by the user message 1198. Screen 1190 may also provide a diagram 1206 of an illustrative wiring configuration that may assist a user in identifying if their existing voltage is 110 voltage or higher. In addition, an information icon 1210 may be provided that, when selected by a user, may cause the application program code to display an additional screen including detailed information about the current step of the installation phase, sometimes including a video demonstration. Selection of the button 1212 labeled "next' may cause the application program code to display the next screen in the sequence of screens related to the removal of an existing HVAC controller.

In some cases, selection of the option 1202 labeled "yes" in response to the user query 1198 indicates that the user's voltage is 110 volts or higher. In addition, selection of the option 1202 labeled "yes" may cause the application program code to display a screen 1220, shown in FIG. 34, which informs the user that their current wiring is incompatible with the new HVAC controller, if appropriate. As shown in FIG. 34, screen 1220 includes a first label 1222 that identifies the current phase of the setup process. A status bar indicator 1224 may also be provided that shows the status of the installation phase. In addition, screen 1220 may include a brief text string 1226 identifying the current step of the installation phase. For example, as shown in FIG. 34, the brief text string 1226 may indicate to the user that the voltage is incompatible. A user message 1228 may also be displayed on screen 1220. The user message 1228 may contain information that may aid the user in the current phase of the process. In some cases, the user message 1228 may provide a brief explanation of the current step of the installation phase identified by the brief text string 1226 and, in some cases, may instruct the user to take a recommended action. An information icon 1232 may be provided that, when selected by a user, may cause the application program code to display an additional screen including detailed information about the current step of the installation phase, sometimes including a video message.

Figure 35:
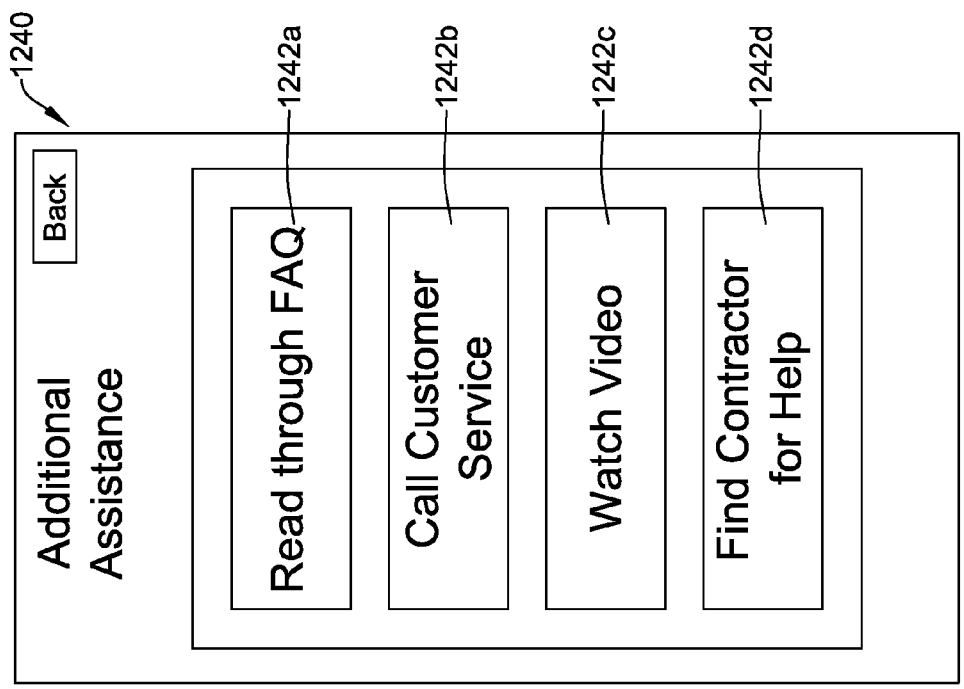

FIG. 35 shows an example of a screen 1240 that may be displayed upon selection of the information icon 1232 displayed on screen 1220 shown in FIG. 34. Screen 1240 may include one or more selectable options 1242a-1242d that, when selected by a user, may cause the application program code to perform a selected function. For example, option 1242a, when selected by a user, may cause the application program code to access and/or display a set of frequently asked questions (FAQs) and their answers so that they may be viewed by the user via the user interface of the remote device 62. Selection of option 1242b may cause the application program code to initiate a telephone call to customer service and/or technical support. Selection of option 1242c may cause the application program code to access and/or display an instructional support video. In some cases, the application program code may access the instructional video using the web browser supported by the user's remote device 62, but this is not required. Selection of option 1242d labeled "find a contractor" may cause the application program code to display another screen 1250, shown in FIG. 36, that may query the user about using location based services to identify a local contractor or that may include a user prompt that may prompt a user to enter their zip code. The application program code may utilize location based services or the zip code provided by the user to identify a local qualified contractor. In some cases, the application program code may display a contractor's contact information to the user via the user interface of the remote device 62. In other cases, the application program code may transmit the contractor information to the user via an email message or SMS text message.

Referring back to FIG. 33, selection of the button 1212 labeled "next' may cause the application program code to display the next screen in the sequence of screens related to the removal of an existing HVAC controller. FIG. 37 shows an example of a next screen 1260 that may be displayed as part of the sequence of screens related to the removal of an existing HVAC controller. In some cases, as discussed herein, the sequence of screens may be a predetermined sequence of screens having a predetermined display order. As shown in FIG. 37, screen 1260 includes a first label 1262 that identifies the current phase of the setup process. A status bar indicator 1264 may also be provided that shows the status of the installation phase. In addition, screen 1260 may include a brief text string 1266 identifying the current step of the installation phase. For example, as shown in FIG. 37, the brief text string 1266 identifies the current step as "Remove Current Wiring and Disconnect." A user message 1268 may also be displayed on screen 1260. The user message 1268 may contain information that may aid the user in the current phase of the process. In some cases, the user message 1268 may provide a brief explanation of the current step of the installation phase identified by the brief text string 1266. Additionally, in some cases the user message may instruct the user to take one or more selected actions consistent with the current step of the installation phase. In some cases, as shown in FIG. 37, screen 1260 may include an icon or button 1270 that, when selected by a user, may cause the previously captured photo of the panel wiring to be displayed to the user via the user interface of the remote device 62. The photo may be displayed in a separate screen or in a pop-up or floating window that may be provided over the screen 1260. In addition, screen 1260 may include a list 1272 of at least two wiring terminals labels 1274, wherein each wiring terminal label is available for selection by user. Screen 1260 may also include a scroll bar 1276 that, when manipulated by a user, may cause additional wiring terminal labels 1274 available for selection by a user to be displayed by screen 1260. The user may utilize the previously captured photo to aid in the selection of the appropriate wiring terminal labels 1274 consistent with a previous wiring configuration. It will be generally recognized by those of skill in the art that the wiring terminal labels "R", "C", "W", "Y", and "G" cover a vast majority of known wiring configurations related to existing HVAC controllers. An information icon 1278 may be provided that, when selected by a user, may cause the application program code to display an additional screen including detailed information about the current step of the installation phase, sometimes including a video demonstration.

FIG. 38 shows another view of screen 1260 after at least one wiring terminal label 1274 has been selected by a user. As shown in FIG. 38, wiring terminal labels 1274 labeled "R", "Y", "W", and "G" have been selected by the user. In some cases, a checkbox (FIG. 38) or radio button may be utilized to indicate selection by a user. However, it will be generally recognized that other methods used to highlight a selected option or options may be employed. Additionally, in some cases, the application program code may cause a default color 1284 (e.g. red, white, yellow and green) to be displayed adjacent the selected wiring terminal label(s) 1274. Selection of the button 1282 labeled "next' may cause the application program code to accept the legacy wiring configuration indicated by the user and/or display the next screen in the sequence of screens related to the removal of an existing HVAC controller.

Figure 39:
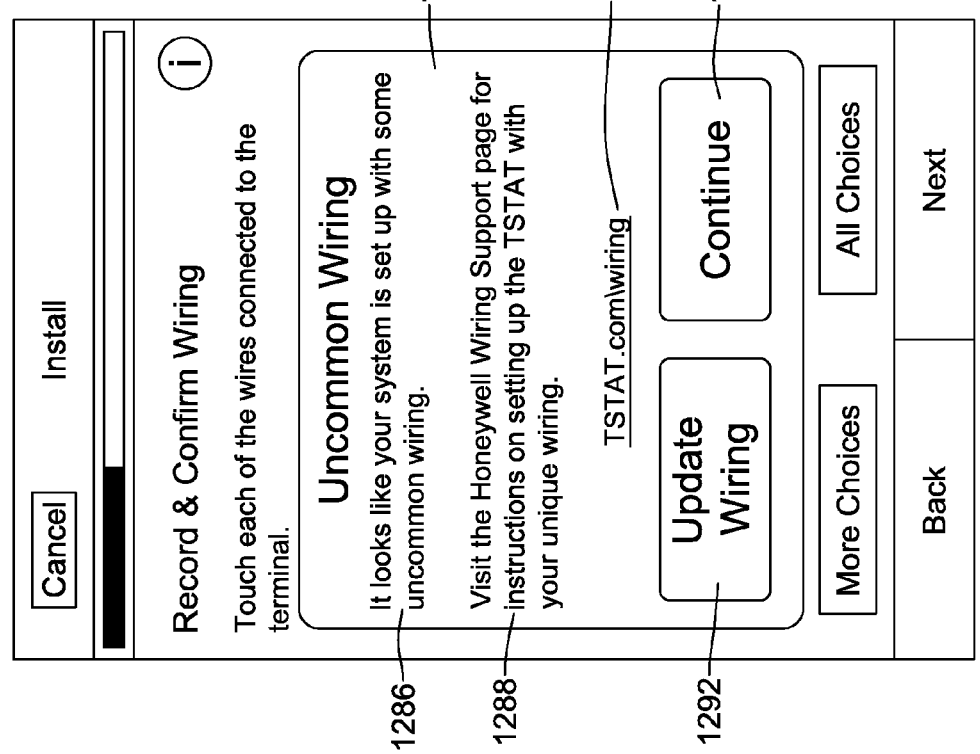

In some cases, if the existing wiring configuration indicated by the user through screen 1260 is an uncommon wiring configuration, the application program code may cause a pop-up or floating window 1284 to be displayed over screen 1260, as shown in FIG. 39. In some cases, the information displayed in pop-up window 1284, shown in FIG. 39, may also be displayed in a separate screen if desired. As shown in FIG. 39, window 1284 may include a user message 1286 that indicates to the user that the wiring configuration previously entered by the user via screen 1260 is uncommon. In addition, window 1284 may include a user prompt 1288 that may instruct the user to visit a website that may provide additional, detailed instructions for setting up the new HVAC controller based on the uncommon wiring configuration indicated by a user. In some cases, window 1284 may include a hyperlink 1290 that, when selected by the user, may cause the application program code the launch a web browser provided by the user's remote device 62 and cause the website or web page containing the additional wiring configuration information to be displayed to the user via the user interface of the remote device 62. Alternatively, or in addition, the user may enter the web address included in the hyperlink into the web browser of a separate device and view the information on the separate device. Selection of the button 1292 labeled "update wiring" may cause the previous screen 1260 to be displayed such that a user may update and/or make changes to the existing wiring configuration based on the additional information provided by the website or web page. Selection of the button 1294 labeled "continue" or "next" may cause the application program code to display the next screen in the sequence of screens related to removal of the existing thermostat.

Figure 40:
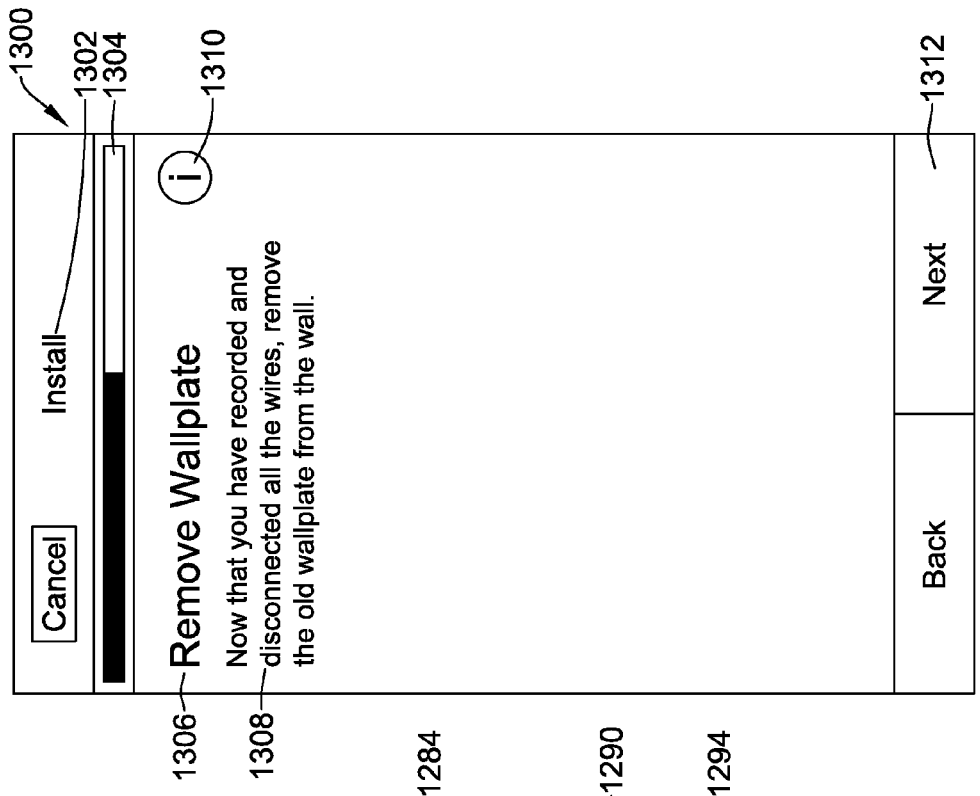

FIG. 40 shows an example of another screen 1300 that may be displayed as part of the sequence of screens related to the removal of an existing HVAC controller. In some cases, as discussed herein, the sequence of screens may be a predetermined sequence of screens having a predetermined display order. As shown in FIG. 40, screen 1300 includes a first label 1302 that identifies the current phase of the setup process. A status bar indicator 1304 may also be provided that shows the status of the installation phase. In addition, screen 1300 may include a brief text string 1306 identifying the current step of the installation phase. For example, as shown in FIG. 40, the brief text string 1306 identifies the current step as "Remove Wall Plate."A user message 1308 may also be displayed on screen 1300. The user message 1308 may contain information that may aid the user in the current phase of the process. In some cases, the user message 1308 may provide a brief explanation of the current step of the installation phase identified by the brief text string 1306. An information icon 1310 may be provided that, when selected by a user, may cause the application program code to display an additional screen including detailed information about the current step of the installation phase, sometimes including a video demonstration. Selection of the button 1312 labeled "next' may cause the application program code to display the next screen in the sequence of screens related to the removal of an existing HVAC controller.

Figures 41, 42:
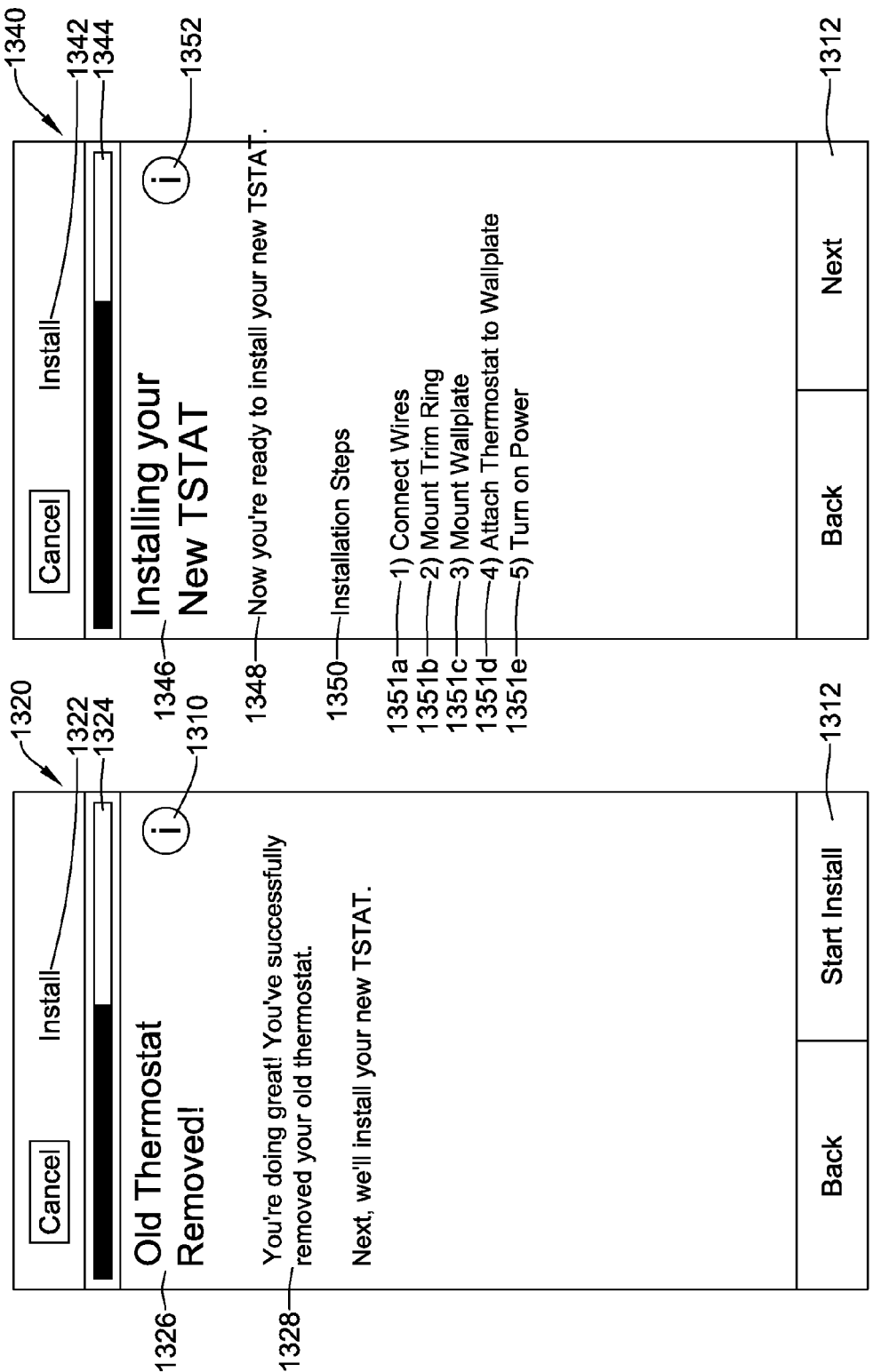

FIG. 41 shows an example of another screen 1320 that may be displayed as part of the sequence of screens related to the removal of an existing HVAC controller. In some cases, as discussed herein, the sequence of screens may be a predetermined sequence of screens having a predetermined display order. As shown in FIG. 41, screen 1320 includes a first label 1322 that identifies the current phase of the setup process. A status bar indicator 1324 may also be provided that shows the status of the installation phase. In addition, screen 1320 may include a brief text string 1326 identifying the current step of the installation phase. For example, as shown in FIG. 41, the brief text string 1326 identifies the current step as "Old Thermostat Removed!" A user message 1328 may also be displayed on screen 1320. In some cases, the user message 1328 may provide a brief explanation of the current step of the installation phase identified by the brief text string 1326. An information icon 1330 may be provided that, when selected by a user, may cause the application program code to display an additional screen including detailed information about the current step of the installation phase, sometimes including a video message. Selection of the button 1312 labeled "next" or "start install" may cause the application program code to display a first screen in a sequence of screens related to the installation of the replacement HVAC controller 18.

FIGS. 42-49 show several illustrative screens that may be displayed to the user via the user interface of the user's remote device 62 by the application program code, as described herein, that may guide the user through installation of a new HVAC controller 18. FIG. 42 shows an example of a first screen 1340 that may be displayed in the sequence of screens related to the installation of a replacement HVAC controller 18. In some cases, as discussed herein, the sequence of screens may be a predetermined sequence of screens having a predetermined display order. The user may move backward and forward within the predetermined sequence of screens by the selection of appropriate buttons provided on the screen for this purpose. In other cases, the user may scroll backward and forward within the predetermined sequence of screens by dragging their finger from side to side across the display of their remote device 62 or through some other gesture. These are just some examples.

As shown in FIG. 42, screen 1340 includes a first label 1342 that identifies the current phase of the setup process. A status bar indicator 1344 may also be provided that shows the status of the installation phase. In addition, screen 1340 may include a brief text string 1346 identifying the current step of the installation phase. For example, as shown in FIG. 42, the brief text string 1346 identifies the current step as "Installing Your New Thermostat." A user message 1348 may also be displayed on screen 1340. The user message may contain information that may aid the user in the current phase of the process. In some cases, the user message 1348 may provide a brief explanation of the current step of the installation phase identified by the brief text string 1346. Screen 1340 may also provide an overview 1350 of the current phase of the setup process. The overview 1350 may list individual steps 1351a-1351e of the current phase of the installation phase. Selection of any of the individual steps 1351a-1351e provided in the overview 1350 may cause the application program to jump to that step in the setup process. An information icon 1352 may be provided that, when selected by a user, may cause the application program code to display an additional screen including detailed information about the current step of the installation phase, sometimes including a video demonstration. Selection of the button 1354 labeled "next' may cause the application program code to display the next screen in the sequence of screens related to the installation of the new HVAC controller 18.

Figures 43, 44:
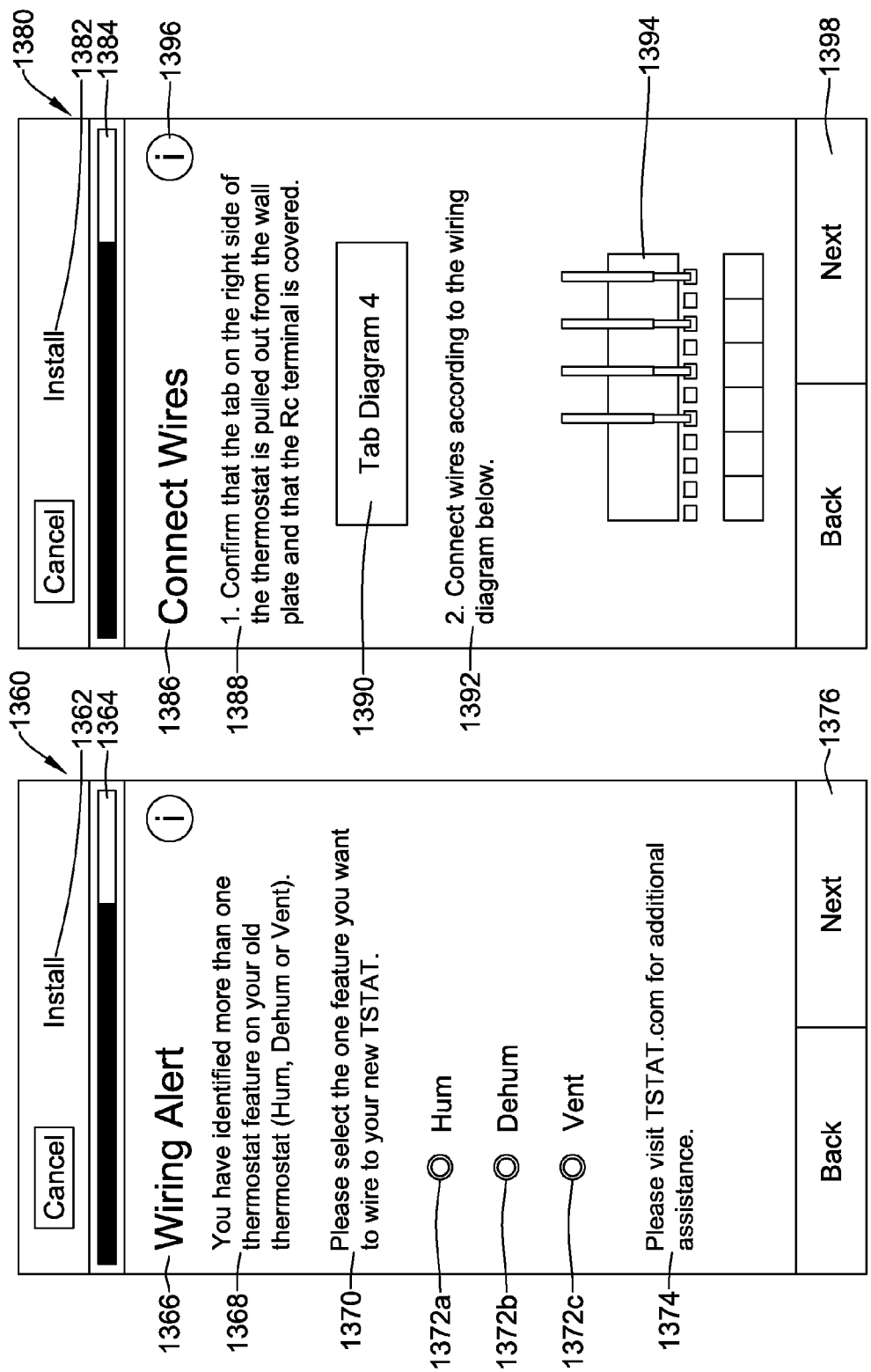

In some cases, if the wiring configuration provided by the user through screen 1260 (FIGS. 37 and 38) indicates that the previous HVAC controller was controlling one or more of a dehumidification unit, a humidification unit, or a ventilation unit, the application program code may display a wiring alert screen 1360 to the user via the user interface of the remote device 62. As shown in FIG. 43, wiring alert screen 1360 may include a first label 1362 that identifies the current phase of the setup process. A status bar indicator 1364 may also be provided that shows the status of the installation phase. In addition, screen 1360 may include a brief text string 1366 identifying the wiring alert. A user message 1368 may also be displayed on screen 1360. The user message may contain information about the wiring alert. In addition, screen 1360 may include a user prompt 1370 that may prompt the user to select which of a humidification unit, a dehumidification unit, and/or ventilation unit the user desires to wire to the new HVAC controller 18 from a list of selectable options 1372a-1372c. Screen 1360 may include an additional user prompt 1374 that may prompt the user to visit a website or view a web page associated with the HVAC controller 18 for additional details related to wiring the new HVAC controller 18 to control one or more of a humidification unit, a dehumidification unit, and/or ventilation unit. In some cases, the user prompt 1374 may include a hyperlink (not shown) that, when selected by a user, may cause the application program code the launch a web browser provided by the user's remote device 62 and cause the website or web page containing the additional wiring configuration information to be displayed to the user via the user interface of the remote device 62. Selection of the button 1376 labeled "next" may cause the application program code to display the next screen in the sequence of screens related to the installation of the new HVAC controller 18.

FIG. 44 shows another screen 1380 that may be displayed by the application program code as part of the sequence of screens related to the installation of a new HVAC controller 18. In some cases, as discussed herein, the sequence of screens may be a predetermined sequence of screens having a predetermined display order, but this is not required. In this case, the sequence of screens may be dependent, at least in part, on the wiring configuration indicated through screen 1260 (FIGS. 37 and 38). As shown in FIG. 44, screen 1380 includes a first label 1382 that identifies the current phase of the setup process. A status bar indicator 1384 may also be provided that shows the status of the installation phase. In addition, screen 1380 may include a brief text string 1386 identifying the current step of the installation phase. For example, as shown in FIG. 44, the brief text string 1386 identifies the current step as "Connect Wires." Screen 1380 may include at least one user message 1388 that may describe at least one step for connecting one or more wires to the new HVAC controller as part of the "Connect Wires" step of the installation phase. In some cases, in addition to describing at least one step of the wiring connection process, screen 1380 may display at least one diagram 1390 adjacent the user message 1388. The diagram 1390 may provide a visual illustration of the step described by user message 1388. In some cases, screen 1380 may also display an additional user message 1392 that may describe another step of the wiring connection process. In some cases, the user message 1392 may instruct a user to connect the wires according to a wiring diagram 1394 that may be displayed on screen 1380 in connection with and adjacent to the user message 1392. The wiring diagram 1394 that is displayed may be dependent upon the legacy wiring diagram indicated by the user and the user's answers to the one or more questions about the user's HVAC system including additional HVAC equipment that may be present such as, for example, a humidification unit, a dehumidification unit and/or a ventilation unit. As shown in FIG. 44, the application program code may display one or more steps related to a wiring configuration process for a common wiring configuration on a single screen 1380. An information icon 1396 may be provided that, when selected by a user, may cause the application program code to display an additional screen including detailed information about the current step of the installation phase, sometimes including a video demonstration. Selection of the button 1312 labeled "next" may cause the application program code to display another screen in a sequence of screens related to the installation of the replacement HVAC controller 18.

It will be generally understood that the number of steps related to the wiring connection process and/or the number of diagrams that may be displayed in connection with the steps may be dependent upon the wiring configuration indicated by the user through screen 1260 (FIGS. 37 and 38). In some cases, one or more additional screens or a scrolling display including additional steps and/or diagrams may be displayed by the application program code in connection with a wiring connection process as necessary.

Referring back to FIGS. 32 and 44, in some instances a user may capture a photo or video of the existing wire panel using a camera built into their remote device 62 or a separate camera, and the photo or video may be read by the application program code. The application program code may include wire recognition logic incorporating appropriate digital processing techniques for identifying the color and the position of the wires in the picture of the existing wire panel. The wire recognition logic may use image processing algorithms, and may be substantially simpler than some more complex image processing applications such as facial recognition applications. The wire recognition logic may enable the application program code to determine the existing wiring configuration based on the color and/or positions of the wires in the picture. In some cases, the application program code may include logic for recognizing if one or more wire terminals includes a jumper. In some cases, the wire recognition logic contained within the application program code may cause the controller of the remote device 62 to access a wiring configuration database stored locally in the memory of the remote device 62, and to compare the existing wiring configuration detected by the wire recognition logic to the wiring configurations contained within the database. Based on the comparison of the existing wiring configuration to the wiring configurations stored in the database, the controller of the remote device 62 may identify an appropriate wiring configuration for the new thermostat based on the comparison and, in some cases, answers to one or more interview questions about the HVAC system provided by the user via a user interface of the remote device 62. The application program code may then display a recommended wiring diagram for the new thermostat to the user via the user interface of the remote device, and instruct the user to connect the existing wires according to a wiring diagram, such as shown in FIG. 44.

Rather than doing the processing on the remote device 62, it is contemplated that the wiring recognition logic may be implemented on a remote server. The remote device 62 may transmit a captured wiring configuration to the remote server. The remote server may then access a wiring configuration database stored at the server and the server may compare the existing wiring configuration to the wiring configurations contained within the database. The remote server may identify an appropriate wiring configuration for the new thermostat based on the comparison and, in some cases, answers to one or more interview questions about the HVAC system provided by the user. The remote server may then transmit a message containing a recommended new wiring configuration to the remote device 62 where it may be displayed to the user via the user interface of their remote device 62, such as shown in FIG. 44, by the application program code of the remote device 62. These are just some examples.

FIG. 45 shows another screen 1400 that may be displayed as part of the sequence of screens related to the installation of the new HVAC controller 18. In some cases, as discussed herein, the sequence of screens may be a predetermined sequence of screens having a predetermined display order.

As shown in FIG. 45, screen 1400 includes a first label 1402 that identifies the current phase of the setup process. A status bar indicator 1404 may also be provided that shows the status of the installation phase. In addition, screen 1400 may include a brief text string 1406 identifying the current step of the installation phase. For example, as shown in FIG. 45, the brief text string 1406 identifies the current step as "Mount Trim Ring." A user message 1408 may also be displayed on screen 1400. In some cases, the user message 1408 may provide a brief explanation of the current step of the installation phase identified by the brief text string 1406. In addition, screen 1400 may include an instructional diagram 1410 visually showing the user how to mount the trim ring. An information icon 1412 may be provided that, when selected by a user, may cause the application program code to display an additional screen including detailed information about the current step of the installation phase, sometimes including a video demonstration. Selection of the button 1414 labeled "next" may cause the application program code to display another screen in a sequence of screens related to the installation of the replacement HVAC controller 18.

FIG. 46 shows another screen 1420 that may be displayed as part of the sequence of screens related to the installation of the new HVAC controller 18. In some cases, as discussed herein, the sequence of screens may be a predetermined sequence of screens having a predetermined display order. As shown in FIG. 46, screen 1420 includes a first label 1422 that identifies the current phase of the setup process. A status bar indicator 1424 may also be provided that shows the status of the installation phase. In addition, screen 1420 may include a brief text string 1426 identifying the current step of the installation phase. For example, as shown in FIG. 46, the brief text string 1426 identifies the current step as "Mount Wallplate." A user message 1428 may also be displayed on screen 1420. In some cases, the user message 1428 may provide a brief explanation of the current step of the installation phase identified by the brief text string 1426. In addition, screen 1420 may include an instructional diagram 1430 visually showing the user how to mount the wallplate to a wall. An information icon 1432 may be provided that, when selected by a user, may cause the application program code to display an additional screen including detailed information about the current step of the installation phase, sometimes including a video demonstration. Selection of the button 1434 labeled "next" may cause the application program code to display another screen in a sequence of screens related to the installation of the replacement HVAC controller 18.

FIG. 47 shows another screen 1440 that may be displayed as part of the sequence of screens related to the installation of the new HVAC controller 18. In some cases, as discussed herein, the sequence of screens may be a predetermined sequence of screens having a predetermined display order. As shown in FIG. 47, screen 1440 includes a first label 1442 that identifies the current phase of the setup process. A status bar indicator 1444 may also be provided that shows the status of the installation phase. In addition, screen 1440 may include a brief text string 1446 identifying the current step of the installation phase. For example, as shown in FIG. 47, the brief text string 1446 identifies the current step as "Attach to Wallplate." A user message 1448 may also be displayed on screen 1420. In some cases, the user message 1448 may provide a brief explanation of the current step of the installation phase identified by the brief text string 1446. In addition, screen 1440 may include an instructional diagram 1450 visually showing the user how to attach the HVAC controller to the wallplate. An information icon 1452 may be provided that, when selected by a user, may cause the application program code to display an additional screen including detailed information about the current step of the installation phase, sometimes including a video demonstration. Selection of the button 1454 labeled "next" may cause the application program code to display another screen in a sequence of screens related to the installation of the replacement HVAC controller 18.

FIG. 48 shows another screen 1460 that may be displayed as part of the sequence of screens related to the installation of the new HVAC controller 18. In some cases, as discussed herein, the sequence of screens may be a predetermined sequence of screens having a predetermined display order. As shown in FIG. 48, screen 1460 includes a first label 1462 that identifies the current phase of the setup process. A status bar indicator 1464 may also be provided that shows the status of the installation phase. In addition, screen 1460 may include a brief text string 1466 identifying the current step of the installation phase. Alternatively, or in addition to, the brief text string 1466 may instruct the user to take a desired action. For example, as shown in FIG. 48, the brief text string 1446 instructs a user to "Turn on Power." A user message 1468 may also be displayed on screen 1460. In some cases, the user message 1468 may provide a brief explanation of the current step of the installation phase identified by the brief text string 1466. In addition, screen 1460 may include an instructional diagram 1470 visually showing the user how to turn the power on to the HVAC controller 18. An information icon 1472 may be provided that, when selected by a user, may cause the application program code to display an additional screen including detailed information about the current step of the installation phase, sometimes including a video demonstration. Selection of the button 1474 labeled "next" may cause the application program code to display another screen in a sequence of screens related to the installation of the replacement HVAC controller 18.

Figure 49:
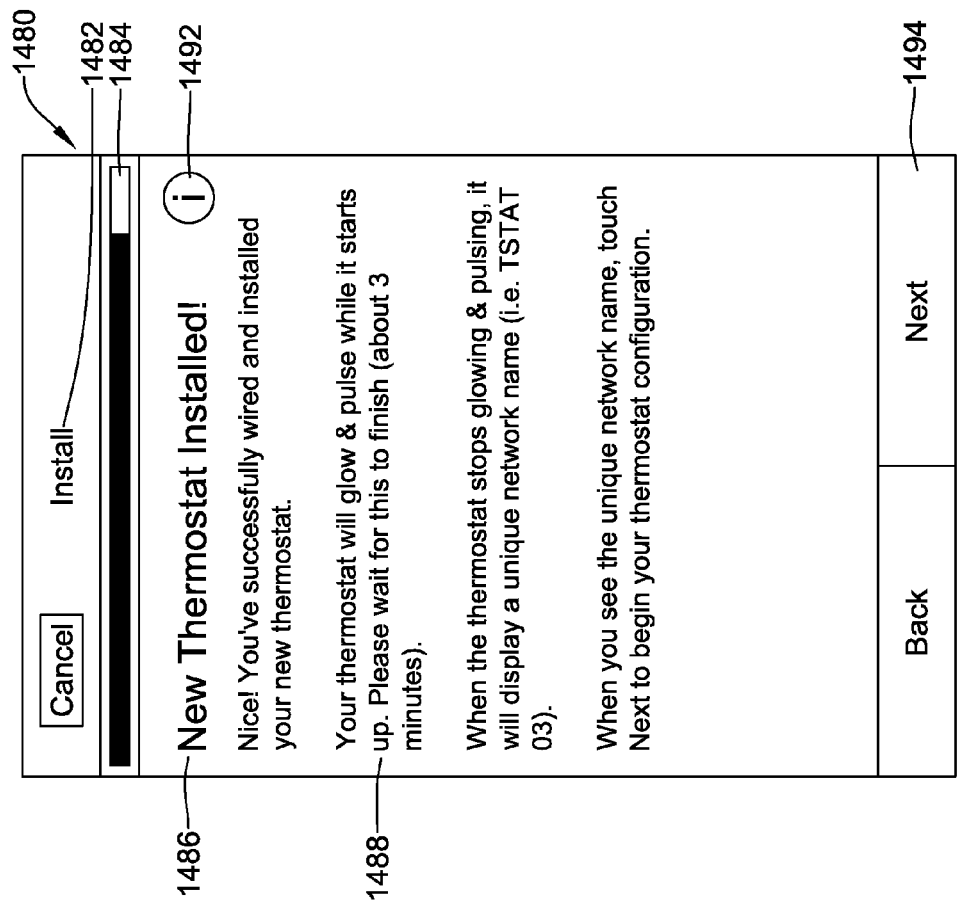

FIG. 49 shows another screen 1480 that may be displayed as part of the sequence of screens related to the installation of the new HVAC controller 18. In some cases, as discussed herein, the sequence of screens may be a predetermined sequence of screens having a predetermined display order. As shown in FIG. 49, screen 1480 includes a first label 1482 that identifies the current phase of the setup process. A status bar indicator 1484 may also be provided that shows the status of the installation phase. In addition, screen 1480 may include a brief text string 1486 identifying the current step of the installation phase. A user message 1488 may also be displayed on screen 1480. In some cases, the user message 1488 may provide a brief explanation of the current step of the installation phase identified by the brief text string 1486. In some cases, the user message 1488 may provide additional information about the next phase in the installation phase. An information icon 1492 may be provided that, when selected by a user, may cause the application program code to display an additional screen including detailed information about the current step of the installation phase, sometimes including a video message. Selection of the button 1494 labeled "next" may cause the application program code to display another screen in a sequence of screens related to the installation of the replacement HVAC controller 18.

Figure 50:
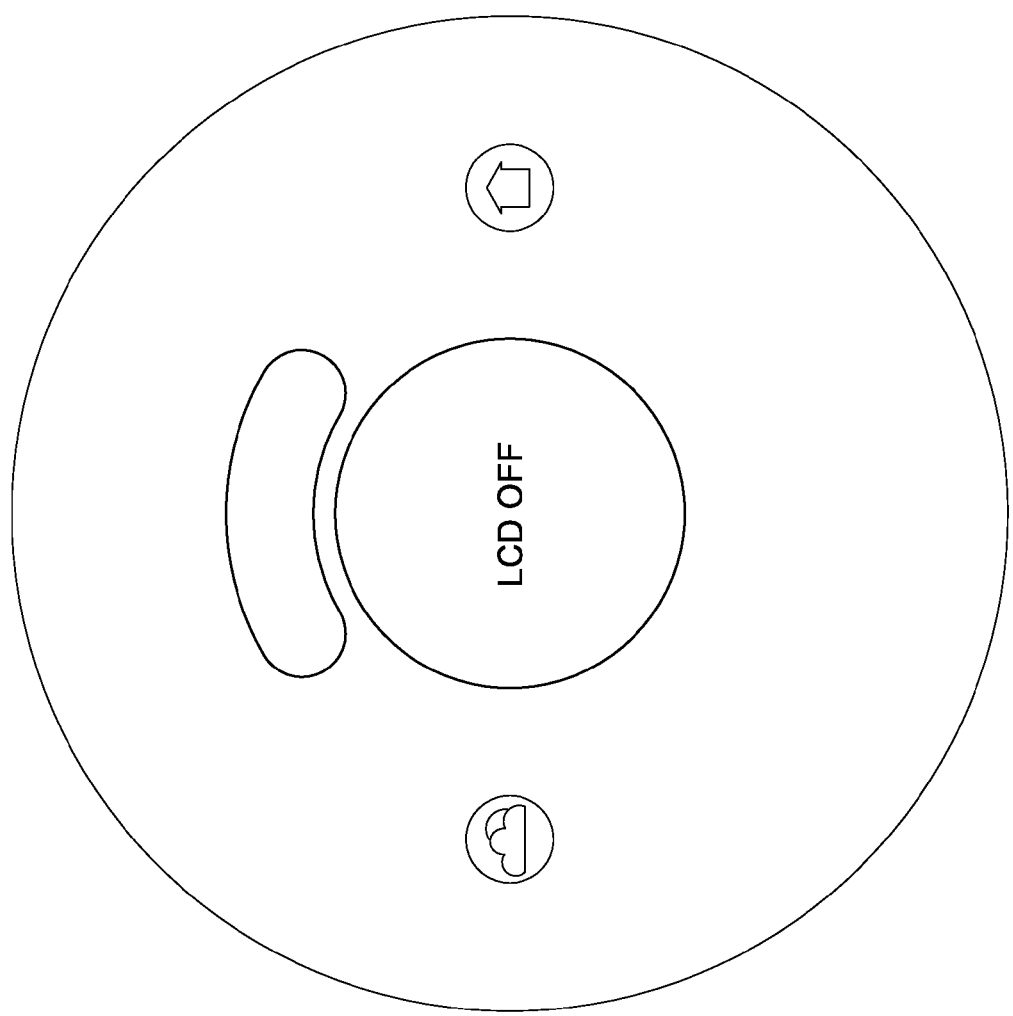
FIG. 50 is a front elevation view an illustrative HVAC controller after a successful installation.

FIG. 50 shows a schematic view of an illustrative HVAC controller 18 after a successful installation. In some cases, the HVAC controller 18 may glow and/or emit light pulses during its initial startup. In some cases, this may include illuminating the light ring to produce a halo glow around the HVAC controller 18. In some cases, this may visually indicate to the user that the HVAC controller 18 is starting up. Once the HVAC controller 18 has stopped glowing and/or pulsing and the liquid crystal display of the user interface is on, the HVAC controller 18 is ready to be configured to control one or more components of the HVAC system 4.

In some cases, upon successful installation of the HVAC controller 18, the HVAC controller 18 may be programmed to configure itself as a WiFi access point for hosting its own wireless network 54 within a building or structure, and may be programmed to accept a wireless connection with a user's remote device 62. In some cases, the application code previously downloaded and stored in the memory of the user's remote device 62 may cause the remote device 62 to search for available wireless networks within and/or in close proximity to the building or structure in which the HVAC controller 18 is located. Since the HVAC controller 18 may be initially configured as a wireless access point, the application program code may cause the remote device 62 to detect the wireless network hosted by the HVAC controller 18, and to display the HVAC controller's wireless network on the user interface of the remote device 62 as being available for connection. The HVAC controller's wireless network may be displayed as one selectable option among a list of other wireless networks that are available in the area for connection. A user may initiate connection to the HVAC controller's wireless network by selecting the HVAC controller's wireless network from the list of wireless networks. In some cases, a password may be requested. In any event, once connected to the HVAC controller's wireless network, the user may be able to configure the HVAC controller 18 to control one or more components of the HVAC system 4 through the same or a different application program code stored on the user's remote device 62 for that purpose.

Figure 51:
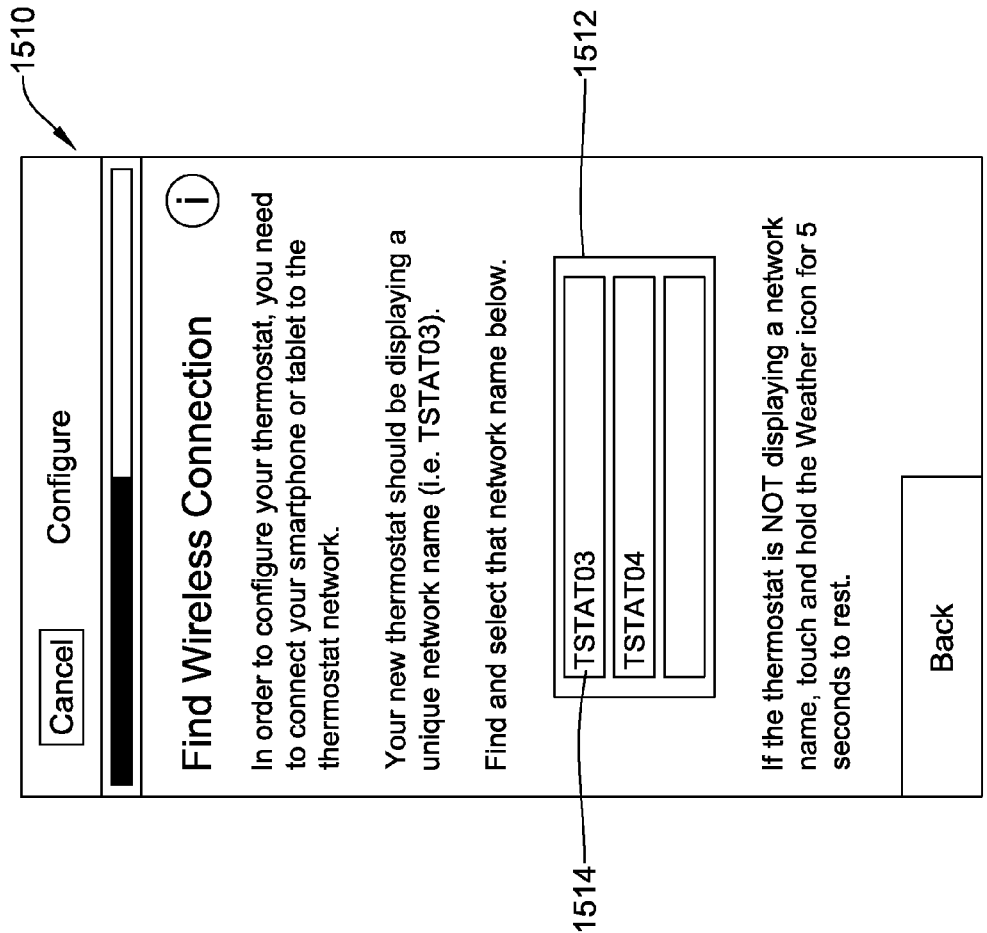
FIG. 51 shows an illustrative screen that may be displayed on the user interface of a remote device (e.g. mobile device) when the remote device is attempting to connect to a wireless network hosted by an illustrative HVAC controller.
Figure 52:
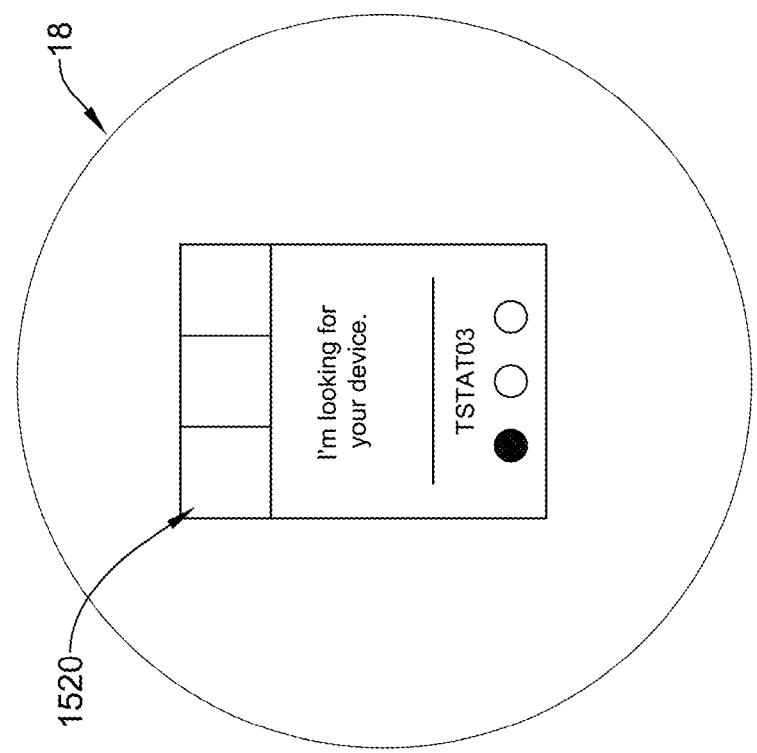
FIG. 52 shows an illustrative screen that may be displayed on the user interface of an illustrative HVAC controller when a remote device (e.g. mobile device) is attempting to connect to a network hosted by the illustrative HVAC controller.

FIG. 51 provides an illustrative screen 1510 that may be displayed on the user interface of the remote device 62 when the remote device 62 is attempting to connect to the wireless access point hosted by the HVAC controller 18. As shown in FIG. 51, screen 1510 may include a list 1512 of wireless networks 1514 available in the area for connection including the wireless network hosted by the HVAC controller 18. Each of the available wireless networks 1514 displayed on the screen 1510 may be displayed as individually selectable options available for selection by a user, and in the example shown, are assigned a unique SSID that identifies them to a user. For example, the HVAC controller 18 may host an access point wireless network identified as "TSTAT03". The remote device 62 may attempt to connect to the HVAC controller's wireless network upon selection of the wireless network option 1514 labeled "TSTAT03" by a user. FIG. 52 provides an example of a screen 1520 that may be displayed on the user interface of the HVAC controller 18 when the remote device 62 is attempting to connect to the HVAC controller 18 over the wireless network hosted by the HVAC controller 18.

A wireless network may be established between the HVAC controller 18 and a remote device 62 upon acceptance of the connection from the remote device 62. In many cases, the wireless network may be hosted by the HVAC controller 18 and may initially be used to access and configure the HVAC controller 18 via the application program code previously downloaded and stored on the user's remote device 62. In some cases, the HVAC controller 18 and the remote device 62 may remain paired over the wireless network hosted by the HVAC controller 18 during the configuration phase and at least part of the connection phase of the installer setup process. During the connection phase of the installation setup process, as will be described herein, the HVAC controller 18 may terminate the hosted wireless network and reconfigure itself as a client device on the building's wireless network.

Figure 53:
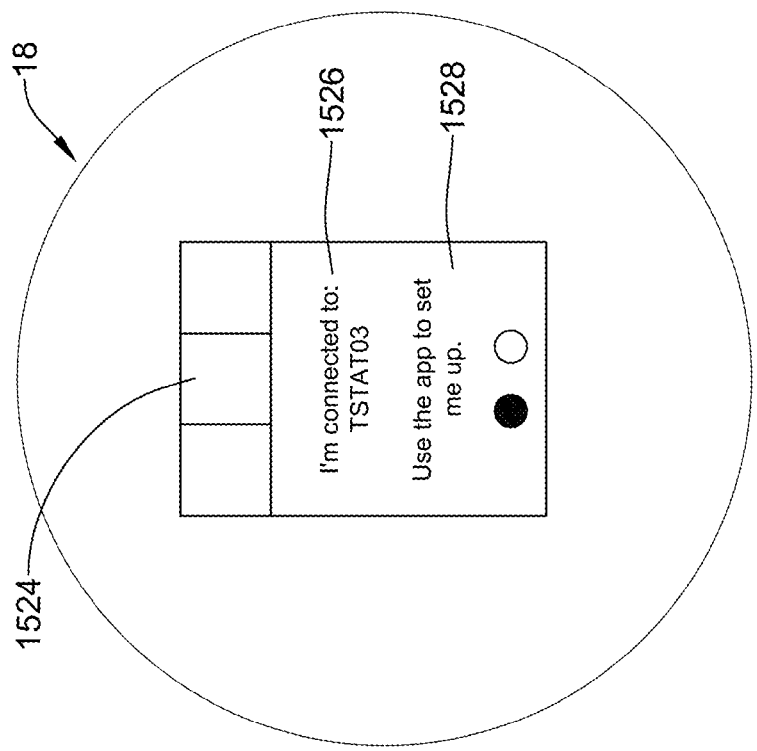
FIG. 53 shows an illustrative screen that may be displayed on the user interface of an illustrative HVAC controller upon successful connection of a remote device to the wireless network hosted by the illustrative HVAC controller 18.

FIG. 53 provides an illustrative screen 1524 that may be displayed on the display of the user interface of the HVAC controller 18 upon successful connection of the remote device 62 to the wireless network hosted by the HVAC controller 18. Screen 1524 may include a user message 1526 that indicates that the connection to the remote device 62 was successful. Additionally, in some cases, screen 1524 may include a user prompt 1526 that may prompt the user to continue to use the application program code stored on the remote device 62 to setup and/or configure the HVAC controller 18.

Figure 54:
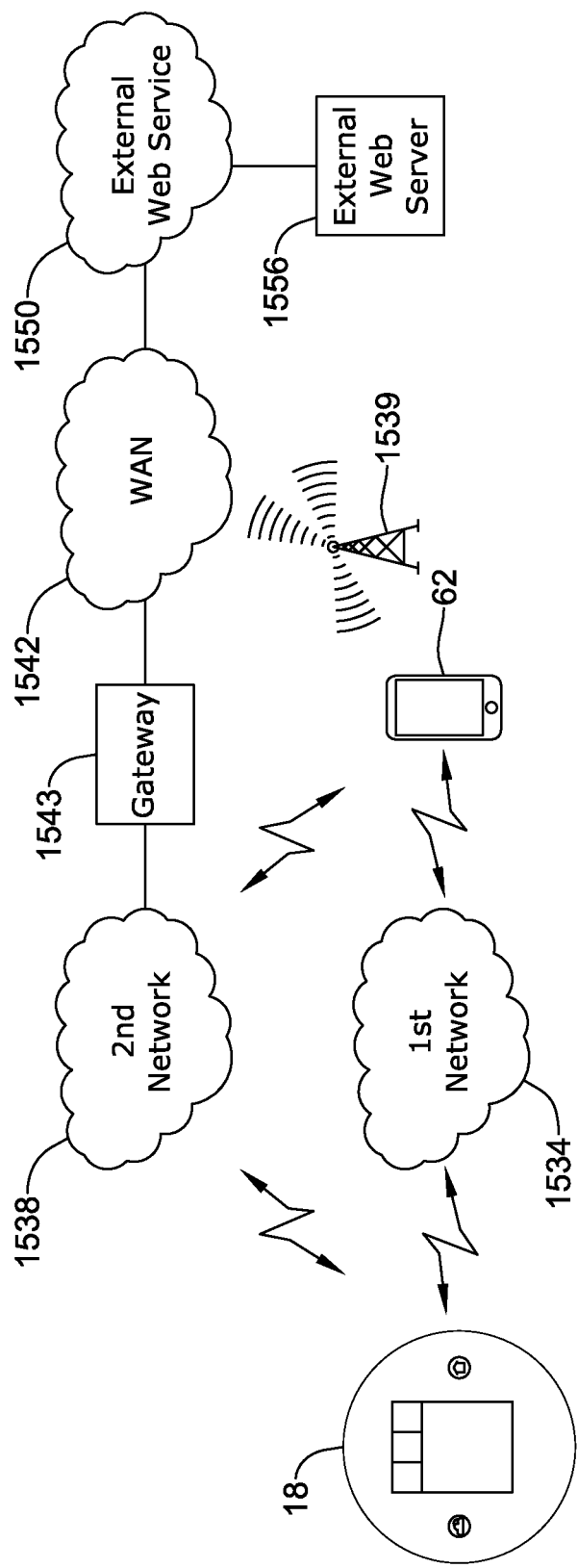
FIG. 54 is a schematic diagram of network architecture that may be utilized by an illustrative HVAC controller in communication with a remote device and an external web service.

In some cases, the HVAC controller 18 may be configured to connect to a second wireless network 1538 such as, for example, the building's WiFi network. FIG. 54 provides a schematic diagram of a network architecture that may be established between the user's remote device 62, the HVAC controller 18, and a cloud-based, external web service 1550 (e.g. Honeywell's TOTAL CONNECT™ web service) hosted by a remote/external web server 1556. In many cases, the second wireless network 1538 may be capable of communicating over a wide area network 1542 (e.g. the Internet) via a router or gateway 1543 to access the external web service 1550 hosted by the external web server 1556. The external web service 1550 may include a user account having one or more user profiles that may be associated with the HVAC controller 18. The external web service 1550 may provide additional functionalities and or programming capabilities that may not otherwise be available at the HVAC controller 18, or through application program code executed by the user's remote device 62. Additionally, the external web service 1550 may be programmed to receive selected data from the HVAC controller 18 over the wide area network 1542. In some cases, after connection between the HVAC controller 18 and the web service 1550 has been established as part of the installation setup process, the HVAC controller 18 may be configured to deliver some or all of the installer setup parameters to the web service 1550 over the wide area network 1542 via the building's wireless network 1538. The web service 1550 may be programmed to associate the various installation setup parameters with the user's account hosted by the web service 1550 and store them in an appropriate database.

In some cases, the HVAC controller 18 may be programmed to receive one or more access parameters for accessing the second wireless network 1538 over the first wireless network 1534 from the user's remote device 62. The one or more access parameters may include a service set identifier (SSID) for the second wireless network 1538 and/or password required to gain access to the second wireless network 1538. In some cases, the one or more access parameters for accessing the second wireless network 1538 may have been previously entered by a user through the user interface of the user's remote device 62, and may be stored in the memory of the remote device 62. In this example, the one or more access parameters for accessing the second wireless network 1538 may be passed to the HVAC controller 18 when the remote device 62 is connected to the HVAC controller 18 via the first wireless network 1534.

In some cases, upon connection of the remote device 62 to the HVAC controller 18 via the first wireless network 1534, the HVAC controller 18 may be configured to implement a web server for serving up one or more web pages over the first wireless network 1534 that may be displayed and viewed on the user interface of the wireless device 62. The one or more web pages displayed on the user interface of the wireless device 62 may solicit and accept the one or more access parameters for accessing the second wireless network 1538 from a user. Such a feature is shown and described in U.S. application Ser. No. 13/559,470 which is incorporated herein by reference in its entirety for all purposes. These are just some examples. The HVAC controller 18 may be programmed to use, at least in part, the one or more access parameters to connect to the second wireless network 1538. In some cases, the HVAC controller 18 may be programmed to connect to the second wireless network 1538 as a network client device using the one or more access parameters received from the user's remote device 62, making the HVAC controller 18 available on the second network 1538.

In some cases, the HVAC controller 18 may be programmed to first disconnect itself from the first wireless network 1534 established between the HVAC controller 18 and the user's remote device 62 before connecting to the second wireless network 1538 as a network client. For example, and in some cases, the HVAC controller 18 may be programmed to perform a reset, and on initialization, may automatically connect to the second wireless network 1538 using the one or more access parameters. In some cases, this step may be performed by the HVAC controller 18 after the user has configured the HVAC controller 18 to control one or more components of the HVAC system 4 using the application program code stored in the memory of the user's remote device 62 when the user's remote device is in communication with the HVAC controller 18 over the first wireless network 1534 established between the remote device 62 and the HVAC controller 18. For example, this step may be performed during the connection phase of the installer setup process, discussed in further detail below.

The configuration phase, as described herein, may be completed utilizing the application program code executed by the user's remote device 62 when the user's remote device 62 is connected to the HVAC controller 18 over the first network 1534 hosted by the HVAC controller 18 (FIG. 54). The HVAC controller 18 may then transmit the configuration information to the web service 1550 when a second network connection 1538 is established between the web service 1550 and the HVAC controller 18. Alternatively, or in addition, the application program code executed by the user's remote device 62 may transmit the configuration information over the second network 1538 or another network 1539 (e.g. cell phone, SMS, or the like) to the web service 1550, and the web service 1550 may transmit the configuration information to the HVAC controller 18.

More particularly, and in some cases, because a single communication protocol may be utilized by the remote device 62 to communicate with the web service 1550 or the HVAC controller 18, the application program code may be used to configure the HVAC controller 18 when the user's remote device 62 is connected to the HVAC controller 18 over the first network 1534, or when the user's remote device 62 is in communication with the HVAC controller 18 over the wide area network 1542 via the external web service 1550. The user's remote device 62 may communicate directly with the external web service 1550 via the second network 1538 or another network 1539, as desired. This feature may be useful if the network connection established between the HVAC controller 18 and the remote device 62 over the first network 1534 becomes disrupted. For example, in some cases, the user may finish configuring the HVAC controller 18 using the application program code on their remote device 62. This information may then be transmitted from the user's remote device 62 to the web service 1550 via the second network 1538 or another network 1539. The web service 1550 may associate the configuration information with the user's account hosted by the web service 1550, and then transmit the configuration to the HVAC controller 18 via the second network 1538 when a network connection between the HVAC controller 18 and the web service 1550 is established.

Similarly, after the user has finished configuring the HVAC controller 18 utilizing the network connection between the HVAC controller 18 and the remote device 62, the HVAC controller 18 may transmit the configuration information to the web service 1550 over the second network 1548. Additionally, in some cases, both the web service 1550 and the HVAC controller 18 may utilize the same installation setup logic by executing the same code from the same code base. The code may be compiled for use by the HVAC controller 18 and for use by the web service 1550. This feature may allow the web service 1550 to more easily communicate directly with the application program code executed by the user's remote device 62, regardless of the state of the HVAC controller 18. In some cases, because the application program code uses the same communication protocol to communicate with the web service 1550 and the HVAC controller, and both the web service 1550 and the HVAC controller 18 may use the same installation setup logic by executing the same basic code from the same code base, configuration information may be transmitted between any one of the application program code executed by the user's remote device 62, the HVAC controller 18, and/or the web service 1550. Additionally, because each of the HVAC controller 18, the application program code, and the web service 1550 use the same installation setup logic, this may permit a user to begin configuring the HVAC controller 18 utilizing the application program code executed by their remote device 62 and finish configuring the HVAC controller 18 through the web service or at the user interface of the HVAC controller 18 itself with minimal differences in the user experience.

Figure 55:
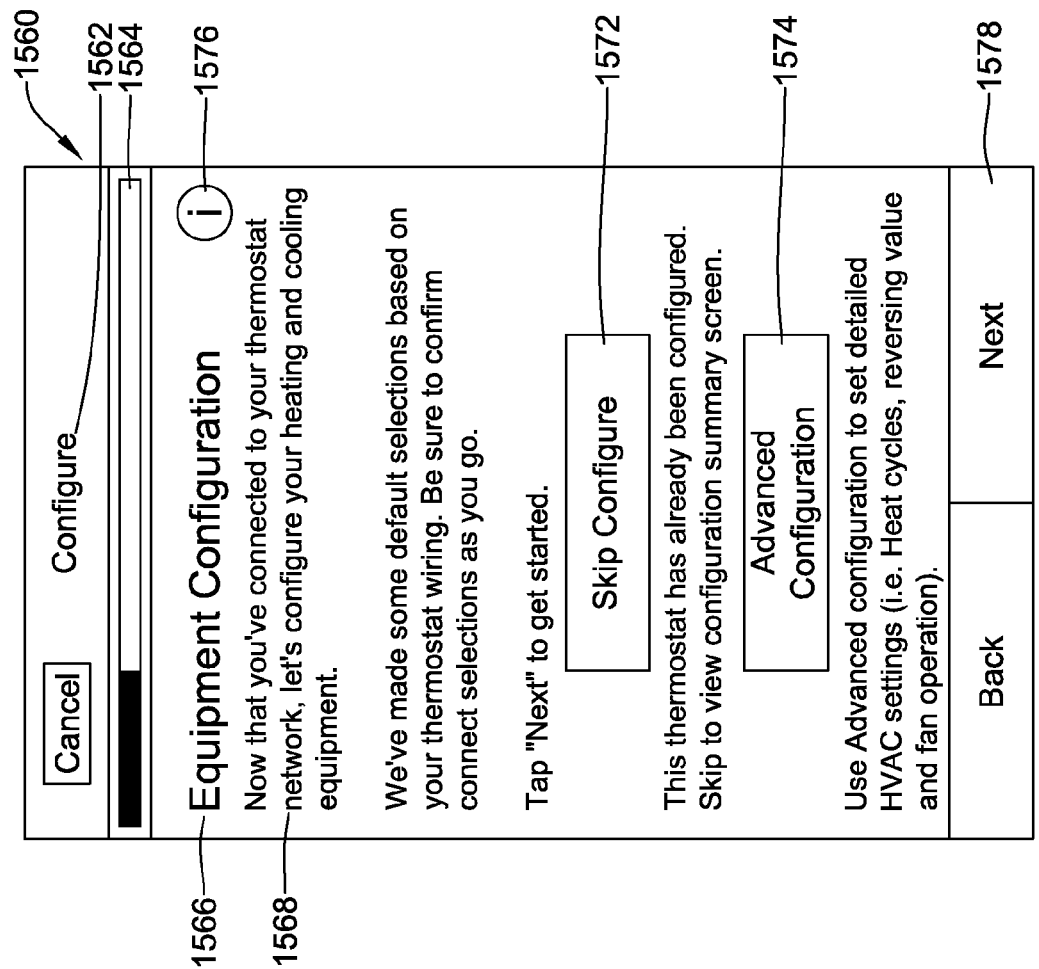
FIGS. 55-69 show illustrative screens that may be displayed on the user interface of a remote device (e.g. mobile device) by an application program code that may guide the user through configuring an illustrative HVAC controller.

FIG. 55 provides an example of a screen 1560 that may be displayed on the user interface of the user's remote device 62 upon successful connection of the remote device 62 to the wireless network hosted by the HVAC controller 18. In some cases, screen 1560 may be a first screen in a sequence of screens related to configuring the newly installed HVAC controller 18. In some cases, the sequence of screens may be a predetermined sequence of screens having a predetermined display order. The user may move backward and forward within the predetermined sequence of screens by the selection of appropriate buttons provided on the screen for this purpose. In other cases, the user may scroll backward and forward within the predetermined sequence of screens by dragging their finger from side to side across the display of their remote device 62. These are just some examples.

As shown in FIG. 55, screen 1560 includes a first label 1562 that identifies the current phase of the setup process. In this example, first label 1562 identifies the current phase of the setup process as "Configure." A status bar indicator 1564 may also be provided that shows the current status of the configuration phase. In addition, screen 1560 may include a brief text string 1566 identifying the current step of the configuration phase. For example, as shown in FIG. 55, the brief text string 1566 identifies the current step as "Equipment Configuration." A user message 1568 may also be displayed on screen 1560. The user message may contain information that may aid the user in the current phase of the process. In some cases, the user message 1568 may provide a brief explanation of the current step of the configuration phase identified by the brief text string 1566. Screen 1560 may also include a button 1572 labeled "skip configure" that may permit a user to skip the configuration phase. A user may select button 1572 labeled "skip configure" if they have already completed this phase of the setup process. In addition, screen 1560 may include a button 1574 labeled "advanced configuration" that, when selected by a user, may cause the application program code to display one or more screens related to setting one or more detailed HVAC settings such as, for example, a number of heating cycles, reversing valve settings, fan operation, etc. An information icon 1576 may be provided that, when selected by a user, may cause the application program code to display an additional screen including detailed information about the current step of the configuration phase, sometimes including a video demonstration. Selection of the button 1578 labeled "next" may cause the application program code to display the next screen in the sequence of screens related to configuring the newly installed HVAC controller 18.

Figure 56:
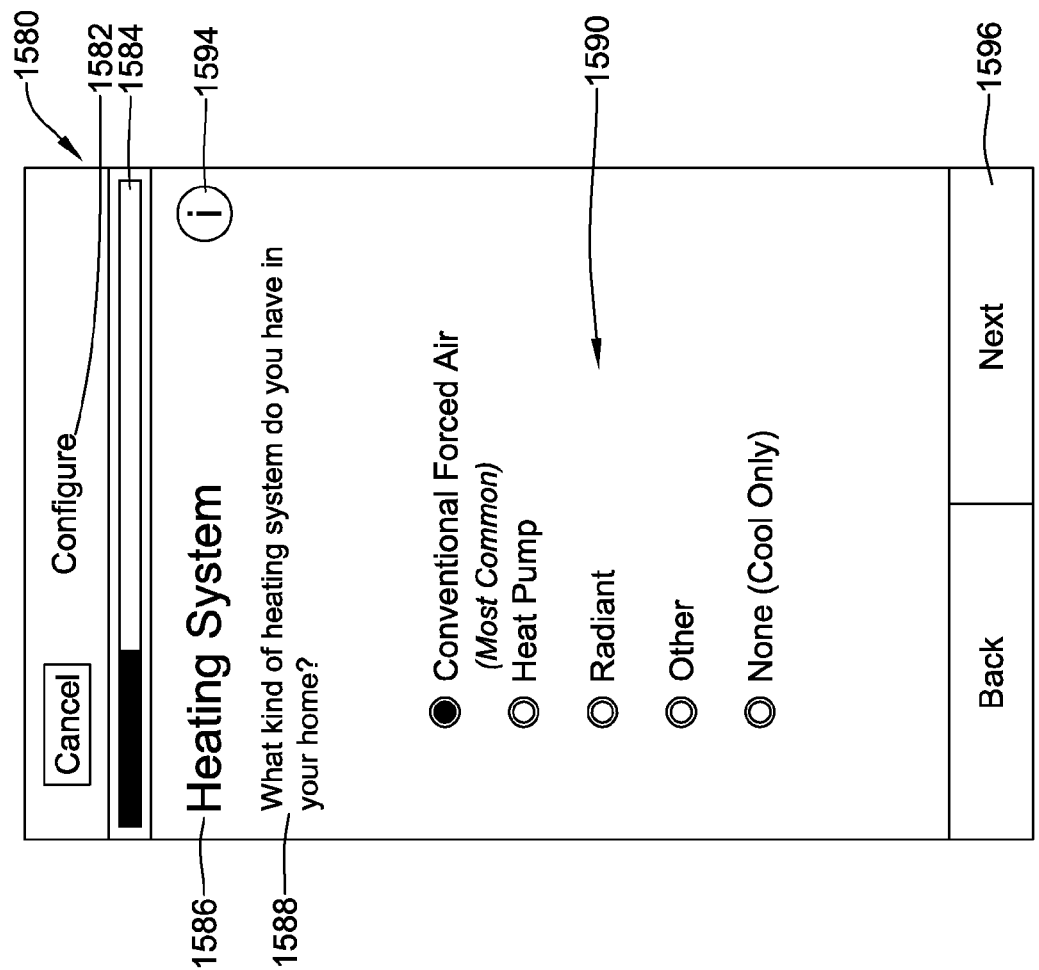

FIG. 56 provides another example of a screen 1580 that may be displayed on the user interface of the user's remote device 62 related to configuring the newly installed HVAC controller 18. As shown in FIG. 56, screen 1580 includes a first label 1582 that identifies the current phase of the setup process. In this example, first label 1582 identifies the current phase of the setup process as "Configure." A status bar indicator 1584 may also be provided that shows the current status of the configuration phase. In addition, screen 1580 may include a brief text string 1586 identifying the current step of the configuration phase. For example, as shown in FIG. 56, the brief text string 1586 identifies the current step of the configuration phase as "Heating System." A user message 1588 may also be displayed on screen 1580. In this example, the user message may contain a user query that prompts the user to select their heating system type from a list 1590 of one or more selectable options 1592a-1592e, each selectable option corresponding to a different type of heating system. In some cases, a radio button or checkbox may be provided to highlight the user's selection. Additionally, the list 1590 may indicate the most common type of heating system to aid the user in their selection. An information icon 1594 may be provided that, when selected by a user, may cause the application program code to display an additional screen including detailed information about the current step of the configuration phase, sometimes including a video demonstration. Selection of the button 1596 labeled "next" may cause the application program code to display the next screen in the sequence of screens related to configuring the newly installed HVAC controller 18.

Figure 57:
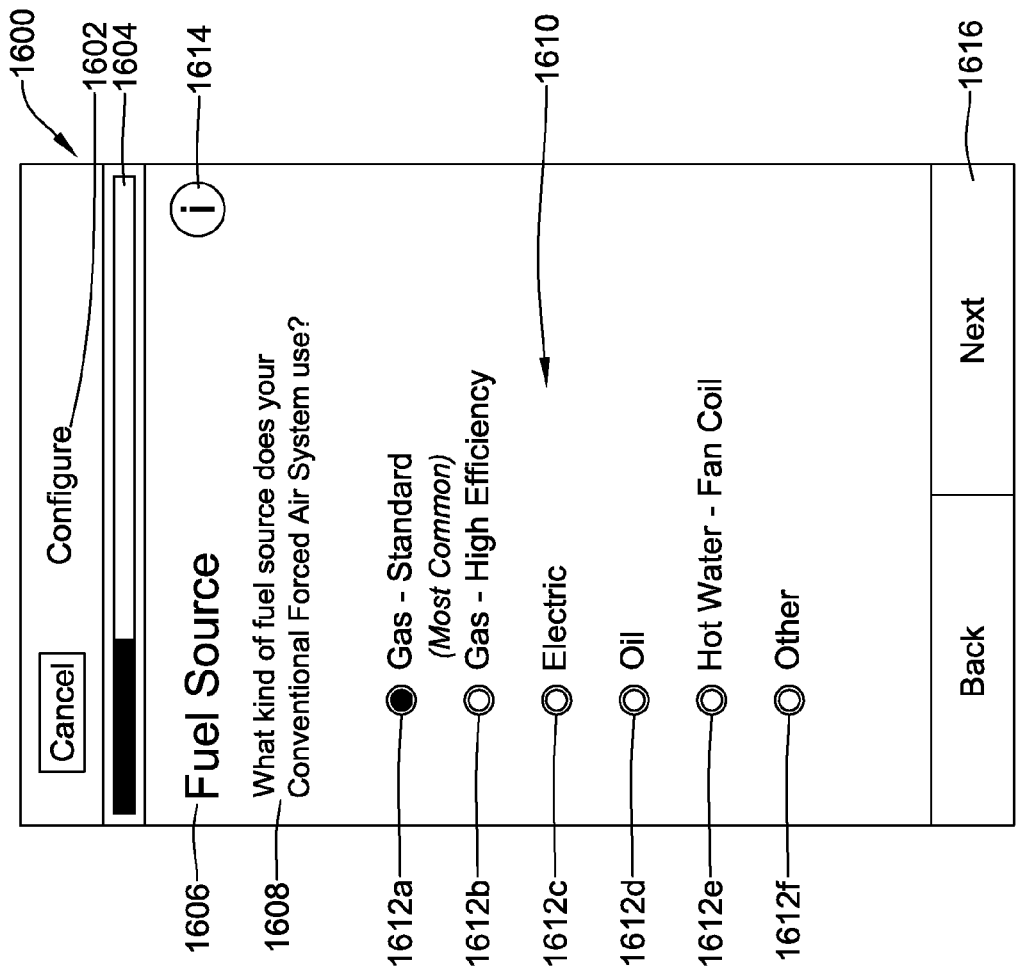

FIG. 57 provides another example of a screen 1600 that may be displayed on the user interface of the user's remote device 62 related to configuring the newly installed HVAC controller 18. As shown in FIG. 57, screen 1600 includes a first label 1602 that identifies the current phase of the setup process. In this example, first label 1602 identifies the current phase of the setup process as "Configure." A status bar indicator 1604 may also be provided that shows the current status of the configuration phase. In addition, screen 1600 may include a brief text string 1606 identifying the current step of the configuration phase. For example, as shown in FIG. 57, the brief text string 1606 identifies the current step of the configuration phase as "Fuel Source." A user message 1608 may also be displayed on screen 1600. In this example, the user message 1608 may contain a user query that prompts the user to select their fuel source from a list 1610 of one or more selectable options 1612a-1612f, each selectable option corresponding to a different type of fuel source. In some cases, a radio button or checkbox may be provided to highlight the user's selection. Additionally, the list 1610 may indicate the most common type of fuel source to aid the user in their selection. An information icon 1614 may be provided that, when selected by a user, may cause the application program code to display an additional screen including detailed information about the current step of the configuration phase, sometimes including a video demonstration. Selection of the button 1616 labeled "next" may cause the application program code to display the next screen in the sequence of screens related to configuring the newly installed HVAC controller 18.

Figure 58:
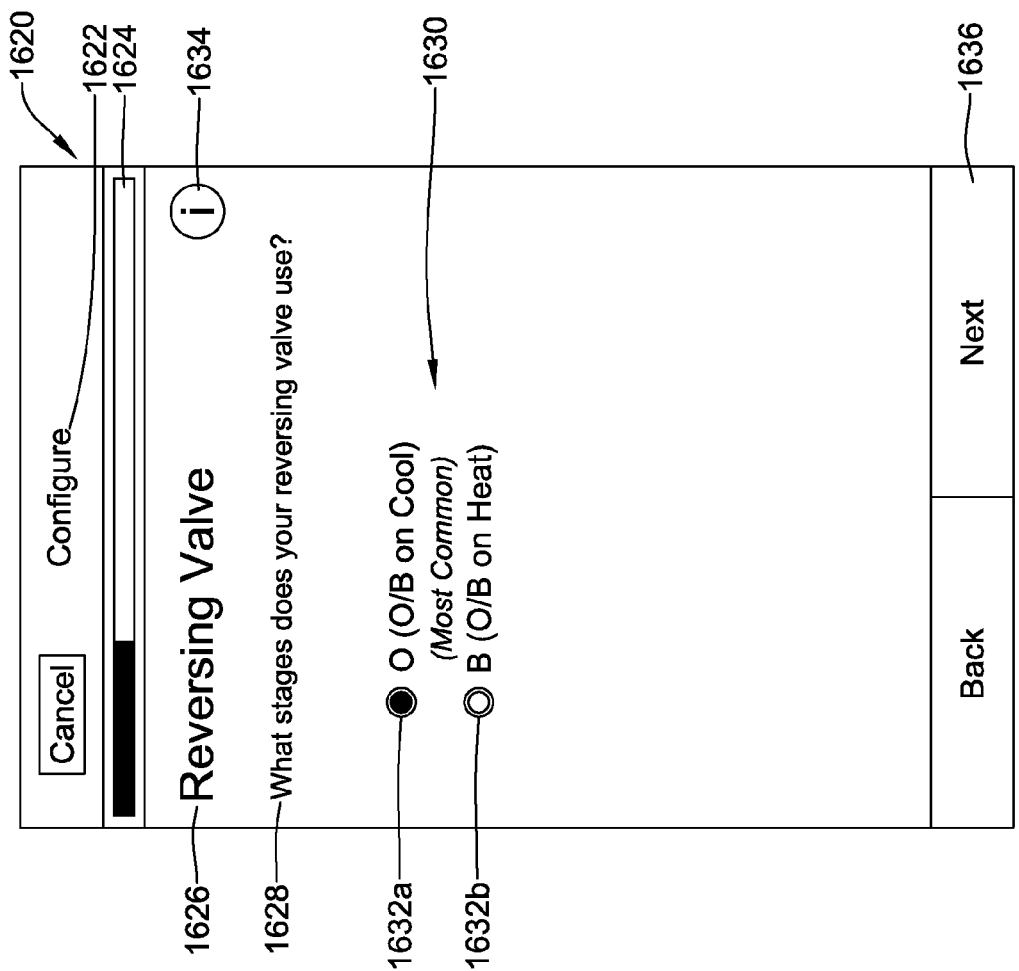

FIG. 58 provides another example of a screen 1620 that may be displayed on the user interface of the user's remote device 62 related to configuring the newly installed HVAC controller 18. As shown in FIG. 58, screen 1620 includes a first label 1622 that identifies the current phase of the setup process. In this example, first label 1622 identifies the current phase of the setup process as "Configure." A status bar indicator 1624 may also be provided that shows the current status of the configuration phase. In addition, screen 1620 may include a brief text string 1626 identifying the current step of the configuration phase. For example, as shown in FIG. 58, the brief text string 1626 identifies the current step of the configuration phase as "Reversing Valve." A user message 1628 may also be displayed on screen 1620. In this example, the user message 1628 may contain a user query that asks the user to identify what stage is used by the reversing valve from a list 1630 of one or more selectable options 1632a-1632b, each selectable option corresponding to a different stage that may be utilized by a revering valve. In some cases, a radio button or checkbox may be provided to highlight the user's selection. Additionally, the list 1630 may indicate the most common stage utilized by a reversing valve. An information icon 1634 may be provided that, when selected by a user, may cause the application program code to display an additional screen including detailed information about the current step of the configuration phase, sometimes including a video demonstration. Selection of the button 1636 labeled "next" may cause the application program code to display the next screen in the sequence of screens related to configuring the newly installed HVAC controller 18.

Figure 59:
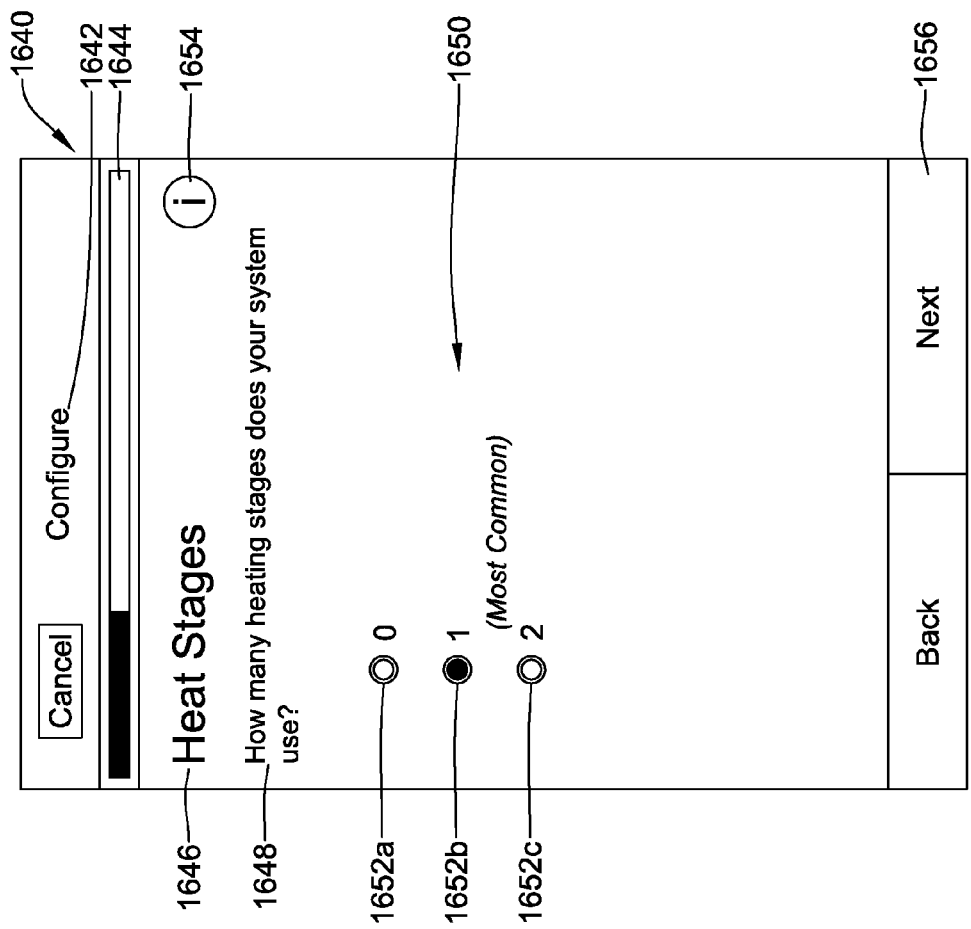

FIG. 59 provides another example of a screen 1640 that may be displayed on the user interface of the user's remote device 62 related to configuring the newly installed HVAC controller 18. As shown in FIG. 59, screen 1640 includes a first label 1642 that identifies the current phase of the setup process. In this example, first label 1642 identifies the current phase of the setup process as "Configure." A status bar indicator 1644 may also be provided that shows the current status of the configuration phase. In addition, screen 1640 may include a brief text string 1646 identifying the current step of the configuration phase. For example, as shown in FIG. 59, the brief text string 1646 identifies the current step of the configuration phase as "Heat Stages." A user message 1648 may also be displayed on screen 1640. In this example, the user message 1648 may contain a user query that asks the user to identify the number of heating stages utilized by their heating system from a list 1650 of one or more selectable options 1652a-1652c, each selectable option corresponding to a different number of heating stages.

In some cases, a radio button or checkbox may be provided to highlight the user's selection. Additionally, the list 1650 may indicate the most common number of stages utilized by a heating system. An information icon 1654 may be provided that, when selected by a user, may cause the application program code to display an additional screen including detailed information about the current step of the configuration phase, sometimes including a video demonstration. Selection of the button 1656 labeled "next' may cause the application program code to display the next screen in the sequence of screens related to configuring the newly installed HVAC controller 18.

Figure 60:
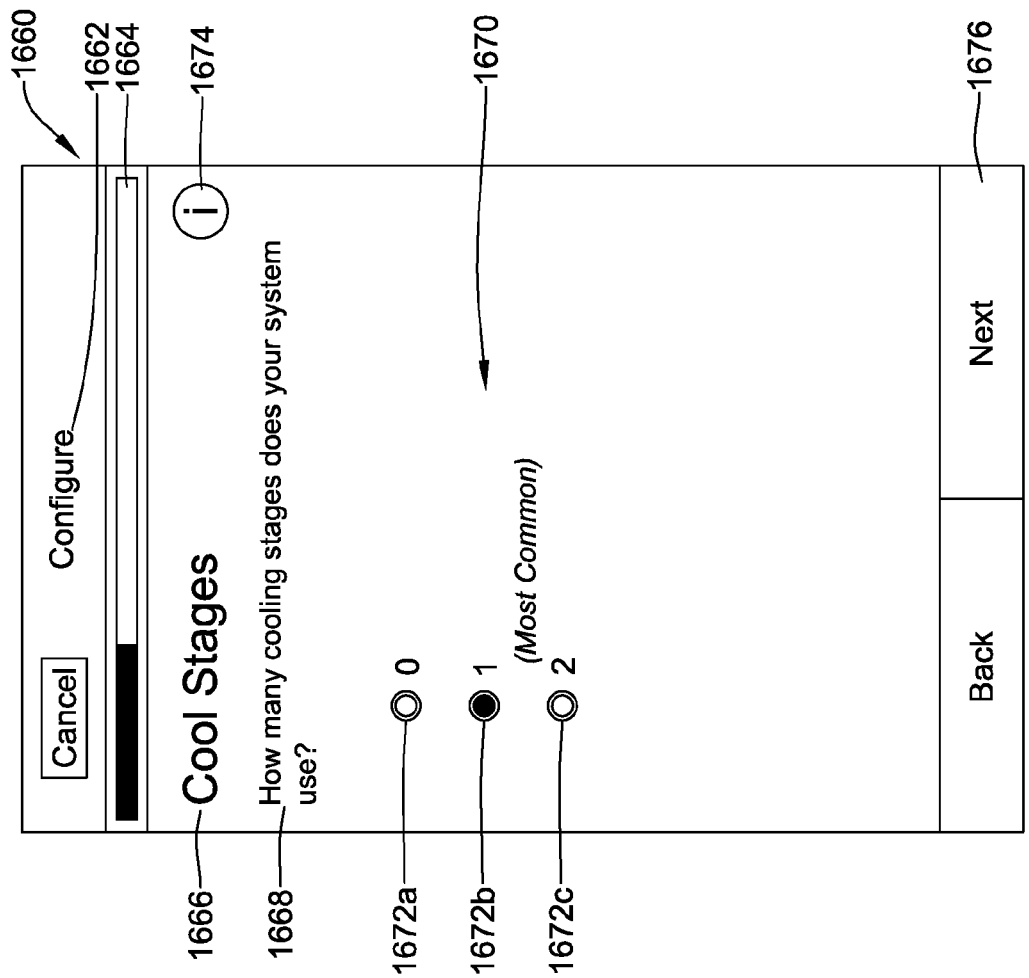

FIG. 60 provides another example of a screen 1660 that may be displayed on the user interface of the user's remote device 62 related to configuring the newly installed HVAC controller 18. As shown in FIG. 60, screen 1660 includes a first label 1662 that identifies the current phase of the setup process. In this example, first label 1662 identifies the current phase of the setup process as "Configure." A status bar indicator 1664 may also be provided that shows the current status of the configuration phase. In addition, screen 1660 may include a brief text string 1666 identifying the current step of the configuration phase. For example, as shown in FIG. 60, the brief text string 1666 identifies the current step of the configuration phase as "Cooling Stages." A user message 1668 may also be displayed on screen 1660. In this example, the user message 1668 may contain a user query that asks the user to identify the number of cooling stages utilized by their cooling system from a list 1670 of one or more selectable options 1672*a*-1672*c*, each selectable option corresponding to a different number of cooling stages. In some cases, a radio button or checkbox may be provided to highlight the user's selection. Additionally, the list 1670 may indicate the most common number of stages utilized by a cooling system. An information icon 1674 may be provided that, when selected by a user, may cause the application program code to display an additional screen including detailed information about the current step of the configuration phase, sometimes including a video demonstration. Selection of the button 1676 labeled "next' may cause the application program code to display the next screen in the sequence of screens related to configuring the newly installed HVAC controller 18. It will be generally understood that if the user does not have a cooling system, the user may advance through this screen by utilizing the next button and/or by dragging their finger across the display of the user interface of the remote device 62 or perform some other gesture.

Figure 61:
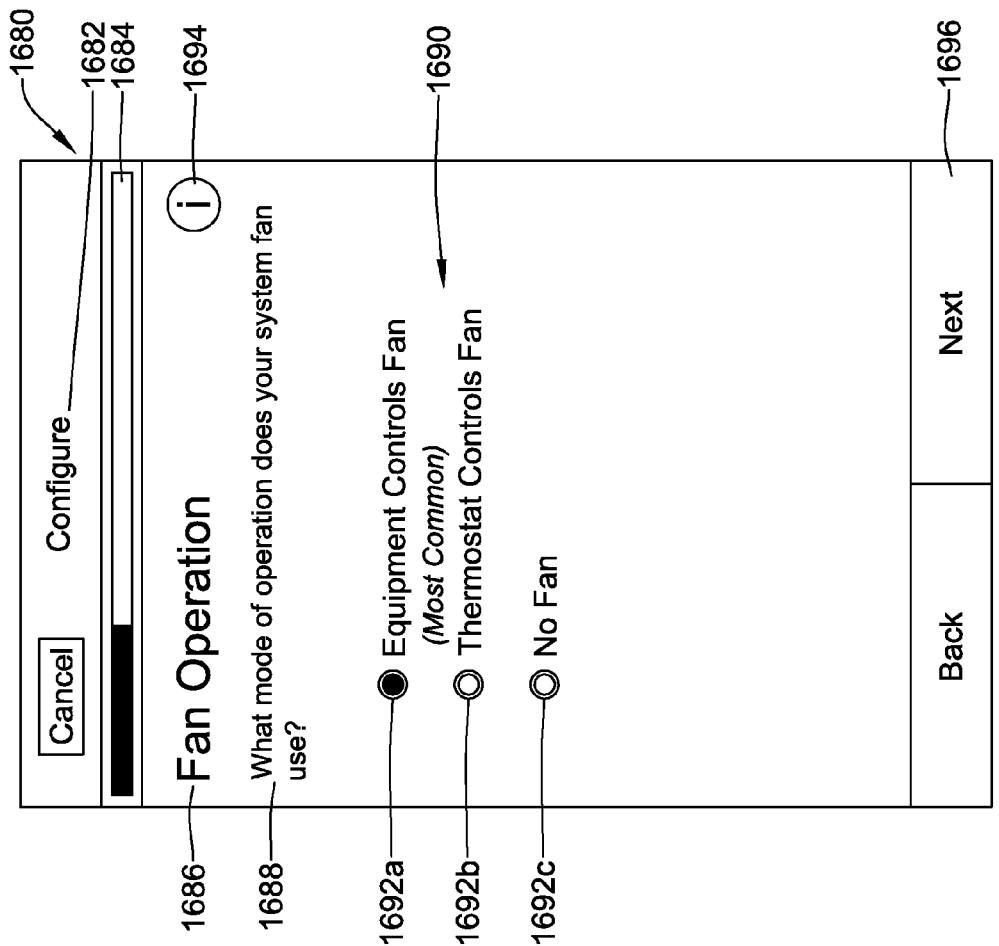

FIG. 61 provides another example of a screen 1680 that may be displayed on the user interface of the user's remote device 62 related to configuring the newly installed HVAC controller 18. As shown in FIG. 61, screen 1680 includes a first label 1682 that identifies the current phase of the setup process. In this example, first label 1682 identifies the current phase of the setup process as "Configure." A status bar indicator 1684 may also be provided that shows the current status of the configuration phase. In addition, screen 1680 may include a brief text string 1686 identifying the current step of the configuration phase. For example, as shown in FIG. 61, the brief text string 1686 identifies the current step of the configuration phase as "Fan Operation." A user message 1688 may also be displayed on screen 1680. In this example, the user message 1688 may contain a user query that asks the user to identify the mode of operation that is utilized by the system fan from a list 1690 of one or more selectable options 1692*a*-1692*c*, each selectable option corresponding to a different mode of fan operation. In some cases, a radio button or checkbox may be provided to highlight the user's selection. Additionally, the list 1690 may indicate the most common mode of fan operation. An information icon 1694 may be provided that, when selected by a user, may cause the application program code to display an additional screen including detailed information about the current step of the configuration phase, sometimes including a video demonstration. Selection of the button 1696 labeled "next' may cause the application program code to display the next screen in the sequence of screens related to configuring the newly installed HVAC controller 18.

Figure 62:
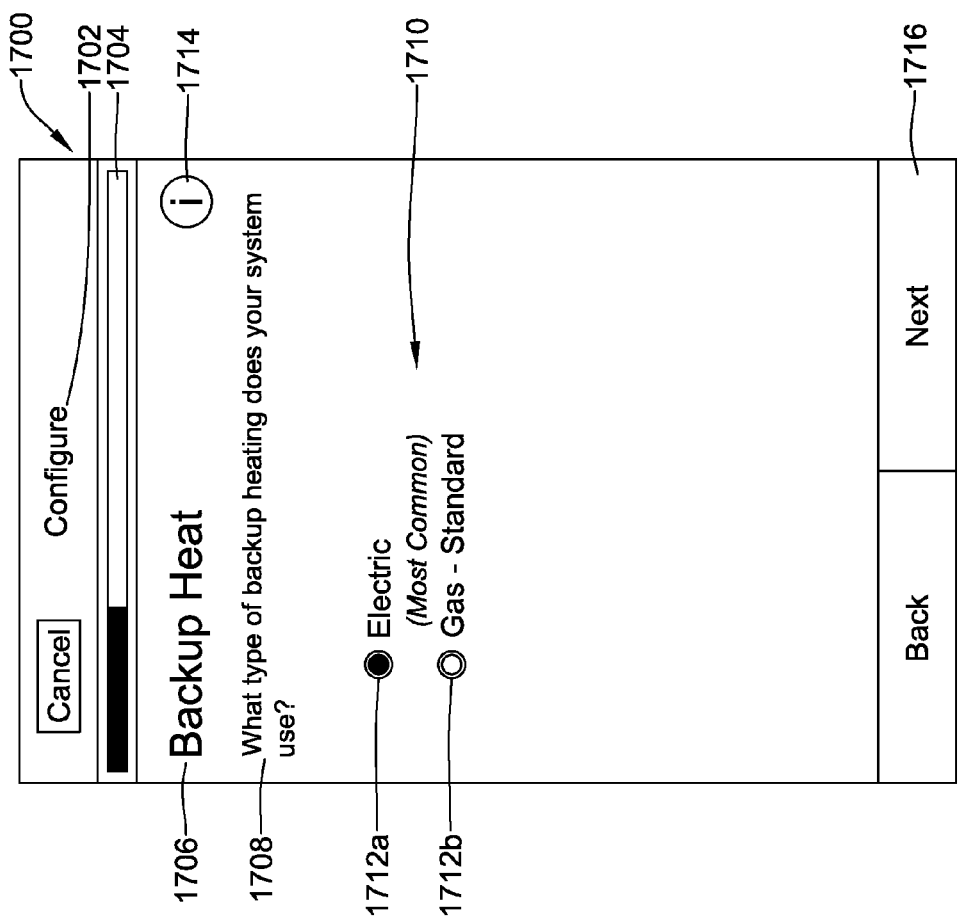

FIG. 62 provides another example of a screen 1700 that may be displayed on the user interface of the user's remote device 62 related to configuring the newly installed HVAC controller 18. As shown in FIG. 62, screen 1700 includes a first label 1702 that identifies the current phase of the setup process. In this example, first label 1702 identifies the current phase of the setup process as "Configure." A status bar indicator 1704 may also be provided that shows the current status of the configuration phase. In addition, screen 1700 may include a brief text string 1706 identifying the current step of the configuration phase. For example, as shown in FIG. 62, the brief text string 1706 identifies the current step of the configuration phase as "Backup Heat." A user message 1708 may also be displayed on screen 1700. In this example, the user message 1708 may contain a user query that asks the user to identify the type of backup heating utilize by the HVAC system 4 from a list 1710 of one or more selectable options 1712*a*-1712*b*, each selectable option corresponding to a different type of backup heat. In some cases, a radio button or checkbox may be provided to highlight the user's selection. Additionally, the list 1710 may indicate the most common type of backup heat. An information icon 1714 may be provided that, when selected by a user, may cause the application program code to display an additional screen including detailed information about the current step of the configuration phase, sometimes including a video demonstration. Selection of the button 1716 labeled "next' may cause the application program code to display the next screen in the sequence of screens related to configuring the newly installed HVAC controller 18. It will be generally understood that if the system does not utilize backup heat, the user may advance through this screen by utilizing the next button and/or by dragging their finger across the display of the user interface of the remote device 62 or perform some other gesture.

Figure 63:
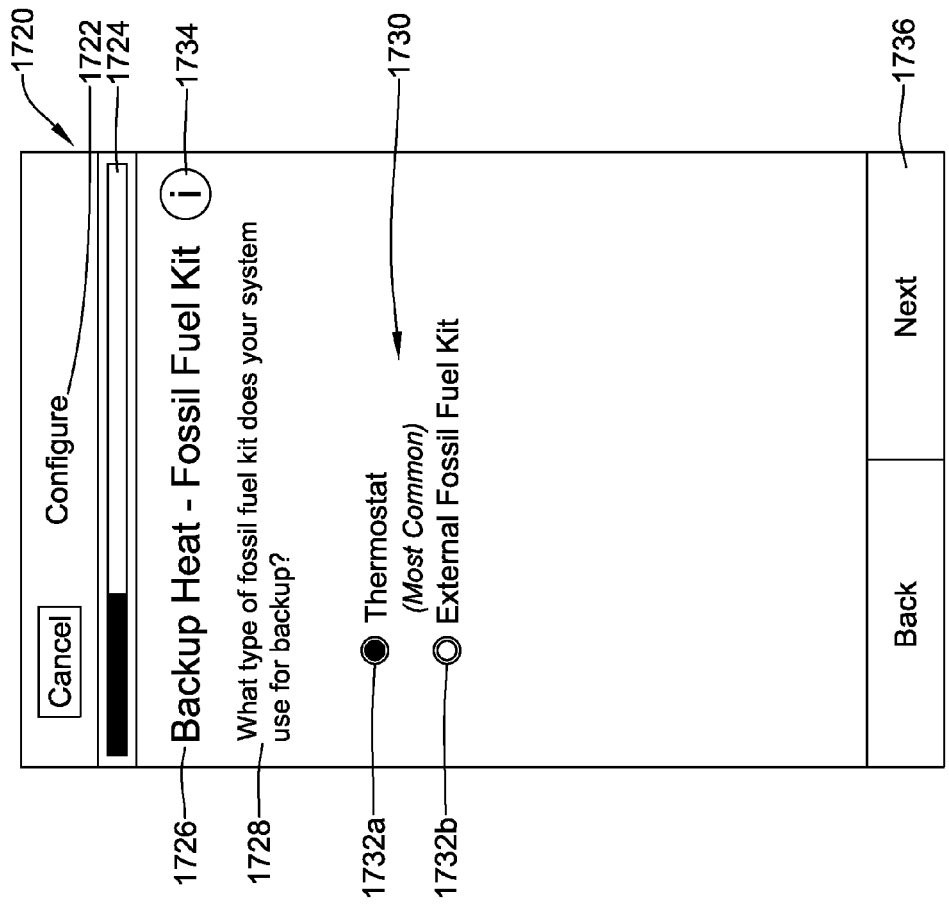

FIG. 63 provides another example of a screen 1720 that may be displayed on the user interface of the user's remote device 62 related to configuring the newly installed HVAC controller 18. As shown in FIG. 63, screen 1720 includes a first label 1722 that identifies the current phase of the setup process. In this example, first label 1722 identifies the current phase of the setup process as "Configure." A status bar indicator 1724 may also be provided that shows the current status of the configuration phase. In addition, screen 1720 may include a brief text string 1726 identifying the current step of the configuration phase. For example, as shown in FIG. 63, the brief text string 1726 identifies the current step of the configuration phase as "Backup Heat-Fossil Fuel Kit." A user message 1728 may also be displayed on screen 1720. In this example, the user message 1728 may contain a user query that asks the user to identify the type of fossil fuel kit utilized for backup heating by the HVAC system 4 from a list 1730 of one or more selectable options 1732*a*-1732*b*, each selectable option corresponding to a different type of fossil fuel kit. In some cases, a radio button or checkbox may be provided to highlight the user's selection. Additionally, the list 1730 may indicate the most common type of fossil fuel kit. An information icon 1734 may be provided that, when selected by a user, may cause the application program code to display an additional screen including detailed information about the current step of the configuration phase, sometimes including a video demonstration. Selection of the button 1736 labeled "next' may cause the application program code to display the next screen in the sequence of screens related to configuring the newly installed HVAC controller 18. It will be generally understood that if the backup heat does not utilize a fossil fuel kit, the user may advance through this screen by utilizing the next button and/or by dragging their finger across the display of the user interface of the remote device 62 or performing some other gesture.

Figure 64:
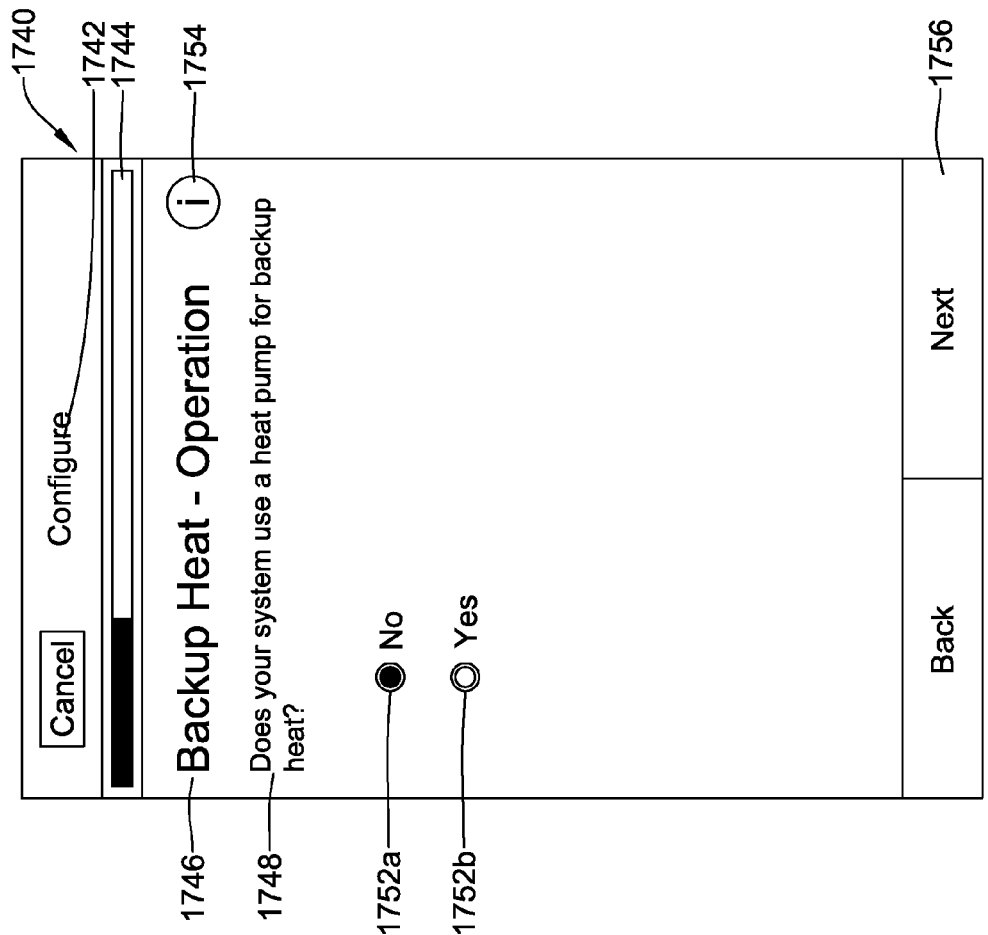

FIG. 64 provides another example of a screen 1740 that may be displayed on the user interface of the user's remote device 62 related to configuring the newly installed HVAC controller 18. As shown in FIG. 64, screen 1740 includes a first label 1742 that identifies the current phase of the setup process. In this example, first label 1742 identifies the current phase of the setup process as "Configure." A status bar indicator 1744 may also be provided that shows the current status of the configuration phase. In addition, screen 1740 may include a brief text string 1746 identifying the current step of the configuration phase. For example, as shown in FIG. 64, the brief text string 1746 identifies the current step of the configuration phase as "Backup Heat-Operation." A user message 1748 may also be displayed on screen 1740. In this example, the user message 1748 may contain a user query that asks the user to if the system using a heat pump for backup heat. The user may respond to the query presented by the user message 1748 by selecting a first option 1752*a* labeled "Yes" or a second option labeled "No." In some cases, a radio button or checkbox may be provided to highlight the user's selection. An information icon 1754 may be provided that, when selected by a user, may cause the application program code to display an additional screen including detailed information about the current step of the configuration phase, sometimes including a video demonstration. Selection of the button 1756 labeled "next' may cause the application program code to display the next screen in the sequence of screens related to configuring the newly installed HVAC controller 18. It will be generally understood that if the HVAC system 4 does not utilize backup heating, the user may advance through this screen by utilizing the next button and/or by dragging their finger across the display of the user interface of the remote device 62 or performing some other gesture.

Figure 65:
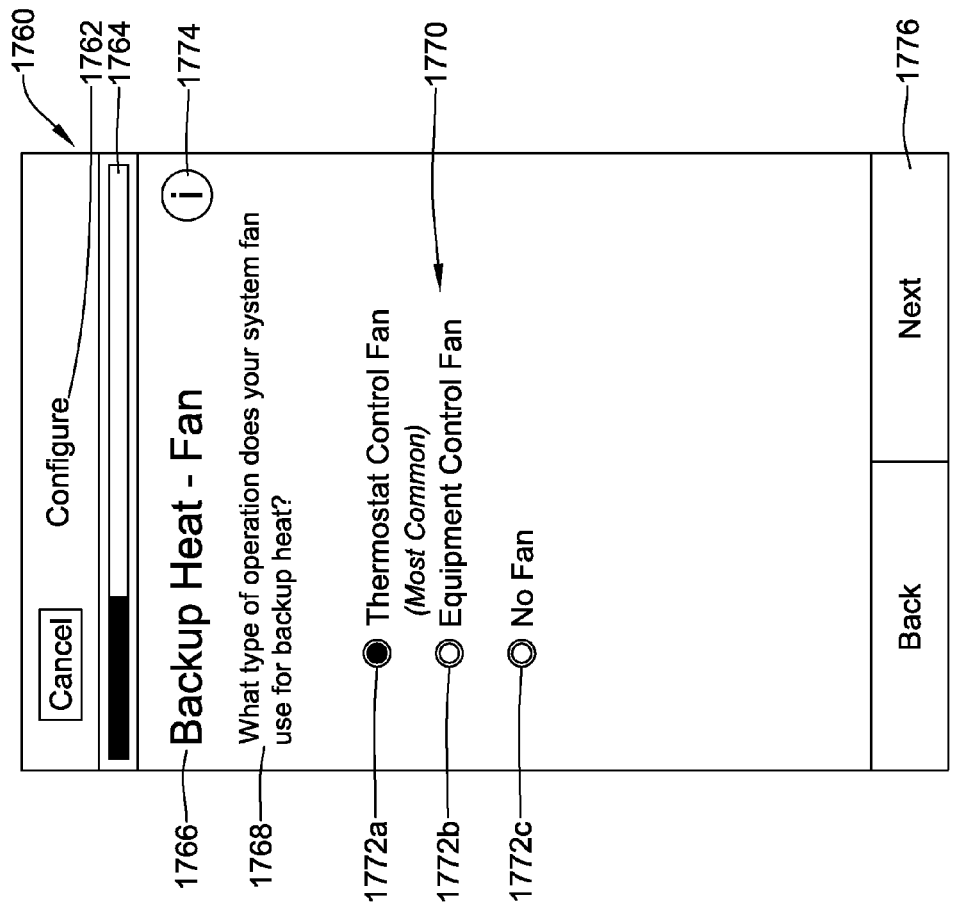

FIG. 65 provides another example of a screen 1760 that may be displayed on the user interface of the user's remote device 62 related to configuring the newly installed HVAC controller 18. As shown in FIG. 65, screen 1760 includes a first label 1762 that identifies the current phase of the setup process. In this example, first label 1762 identifies the current phase of the setup process as "Configure." A status bar indicator 1764 may also be provided that shows the current status of the configuration phase. In addition, screen 1760 may include a brief text string 1766 identifying the current step of the configuration phase. For example, as shown in FIG. 65, the brief text string 1766 identifies the current step of the configuration phase as "Backup Heat-Fan." A user message 1768 may also be displayed on screen 1760. In this example, the user message 1768 may contain a user query that asks the user to identify what mode of operation is utilized by the system fan for backup heat. The user may identify the fan mode of operation from a list 1770 of selectable options 1772*a*-1772*c*, each selectable option corresponding to a different mode of fan operation for backup heat. In some cases, a radio button or checkbox may be provided to highlight the user's selection. In addition, the list 1770 may indicate the most common mode of fan operation for backup heat. An information icon 1774 may be provided that, when selected by a user, may cause the application program code to display an additional screen including detailed information about the current step of the configuration phase, sometimes including a video demonstration. Selection of the button 1776 labeled "next' may cause the application program code to display the next screen in the sequence of screens related to configuring the newly installed HVAC controller 18. It will be generally understood that if the HVAC system 4 does not utilize backup heating, the user may advance through this screen by utilizing the next button and/or by dragging their finger across the display of the user interface of the remote device 62 or performing some other gesture.

Figure 66:
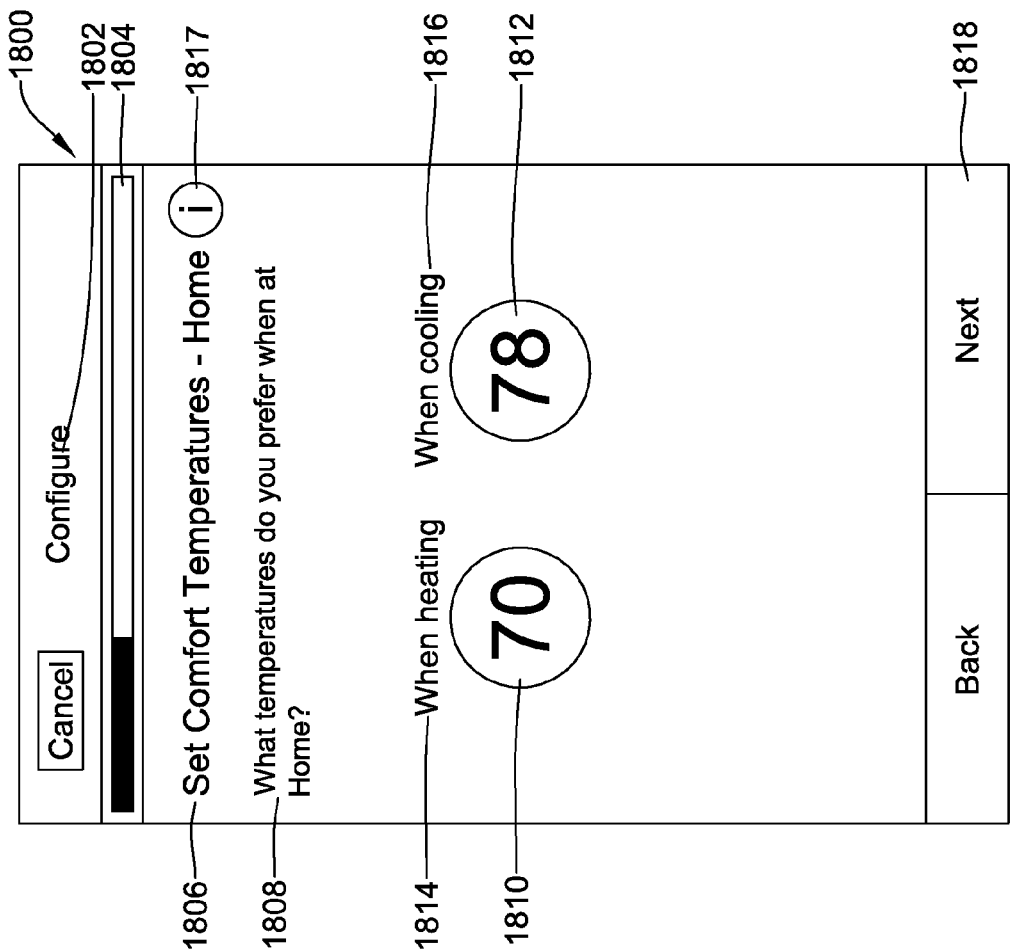

FIG. 66 provides another example of a screen 1800 that may be displayed on the user interface of the user's remote device 62 related to configuring the newly installed HVAC controller 18. Screen 1800, shown in FIG. 66, relates to setting temperature setpoints for heating and/or cooling as applicable. It will be generally understood that a similar screen or screens may be displayed related to setting a humidity setpoint for heating and/or cooling as applicable. As shown in FIG. 66, screen 1800 includes a first label 1802 that identifies the current phase of the setup process. In this example, first label 1802 identifies the current phase of the setup process as "Configure." A status bar indicator 1804 may also be provided that shows the current status of the configuration phase. In addition, screen 1800 may include a brief text string 1806 identifying the current step of the configuration phase. For example, as shown in FIG. 66, the brief text string 1806 identifies the current step of the configuration phase as "Set Comfort Temperatures—Home." A user message 1808 may also be displayed on screen 1800. In this example, the user message 1808 may prompt the user to identify a comfortable temperature when the user is at home for both heating and/or cooling, as applicable. In some cases, screen 1800 may include a first icon 1810 corresponding to a heating comfort temperature. Screen 1800 may also include a second icon 1812 corresponding to cooling comfort temperature, as applicable. Identifying labels 1814, 1816 may be displayed adjacent the heating and/or cooling icons. In some cases, the user may adjust the heating and/or cooling temperature values from the displayed default values by pressing and/or holding the icon until the desired temperature is displayed. In other cases, first and second arrows may be displayed adjacent each of the heating and cooling icons 1810, 1812 for adjusting the displayed temperature values. These are just some examples. An information icon 1817 may be provided that, when selected by a user, may cause the application program code to display an additional screen including detailed information about the current step of the configuration phase, sometimes including a video demonstration. Selection of the button 1818 labeled "next' may cause the application program code to display the next screen in the sequence of screens related to configuring the newly installed HVAC controller 18.

Figure 67:
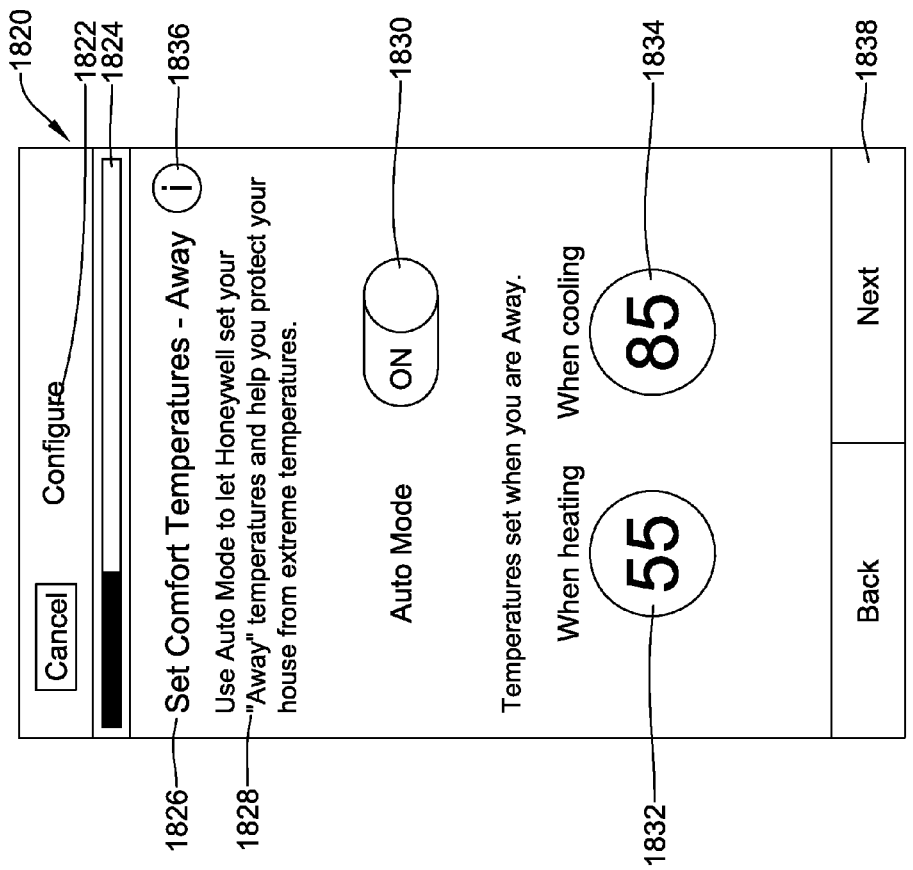

FIG. 67 provides another example of a screen 1820 that may be displayed on the user interface of the user's remote device 62 related to configuring the newly installed HVAC controller 18. Screen 1820, shown in FIG. 67, relates to setting temperature setpoint values for heating and/or cooling as applicable. It will be generally understood that a similar screen or screens may be displayed related to setting a humidity setpoint value for heating and/or cooling. As shown in FIG. 67, screen 1820 includes a first label 1822 that identifies the current phase of the setup process. In this example, first label 1822 identifies the current phase of the setup process as "Configure." A status bar indicator 1824 may also be provided that shows the current status of the configuration phase. In addition, screen 1820 may include a brief text string 1826 identifying the current step of the configuration phase. For example, as shown in FIG. 67, the brief text string 1826 identifies the current step of the configuration phase as "Set Comfort Temperatures-Away." A user message 1828 may also be displayed on screen 1820. In this example, the user message 1828 may provide additional information about utilizing temperature setpoint values during an away mode of operation. In this example, screen 1820 may provide button 1830, that when selected by a user, may enable an auto mode of operation to be utilized by the HVAC controller 18 to control the temperature for heating and/or cooling according to one or more default temperature setpoint values when the HVAC controller 18 is controlling the HVAC system 4 according to an away mode. In some case, screen 1820 may display the default temperature setpoint values 1832, 1834 in a region of the screen 1820. An information icon 1836 may be provided that, when selected by a user, may cause the application program code to display an additional screen including detailed information about the current step of the configuration phase, sometimes including a video demonstration. Selection of the button 1838 labeled "next' may cause the application program code to display the next screen in the sequence of screens related to configuring the newly installed HVAC controller 18.

Figure 68:
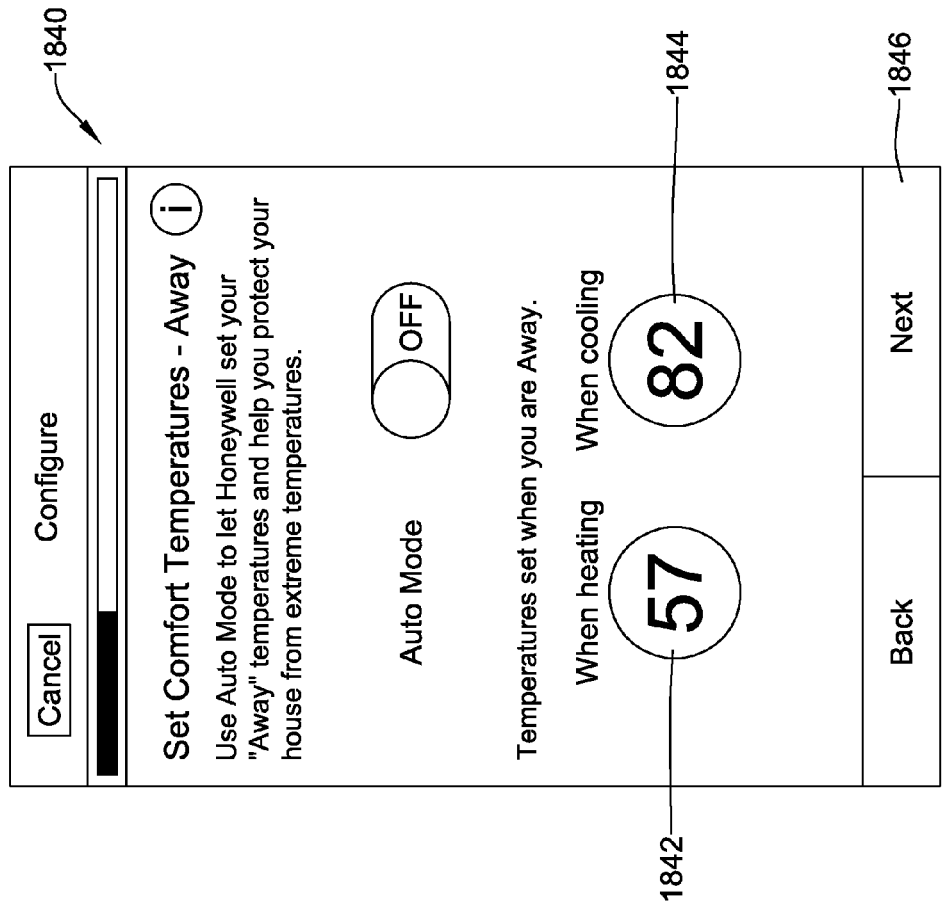

As shown in FIG. 67, a user may enable or disable the auto away mode by selecting button 1830. In some cases, button 1830 may function as a toggle switch that when selected in a first instance by a user enables the auto away mode, and when selected in a second instance by a user disables the auto away mode. In some cases, when selection of button 1830 disables the auto mode, the application program code may display screen 1840, as shown in FIG. 68. Through screen 1840, the user may adjust and select the temperature setpoint values 1842, 1844 for heating and/or cooling to be utilized by the HVAC controller 18 to control the HVAC system 4 during an away mode of operation. In some cases, the user may adjust the heating and/or cooling temperature values 1842, 1844 from the displayed default values by pressing and/or holding the icon until the desired temperature is displayed. Selection of the button 1846 labeled "next' may cause the application program code to display the next screen in the sequence of screens related to configuring the newly installed HVAC controller 18.

Figure 69:
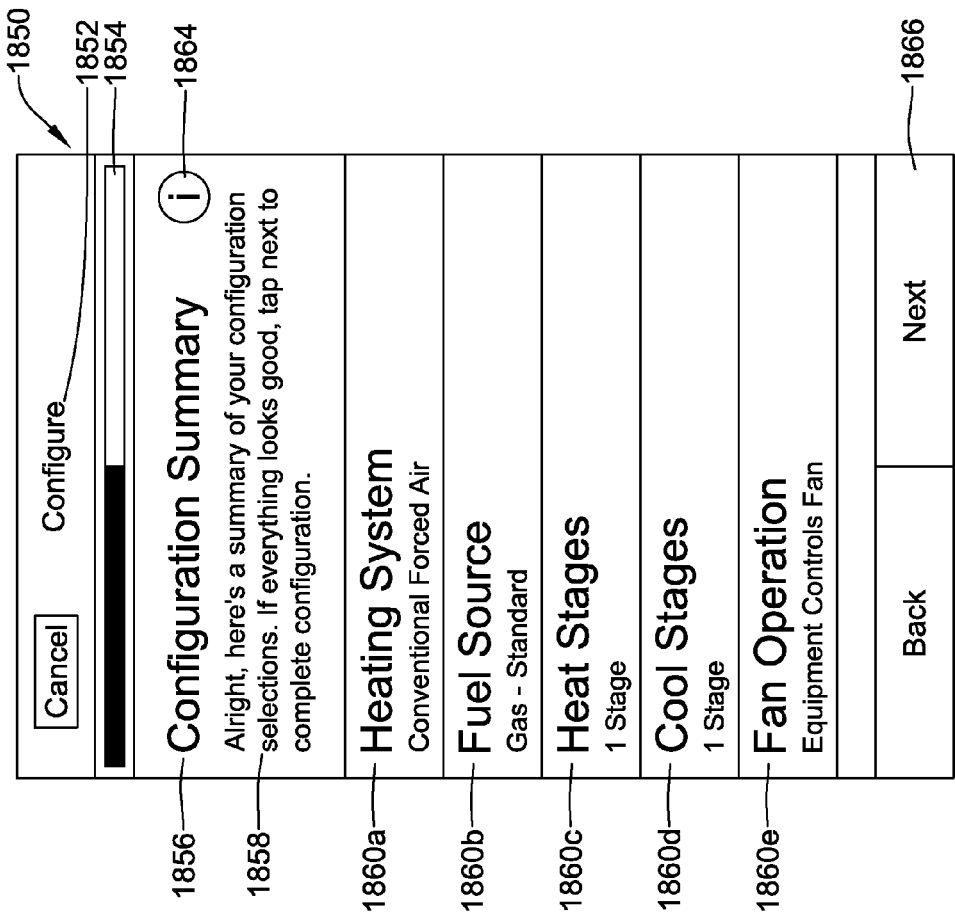

FIG. 69 provides another example of a screen 1850 that may be displayed on the user interface of the user's remote device 62 related to configuring the newly installed HVAC controller 18. As shown in FIG. 69, screen 1850 may provide a summary of the configuration settings accepted from a user through the previous screens 1580, 1600, 1620, 1640, 1660, 1680, 1700, 1720, 1740, 1760, 1800, 1820, and/or 1840. Screen 1850 may include a first label 1852 that identifies the current phase of the setup process. In this example, first label 1852 identifies the current phase of the setup process as "Configure." A status bar indicator 1854 may also be provided that shows the current status of the configuration phase. In addition, screen 1850 may include a brief text string 1856 identifying the current step of the configuration phase. For example, as shown in FIG. 69, the brief text string 1856 identifies the current step of the configuration phase as "Configuration Summary." A user message 1858 may also be displayed on screen 1850. In this example, the user message 1858 may provide additional information about the configuration summary screen 1850. In addition, screen 1850 may include one or more selectable options 1860*a*-1860*e*, each option corresponding to a different component of the HVAC system 4 that was configured during the configuration phase of the installation setup process. Selection of any one of the options 1860*a*-1860*e* by a user may cause the application program code to display detailed information about the configuration settings identified for that particular HVAC system component corresponding to the selected option. An information icon 1864 may be provided that, when selected by a user, may cause the application program code to display an additional screen including detailed information about the current step of the configuration phase, sometimes including a video demonstration. Selection of the button 1866 labeled "next' may cause the application program code to display the next screen in the sequence of screens related to configuring the newly installed HVAC controller 18.

Figure 70:
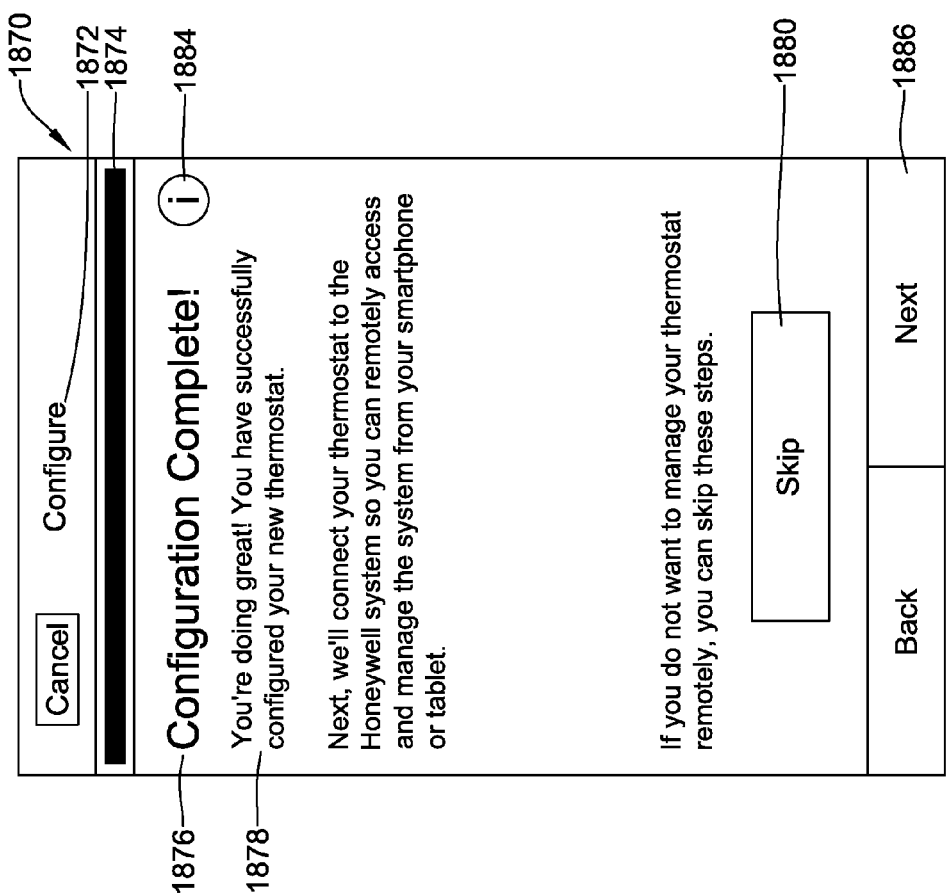
FIG. 70 shows an illustrative screen that may be displayed on the user interface of a remote device by an application program code upon completion of the configuration phase of the setup process.

FIG. 70 shows an example of a screen 1870 that may be displayed on the user interface of the user's remote device 62 by the application program code upon successful completion of the configuration phase of the installation setup process. As shown in FIG. 70, screen 1870 can include a first label 1872 that identifies the current phase of the setup process. In this example, first label 1872 identifies the current phase of the setup process as "Configure." A status bar indicator 1874 may also be provided that shows the current status of the configuration phase. In addition, screen 1870 may include a brief text string 1876 announcing completion of the configuration phase to the user. For example, as shown in FIG. 70, the brief text string 1876 states "Configuration Complete!" A user message 1878 may also be displayed on screen 1870. In this example, the user message 1878 may provide additional information about the next phase of the installation setup process. In some cases, screen 1870 may include a button 1880 labeled "skip" that, when selected by a user, may allow the user to skip the next set of steps in the installation setup process. An information icon 1884 may be provided that, when selected by a user, may cause the application program code to display an additional screen including detailed information about the current step of the configuration phase, sometimes including a video message. Selection of the button 1886 labeled "next' may cause the application program code to display the next screen in the sequence of screens related to configuring the newly installed HVAC controller 18.

Figure 71:
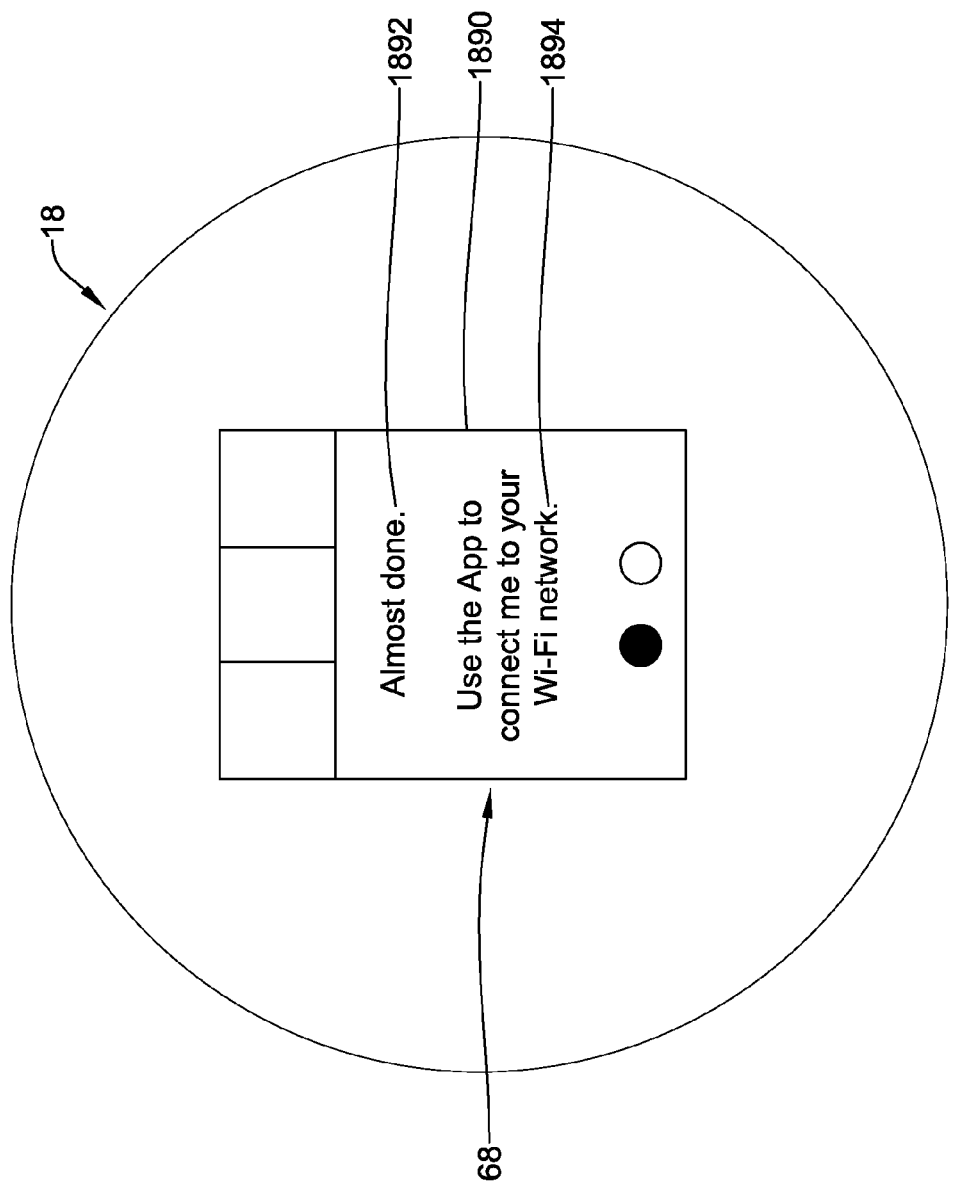
FIG. 71 shows an illustrative screen that may be displayed on the display of the user interface of the HVAC controller that has been configured upon completion of the configuration phase of the setup process.

FIG. 71 shows an example of a screen 1890 that may be displayed on the display of the user interface of the HVAC controller 18. As shown in FIG. 71, screen 1890 includes a user message 1892 that informs the user that the setup process is almost complete. In addition, screen 1890 may include a user prompt 1894 that may prompt the user to utilize the application program code to connect the HVAC controller to the building's wireless network (e.g. second network 1538 shown in FIG. 54).

FIGS. 72-75 and 77 show several illustrative screens that may be displayed to the user via the user interface of the user's remote device 62 by the application program code, as described herein, that guide the user through connecting the newly installed HVAC controller 18 to the building's wireless network (e.g. second network 1538 shown in FIG. 54). In some cases, as discussed herein, the sequence of screens may be a predetermined sequence of screens having a predetermined display order. The user may move backward and forward within the predetermined sequence of screens by the selection of appropriate buttons provided on the screen for this purpose. In other cases, the user may scroll backward and forward within the predetermined sequence of screens by dragging their finger from side to side across the display of their remote device 62. These are just some examples.

Figure 72:
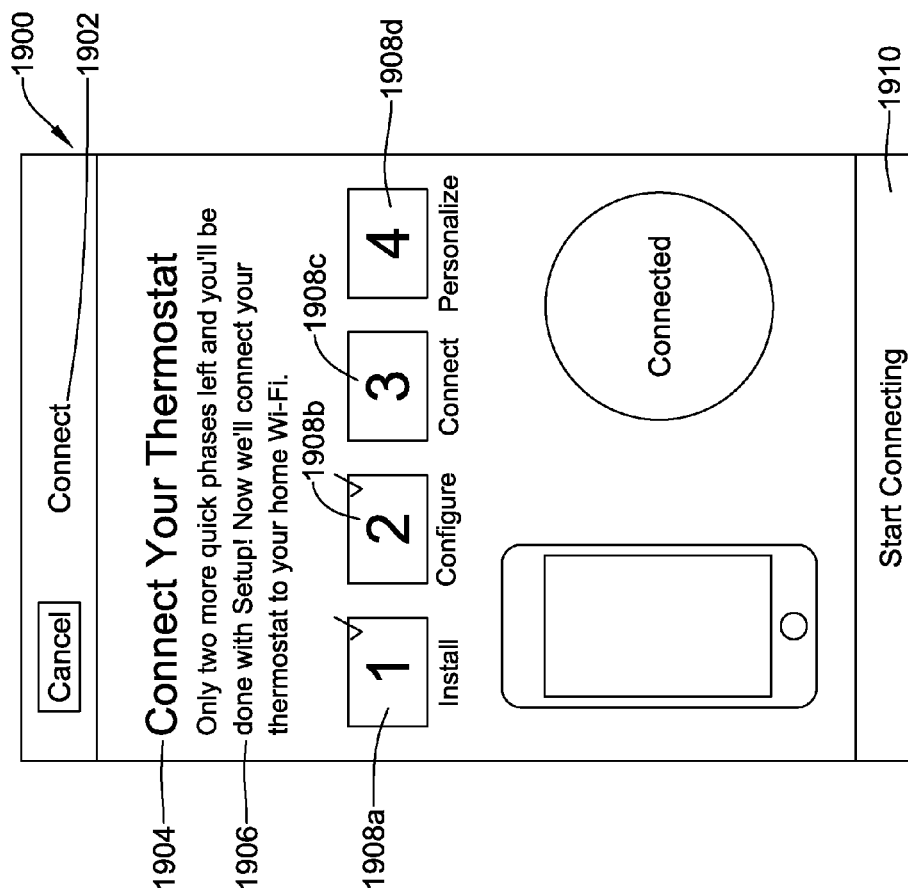
FIGS. 72-78 show illustrative screens that may be displayed on the user interface of a remote device by an application program code that may guide the user through connecting an HVAC controller to a wireless network and to a web service.

FIG. 72 shows an example of a first screen 1900 that may be displayed on the user interface of the user's remote device 62 related to connecting the HVAC controller 18 to the building's wireless network (e.g. second network 1538 shown in FIG. 54) and in some cases, to a web service 1550 (e.g. Honeywell's TOTAL CONNECT™ web service) associated with the HVAC controller 18. As shown in FIG. 72, screen 1900 can include a first label 1902 that identifies the current phase of the setup process. In this example, first label 1902 identifies the current phase of the setup process as "Connect." Additionally, screen 1900 may include a brief text string 1904 that identifies the current step of the connection phase. For example, as shown in FIG. 72, the brief text string 1904 identifies the current step of the connection phase as "Connect Your Thermostat." A user message 1906 may be displayed on screen 1900. User message 1906 may include additional information or instructions about the current step of the connection phase. In some cases, screen 1900 may also include icons 1908a-1908d identifying each of the four phases of the setup process, which in this example include "install", "configure", "connect" and "personalize". In addition, the icon 1908c identifying the current phase of the setup process may be grayed-out, bolded, or otherwise highlighted to visually indicate to the user that it is the current phase of the setup process. Once that phase of the setup process is complete the icon(s) may include a dot or a checkmark in a corner of the icon to indicate that the phase has been completed. For example, as shown in FIG. 72, icons 1908a and 1908b corresponding to the installation phase and the configuration phase of the setup process each include a checkmark indicating to the user that those phases of the setup process have been completed. The user may initiate the connection process by selecting 1910 labeled "start connecting" provided at the bottom of screen 1900.

Figure 73:
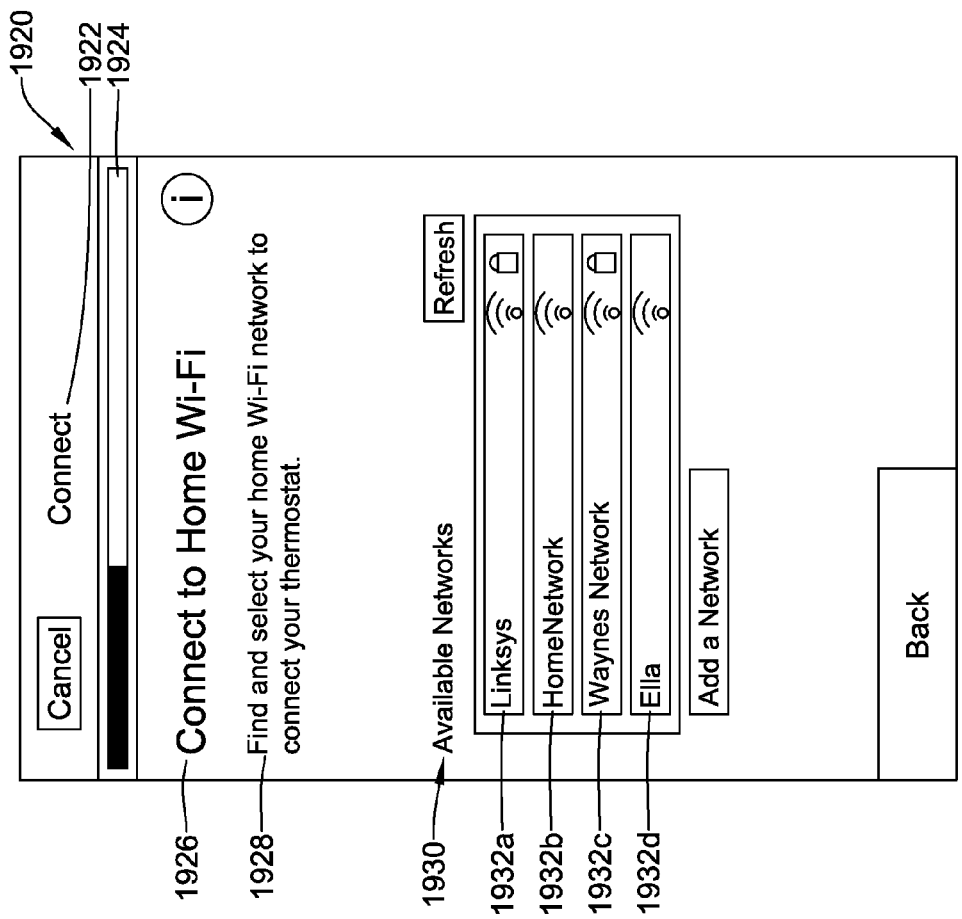

Selection of button 1910 labeled "start connecting" provided on screen 1900 may cause the application program code to display the next screen 1920, shown in FIG. 73, in the sequence of screens related to connecting the HVAC controller 18 to the building's wireless network (e.g. second network 1538 shown in FIG. 54) and/or web service 1550 to be displayed on the user interface of the user's remote device 62. As shown in FIG. 73, screen 1920 can include a first label 1922 that identifies the current phase of the setup process. In this example, first label 1922 identifies the current phase of the setup process as "Connect." A status bar indicator 1924 may also be provided that shows the current status of the connection phase. In addition, screen 1920 may include a brief text string 1926 identifying the current step of the connection phase. For example, as shown in FIG. 72, the brief text string 1926 identifies the current step of the connection phase as "Connect to Home Wi-Fi." A user message 1928 may also be displayed on screen 1920. In this example, the user message 1928 may prompt the user to identify and select the building's wireless network from a list 1930 of available wireless networks 1932a-1932d. It may be useful to note, that at this point in the installation setup process the user's remote device 62 and the HVAC controller 18 may be paired together over the first wireless network 1534 hosted by the HVAC controller 18. In some cases, however, the user's remote device 62 and the HVAC controller 18 may not be paired together over the first wireless network 1534 hosted by the HVAC controller 18.

Figure 74:
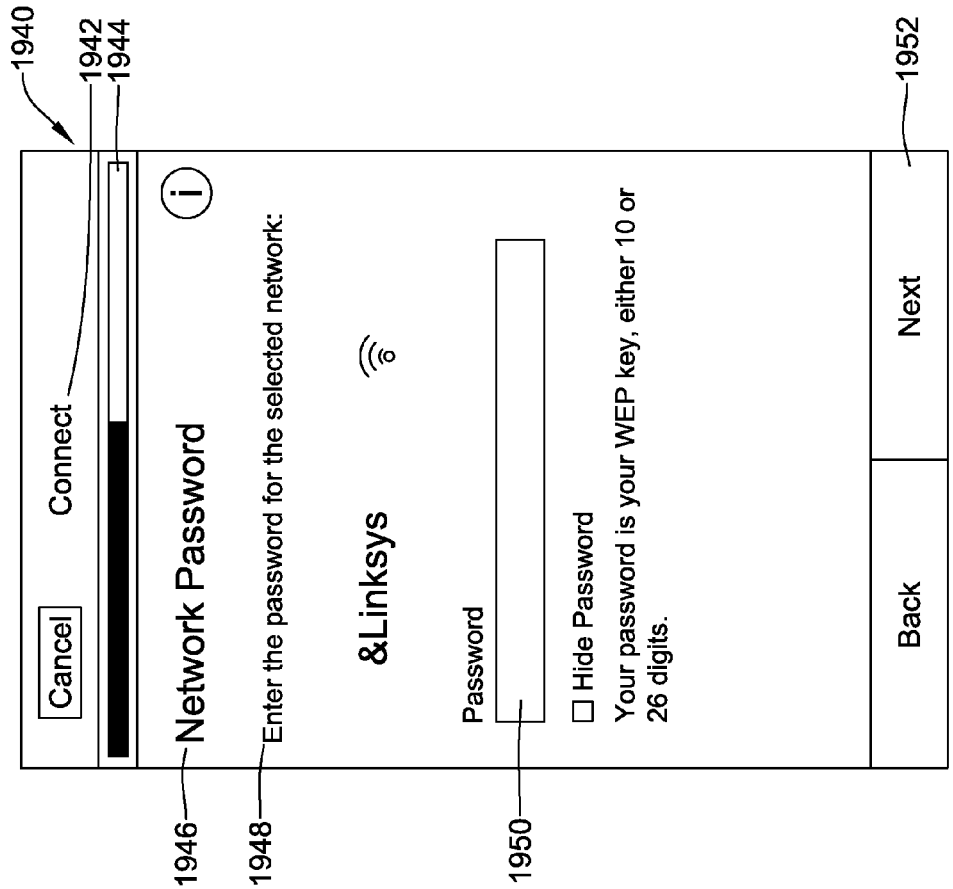

If a selected building's wireless network (e.g. second network 1538 shown in FIG. 54) is password protected, the application program code may then cause screen 1940, shown in FIG. 74, to be displayed to the user via the user interface of the remote device 62. Through screen 1940, the application program code may solicit and accept the network password from the user for accessing the building's wireless network. As shown in FIG. 74, screen 1940 can include a first label 1942 that identifies the current phase of the setup process. In this example, first label 1942 identifies the current phase of the setup process as "Connect." A status bar indicator 1944 may also be provided that shows the current status of the connection phase. In addition, screen 1940 may include a brief text string 1946 identifying the current step of the connection phase. For example, as shown in FIG. 74, the brief text string 1946 identifies the current step of the connection phase as "Network Password." A user message 1948 may also be displayed on screen 1940. In this example, the user message 1928 may prompt the user to provide the password for the building's wireless network. Screen 1940 may include a password entry field 1950 which the user may utilize to enter the network password. Selection of the button 1952 labeled "next' may cause the application program code to accept the password entered by the user via the password entry field 1950 and to display the next screen in the sequence of screens related to connecting the HVAC controller 18 to a wireless network and/or web service.

The application program code may transmit the selected network ID and/or password to the HVAC controller 18 over the first wireless network 1534 which is hosted by the HVAC controller 18, after which the application program code may cause the remote device 62 to disconnect from first network 1534 hosted by the HVAC controller and connect to the building's wireless network 1538. The application program code may cause the remote device 62 to communicate with the HVAC controller 18 via the web service 1550 upon successful connection of the HVAC controller 18 to the web service 1550. In parallel or in rapid succession, upon receiving the building's network ID and password from the application program code, the HVAC controller 18 will attempt to connect to the building's wireless network 1538. Once successfully connected to the building's wireless network, the HVAC controller 18 may be programmed to sync to the web service 1550 associated with the HVAC controller 18 over the wide area network 1542. In some cases, during this step of the connection process, the HVAC controller 18 may be programmed to discontinue hosting the first network 1534 (FIG. 54) and to reconfigure itself as a network client on the building's wireless network 1538.

Figure 75:
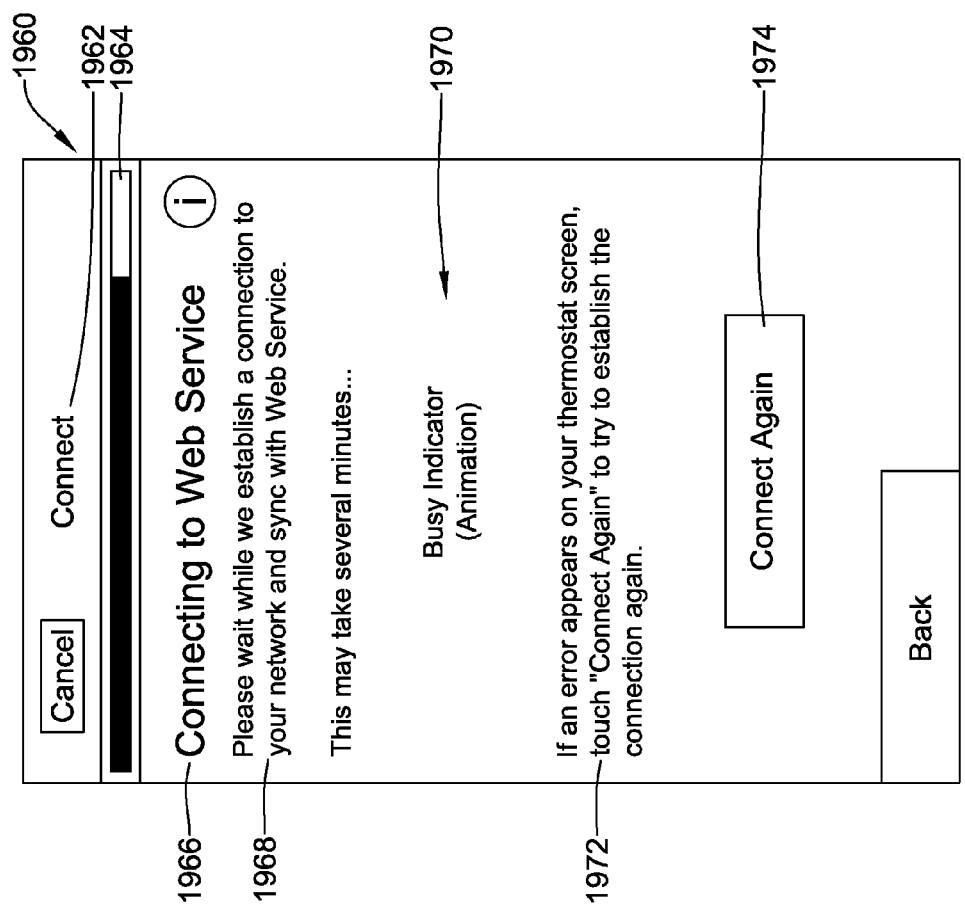

FIG. 75 shows an example of a screen 1960 that may be displayed by the application program code on the user interface of the remote device 62 during the connection phase when the HVAC controller 18 is attempting to connect to the building's wireless network 1538 and ultimately, with the web service 1550 associated with the HVAC controller 18. As shown in FIG. 75, screen 1960 can include a first label 1962 that identifies the current phase of the setup process. In this example, first label 1962 identifies the current phase of the setup process as "Connect." A status bar indicator 1964 may also be provided that shows the current status of the connection phase. In addition, screen 1960 may include a brief text string 1966 identifying the current step of the connection phase. For example, as shown in FIG. 75, the brief text string 1966 identifies the current step of the connection phase as "Connect to Web Service." A user message 1968 may also be displayed on screen 1960. User message 1968 may provide additional information about the current step of the connection process. In some cases, screen 1960 may display a busy indicator 1970 indicating to the user that the HVAC controller 18 is busy. If the HVAC controller 18 cannot connect to the building's wireless network 1538 and/or the web service 1550, screen 1960 may include an error message 1972. In addition, screen 1960 may include a button 1974 labeled "connect again" that, when selected by the user, may cause the HVAC controller 18 to attempt to re-connect to the building's wireless network 1538 and/or web service 1550 if the previous connection attempt was unsuccessful.

Figure 76:
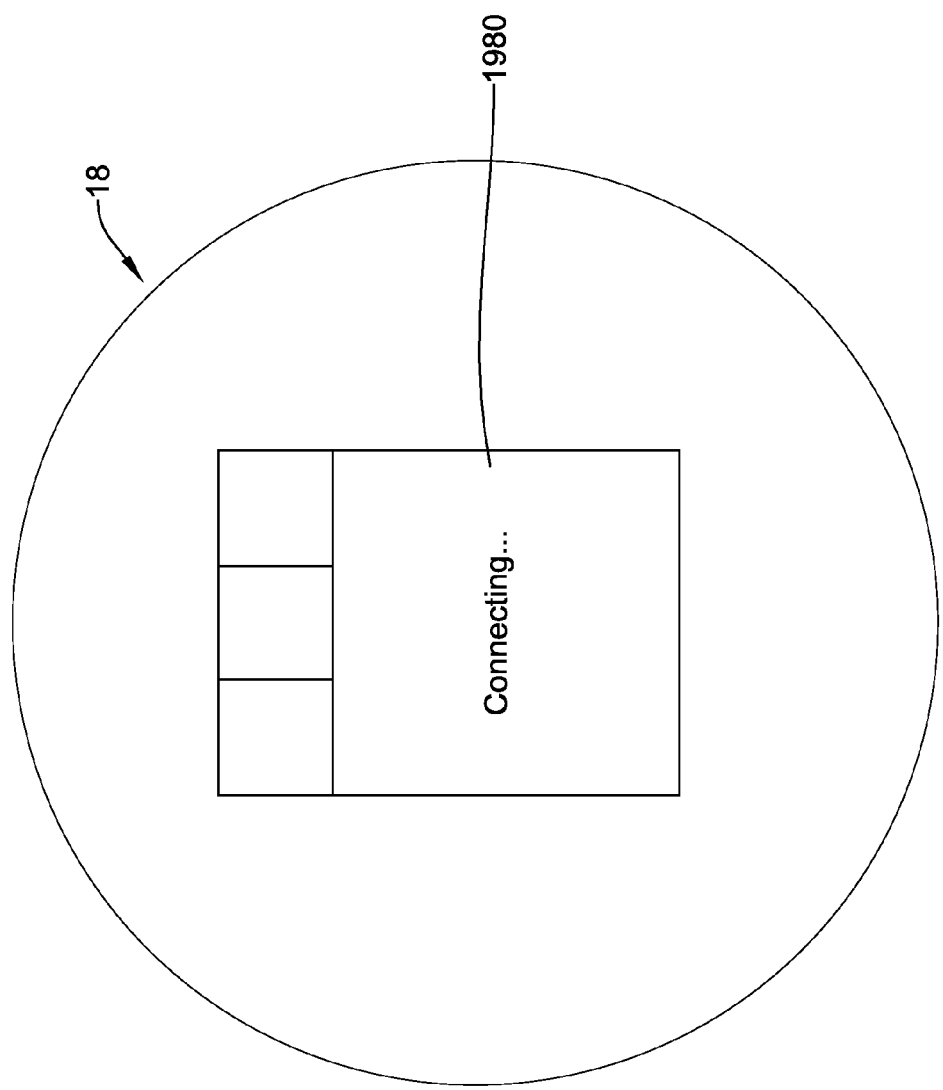

FIG. 76 shows an example of a screen 1980 that may be displayed on the display of the user interface of the HVAC controller 18 when the HVAC controller 18 is attempting to connect to the building's wireless network 1538 and ultimately, the web service 1550. As shown in FIG. 76, screen 1980 includes a user message 1982 that indicates to the user that the connection process is occurring.

Figure 77:
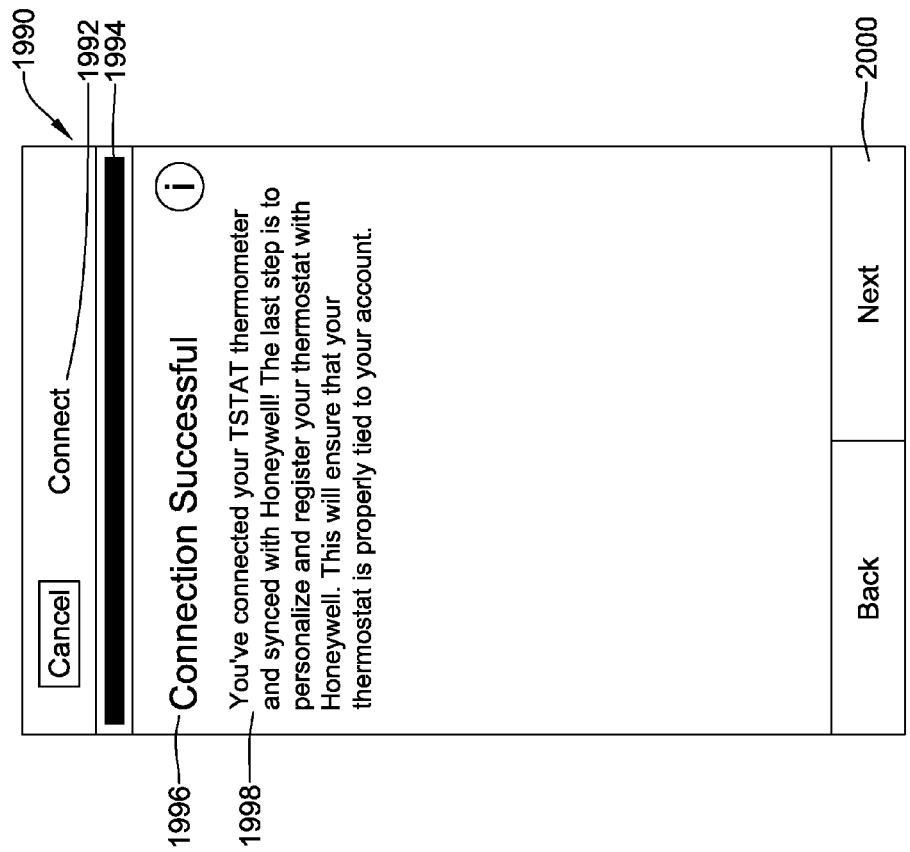

In some cases, the web service 1550 may transmit a message to the application program code stored in the memory of the user's remote device confirming that the HVAC controller 18 was successfully configured and is connected to the web service 1550. FIG. 77 shows an example of a screen 1990 that may be displayed by the application program code on the user interface of the remote device 62 upon successful connection of the HVAC controller 18 to the web service 1550. Screen 1990 can include a first label 1992 that identifies the current phase of the setup process. In this example, first label 1992 identifies the current phase of the setup process as "Connect." A status bar indicator 1994 may also be provided that shows the current status of the connection phase. In addition, screen 1990 may include a brief text string 1996 informing the user that the connection was successful. A user message 1998 may also be displayed on screen 1960. User message 1998 may provide additional information about the current step of the connection phase and may provide information about the next step in the installation setup process. Selection of button 2000 labeled "next" may cause the application code to display another screen related to the setup of the HVAC controller.

Figure 78:
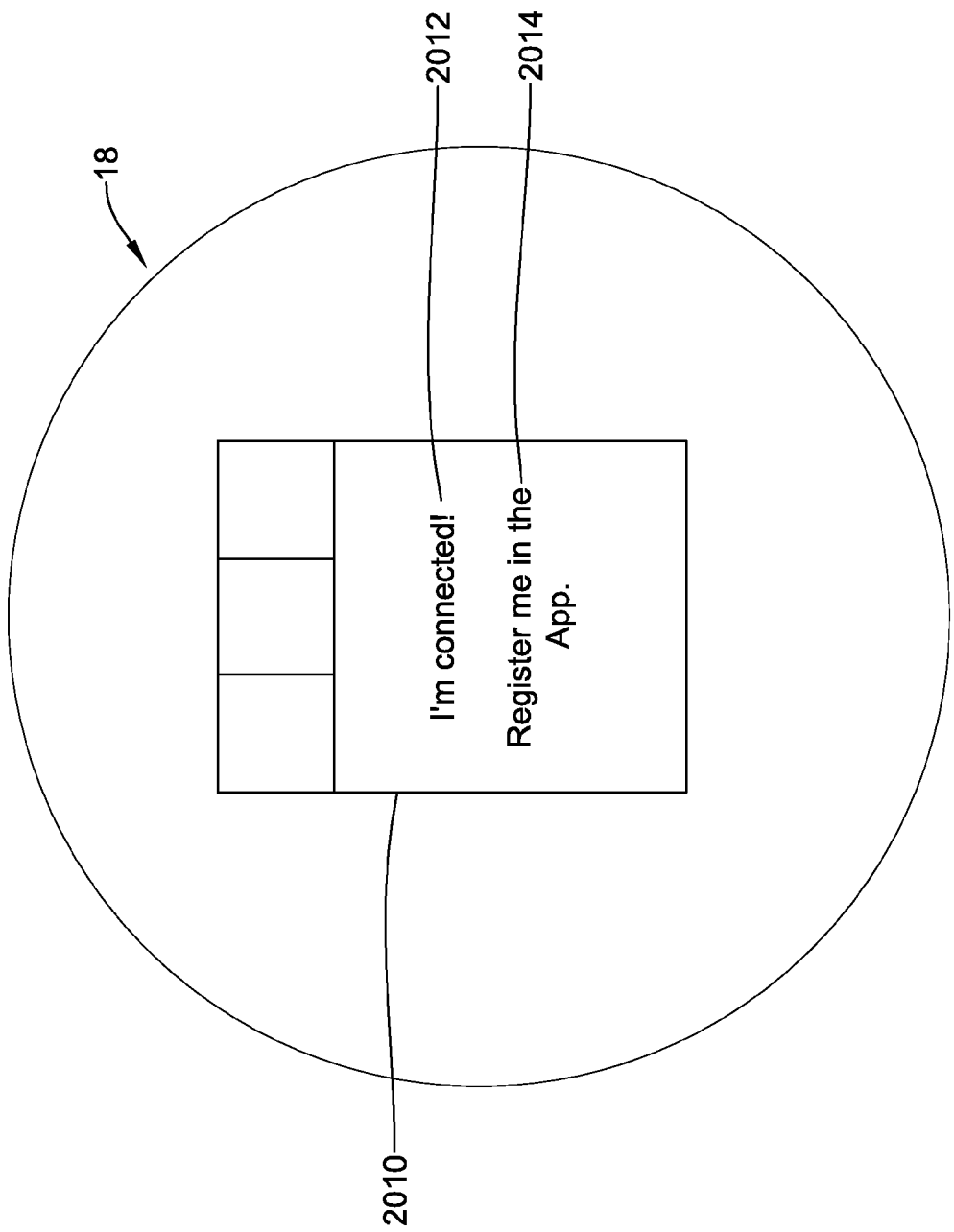

FIG. 78 shows an example of a screen 2010 that may be displayed on the display of the user interface of the HVAC controller 18 when the HVAC controller 18 has successfully connected to the building's wireless network 1538 and the web service 1550 associated with the HVAC controller 18 (e.g. Honeywell's TOTAL CONNECT™ web service). As shown in FIG. 78, screen 2010 includes a user message 2012 that informs the user that the HVAC controller 18 is successfully connected to the building's wireless network 1538 and the web service 1550. In addition, screen 2010 may include a user prompt 2014 that may prompt a user to register the HVAC controller utilizing the application program code stored in the memory of the user's remote device 62.

An illustrative connection process that may be utilized to connect the HVAC controller 18 to the building's wireless network 1538 and subsequently to the web service 1550 is also shown and described in U.S. application Ser. No. 13/559,470 which is incorporated herein by reference in its entirety for all purposes.

The last phase in the illustrative installation setup process relates to personalizing the newly installed HVAC controller 18. FIGS. 79-84 show illustrative screens that may be displayed on the user interface of a remote device by an application program code that may guide a user through personalizing the HVAC controller 18. Personalizing the HVAC controller 18 may include naming the HVAC controller and, in cases where multiple thermostats may be located within the building, identifying the location of the HVAC controller 18. In addition, personalizing the HVAC controller 18 may include registering and associating the HVAC controller with the user's account hosted by the web service 1550. In some cases, as part of the registration process and as discussed in detail in U.S. application Ser. No. 13/559,470, the HVAC controller 18 may transmit its MAC address and CRC code to the remote device 62. The application program code may then cause the remote device 62 to transmit the MAC address and CRC code associated with the HVAC controller to the web service 1550 during the registration process. The MAC address and CRC code are unique identifiers that may be used by the web service 1550 to identify the HVAC controller 18 on the building's wireless network 1538. In some cases, the HVAC controller 18 may transmit the MAC address and CRC code associated with the HVAC controller 18 to the web service 1550 during the registration process.

Figure 79:
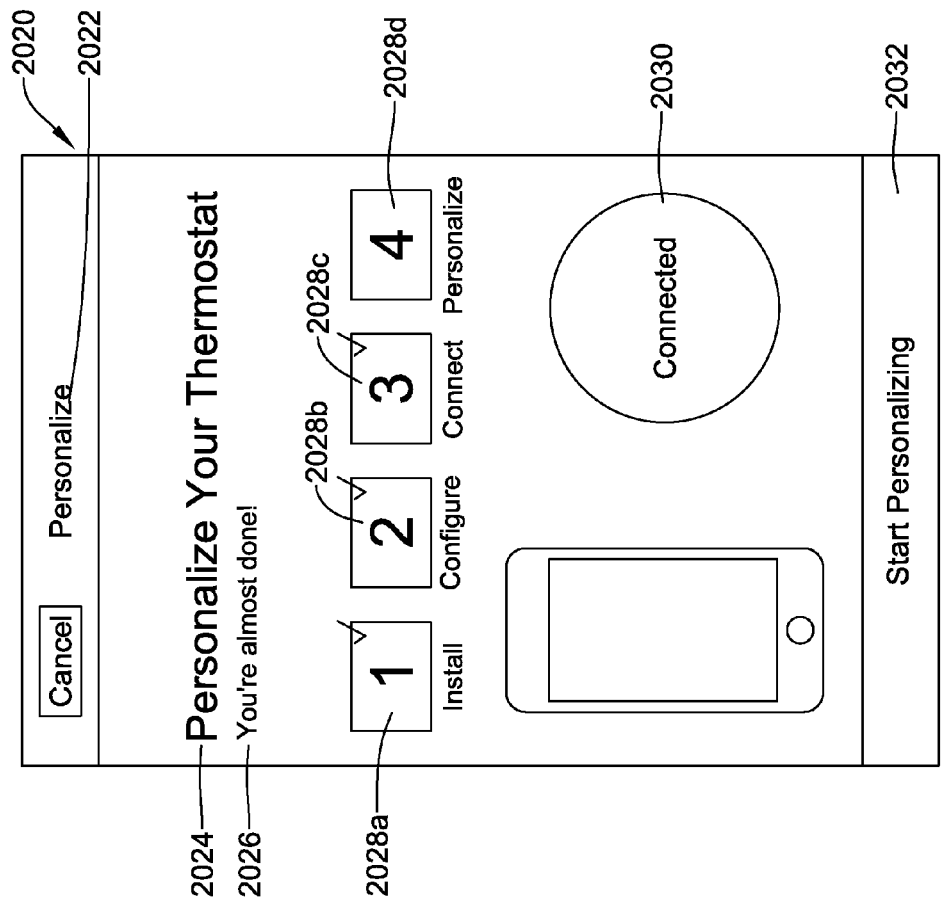

FIG. 79 shows an example of a first screen 2020 that may be displayed on the user interface of the user's remote device 62 related to personalizing the HVAC controller 18. It may be useful to note that at this point in the installation setup process; the remote device 62 may or may not be in communication with the HVAC controller 18 via the web service 1550. In some cases, changes made to the HVAC controller 18 through the application program code executed by the remote device 62 are transmitted to the web service 1550, which in turn pushes down the changes to the HVAC controller 18 via the building's wireless network 1538. If the HVAC controller 18 loses connection with the web service 1550, the web service 1550 may buffer any changes or modifications to the HVAC controller 18. The web service 1550 may be programmed to transmit the buffered changes or modifications to the HVAC controller 18 over the second wireless network 1538 upon restoration of the network connection between the HVAC controller 18 and the web service 1550. While in other cases, changes made via the application program code may be transmitted from the remote device 62 to the HVAC controller 18, without the intervening web service 1550.

In some cases, as shown in FIG. 79, screen 2020 may include a first label 2022 identifying the current phase of the setup process. In this example, first label 2022 identifies the current phase of the setup process as "Personalize." Additionally, screen 2020 may include a brief text string 2024 that identifies the current step of the personalization phase. For example, as shown in FIG. 79, the brief text string 2024 identifies the current step of the connection phase as "Personalize Your Thermostat." A user message 2026 may be displayed on screen 1900. In some cases, user message 2026 may include additional information or instructions about the current step of the personalization phase. In some cases, screen 2020 may also include icons 2028*a*-2028*d* identifying each of the four phases of the setup process, which in this example include "install", "configure", "connect" and "personalize". In addition, the icon 2028*d* identifying the current phase of the setup process may be grayed-out, bolded, or otherwise highlighted to visually indicate to the user that it is the current phase of the setup process. Once a phase of the setup process is complete, the icon(s) 2028a-2028d may include a dot or a checkmark in a corner of the icon to indicate that the phase has been completed. For example, as shown in FIG. 79, icons 2028a-2028c corresponding to the installation phase, the configuration phase, and the connection phase of the setup process each include a checkmark indicating to the user that those phases of the setup process are complete. In some cases, screen 2020 may include a thermostat icon 2030 indicating to the user that the HVAC controller 18 is connected to the remote device 62 and/or to the web service 1550. The user may initiate the personalization process by selecting 2032 labeled "start personalizing" provided at the bottom of screen 2020.

Selection of button 2032 labeled "start personalizing" provided on screen 2020 may cause the application program code to display the next screen 2040, shown in FIG. 80, in the sequence of screens related to personalizing the HVAC controller 18. As shown in FIG. 80, screen 2040 can include a first label 2042 that identifies the current phase of the setup process. In this example, first label 2042 identifies the current phase of the setup process as "Personalize." A status bar indicator 2044 may also be provided that shows the current status of the personalization phase. In addition, screen 2040 may include a brief text string 2046 identifying the current step of the personalization phase. For example, as shown in FIG. 80, the brief text string 2046 identifies the current step of the personalization phase as "Personalize." A user message 2048 may also be displayed on screen 2040. In this example, the user message 2048 may prompt the user to name and identify the location of the HVAC controller 18. Screen 2040 may include a first text entry box 2050 labeled "Location Name" for receiving and accepting the location of the HVAC controller 18 from a user. A second text entry box 2052 labeled "Thermostat Name" may be displayed for receiving and accepting a thermostat name from a user. Selection of button 2054 labeled next may cause the application program code to display another screen in the sequence of screens related to personalizing the HVAC controller 18.

FIG. 81 shows an example screen 2060 through which a user may register the HVAC controller 18 with the web service 1550 as part of the personalization phase of the installation setup process. As shown in FIG. 81, screen 2060 can include a first label 2062 that identifies the current phase of the setup process. In this example, first label 2062 identifies the current phase of the setup process as "Personalize." A status bar indicator 2064 may also be provided that shows the current status of the personalization phase. In addition, screen 2060 may include a brief text string 2066 identifying the current step of the personalization phase. For example, as shown in FIG. 81, the brief text string 2066 identifies the current step of the personalization phase as "Register." A user message 2068 may also be displayed on screen 2040. In this example, user message 2068 may prompt the user to register the HVAC controller with the web service 1550 by entering their address and time zone into the text entry fields 2070 displayed on screen 2060. Alternatively, in some cases, a button 2072 may be provided that, when selected by a user, cause the application program code stored in the memory of the user's remote device to utilize location based services of the user's remote device to identify the location of the HVAC controller 18 and automatically populate the fields 2070. This feature may be more accurate when the user is actually in the building near the location of the HVAC controller 18 during the registration process. In some cases, selection of button 2074 displayed on screen 2060 may cause the application program code to display the MAC address and/or CRC code of the HVAC controller 18 on the screen 2060 such that it may be viewed by the user.

Figure 82:
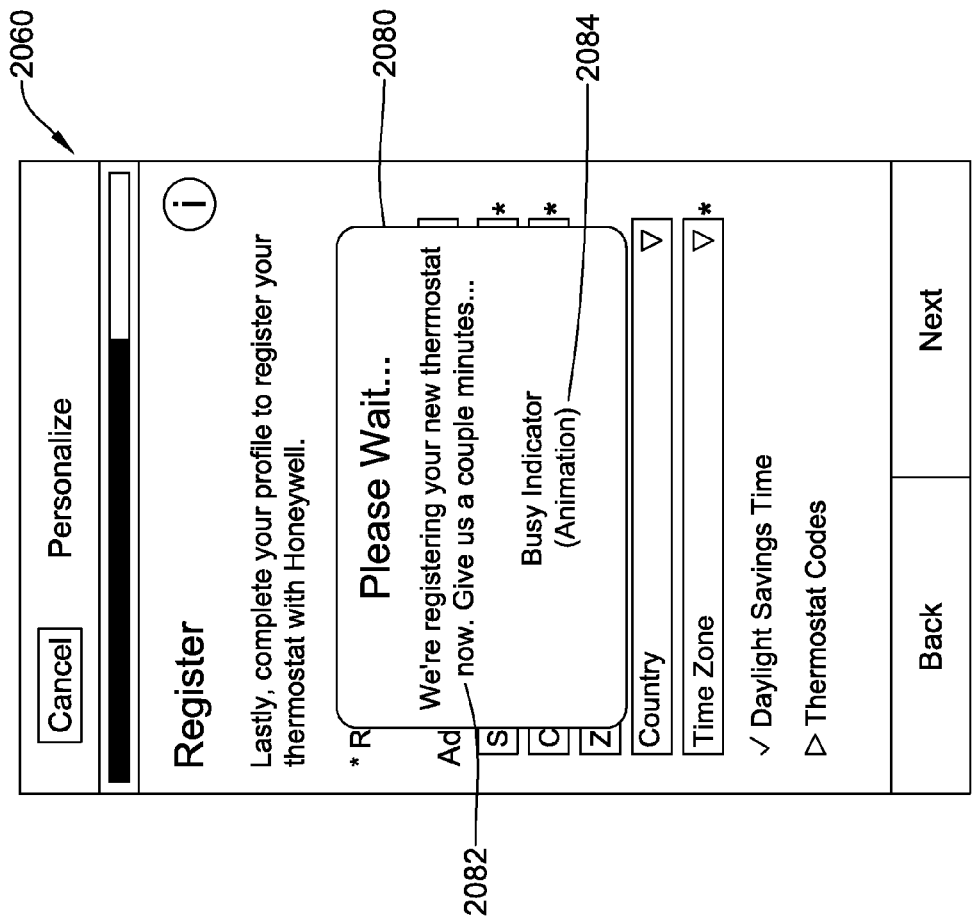

Selection of button 2076 labeled "next" may cause the application code to accept the registration information from the user and transmit the registration information to the web service 1550. Additionally, in some cases, selection of button 2076 labeled "next" provided on screen 2060 may cause the application program code to display a pop-up or floating window 2080 over screen 2060, as shown in FIG. 82. Window 2080 may include a user message 2082 that informs the user that the HVAC controller 18 is being registered with the HVAC controller 18. In some cases, window 2080 may also include an animated busy indicator 2084.

Figure 83:
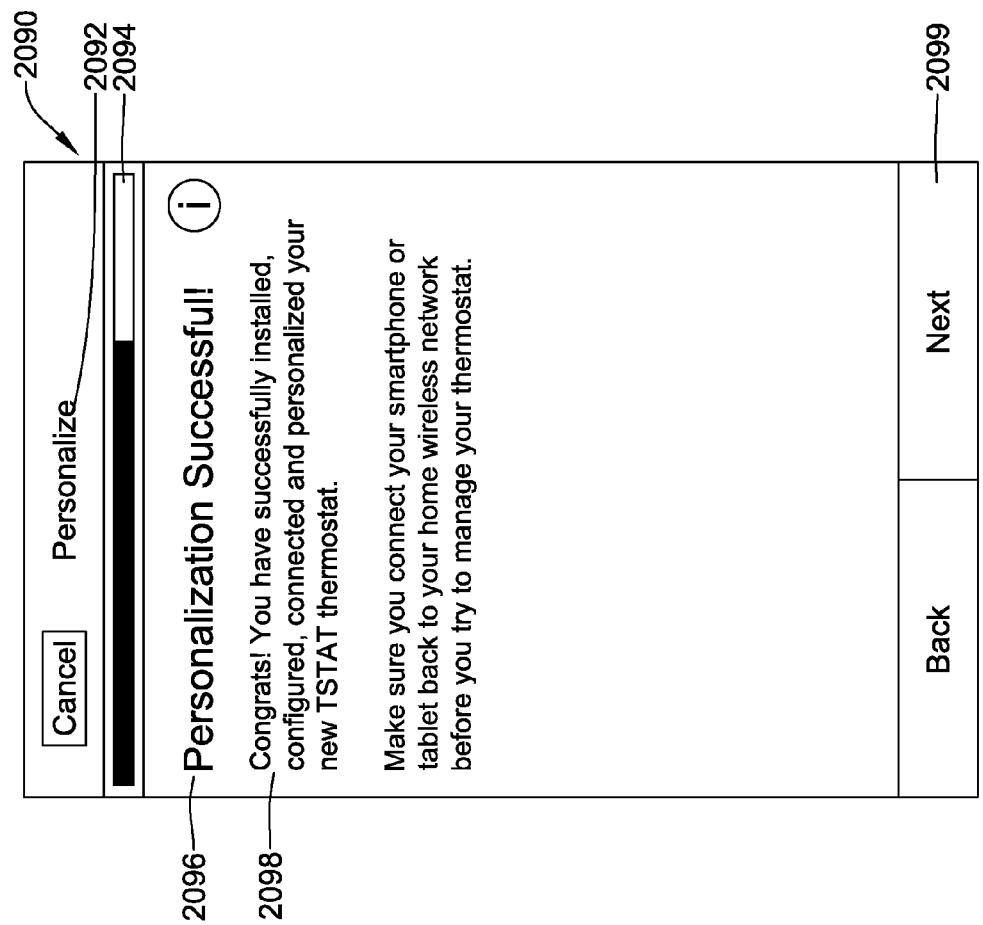

Upon successful completion of the registration process with the web service 1550, the web service 1550 may transmit a message to the application program code stored in the memory of the user's remote device 62 confirming that the registration process was successfully completed. FIG. 83 shows an example of a screen 2090 that may be displayed by the application program code on the user interface of the remote device 62 upon successful registration of the HVAC controller 18 with the web service 1550. Screen 2090 can include a first label 2092 that identifies the current phase of the setup process. In this example, first label 2092 identifies the current phase of the setup process as "Personalize." A status bar indicator 2094 may also be provided that shows the current status of the connection phase. In addition, screen 2090 may include a brief text string 2096 informing the user that the registration process was successful. A user message 2098 may also be displayed on screen 2060. User message 2098 may provide additional information or instructions about the current step of the personalization phase of the installation setup process. Selection of button 2099 labeled "next" may cause the application code to display another screen related to the setup of the HVAC controller 18.

Figure 84:
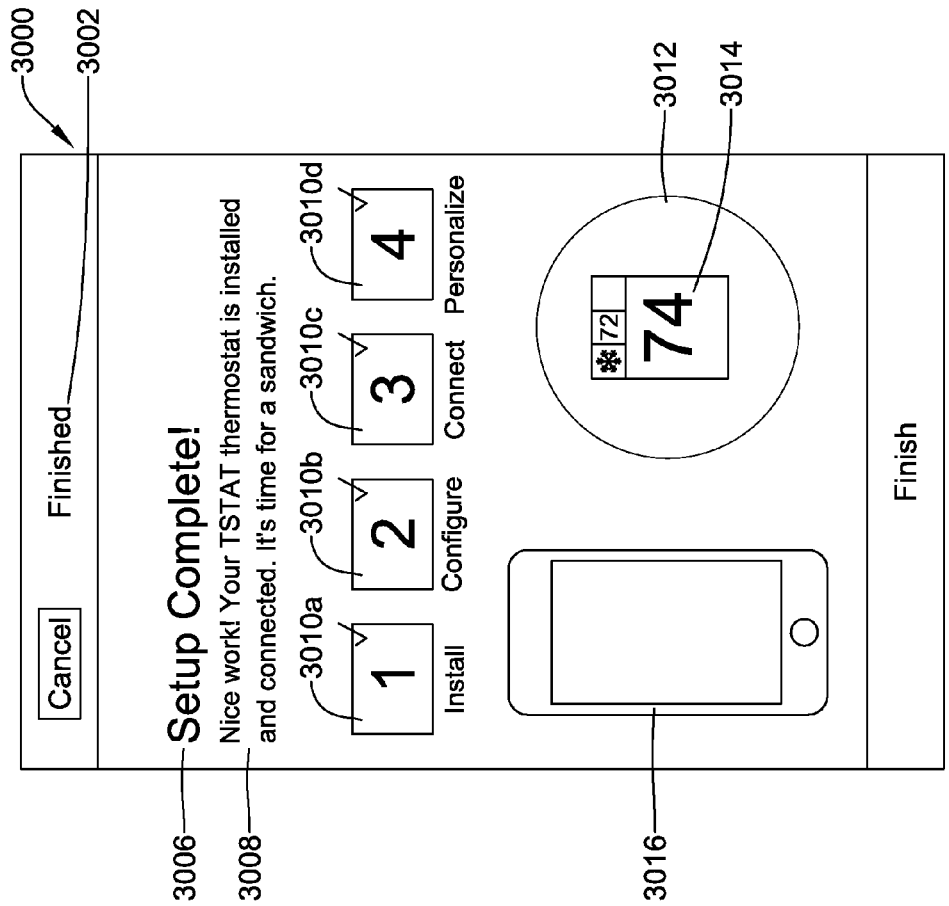

FIG. 84 shows an example of yet another screen 3000 that may be displayed on the user interface of the user's remote device 62 related to personalizing the HVAC controller 18. It may be useful to note that at this point in the installation setup process; the HVAC controller 18 may be connected to the web service 1550 and can be controlled via the web service 1550 and/or via the application program code executed by the user's remote device 62. In some cases, screen 3000 may include a first label 3002 identifying the current phase of the setup process. In this example, first label 3002 identifies the current phase of the setup process as "Finished." Additionally, screen 3000 may include a brief text string 3006 that notifies the user that the setup process is complete. A user message 3008 may be displayed on screen 3000. In some cases, user message 3008 may include additional information or instructions about the phase of the installation setup process. In this example, user message 3008 confirms that the HVAC controller 18 is installed and connected. In some cases, screen 3000 may also include icons 3010a-3010d identifying each of the four phases of the setup process, which in this example include "install", "configure", "connect" and "personalize". Once the installation setup process is completed, each of the icons 3010a-3010d may include a dot or a checkmark in a corner of the icon to indicate that the phase has been completed, as shown in FIG. 84. In some cases, screen 3000 may include a thermostat icon 3012. In some cases, the thermostat icon 3012 may display a current temperature reflective of a measure of the current temperature received from the HVAC controller 18. Additionally, in some cases, screen 3000 may also include an icon 3016 representing the user's remote device 62 to indicate that the HVAC controller 18 is also in communication with the remote device 62. Selection of button 3018 labeled "finish" may end the installation setup process.

FIG. 85 shows an example of a confirmation screen 3020 that may be displayed on the display of the user interface of the HVAC controller 18 upon successful completion of the installation setup process. As shown in FIG. 85, screen 3020 may include a confirmatory user message confirming successful completion of the installation setup process. Additionally, in some cases, the HVAC controller 18 may be configured to glow and/or make an audible sound indicative of successful completion of the installation setup process. Upon successful completion of the installation setup process, the user may begin to immediately use the newly installed HVAC controller.

In some cases, the application program code previously downloaded and stored in the memory of the user's remote device 62 may include a tour to facilitate a user's understanding of how to use the newly installed HVAC controller. In one example, the tour may include a video based tour that the user may access and view through the user interface of their remote device 62. For example, the tour may include a link that may activate a short video either embedded within the application program code and stored in the memory of the user's remote device 62 or a link to a video hosted by an external website such as, for example, YOUTUBE (www.youtube.com). The video-based tour may provide an overview of selected functions of the thermostat. Upon viewing the video, a user should better understand how to utilize the selected functions.

In some instances, the tour may be contained within the application program code, and may include a task-based tutorial that may guide a user through a series of tasks or steps related to one or more thermostat functions that are to be completed by the user. After successful completion of the series of tasks or steps, the user should be able to independently utilize the selected function of the thermostat. Non-limiting examples of the selected thermostat functions through which the tour or task-based tutorial may guide a user include: changing a temperature setpoint; selecting an appropriate geofence; creating a custom geofence; creating a customized one-touch action macro or shortcut; creating a user profile; viewing performance logs; changing alert timers, etc.

FIG. 86A is a schematic block diagram of an illustrative mobile device 4100 that may be used in programming an HVAC controller 4102. It will be appreciated that the mobile device 4100 may be similar to those described previously, and may be considered as an example of the remote device 62 (FIG. 2). The mobile device 4100 may be a smartphone or tablet, but this is not required. In some instances, the HVAC controller 4102 may be considered as being an example of the HVAC controller 18 (FIG. 1). The illustrative mobile device 4100 includes a touch screen display 4104 that is configured to display information and to permit a user to enter information. A network connection 4106 is configured to communicate with a remote server 4108 that is itself in operative communication with the HVAC controller 4102. The illustrative mobile device 4100 includes a controller 4110 that is in operative communication with the touch screen display 4104 and the network connection 4106.

The controller 4110 of the mobile device 4100 is configured to display one or more screens on the touch screen display 4104 of the mobile device 4100 and to accept input from a user to remotely program one or more functions of the HVAC controller 4102. In some embodiments, the controller 4110 of the mobile device 4100 is further configured to provide a tour via the touch screen display 4104 of the mobile device 4100 that guides a user though programming a first function of the one or more functions of the HVAC controller 4102. Optionally, the tour may include an instructional video. In some cases, the controller 4110 of the mobile device 4100 is further configured to output one or more programmed functions of the HVAC controller 4102 to the remote server 4108 via the network connection 4106.

In some cases, a tour prompts the user to take one or more programming actions as the tour guides the user though programming a first function, such that the first function of the HVAC controller 4102 becomes programmed during the tour. Optionally, the tour provides additional information to facilitate the user's understanding of the first function and/or to aid the user in making an appropriate selection. In some cases, as will be illustrated in subsequent screen shots, the tour includes a user prompt superimposed over an underlying screen, wherein the underlying screen is one of the one or more screens used to program the one or more functions of the HVAC controller 4102.

In some embodiments, the controller 4110 of the mobile device 4100 requires the tour to be run for the first function before allowing programming of a second function of the one or more functions of the HVAC controller 4102. In some cases, the tour displays a sequence of two or more screens on the touch screen display 4104 of the mobile device 4100 that guides the user though programming the first function of the one or more functions of the HVAC controller 4102. Illustrative but non-limiting examples of first functions include how to check status, how to adjust the temperature, how to switch between heating and cooling modes, how to switch from heating to off, how to switch from cooling to off, how to switch from fan on to fan auto, how to switch from fan on to fan off, how to switch from fan auto to fan off, how to enable geo-fencing, how to adjust geo-fencing settings, how to create one touch macros and how to use one touch macros.

FIG. 86B is a schematic block diagram of an illustrative mobile device 4200 that may be used in programming an HVAC controller 4102. It will be appreciated that the mobile device 4200 may be similar to those described previously, and may be considered as an example of the remote device 62 (FIG. 2). The mobile device 4200 may be a smartphone or tablet, but this is not required. In some instances, the HVAC controller 4102 may be considered as being an example of the HVAC controller 18 (FIG. 1). The mobile device 4200 includes a user interface 4204 that is configured to display information and to permit a user to enter information. A network connection 4206 is configured to communicate with a remote server 4108 that is itself in operative communication with the HVAC controller 4102. A memory 4208 is configured to store an application program. The mobile device 4200 includes a controller 4210 that is in operative communication with the user interface 4204, the network connection 4206 and the memory 4208.

In some embodiments, the application program, when executed by the controller 4210 of the mobile device 4200, enables a user to remotely program one or more functions of the HVAC controller 4102 via the user interface 4204 of the mobile device 4200 and to output one or more programmed functions to the remote server 4108 via the network connection 4206. In some cases, the application program may also be programmed to provide a task based tutorial that, when activated, displays a series of two or more screens that prompt the user to take one or more programming actions while guiding the user though programming a first function of the HVAC controller 4102, such that the first function of the HVAC controller 4102 becomes programmed.

In some cases, the task based tutorial provides additional information to facilitate the user's understanding of the first function. In some instances, the task based tutorial provides additional information to aid the user in taking appropriate programming actions. The task based tutorial may include a user prompt superimposed over an underlying screen, wherein the underlying screen is one of one or more screens used to remotely program the one or more functions of the HVAC controller 4102 via the user interface 4204 of the mobile device 4200. Optionally, the controller 4210 of the mobile device 4200 requires the task based tutorial to be run for the first function before unlocking a second function of the one or more functions of the HVAC controller 4102.

Figure 86C:
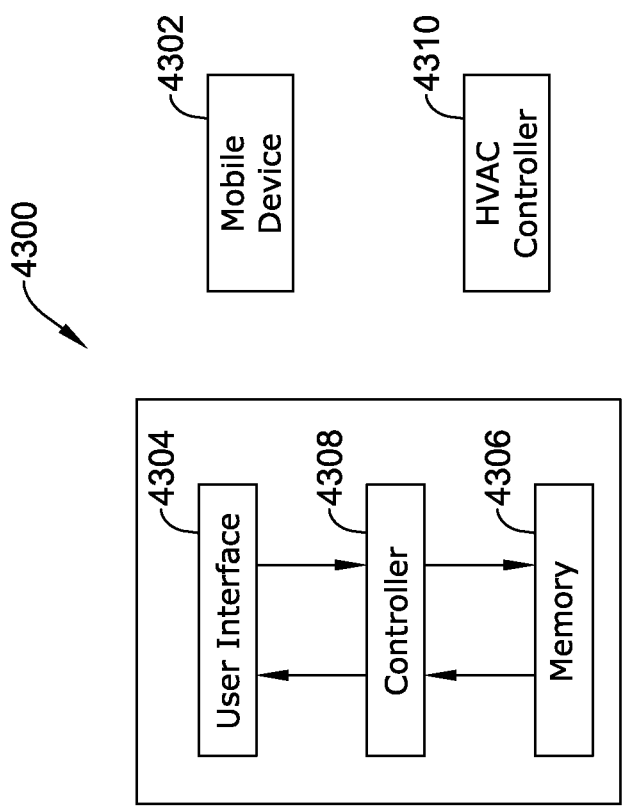
FIG. 86C is a schematic block diagram of a server of an illustrative building automation system.

FIG. 86C provides a schematic block diagram illustrating a server 4300. In some embodiments, the server 4300 may represent the external server 66 (FIG. 1) and may in some cases be the same as the remote server 4108 shown in FIGS. 86A and 86B. The illustrative server 4300 includes a network connection 4304 for connecting to a mobile device 4302 that is located remote from the server 4300. The server 4300 includes a memory 4306 that is configured to store an application program for a mobile device, such as the mobile device 4302. The application program may be configured to enable a user of the mobile device 4302 to remotely program one or more functions of an HVAC controller 4310 and to output one or more programmed functions. The HVAC controller 4310 may, for example, be representative of the HVAC controller 18 (FIG. 1). The application program is also configured to provide a task based tutorial that, when activated, displays a series of two or more screens on the mobile device 4302 that prompt the user to take one or more programming actions while guiding the user though programming one or more functions of the HVAC controller 4310. The illustrative server 4300 includes a controller 4308 that is operatively coupled to the network connection 4304 and the memory 4306. The controller 4308 is configured to upload the application program to the mobile device 4302 upon request.

In some cases, the task based tutorial of the application program provides additional information to facilitate the user's understanding of the one or more functions and/or to aid the user in taking appropriate programming actions. In some embodiments, the task based tutorial includes a user prompt superimposed over an underlying screen, wherein the underlying screen is one of one or more screens used to remotely program the one or more functions of the HVAC controller 4310.

In some cases, the user's successful completion of a first series of tasks or steps related to a first selected thermostat function or group of functions may cause the application program code to provide access to at least a second series of tasks or steps related to a second function or group of functions that are different from the first series of tasks or steps. The second series of tasks or steps may be more advanced than the first series of tasks or steps. The user may continue to utilize the task based tutorial within the application program code to explore and access different features of their thermostat. In some cases, the user may exit the task-based tutorial at any time through selection of an appropriate button or icon displayed on the user interface for that purpose. In some cases, the user may be granted access to certain functions of the thermostat only after a series of tasks or steps related to the selected function is successfully completed by the user. In use, the user may activate the task-based tutorial at any time by selecting an appropriate icon or button on the user interface to unlock or gain access to a selected function. In many cases, the application program code may recognize that a selected thermostat function has not been unlocked or utilized by the user, and will display an appropriate button or icon for accessing the task based tutorial. Upon activation of the task-based tutorial by the user, the application program code may display one or more screens that may guide a user through a series of tasks or steps related to the selected function to which the user desires to utilize. After completing a series of tasks or steps related to the selected function, the selected function may become accessible to the user. The user may then close the task based tutorial through selection of an appropriate icon or button.

Figure 86D:
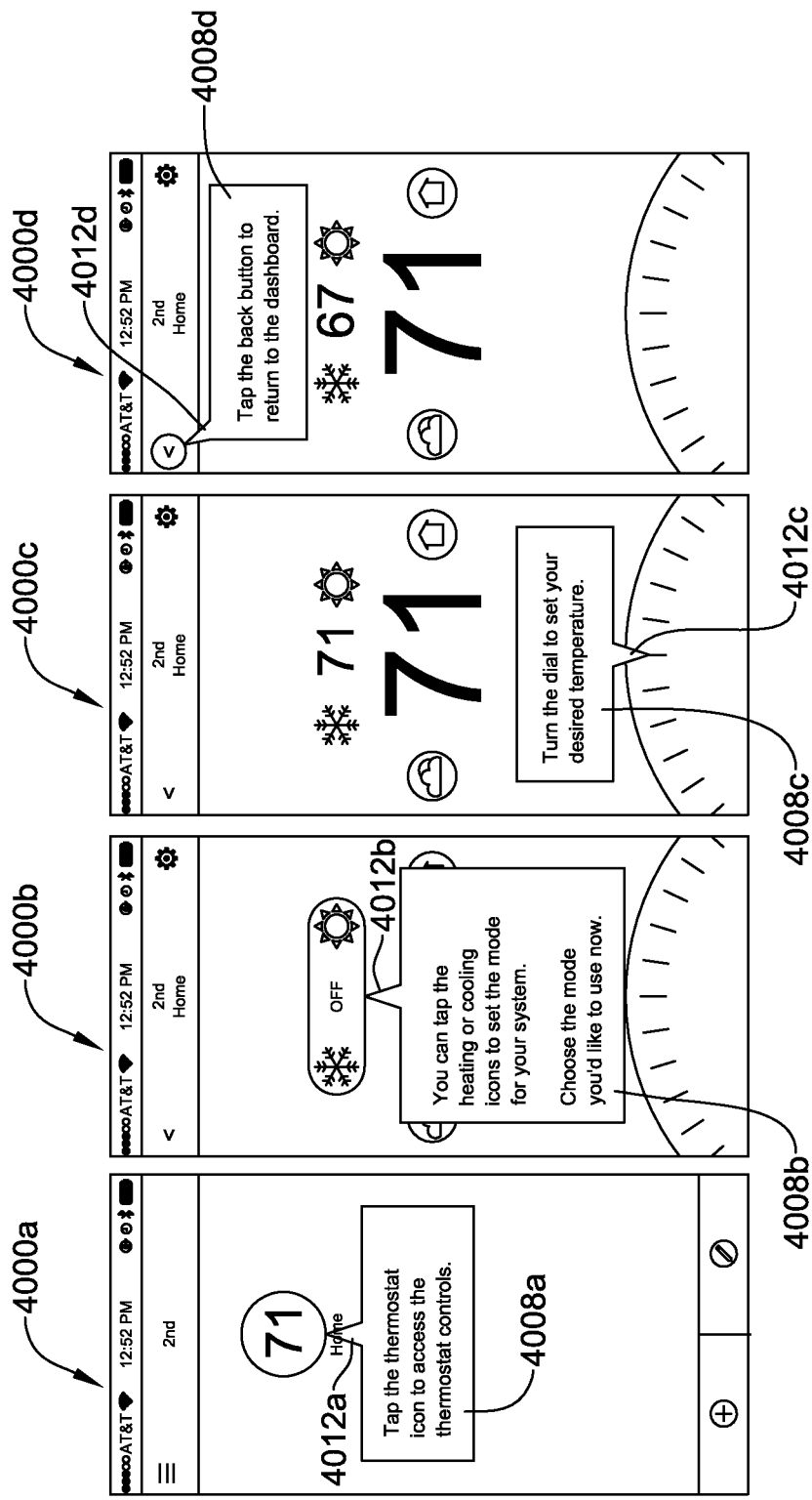
FIGS. 86D and 86E show illustrative screens that may be displayed on the user interface of a remote device (e.g. mobile device) by an application program code that may guide a user through utilizing certain functions of an HVAC controller.

FIG. 86D shows a first set of screens 4000a-4000d that may be displayed on the user interface of a user's remote device 62 by a task based tutorial contained within application program code executed by the user's remote device 62. As shown in FIG. 86D, screens 4000a-4000d relate to selecting an HVAC operational mode (e.g. heating or cooling) and then selecting a desired temperature setpoint for the selected HVAC operational mode. Each of the screens may include a user prompt 4008a-4008d that may prompt or instruct a user to take a desired action to complete a least a first step in a series of steps displayed by the task based tutorial related to the selected function. The user prompt 4008a-4008d may include additional information that may facilitate the user's understanding of the selected function and which, in some cases, may aid the user in making an appropriate selection. In some cases, as shown in FIG. 86D, the user prompt 4008a-4008d may include an indicator 4012a-4012d that indicates or visually guides a user to select an appropriate icon or button for completing a selected step, but this is not required. Successful completion of the steps displayed in the first set of illustrative screens 4000a-4000d may cause the task based tutorial to display a second set of screens relating to a different or more advanced thermostat function.

Figure 86E:
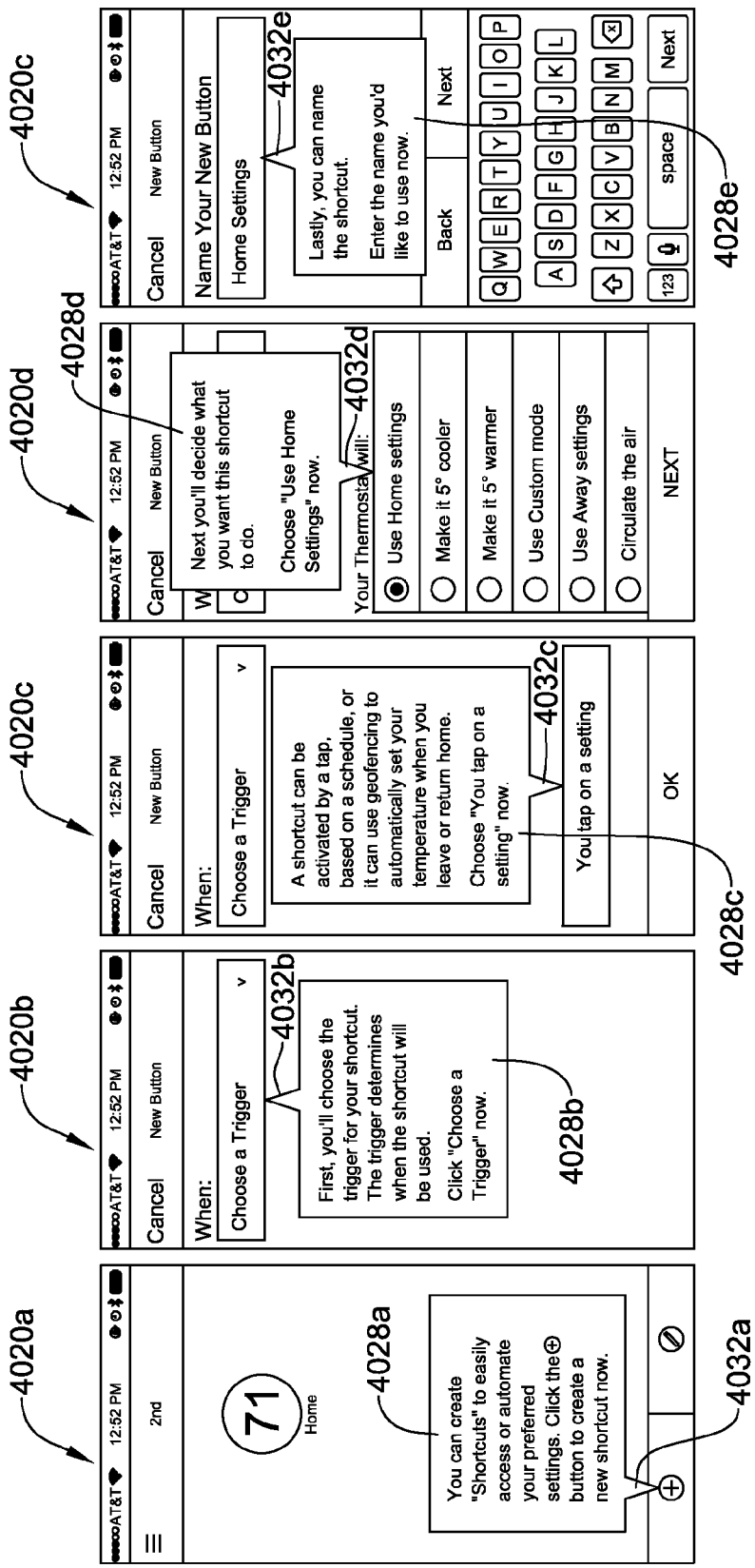

FIG. 86E show a second set of one or more screens 4020a-4020e that may be displayed on the user interface of a user's remote device 62 by a task based tutorial contained within the application program code executed by the user's remote device 62. As discussed herein, the second set of screens may be displayed upon successful completion of one or more tasks or steps displayed in a first set of screens. In some cases, the second selected function may be unrelated to the first selected function. However, in other cases, the second set of screens may guide a user through a series of tasks or steps related to more advanced features of the first selected function.

As shown in FIG. 86E, the second set of screens 4020a-4020e guide a user through customizing or programming a one-touch macro. Each of the screens 4020a-4020e may include a user prompt 4028a-4028e that may prompt or instruct a user to take a desired action to complete a least a first step in a series of steps displayed by the task based tutorial related to the selected function. The user prompt 4028a-4028e may include additional information that may facilitate the user's understanding of the selected function and which, in some cases, may aid the user in making an appropriate selection. In some cases, as shown in FIG. 86E, the user prompt 4028a-4028e may include an indicator 4032a-4032e that indicates or visually guides a user to select an appropriate icon or button for completing a selected step, but this is not required. Successful completion of the steps displayed in the first set of illustrative screens 4020a-4020d may cause the task based tutorial to display yet another set of screens relating to a yet another thermostat function. It will be generally understood that the user may exit the task based tutorial and subsequently, return to the task based tutorial at any time to learn about and/or master other thermostat functions.

Through the application program code on the user's remote device, the user may register their HVAC controller 18 with a selected HVAC contractor. In some cases, through the application program code, the user may elect to give remote access to their HVAC controller 18 to the selected HVAC contractor so that the HVAC contractor may remotely monitor the performance of the user's HVAC system and/or energy usage, recommend certain actions for improving the performance of their HVAC system and/or for increasing the energy efficiency of their HVAC system, display energy usage reports, send reminders to change filters and/or schedule routine maintenance, and/or inform the user about upcoming service specials.

Referring back to FIG. 19D, it is contemplated that the user may activate a feature in the application program code for identifying and connecting with an HVAC contractor through a selection of an appropriate option 808 from a list of selectable options displayed on an options screen 810 accessible through a home screen 800. Upon receiving selection of the option 808 labeled "Find a Contractor" from a user, the application program code may cause the user's remote device 62 to display at least a first screen, sometimes of a sequence of screens, related to identifying and connecting with an HVAC contractor. Illustrative screens relating to identifying and connecting with an HVAC contractor are shown in FIGS. 87-92. In one example, upon receiving selection of the option 808 labeled "Find a Contractor" from a user, the application program code may cause the user's remote device 62 to display an illustrative first screen 4060, shown in FIG. 87, that may prompt a user to enter location information such as a city, state or zip code or to select a location from a list of available locations 4068. In some cases, the user's remote device may supply the location information using GPS data from a GPS unit of the remote device. Upon receiving location or location information data, the application code may display a subsequent screen 4080, shown in FIG. 88, in a sequence of screens related to identifying and connecting with an HVAC contactor. The screen 4080 displays a list of local HVAC contractors 4088 including their contact information and sometimes consumer rating information, as applicable. In some cases, the list of HVAC contractors may be ordered according to their location relative to the user's home, with those contactors located closest to the user's home being displayed at the top of the list. In other cases, the list of HVAC contractors may be displayed in an order according to their consumer ratings (number or stars given by previous consumers), with the highest rated HVAC contractors displayed at the top of the list. In still other cases, HVAC contractors currently offering new customer or service specials may be ordered at the top of the list and/or may be highlighted.

In some cases, an HVAC contractor may offer remote monitoring services. The user may receive an invitation via email or through the message center discussed above, which may invite the user to connect their HVAC controller 18 to the HVAC contractor's monitoring service. Through the received invitation, the user may choose a monitoring program (e.g., a full or partial monitoring program) that best suits the user's needs and also which may limit or grant a certain level of access to the associated contractor for the HVAC system. Once a monitoring program has been selected by the user, the user's HVAC controller 18 may be automatically set up for monitoring by the selected HVAC contractor that sent the invitation, and the user and contractor may have linked accounts via a remote server to facilitate the monitoring, scheduling and/or performance of maintenance checks, etc. Even after the user and contractor are linked, the customer may have the ability to disconnect the HVAC contractor from its HVAC system and/or HVAC controller (and corresponding data and/or information sharing), which may allow the user to retain control of its HVAC system data and/or information.

Figure 89:
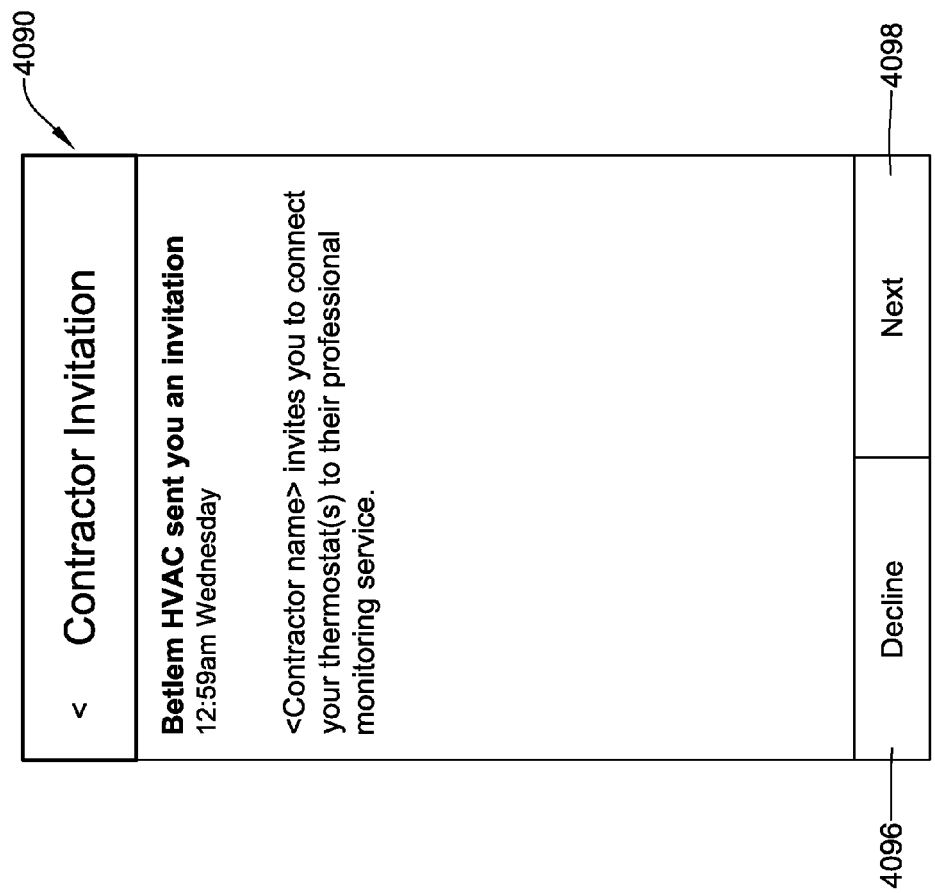

Turning now to the specific examples provided in FIGS. 89-92, upon opening a message received from the HVAC contractor in the message center, the application program code may display an invitation screen 4090, shown in FIG. 89, displaying a user message including an invitation to participate in monitoring services offered by the HVAC contractor. Selection of the button 4098 labeled "Next" or another appropriate button displayed on invitation screen 4090 may cause the application program code to display a subsequent screen 5000 in a sequence of screens, shown in FIG. 90, which may prompt a user to select one or more locations 5008 for which monitoring services are desired. In addition, screen 4090 may include another button 4096 that, when selected by a user, may permit a user to decline or opt out of any monitoring services provided by the selected HVAC contractor.

Figure 91:
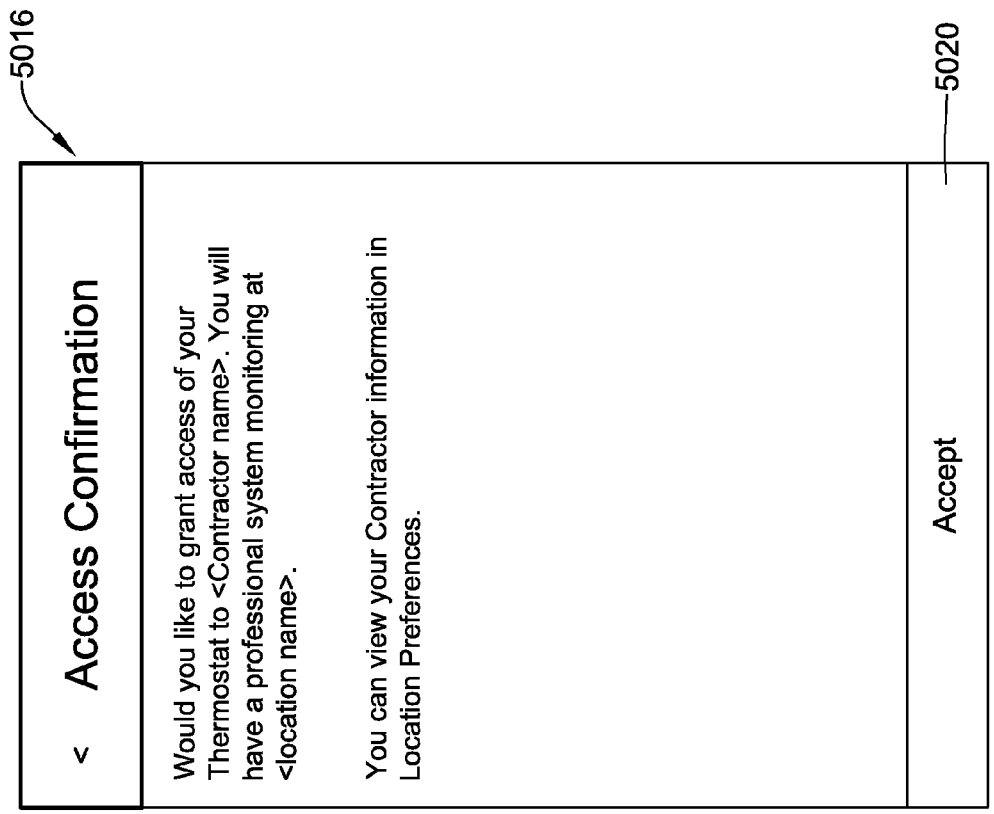

Upon receiving a selection of one or more locations 5008 for which the user desires monitoring services, the application program code may display screen 5016, shown in FIG. 91. Screen 5016 may display a user message prompting the user to confirm that they desire to provide remote access to their HVAC controller 18. In addition, screen 5016 may include at least a first selectable option 5020 that, when selected by the user, causes the application program code to transmit a message to the selected HVAC contract indicating that that the user has granted remote access to their HVAC controller 18 and HVAC system. In some cases, screen 5016 may also include a button (not shown) that, when selected by a user, may permit a user to decline or opt out of any monitoring services provided by the selected HVAC contractor.

Figure 92:
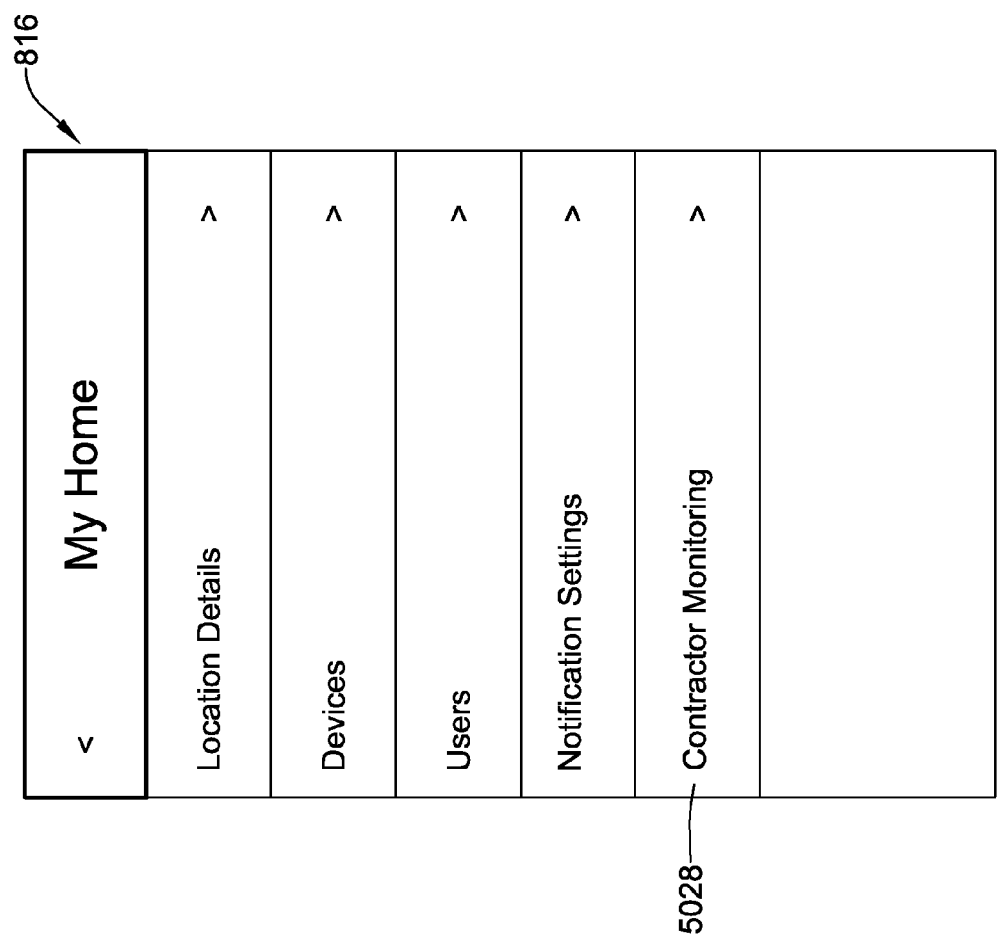
FIG. 92 shows another view of an options screen after a user has connected to an HVAC contractor.

FIG. 92 shows options screen 816 of FIG. 19D after the user has connected with an HVAC contractor to provide monitoring services. As can been seen in FIG. 92, an option 5028 labeled contractor monitoring has been activated and is visible. Once activated, a user may select option 5028 to connect to the remote HVAC contractor to view information and data provided by the HVAC contractor including, but not limited to: notifications, reminders, scheduled appointments, energy usage information, HVAC system performance data, recommended actions, and/or the like.

In one example, an HVAC controller 18 may include a memory, a wireless transceiver for wirelessly sending and receiving data over a building's wireless local area network, and a controller configured to execute a program code stored in the memory for connecting the HVAC controller 18 to the wireless local area network via the wireless transceiver and to detect if a mobile wireless device is currently connected to and recognized by the wireless local area network. The controller may further be configured to change at least one operational parameter setting of the HVAC system depending on whether the mobile wireless device is currently connected to and recognized by the wireless local area network or not.

In some cases, the HVAC controller may switch to an energy savings setting when the occupants of the building are away (unoccupied mode), and then switch back to a comfort setting when the occupants of the building return or are present (occupied mode). In some cases, the HVAC controller 18 may be configured to execute a program code stored in the memory for detecting if a user's mobile wireless device, having a unique identifier, is currently enrolled in a local wireless network by repeatedly broadcasting a query for the mobile wireless device over the wireless local area network. The HVAC controller 18 may be configured to change at least one operational parameter setting of the HVAC system (e.g. a temperature set point) to a comfort setting in accordance with an occupied mode upon receiving a response from the mobile wireless device to the query indicating occupancy of the building, and/or change at least one operational parameter setting of the HVAC system (e.g. a temperature set point) to an energy saving setting in accordance with an unoccupied mode upon not receiving a response from the mobile wireless device to the query indicating the user is not present.

In another instance, the use of location signals from one or more cell phones or tablet computers which have enabled location services, may allow the system to infer that a user will soon be home or is home and to adjust the temperature of the home with enough lead time to prepare the home for the user's arrival. The inference may, in some embodiments, include the requirement that the user appears to be moving toward the home as opposed to merely being nearby for an extended period of time. Further, the one-touch macros discussed above may use the departure or expected arrival of the user's mobile device as a trigger for a programmed action, such as adjusting the temperature set point.

In some cases, the application program code executed by the user's remote device 62 may cause the remote device 62 to determine that the user or, more specifically, that the user's remote device 62, has crossed at least one or more proximity boundaries established relative to the location of the HVAC controller 18 or another location. In other cases, the user's remote device 62 may transmit its location to a server or the like, where the server may determine that the user's remote device 62 has crossed at least one or more proximity boundaries established relative to the location of the HVAC controller 18 or another location.

In some embodiments, utilizing the physical location of a user's remote device 62 (such as a smartphone or tablet, for example) may provide more accurate information as to whether or not the user is at home. These days, people tend not to leave their home without their smartphone and will, in fact, make a special trip back home if they have inadvertently left their smartphone. By using the physical location of the remote device 62, the HVAC controller 18 does not, for example, have to rely on a proximity sensor or the like to determine whether or not a user is home at any particular time. While a proximity sensor can be used to detect motion and thus determine if someone is at home, it will be appreciated that a thermostat employing a proximity sensor for this purpose may only determine a user is home if the user happens to walk through the particular hallway or room in which the thermostat is located. If a user is home, but stays in a different room, the thermostat may mistakenly decide that the user is not home, simply because the user has chosen not to walk past the thermostat itself. Utilizing the position of the smartphone to determine the location of the user, and thus whether or not they are home, may provide more comfort and more energy savings.

FIG. 93 is a schematic diagram of an illustrative use of geofencing in controlling an HVAC system. A home 5030 may represent the home 2 (FIG. 1). As shown, a first boundary, or geofence, 5032 may be defined around the home 5030. It will be appreciated that the home 5030 may be a house, an apartment, a townhouse, a condominium or the like. A second boundary, or geofence, 5034 may be defined around the home 5030 at a greater distance than the first geofence 5032. While schematically drawn as concentric circles, it will be appreciated that the first geofence 5032 and/or the second geofence 5034 may have any desired shape. While the second geofence 5034 is drawn as encircling the first geofence 5032, in some instances, it is contemplated that the second geofence 5034 may at least partially overlap regions of the first geofence 5032.

A mobile device 5036, representative of the remote device 62 (FIG. 2), typically has one or more techniques for determining its location. For example, the mobile device 5036 may determine its location via a self-contained GPS unit. In some embodiments, the mobile device 5036 may determine its location via triangulation of cell phone signals. If the mobile device 5036 is programmed with the details of a geofence such as the first geofence 5032 and/or the second geofence 5034, the mobile device 5036 may determine when it crosses the first geofence 5032 and/or the second geofence 5034, and in what direction, and can transmit that information to a remote server 5038. In some embodiments, the mobile device 5036 may simply transmit its location from time to time to the remote server 5038, and the remote server 5038 may determine when the mobile device 5036 crosses the first geofence 5032 and/or the second geofence 5034, and in what direction.

FIG. 94 is a schematic block diagram of an illustrative mobile device 5036, which may be similar to mobile devices described herein and which may, for example, represent the mobile device 62 (FIG. 2). In some cases, the mobile device 5036 is a smartphone. The illustrative mobile device 5036 has location services such as GPS or cell phone signal triangulation that can determine the location of the mobile device 5036. The illustrative mobile device 5036 includes a user interface 5100 and a memory 5102 for storing two or more predetermined geo-fences (such as first geofence 5032 and second geofence 5034), each defining a different sized region about the home 5030 (FIG. 93) of a user of the mobile device 5036. In some embodiments, a first one of the two or more predetermined geo-fences, such as the first geofence 5032, defines a first sized region and a second one of the two or more predetermined geo-fences, such as the second geofence 5034, defines a second sized region, and the second sized region has an area that is at least 25%, 50% or 100% larger than an area of the first sized region.

A controller 5104 of the illustrative mobile device 5036 is operatively coupled to the user interface 5100 and the memory 5102. In the example shown, the controller 5104 is configured to accept a selection of one of the two or more predetermined geo-fences via the user interface 5100 and to report out when the location of the mobile device 5036 crosses the selected one of the two or more predetermined geo-fences to a remote device, such as a remote server. In some cases, the controller 5104 may be further configured to accept a selection of another one of the two or more predetermined geo-fences via the user interface 5100, and to report out when the location of the mobile device 5036 crosses the selected another one of the two or more predetermined geo-fences to a remote device, such as a remote server. In some cases, the controller 5104 is configured to not report out when the location of the mobile device 5036 crosses unselected ones of the two or more predetermined geo-fences.

In some embodiments, the remote device is a remote server 5038, and the controller 5104 is configured to report when the location of the mobile device 5036 crosses the selected one of the two or more predetermined geo-fences to the remote server 5038 via a wireless communication port. In some instances, the remote server 5038, in response to receiving a report that the location of the mobile device 5036 crossed the selected one of the two or more predetermined geo-fences, notifies an HVAC controller 5040 (FIG. 93) in the home 5030 of the user of the mobile device 5036 to change a setting. In some cases, the setting includes a temperature set point or a lighting setting. The change in the setting may be reported back to the mobile device 5036, and the controller 5104 of the mobile device 5036 may be configured to display the changed setting on the user interface 5100 of the mobile device 5036.

FIG. 95 is a schematic block diagram of an illustrative building automation system 5042 that includes a memory 5044 and a controller 5046 that is operably coupled to the memory 5044. The memory 5044 stores a geofence that defines a region about the user's building. The controller 5046 is configured to identify when a user's mobile device 5036 crosses the geo-fence, and in response, cause an adjustment to a temperature set point of the building automation system. In some embodiments, the controller 5046 is also configured to automatically increase the size of the region of the geo-fence if the controller 5046 receives an indication (e.g. from a user) that the geo-fence is too sensitive, and to automatically decrease the size of the region of the geo-fence if the controller 5046 receives an indication (e.g. from a user) that the geo-fence is not sensitive enough.

In some embodiments, the indication (e.g. from the user) that the geo-fence is too sensitive is in response to a query presented to the user. In some cases, the indication from the user that the geo-fence is too sensitive is in response to a query presented to the user via the mobile device 5036. In some instances, the indication from the user that the geo-fence is too sensitive is in response to a query presented to the user via a web page. Optionally, the indication from the user that the geo-fence is not sensitive enough is in response to a query presented to the user. In some cases, the indication that the geo-fence is too sensitive or not sensitive enough is based on historical HVAC data, such as the length of times and spacing between the occupied and unoccupied modes.

Figure 96:
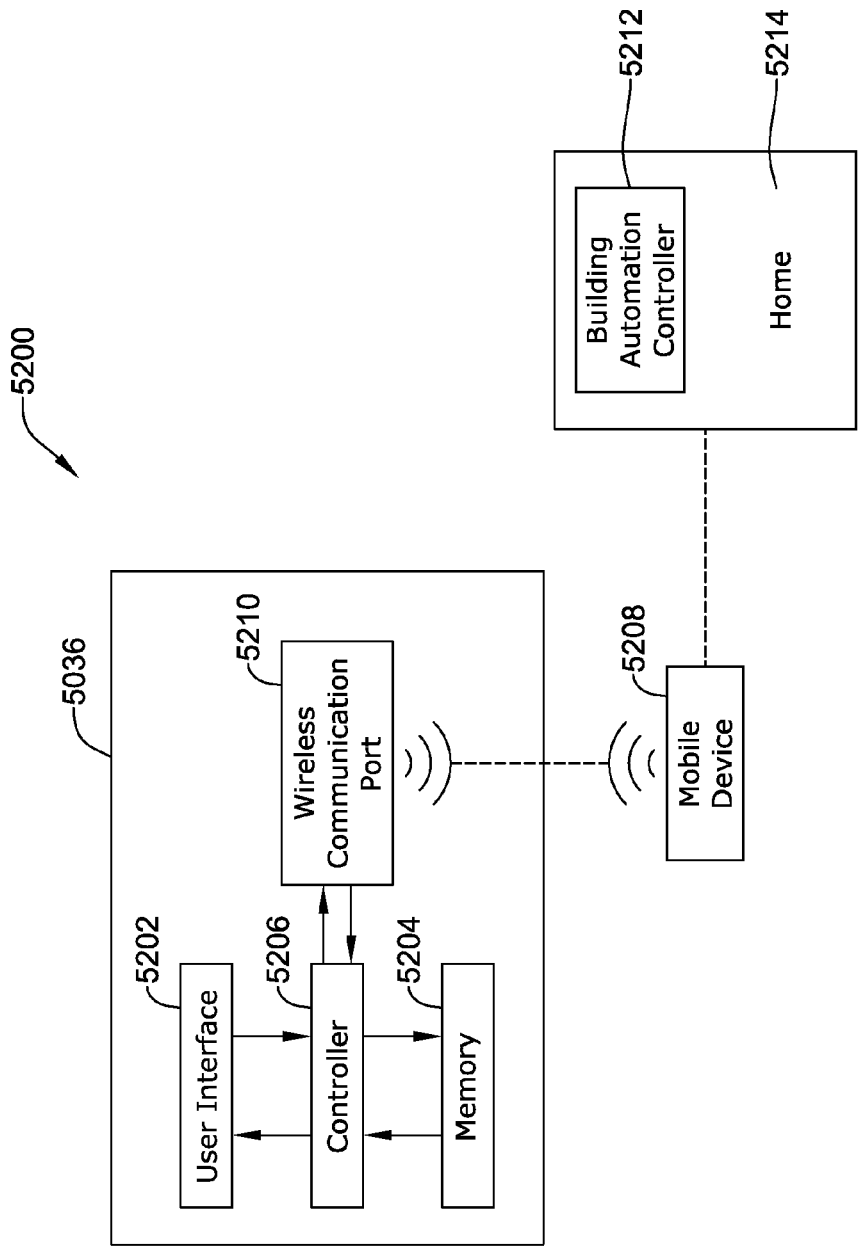
FIG. 96 is a schematic block diagram of another building automation system that may be use with geofencing.

FIG. 96 is a schematic block diagram of an illustrative mobile device 5200 having location services for determining a location of the mobile device 5200. The mobile device 5200 includes a user interface 5202 and a memory 5204. The memory 5204 stores a first geofence (such as first geofence 5032) that defines a first region about a user's building and a second geofence (such as second geofence 5034) that defines a second region about the user's building, wherein the second region is different than the first region. The memory 5204 may also store a programmable geo-fence schedule that assigns the first geo-fence to a first scheduled time period and assigns the second geo-fence to a second scheduled time period. A controller 5206 is operatively coupled to the memory 5204 and the user interface 5202. The controller 5206 is configured to activate the first geo-fence during the first scheduled time period(s), and to identify when the mobile device 5036 crosses the first geo-fence during the first scheduled time period(s). The controller 5206 is further configured to activate the second geo-fence during the second scheduled time period(s), and to identify when the mobile device 5036 crosses the second geo-fence during the second scheduled time period(s). The controller 5206 may report to a remote device 5208 such as a remote server when the location of the mobile device 5036 crosses the first geo-fence during the first scheduled time period(s) and when the location of the mobile device 5036 crosses the second geo-fence during the second scheduled time period(s).

In some embodiments, the remote device 5208 is a remote server, and the controller 5206 is configured to report when the location of the mobile device 5036 crosses the first geo-fence during the first scheduled time period(s) and when the location of the mobile device 5036 crosses the second geo-fence during the second scheduled time period(s). The remote server 5208, in response to receiving a report that the location of the mobile device 5036 crossed the first geo-fence during the first scheduled time period(s) or that the mobile device crossed the second geo-fence during the second scheduled time period(s), may notify a building automation controller 5212 in the user's building 5214 to change a setting. In some embodiments, the first scheduled time period(s) corresponds to a weekday, and the second scheduled time period(s) corresponds to a weekend day. Alternatively, the first scheduled time period(s) may correspond to a first part of a day, and the second scheduled time period(s) may correspond to a second part of the same day. These are just some examples.

In some cases, and to keep things relatively simple, a geofence setting may be offered to the user to select between a smaller proximity boundary and a larger proximity boundary. By manipulating the geofence setting, the user may select between the smaller proximity boundary and the larger proximity boundary. Selection of the small proximity boundary may increase the sensitivity of the HVAC controller 18 to the user's location, as determined by the user's remote device 62, a server and/or the HVAC controller 18.

Figures 97, 98:
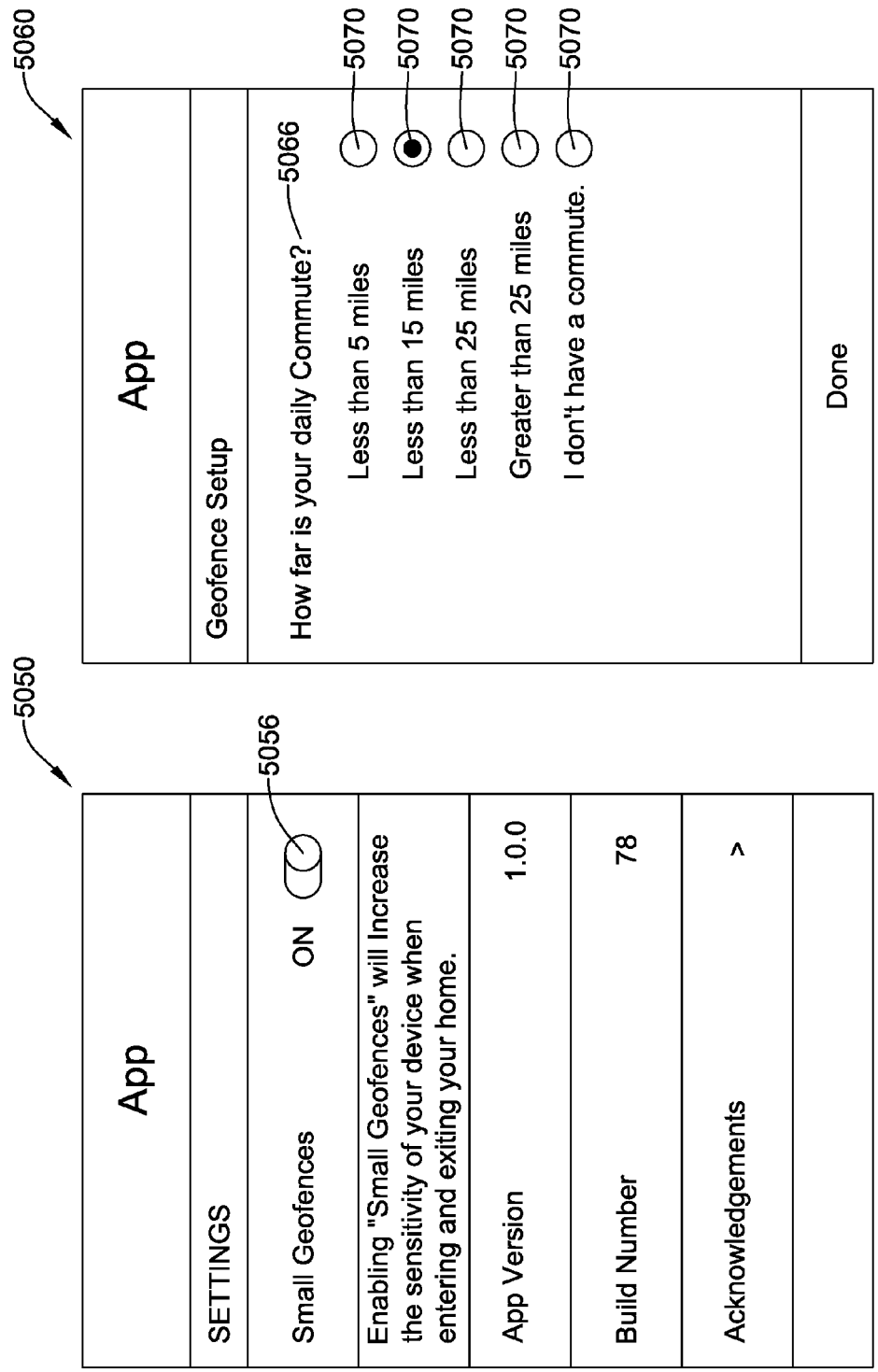

FIG. 97 shows a geofence settings menu screen 5050 that includes a radio button or other selectable option 5056 that permits a user to choose between a small proximity boundary (e.g. smaller radius geofence) and a large proximity boundary (e.g., larger radius geofence) that may be displayed on the user interface of the remote device 62 by the application program code. In one example, the smaller proximity boundary may have a radius extending approximately 500 feet (approximately 152.4 meters) outward from a predetermined location such as, for example, the location of the HVAC controller 18. The larger proximity boundary may have a radius extending approximately seven miles (or more) outward from the same predetermined location. These are just examples. It will be generally understood that the smaller and larger proximity boundaries can correspond to a radius of any suitable distance, as desired. In some cases, the area of the larger proximity boundary may be at least 25% greater than the area of the smaller proximity boundary, but this is just one example.

In some instances, a user may select the size of the proximity boundary based on their schedule. For example, a user may select a larger proximity boundary on days (e.g. weekdays) in which they typically commute to a secondary location (e.g. work), and may select a smaller proximity boundary for use on their non-commuting days (e.g. weekends) where they may remain relatively closer to their home. In another example, a user may select a larger proximity boundary for use during a first period of time (e.g. work hours such as 8:00 AM-5:00 PM), and a smaller proximity boundary for use during a second period of time (e.g. home hours such as 5:00 PM-8:00 AM). More generally, it is contemplated that a plurality of proximity boundaries may each be assigned to a time slot in a proximity boundary "schedule", and thus the currently active proximity boundary at any given time may change during different times of a day, a week or other time periods.

In some cases, the temperature inside of the space controlled by the HVAC Controller may be more tightly controlled (e.g. within one degree of a control setpoint or less) to provide good comfort when the user is expected to be home, and may be allowed to drift by a predetermined amount to provide greater energy efficiency when the user is not expected to be home. In some cases, the allowed drift from the comfort setting may be set depending on the size of the selected proximity boundary. For example, a larger temperature drift may be allowed if a larger proximity boundary is selected. That is, it may take a user longer to reach home after crossing the proximity boundary when the proximity boundary is larger, and thus the HVAC system may have more time to recover from a larger temperature drift and reach the comfort temperature before the user arrives. When so provided, selecting a larger proximity boundary may result in more energy savings (via a larger allowed drift).

In some cases, the proximity boundary may be established relative to the location of the HVAC controller 18 such as, for example, the user's home. In one example, when the user leaves the proximity boundary, sometimes as determined by the application program code executed by the user's remote device 62, the user's remote device 62 may cause the HVAC controller 18, either directly or indirectly, to adjust the temperature setpoint and/or any other applicable operating parameters (e.g. lights, ventilation, humidification/dehumidification, etc.) according to one or more "away" settings. Conversely, when the remote device 62 detects that the user has re-entered the proximity boundary, the user's remote device 62 may cause the HVAC controller, either directly or indirectly, to adjust the temperature setpoint and/or any other operating parameters according to one or more at "home" settings.

In some cases, a proximity boundary may be established relative to a user's secondary location such as, for example, the user's workplace, a school, or some other location. Using a proximity boundary that is defined relative to a user's secondary location may be particularly appropriate when the user's secondary location is located a relatively short distance away from the user's home. In this example, when the remote device 62 detects that the user has entered the proximity boundary at the user's secondary location, the user's remote device 62 may cause the HVAC controller, either directly or indirectly, to adjust the temperature setpoint and/or any other operating parameters according to one or more "away" settings. Conversely, when the remote device 62 determines that the user has left the proximity boundary at the use's secondary location, the user's remote device 62 may cause the HVAC controller, either directly or indirectly, to adjust the temperature setpoint and/or any other operating parameters according to one or more "home" settings.

In some instances, the proximity boundary at the user's secondary location may become active only at scheduled time periods (e.g. during work hours). In some cases, such as when the user's secondary location is relatively close to the user's home, the HVAC controller may allow the temperature (and/or other environmental parameter) inside of the home to drift by a predetermined amount that cannot be fully recovered from in the time that it would normally take the user to travel from the user's secondary location to the user's home. However, by referencing a programmed schedule, such as a user's work schedule, and by assuming the user will remain at the user's secondary location during the programmed work schedule, the HVAC system may obtain more energy savings than if the user's schedule were not taken into account. If the user were to leave the user's secondary location early, the user's remote device 62 may cause the HVAC controller, either directly or indirectly, to begin adjusting the temperature and/or any other operating parameters according to one or more "comfort" settings. In some cases, however, the "comfort" setting may not be achieved by the time the user arrives at home.

In some instances, a household may include more than one person, such as a husband, a wife and two children. Each person may have a remote device 62 (e.g. smartphone) that executes application program code that causes the remote device 62 to determine that the corresponding user, or more specifically, that the corresponding user's remote device 62, has crossed one or more proximity boundaries established relative to a location such as home, work, school, etc. A household account may be established that links each of the remote device 62 associated with a household to the household account. Each remote device 62 may report when the corresponding remote device 62 crosses a particular proximity boundary to a master device, such as a server. The master device (e.g. server) may be in communication with the HVAC controller of the household, a security system controller of the household, a lighting system controller of the household, and/or any other suitable controller as desired. The master device (e.g. server) may be programmed to determine when all (or some subset) of the household members have departed from the household and crossed one or more corresponding proximity boundaries. Each user may have the same or different active proximity boundaries. When this occurs, the server may instruct the HVAC controller to assume a more energy efficient setpoint. In some cases, the master (e.g. server) may also instruct a security system controller to arm the security system and lock all of the doors, and may instruct a lighting controller to turn off the lights.

In some cases, a different proximity boundary may be set for each of the remote devices 62 of the household. For example, if the husband works about 20 miles (about 32.19 kilometers) from the household and the wife works about 10 miles (about 16.09 kilometers) from the household, the remote device 62 of the husband may use a proximity boundary that has a radius of about 15 miles (about 24.14 kilometers) from the household, and the remote device 62 of the wife may use a proximity boundary that has a radius of about 7 miles (about 11.27 kilometers) from the household. If the kids attend a school that is about 6 miles (about 9.656 kilometers) from the household, the remote devices 62 of the kids may use a proximity boundary that has a radius of about 4 miles (about 6.437 kilometers) from the household. These are just examples.

Alternatively, or in addition, the remote device 62 of each household member may use a different proximity boundary relative to a secondary location such as, for example, the member's workplace, school, or other location, as described above. Moreover, it is contemplated that different proximity boundaries may be assigned to different time slots of a proximity boundary "schedule" that may be associated with a particular household member.

In some cases, each household member may set a preferred comfort setpoint. The system may be programmed to set the comfort setpoint of the HVAC system based on which household member crosses a corresponding proximity boundary and is expected to return first. If at a later time, another household member crosses a corresponding proximity boundary and is expected to return, the system may set the comfort setpoint based on a combination of household members that are expected to be at the household. For example, if the wife prefers a heating setpoint to be at 74 degrees and the husband prefers a heating setpoint to be 72 degrees, the system may set the comfort setpoint to 74 degrees upon arrival of the wife, and when the husband arrives later, sets the comfort setpoint to 73 degrees. The system may determine an appropriate setpoint based on the particular combination of household members that are expected to be home. For example, the system may average the set points that are associated with the household members that are expected to be home. In some cases, the average may be a weighted average. In some cases, some household members' preferences may have a higher priority over other household member's preferences. For example, the husband and wife's setpoint preferences may take priority over the kid's preferences.

In some instances, when a user leaves the household and crosses a proximity boundary, the system may require that the user remain across the proximity boundary for a predetermined time period before activating an energy savings setpoint in the household. Alternatively, or in addition, when a user is returning to the household and crosses a proximity boundary, the system may require that the user remain across the proximity boundary for a predetermined time period before activating a comfort setpoint in the household. The proximity boundary used when the user leaves the household and the proximity boundary used when the user returns to the household may be the same or different proximity boundaries. In one example, the proximity boundary used when the user leaves the household may have a larger radius than the proximity boundary used when the user returns to the household.

In some cases, the proximity boundary that is to be used may be learned by the system. For example, location data from each household member may be recorded, and geo patterns may be identified from the recorded location data. In some cases, the location data may be time stamped, and geo patterns in both location and time may be identified. From this, suitable proximity boundaries may be identified and/or learned by the system. For example, if the geo pattern identifies that the husband goes to a common location (e.g. work) M-F from 8:00 AM-5:00 PM, the system may learn a proximity boundary that is between the household and that location, perhaps at 60 percent of the distance from the household to that location. Also, and in some cases, that learned proximity boundary may only be activated on M-F. At the same time, if the geo pattern identifies that the kids go to a common location (e.g. school) M-F from 7:30 AM-2:30 PM, the system may learn a proximity boundary between the household and that location, perhaps at 60 percent of the distance from the household to that location. For more granularity, route information may be extracted from the geo patterns, and the learned proximity boundaries may be based, at least in part, on the route information. For example, a learned proximity boundary may be defined as not only traveling a specified distance from the household but also following an identified route. If such an event occurs, the proximity boundary may be deemed to have been "crossed".

In some embodiments, an application program code, as discussed in detail herein, may cause the user's remote device 62 to launch a geofence setup wizard to aid a user in selecting an appropriate geofence. In other cases, a computing device (e.g. tablet, laptop, desktop) may access a website or the like on a server, which may provide a geofence setup wizard to aid a user in selecting an appropriate geofence. In some cases, the geofence setup wizard may display one or more screens on the display of a user interface that may guide a user through establishing an appropriate geofence suitable for their lifestyle. FIGS. 98-101 show examples of different geofence setup screens that may be displayed on the display of a user interface of a user's remote device 62 by a geofence setup wizard. In some cases, a user's response to a user query presented on a first screen may determine the next screen displayed by the geofence setup wizard. In other cases, the geofence wizard may display a sequence of two or more screens in a predetermined order. In this example, the user may have the ability to skip any non-applicable screens.

In some cases, the geofence setup wizard may display a first screen 5060 that includes a first user query 5066 that queries a user about their daily commute, as shown in FIG. 98. The first screen 5060 may include one or more selectable options 5070 for responding to the first user query 5066. In a subsequent screen 5080, as shown in FIG. 99, the geofence setup wizard may display a recommendation 5086 to the user based on the user's response to the first user query recommending a large geofence setting, a small geofence setting, a custom geofence setting and/or establishing a geofence relative to the user's primary location (e.g. home) or secondary location (e.g. work or school). In the example shown in FIG. 99, the geofence wizard displays a recommendation 5086 recommending that the user select the small geofence setting on the settings menu screen 5050 (FIG. 97) displayed by the application program code. Additionally, the geofence wizard may display another screen including another user query that queries the user about the frequency of their commute. For example, the geofence wizard may display a screen 5090, as shown in FIG. 100, which asks or prompts a user to select the days on which they typically commute to work or school from a list of selectable options 5096 corresponding to each of the days of the week. The geofence wizard may then display a screen 6000 that may include a user query 6006 that may ask the user if they would like to use a different geofence for any unselected days. Screen 6000 may include a first option 6012a labeled "yes" and a second option 6012b labeled "no" for responding to the user query 6006. Selection of a different geofence on days in which the user does not typically commute to a secondary location such as work or school may be particularly appropriate for a user that commutes a distance greater than about 24 kilometers (about 14.91 miles) and that stays relatively close to home on their non-commuting days. This feature may allow a user to select a smaller geofence and apply it to any non-selected days on which the user is typically not travelling to and from the secondary location. These are just some examples.

Figure 102:
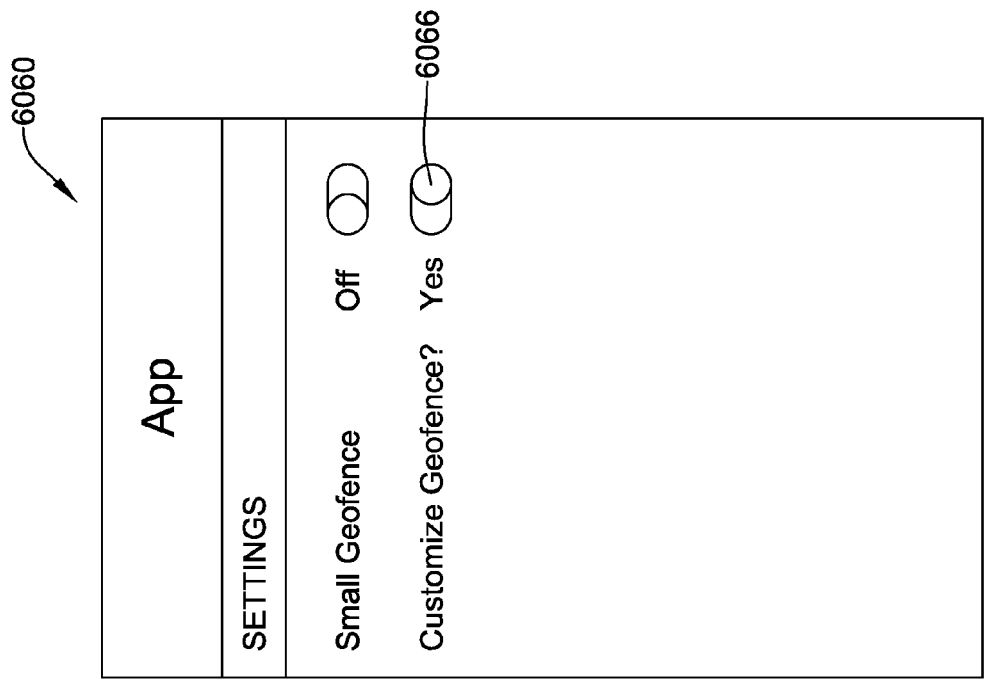
FIG. 102 shows another illustrative setting screen that may be displayed on the user interface of a remote device (e.g. mobile device) by an application program code through which a user may select an appropriate geofence setting.
Figure 101:
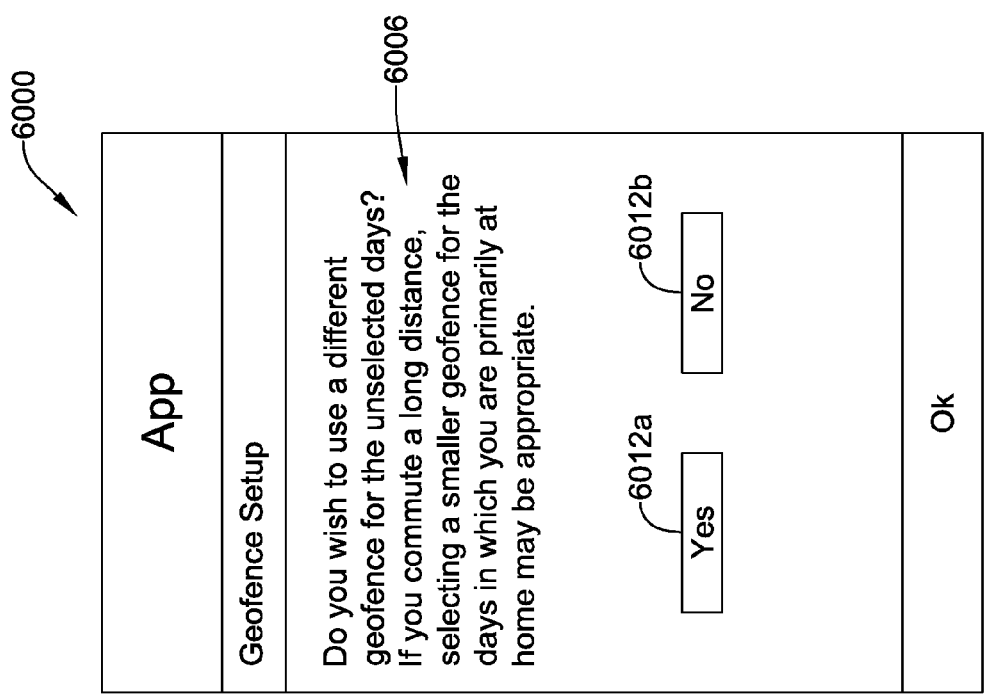

Alternatively, or in addition to the various embodiments described herein, the proximity boundary(s) may be customized by the user and may have any shape and/or size that more appropriately reflects the user's local and/or daily travel habits. For example, at least one proximity boundary may be configured by the user to have the same general size and/or shape of the city in which their home or workplace is located. FIG. 102, for example, shows another view of a settings menu screen 6060 that permits a user to select a custom boundary option. Selection of the custom boundary option 6066 by a user may cause the application program code to display a subsequent screen 6070, as shown in FIG.

Figure 103:
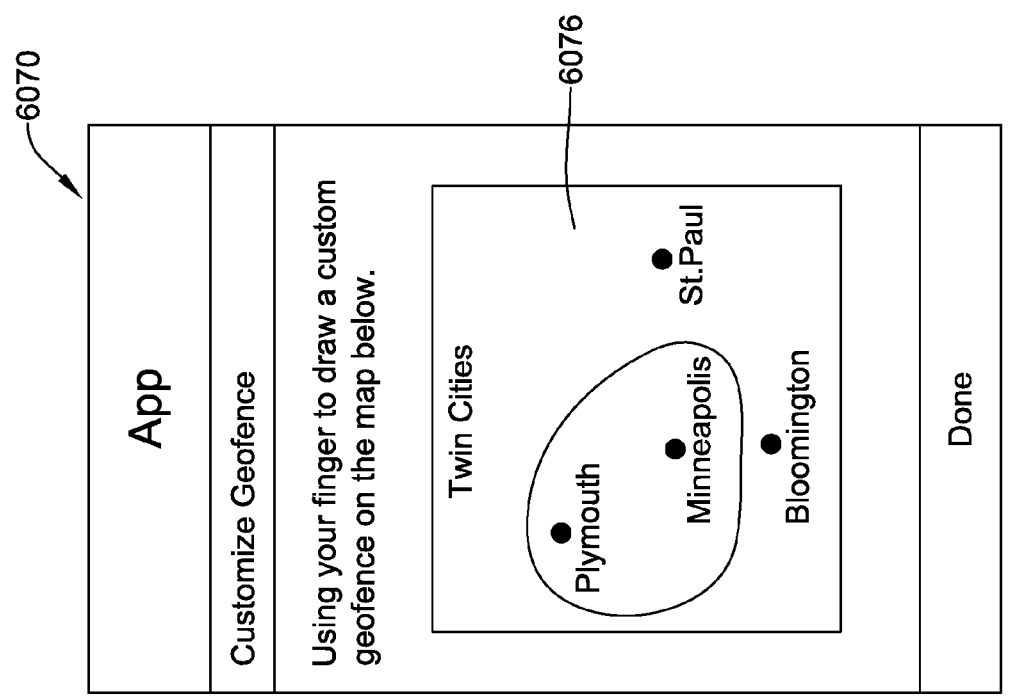
FIG. 103 shows an illustrative screen through which a user may customize a proximity boundary.

103, on the display of the user interface that may permit a user to configure a custom proximity boundary. As shown in FIG. 103, the application program code may display an area map 6076 on the user interface. The user may be prompted to draw a proximity boundary on the area map 6076 by dragging their finger or a stylus on the area map 6076. In some embodiments, if desired, the user may zoom in or zoom out on the area map 6076, depending on how big they want their customized proximity boundary to be, by performing a pinch gesture somewhere on the user interface. The application program code may accept the user's customized proximity boundary and may store the custom proximity boundary in the memory of the user's remote device 62. Again, the user may choose to establish the proximity boundary relative to the location at which the HVAC controller is located, typically their home, and/or a secondary location such as a workplace or school. When the user's remote device 62 determines that the user has crossed the selected proximity boundary, the user's remote device 62 may send a command to the HVAC controller 18, either directly or indirectly, to adjust the temperature setpoint in accordance with the user's selected settings such as for example, the user-specified "at home settings" or "away settings" depending upon if the user is entering or leaving the selected boundary.

Figure 104:
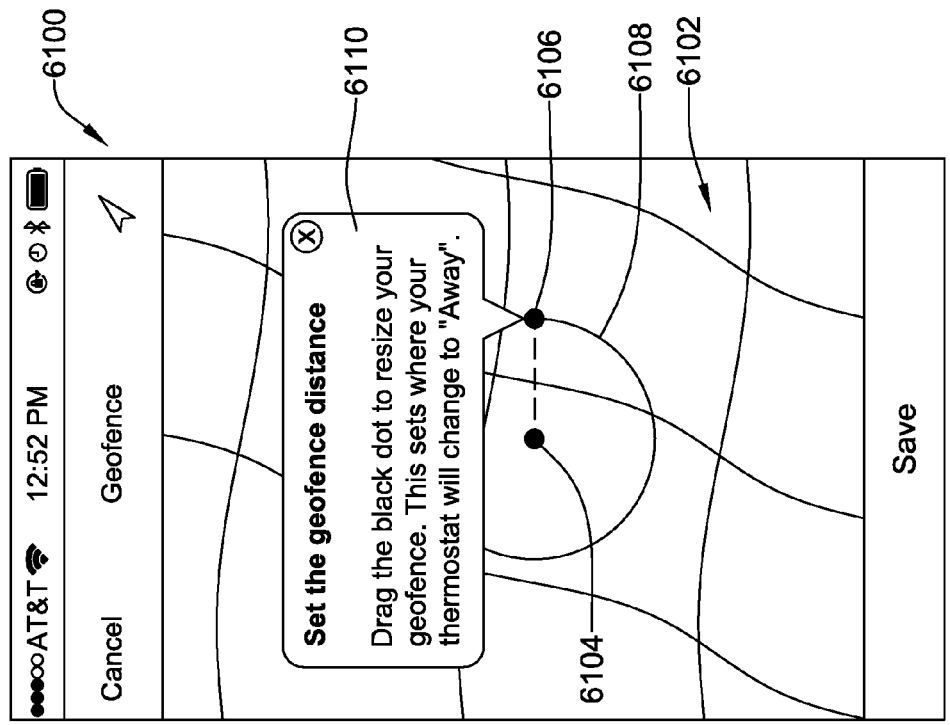
FIGS. 104-106 show illustrative screens through which a user may customize a proximity boundary.
Figure 105:
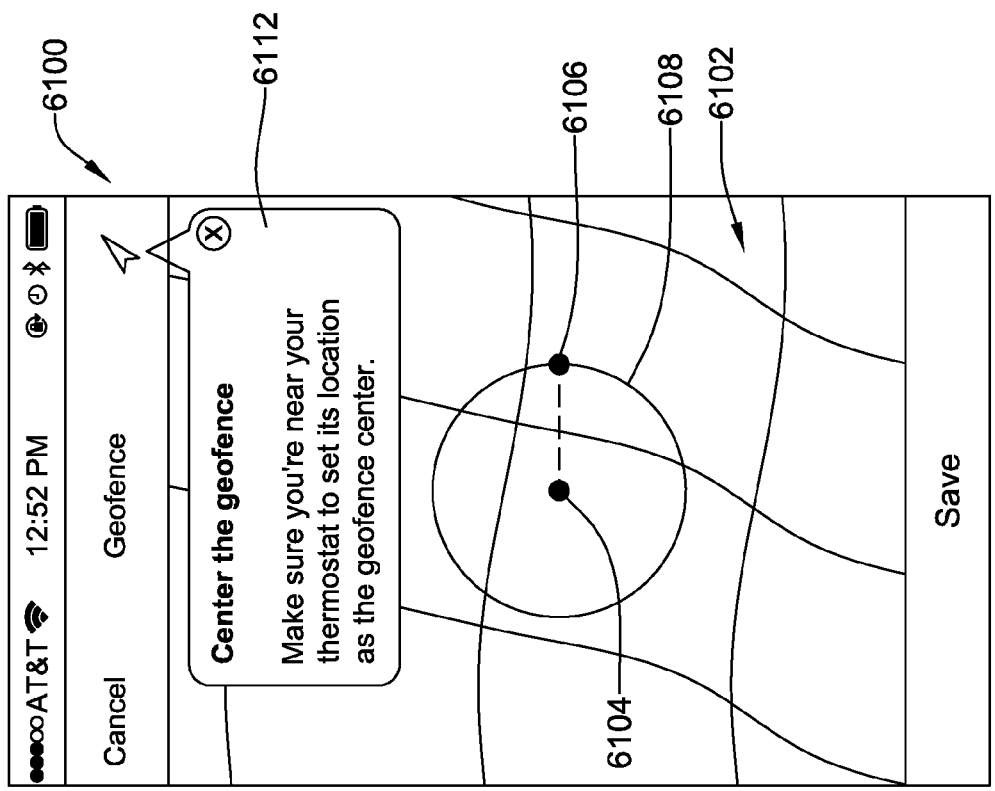
Figure 106:
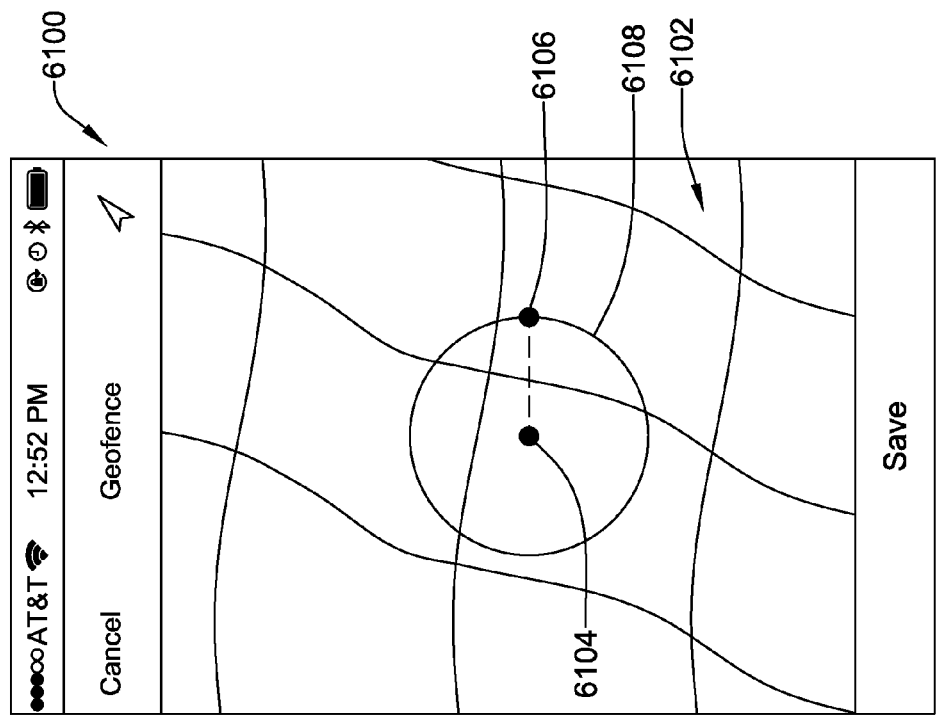
Figure 107:
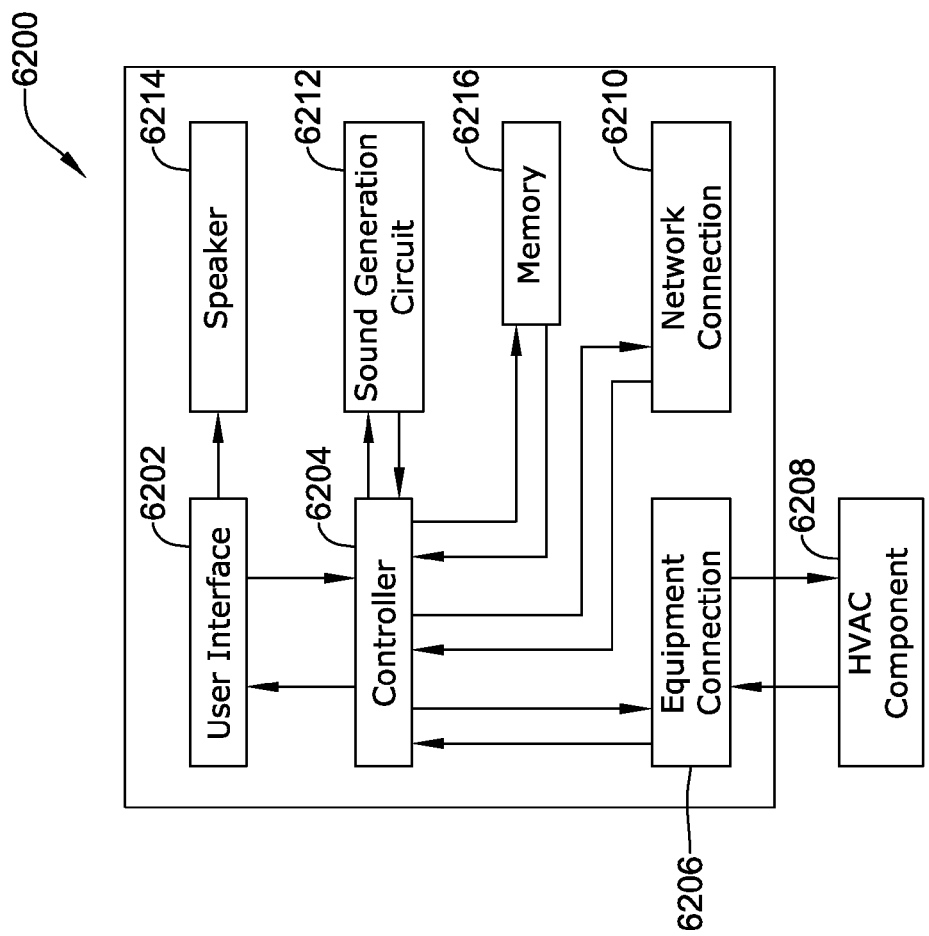
FIG. 107 is a schematic block diagram of an illustrative HVAC controller.

In some embodiments, the user may want to be able to establish a custom proximity boundary that is based upon a radius from their home or other building. FIGS. 104-106 provide illustrative screens that may be displayed on the user's remote device 62. Starting in FIG. 104, a "set my geo fence" screen 6100 may be displayed. In the example shown, a map 6102 is provided, with a location marker 6104 showing the present location of the user's remote device 62. In some instances, setting a geofence boundary is most accurate when the user, or more accurately, the user's remote device 62, is located at the home or other building that is to be the center of the proximity boundary. In some instances, while not illustrated, it is possible that a home address, previously entered when initially setting up the HVAC controller 18, may be used to locate the location marker 6104 if the user is away from home or when the location services of the remote device 62 are turned off when setting or adjusting a proximity boundary. In some embodiments, if the home address was not previously entered, the user's remote device 62 may prompt the user to enter their home address so it can be used to locate the location marker 6104.

The illustrative screen 6100 includes a sizing marker 6106, shown here as a black dot. As the user moves the sizing marker 6106 inwards towards the location marker 6104, a boundary 6108 will become smaller in radius. As the user moves the sizing marker 6106 away from the location marker 6104, the boundary 6108 will become larger in radius. It will be appreciated that the boundary 6108, as illustrated, becomes a new proximity boundary. While drawn as a circle, in some instances the boundary 6108 may take any other predetermined and/or user-defined shape. For example, if the user lives next to a large body of water such as an ocean, there is little need for the boundary 6108 to pass over the water. In such circumstances, perhaps a rectangular boundary 6108 may be more useful. In some cases, the boundary 6108 may be a polygon, and the user may add a vertex to the polygon by touching a location on the boundary 6108 where a vertex should be added. Another sizing marker may be automatically added at that newly created vertex. Once added, the user may drag the new sizing marker to any desired location, which may change the shape of the boundary 6108. With multiple vertices and corresponding sizing markers, the user may easily define nearly any desired shape for the boundary 6108 about the location marker 6104.

In example shown in FIG. 104, a pop up screen 6110 instructs the user how to drag the sizing marker 6106 in one direction or another in order to resize the boundary 6108. In some instances, rather than dragging the sizing marker 6106, the boundary 6108 may be displayed on the screen 6100, and a user may utilize a pinch gesture somewhere on the screen 6100 to make the boundary 6108 smaller or larger, similar to how a user can resize a digital photo, or zoom in or out on a map. In some embodiments, especially if the user is not at home when setting or adjusting a proximity boundary about the home, the screen 6100 may display a map of the user's general area, and superimpose the boundary 6108 on the map. The user may use a finger on the screen 6100 to move the map around until the boundary 6108 is generally centered on their home. It will be appreciated that in doing so, it may be useful to zoom out, using a pinch gesture, to generally locate an area on the map, then zoom in, again using a pinch gesture, to fine tune the location of the user's home before zooming out again to an appropriate distance so that the user can locate the boundary 6108.

In some instances, as illustrated for example in FIG. 105, the screen 6100 may display a pop up screen 6112 that reminds the user that they should be as close to home, or more accurately as close as possible to the HVAC controller 18, when adjusting the boundary 6108. In some embodiments, however, as described above, the user may be not use the location services on the remote device to center the geofence, but rather may be able to use their previously entered home address, newly add their home address, or graphically locate their home on the map 6102, as desired. FIG. 106 provides a view of the screen 6100 without any pop up screens, so that the user may clearly see their newly set proximity boundary 6108.

In some cases, more than one remote device 62 may be configured to communicate with and/or control the HVAC controller 18. Each remote device 62 may be associated with a unique user profile stored in the memory of the HVAC controller 18 and/or at a remote server to which both the HVAC controller 18 and the user's remote device 62 are connected. An example of such a server is Honeywell's TOTAL CONNECT™ server. Each remote device 62 may be configured to transmit a message to the server indicating that a proximity boundary has been crossed as the users, along with their respective remote devices 62, enter and/or exit the area defined by a proximity boundary. As discussed herein, the proximity boundary may be defined relative to the location of the HVAC controller (e.g. the user's home) or a user's secondary location and may be customized by the user. In some cases, the server may be programmed to transmit a command to the HVAC controller 18 to adjust the temperature setpoint and any additional operating parameters according to an "away" setting upon determining that a last user in a group of users is no longer within the area defined by the proximity boundary upon receiving an indication from the last user's remote device 62 that the proximity boundary has been crossed. Conversely, the server may be programmed to transmit a command to the HVAC controller 18 to adjust the temperature setpoint and any additional operating parameters according to an at home setting upon receiving an indication from a user's remote device 62 that the proximity boundary has been crossed by a first user of a group of users, indicating that the first user is now within the area defined by the proximity boundary.

Alternatively or additionally, in certain cases, such as where two or more remote devices each have a unique profile, the HVAC controller 18 or the server may be programmed to include a set of hierarchical rules for determining which individual user profile takes precedence for controlling the HVAC system when both of the remote devices 62 are being actively used by a user and at least one user is determined to be within an area defined by a predetermined proximity boundary. Other methods employing a proximity boundary or other method of detecting a user's presence or approaching presence are shown and described in U.S. Patent Publication No. 2012/0268766, filed on Jul. 26, 2012 and U.S. Patent Publication No. 2014/0045482, filed on Aug. 7, 2012, both of which are incorporated herein by reference in their entireties for all purposes.

In some cases, audible cues may be provided to guide users through control interactions. These audible cues may indicate one or more of what is being changed, the direction of change, and the amount of change. These audio cues may be unique and directly connected to each individual interaction on the device or app or they may be common across multiple interaction experiences and indirectly connected to specific touch points. These audio cues may change in volume and pitch in a recognizable cadence that is directly or indirectly associated to the interactions. For example, when the user adjusts the temperature set point in a way that increases its value, the pitch and volume of each indicated degree of change may get higher, which gives the listener the sensation that the change is going up, even in the absence of visual cues. The audible cues may present changes as a continuous audible cue or as discrete increments, for example, for temperature increments of one degree, the tone may persist with a minimum time and pause duration while changing and may play a sustained tone at the final change which is indicative of the total number of degrees of change. The use of audio may be of particular importance to those who are visually impaired. Through these audible cues, the visually impaired are able to adjust their comfort settings with relative ease. In some embodiments, the audible cue may be distinctive with respect to tone pitch, pattern, or repetition to signal activation of the Away, Weather, or System Mode buttons and to give an audible acknowledgement of activation of those functions.

In certain embodiments, the user may download custom audio and/or visual cues to play on their device based on specific device interactions or based on time or event triggers from other cloud-based data. As an example, a user may download audio and/or visual cues that turn on once or multiple times if a) there is a severe weather alert for their zip code or cellular telephone cell, b) their favorite sports team scores a point, c) a holiday/special event arrives. The audio or visual cues may change in volume and pitch in ways that are recognizable to the user. Example of such cues may include on Christmas, the thermostat may play Jingle Bells on the hour; on New Year's Eve, the thermostat may play Auld Lang Syne at midnight; or when a sports team scores, the thermostat may play the team's song. Additional examples might announce a birthday or a Facebook post. The user may also create or select their own custom audio cues, for example ring tones, and download them to the device to accompany specific interactions. In some embodiments, the audio cues may be accompanied by visual cues such as change in color projected by wall or mud ring illumination, changes in color of illumination of buttons or button-like regions of the window, display of a custom graphic, illumination intensity fluctuations, or combinations of thereof. Audio/visual cues are useful for confirming entry of user inputs to the system, changes of system state, and/or navigation steps which skip portions of the usual programming and/or user interaction sequences. These confirmations may be particularly useful in acknowledging inputs which do not result in an immediate change in the display graphics such as a one-touch action (see below) which will not take effect for some time or an event such as entry of inputs when operating in low battery conditions when a simple acknowledgement tone is preferable to an extended display animation or prolonged audio cue.

FIG. 104 provides a schematic block diagram of an HVAC controller 6200 that may be configured to provide audio and/or visual cues in response to various stimuli, and to permit a user to customize these cues. The HVAC controller 6200 may be considered as being representative of the HVAC controller 18 (FIG. 1). The HVAC controller 6200 includes a user interface 6202 that is configured to accept inputs from a user and to display information to the user. In some cases, the user interface 6202 includes a touchscreen. In some cases, the user interface includes a light ring. In some cases, the user interface 6202 includes a speaker such as the speaker 6214. In some cases, the user interface 6202 includes a vibrator.

A controller 6204 is configured to process inputs from the user interface and to provide the user interface 6202 with information to be displayed. The HVAC controller 6200 includes an equipment connection 6206 that is connectable to one or more HVAC components 6208 and that is operably coupled to the controller 6204. A network connection 6210 is operably coupled to the controller 6204 and provides the controller 6204 with access to outside information. The controller 6204 is configured to output, via the user interface 6202, a particular cue in response to information received from the equipment connection 6206 and/or the network connection 6210, and wherein the particular cue is a cue that was previously selected and activated by the user. In some cases, the user interface 6202 is configured to permit a user to select a cue that the controller 6204 can subsequently output in response to information received from the equipment connection 6206 and/or the network connection 6210.

In some embodiments, the HVAC controller 6200 includes a sound generation circuit 6212 and a speaker 6214 that is connected to the sound generation circuit 6212. A memory 6216 may be used to store a plurality of pre-programmed sounds. The controller 6204 may include circuitry for selecting one or more of the plurality of pre-programmed sounds and activating the sound generation circuit 6212 to play, via the speaker 6214, the selected pre-programmed sounds in response to one or more of a user action, a programmed event, and an occurrence of a signal received by the HVAC controller 6200.

In some cases, the particular cue is selected and downloaded to the HVAC controller 6200 via the network connection 6210. In some embodiments, the network connection 6210 includes a wireless connection while the equipment connection 6206 includes a wired connection. In some instances, the cue may include an audio cue and/or a visual cue. In some embodiments, the cue informs a user that particular information has been received from the equipment connection 6206 and/or the network connection 6210.

In some embodiments, the pre-programmed sounds are indicative of a direction of change of a variable that is associated with the operation of the HVAC controller 6200. For example, the pre-programmed sounds may increase with at least one of pitch and volume when the variable is increased in value, and the pre-programmed sounds may decrease with at least one of pitch and volume when the variable is decreased in value. In some cases, the value is increased and decreased by interacting with the user interface 6202. In some embodiments, the user interface 6202 includes a rotatable ring (such as turning ring 180h, FIG. 5), and wherein rotating the rotatable ring 180h in a first direction increases the value and rotating the rotatable ring 180h in a second direction decreases the value.

Those skilled in the art will recognize that the present disclosure may be manifested in a variety of forms other than the specific embodiments described and contemplated herein. Accordingly, departure in form and detail may be made without departing from the scope and spirit of the present disclosure as described in the appended claims.

What is claimed is:

1. A mobile device for programming an HVAC controller having a wireless interface, the HVAC controller configured to operate HVAC equipment installed at a particular site, the mobile device comprising:
   a touch screen display configured to display information and to permit a user to enter information;
   a wireless port;
   a controller in operative communication with the touch screen display and the wireless port, the controller of the mobile device configured to establish communication to a remote download server via the wireless port and to download an application program code from the remote download server to the mobile device;
   a memory for storing the application program code once downloaded;
   the controller of the mobile device further configured to establish a direct wireless connection, without an intervening wireless gateway, between the wireless port of the mobile device and the wireless interface of the HVAC controller;
   the controller of the mobile device configured to execute the application program code, which provides a predetermined sequence of two or more configuration screens on the touch screen display of the mobile device that facilitate the user in at least partially configuring the HVAC controller by setting two or more configuration parameters via the touch screen display of the mobile device, the predetermined sequence of two or more configuration screens including a configuration screen that solicits a configuration parameter pertaining to a heating system type, a configuration screen that solicits a configuration parameter pertaining to a number of heating stages, and a configuration screen that solicits a configuration parameter pertaining to a number of cooling stages for the HVAC equipment installed at the particular site;
   the controller of the mobile device further configured to upload the two or more configuration parameters to the HVAC controller via the direct wireless connection between the wireless port of the mobile device and the wireless interface of the HVAC controller; and
   wherein after the controller of the mobile device uploads the two or more configuration parameters to the HVAC controller via the direct wireless connection between the wireless port of the mobile device and the wireless interface of the HVAC controller, the mobile device is configured to drop the direct wireless connection between the wireless port of the mobile device and the wireless interface of the HVAC controller and establish communication with a remote monitoring server, and wherein the HVAC controller is configured to also establish communication with the remote monitoring server.

2. The mobile device of claim 1, wherein the mobile device comprises one of a smart phone and a tablet.

3. The mobile device of claim 1, wherein the remote download server is the same server as the remote monitoring server.

4. The mobile device of claim 1, wherein the application program code is also configured to display one or more install screens, wherein the one or more install screens include information on removing an old thermostat as part of a process of installing the HVAC controller.

5. The mobile device of claim 1, wherein the application program code is configured to also display one or more install screens, wherein the one or more install screens include information on wiring the HVAC controller as part of a process of installing the HVAC controller.

6. The mobile device of claim 1, wherein the predetermined sequence of two or more configuration screens further includes a configuration screen that solicits a configuration parameter pertaining to one of a fuel type, a reversing valve control type, a fan control type, and a backup heat type.

7. The mobile device of claim 1, wherein the predetermined sequence of two or more configuration screens include a configuration screen that solicits a configuration parameter pertaining to a comfort preference of the user.

8. The mobile device of claim 1, wherein the predetermined sequence of two or more configuration screens includes a configuration screen instructing the user enter configuration information to configure a wireless connection between the HVAC controller and a home wireless network.

9. The mobile device of claim 1, wherein communication between the HVAC controller and the mobile device over the direct wireless connection, the communication between the HVAC controller and the remote monitoring server, and the communication between the mobile device and the remote monitoring server all use a same communication protocol.

10. An HVAC controller configured to operate HVAC equipment installed at a particular site, the HVAC controller comprising:
    a user interface configured to display information to be viewed by a user and to accept inputs from the user;
    a controller operably coupled to the user interface;
    an on board wireless interface operably coupled to the controller, the controller configured to establish the on board wireless interface to create a direct communication path, without an intervening wireless gateway, with a wireless mobile device for initially configuring the HVAC controller, including:
      for initially configuring the HVAC controller for communication with a wireless gateway by receiving network configuration information from the wireless mobile device;
      for specifying two or more HVAC equipment configuration parameters that identify characteristics of the HVAC equipment installed at the particular site, the two or more HVAC equipment parameters including a heating system type, a number of heating stages and a number of cooling stages;
    the controller configured to accept the network configuration information and the two or more HVAC equipment configuration parameters from the mobile device via the direct communication path established between the on board wireless interface and the wireless mobile device;
    wherein after the controller accepts the network configuration information and the two or more HVAC equipment configuration parameters from the mobile device via the direct communication path established between the on board wireless interface and the wireless mobile device, the mobile device is configured to drop the direct wireless connection between the mobile device and the HVAC controller, and establish communication with a remote monitoring server, and wherein the HVAC controller is configured to establish communication with the wireless gateway using the network configuration information received from the wireless mobile device via the direct communication path, and to establish communication with the remote monitoring server via the wireless gateway; and wherein communication over the direct wireless connection between the HVAC controller and the mobile device and the communication between the HVAC controller, the wireless gateway, and the remote monitoring server all use a same communication protocol.

11. The HVAC controller of claim 10, wherein the mobile device is one of a smart phone and a tablet.

12. The HVAC controller of claim 10, wherein the user interface comprises a touch screen.

13. The HVAC controller of claim 10, wherein the controller is configured to display, via the user interface, a screen instructing a user that the HVAC controller is wirelessly coupled to the mobile device, and to utilize the mobile device to configure the HVAC controller.

14. The HVAC controller of claim 13, wherein the controller is further configured to display, via the user interface, a screen instructing a user to utilize the mobile device to initially configure the HVAC controller for communication with a wireless gateway.

15. The HVAC controller of claim 10, wherein the two or more HVAC equipment configuration parameters that identify characteristics of the HVAC equipment installed at the particular site further include one or more of a fuel type, a reversing valve control type, a fan control type, and a backup heat type.

16. The HVAC controller of claim 10, wherein the HVAC controller further receives one or more comfort settings from the wireless mobile device via the direct communication path.

17. A computer readable medium containing program instructions for facilitating a user of a wireless mobile device in configuring a wireless HVAC controller, wherein execution of the program instructions by one or more processors of the wireless mobile device causes the wireless mobile device to carry out the steps of:

providing one or more screens on a display of the wireless mobile device to accept configuration information from the user;

accepting configuration parameters from the user of the wireless mobile device including two or more of a heating system type parameter, a fuel type parameter, a reversing valve control type parameter, a number of heating stages parameter, a number of cooling stages parameter, a fan control type parameter, and a backup heat type parameter;

establishing a direct communication path, without an intervening wireless gateway between the wireless mobile device and the HVAC controller;

transmitting the accepted configuration parameters from the wireless mobile device to the HVAC controller via the direct communication path between the wireless mobile device and the HVAC controller; and terminating the direct communication path between the wireless mobile device and the HVAC controller;

wherein the accepted configuration parameters includes one or more network configuration parameters for configuring communication between the wireless HVAC controller and the wireless gateway; and wherein communication over the direct communication path between the wireless HVAC controller and the wireless mobile device and the communication between the wireless HVAC controller and the wireless gateway use a same communication protocol.

18. The computer readable medium of claim 17, wherein the accepted configuration parameters includes one or more network configuration parameters for configuring communication between the wireless HVAC controller and the wireless gateway.

* * * * *